US010326080B2

(12) United States Patent
Cho et al.

(10) Patent No.: US 10,326,080 B2
(45) Date of Patent: Jun. 18, 2019

(54) ORGANIC LIGHT-EMITTING DEVICES

(71) Applicant: SAMSUNG DISPLAY CO., LTD., Yongin-si, Gyeonggi-do (KR)

(72) Inventors: Hwan-Hee Cho, Yongin (KR); Mi-Kyung Kim, Yongin (KR); Jae-Yong Lee, Yongin (KR); Dong-Hyun Kim, Yongin (KR); Se-Hun Kim, Yongin (KR); Chang-Woong Chu, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/960,254

(22) Filed: Apr. 23, 2018

(65) Prior Publication Data

US 2018/0240981 A1 Aug. 23, 2018

Related U.S. Application Data

(62) Division of application No. 14/447,559, filed on Jul. 30, 2014.

(30) Foreign Application Priority Data

Feb. 14, 2014 (KR) ........................ 10-2014-0017518

(51) Int. Cl.

| | |
|---|---|
| ***H01L 51/54*** | (2006.01) |
| ***C09K 11/06*** | (2006.01) |
| ***H01L 51/00*** | (2006.01) |
| *H01L 51/50* | (2006.01) |

(52) U.S. Cl.

CPC ...... *H01L 51/0067* (2013.01); *H01L 51/0052* (2013.01); *H01L 51/0054* (2013.01); *H01L 51/0058* (2013.01); *H01L 51/0059* (2013.01); *H01L 51/0071* (2013.01); *H01L 51/0072* (2013.01); *H01L 51/0073* (2013.01); *H01L 51/0074* (2013.01); *H01L 51/0094* (2013.01); *H01L 51/5016* (2013.01); *H01L 2251/5384* (2013.01)

(58) Field of Classification Search

CPC ............... H01L 51/0032; H01L 51/005; H01L 51/0051; H01L 51/0052; H01L 51/0054; H01L 51/0058; H01L 51/0059; H01L 51/006; H01L 51/0061; H01L 51/0065; H01L 51/0067; H01L 51/0068; H01L 51/0069; H01L 51/0071; H01L 51/0072; H01L 51/0073; H01L 51/0074; H01L 51/0094; H01L 51/50; H01L 51/5012; H01L 51/5016; H01L 51/5203; H01L 2251/5384

USPC ....... 428/690, 691, 917, 411.4, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

| | | | | |
|---|---|---|---|---|
| 9,530,969 | B2 | 12/2016 | Mizuki et al. | |
| 9,559,309 | B2 | 1/2017 | Min et al. | |
| 2011/0037062 | A1 | 2/2011 | Fukumatsu et al. | |
| 2011/0315975 | A1 | 12/2011 | Kai et al. | |
| 2012/0001158 | A1 | 1/2012 | Asari et al. | |
| 2012/0080670 | A1 * | 4/2012 | Park ..................... | C07D 209/82 257/40 |
| 2012/0104370 | A1 | 5/2012 | Suzuki et al. | |
| 2012/0138915 | A1 | 6/2012 | Nishimura et al. | |
| 2012/0153272 | A1 | 6/2012 | Fukuzaki | |
| 2013/0112952 | A1 | 5/2013 | Adamovich et al. | |
| 2013/0234119 | A1 | 9/2013 | Mizuki et al. | |
| 2013/0313536 | A1 | 11/2013 | Nishimura et al. | |
| 2014/0070204 | A1 | 3/2014 | Nagao et al. | |
| 2014/0084270 | A1 | 3/2014 | Kato et al. | |
| 2014/0151647 | A1 | 6/2014 | Mizuki et al. | |
| 2014/0197386 | A1 | 7/2014 | Kim et al. | |
| 2014/0306207 | A1 | 10/2014 | Nishimura et al. | |
| 2015/0084020 | A1 | 3/2015 | Nagao et al. | |

FOREIGN PATENT DOCUMENTS

| | | | |
|---|---|---|---|
| EP | 2879196 | A1 | 6/2015 |
| KR | 10-2010-0079458 | A | 7/2010 |
| KR | 10-2010-0105099 | A | 9/2010 |
| KR | 10-2011-0007124 | A | 1/2011 |
| KR | 10-2011-0134885 | A | 12/2011 |
| KR | 10-2011-0134923 | A | 12/2011 |
| KR | 10-2012-0042633 | A | 5/2012 |
| KR | 10-2012-0049135 | A | 5/2012 |
| KR | 10-2012-0057611 | A | 6/2012 |
| KR | 10-2012-0060611 | A | 6/2012 |
| KR | 10-2013-0073023 | A | 7/2013 |
| KR | 10-2013-0132226 | A | 12/2013 |
| KR | 10-2014-0096203 | A | 8/2014 |
| KR | 10-2014-0105913 | A | 9/2014 |
| KR | 10-2014-0108637 | A | 9/2014 |
| WO | WO 2010/107244 | A2 | 9/2010 |
| WO | WO 2012/026780 | A1 | 3/2012 |
| WO | WO 2013/084881 | A1 | 6/2013 |
| WO | WO 2013/122082 | A1 | 8/2013 |
| WO | WO 2013/133219 | A1 | 9/2013 |
| WO | WO 2013/133223 | A1 | 9/2013 |
| WO | WO 2013/187894 | A1 | 12/2013 |
| WO | WO 2014/017484 | A1 | 1/2014 |

OTHER PUBLICATIONS

KIPO Office Action dated Jun. 1, 2016, for Korean Patent application 10-2014-0017518 (9 pages).

KIPO Office Action dated Feb. 15, 2017, for corresponding Korean Patent Application No. 10-2014-0017518 (11 pages).

* cited by examiner

*Primary Examiner* — Andrew K Bohaty

(74) *Attorney, Agent, or Firm* — Lewis Roca Rothgerber Christie LLP

(57) ABSTRACT

An organic light-emitting device includes: a first electrode; a second electrode facing the first electrode; and an organic layer including an emission layer between the first electrode and the second electrode. The emission layer includes at least one compound selected from carbazole-based compounds, and at least one compound selected from heterocyclic compounds as described in the detailed description.

18 Claims, 1 Drawing Sheet

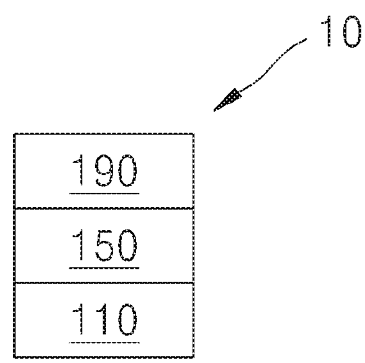
10
190
150
110

ORGANIC LIGHT-EMITTING DEVICES

CROSS-REFERENCE TO RELATED APPLICATION

This application is a divisional of U.S. patent application Ser. No. 14/447,559, filed on Jul. 30, 2014, which claims priority to and the benefit of Korean Patent Application No. 10-2014-0017518, filed on Feb. 14, 2014, in the Korean Intellectual Property Office, the contents of all of which are incorporated herein in their entirety by reference.

BACKGROUND

1. Field

Aspects of embodiments of the present disclosure relate to organic light-emitting devices.

2. Description of the Related Art

Organic light-emitting devices (OLEDs), which are self-emitting devices, have desired features such as wide viewing angles, excellent contrast, quick response, high brightness, excellent driving voltage characteristics, etc.; and can provide multicolored images.

An organic light-emitting device may have a structure in which a first electrode, a hole transport region, an emission layer, an electron transport region, and a second electrode are sequentially disposed in this order on a substrate. Holes injected from the first electrode move to the emission layer via the hole transport region, while electrons injected from the second electrode move to the emission layer via the electron transport region. Carriers such as the holes and electrons recombine in the emission layer to generate exitons. When the exitons drop from an excited state to a ground state, light is emitted.

SUMMARY

Aspects according to one or more embodiments of the present disclosure are directed toward organic light-emitting devices.

Additional aspects will be set forth in part in the description which follows and, in part, will be apparent from the description, or may be learned by practice of the presented embodiments.

According to one or more embodiments of the present invention, an organic light-emitting device includes: a first electrode; a second electrode facing the first electrode; and an organic layer including an emission layer between the first electrode and the second electrode, wherein the emission layer includes at least one compound selected from carbazole-based compounds represented by Formula 1, and at least one compound selected from heterocyclic compounds represented by Formulae 10A, 10B, 10C, 10D, and 10E:

Formula 1

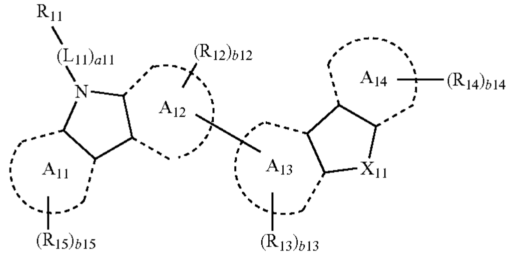

-continued

Formula 10A

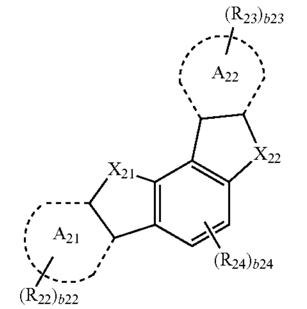

Formula 10B

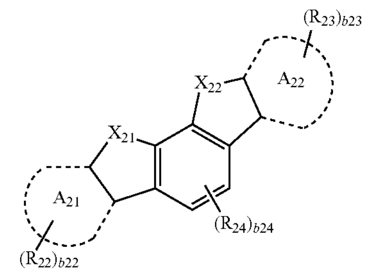

Formula 10C

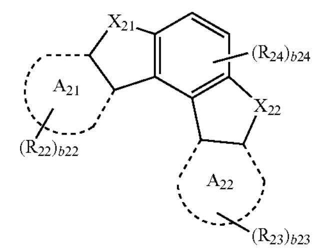

Formula 10D

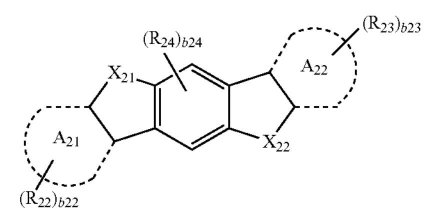

Formula 10E

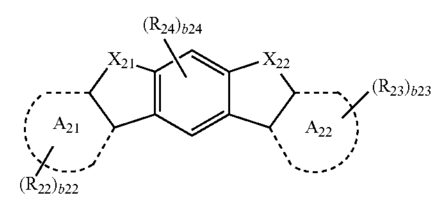

wherein, in Formulae 1, 10A, 10B, 10C, 10D, and 10E, $A_{11}$ to $A_{14}$, $A_{21}$, and $A_{22}$ are each independently selected from benzene, naphthalene, pyridine, pyrimidine, pyrazine, quinoline, isoquinoline, 2,6-naphthyridine, 1,8-naphthyridine, 1,5-naphthyridine, 1,6-naphthyridine, 1,7-naphthyridine, 2,7-naphthyridine, quinoxaline, phthalazine, and quinazoline;

$X_{11}$ is O, S, $C(R_{16})(R_{17})$, $Si(R_{16})(R_{17})$, $P(R_{16})$, $B(R_{16})$, $P(=O)(R_{16})$, or $N(R_{16})$;

$X_{21}$ and $X_{22}$ are each independently, $N$-$(L_{21})_{a21}$-$R_{21}$, O, S, $C(R_{25})(R_{26})$, $Si(R_{25})(R_{26})$, $P(R_{25})$, $B(R_{25})$, or $P(=O)(R_{25})$;

$L_{11}$ is selected from:

a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_1$-$C_{60}$ heteroarylene group, a divalent nonaromatic condensed polycyclic group, and a divalent nonaromatic condensed heteropolycyclic group; and a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_2$-$C_{60}$ heteroarylene group, a divalent nonaromatic condensed polycyclic group, and a divalent nonaromatic condensed heteropolycyclic group, each substituted with at least one selected from a deuterium; —F; —Cl; —Br; —I; a $C_1$-$C_{60}$ alkyl group; a $C_6$-$C_{60}$ aryl group; a monovalent nonaromatic condensed polycyclic group; and a monovalent nonaromatic condensed heteropolycyclic group; except for (i.e, the substituent does not include) a nitrogen (N)-containing $C_1$-$C_{60}$ heteroarylene group, and a nitrogen (N)-containing $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

a11 is an integer selected from 0 to 5;

$R_{11}$, $R_{16}$, and $R_{17}$ are each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium; —F; —Cl; —Br; —I; a $C_1$-$C_{60}$ alkyl group; a $C_6$-$C_{60}$ aryl group; a monovalent nonaromatic condensed polycyclic group; and a monovalent nonaromatic condensed heteropolycyclic group; except for (i.e, the substituent does not include) a nitrogen (N)-containing $C_1$-$C_{60}$ heteroaryl group, and a nitrogen (N)-containing $C_1$-$C_{60}$ heteroaryl group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

$L_{21}$ is selected from a nitrogen (N)-containing $C_1$-$C_{60}$ heteroarylene group, and a $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

a21 is an integer selected from 0 to 5;

$R_{21}$, $R_{25}$, and $R_{26}$ are each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

$R_{12}$ to $R_{15}$, and $R_{22}$ to $R_{24}$ are each independently selected from:

a hydrogen, a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group; and

—N($Q_{21}$)($Q_{22}$);

b12 to b15, and b22 to b24 are each independently an integer selected from 1 to 5; and $Q_{11}$, $Q_{12}$, $Q_{21}$, and $Q_{22}$ are each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group.

According to one or more embodiments of the present invention, an organic light-emitting device includes: a first electrode; a second electrode facing the first electrode; and an organic layer including an emission layer between the first electrode and the second electrode, wherein the emission layer includes at least one compound selected from carbazole-based compounds represented by Formula 1, and at least one compound selected from heterocyclic compounds represented by Formulae 10A, 10B, 10C, 10D, and 10E:

Formula 1

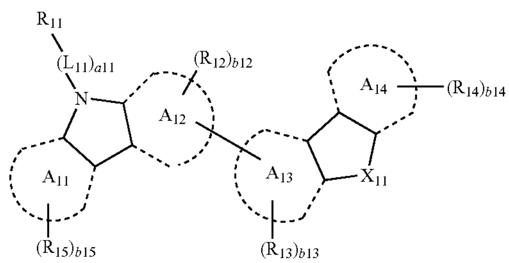

Formula 10A

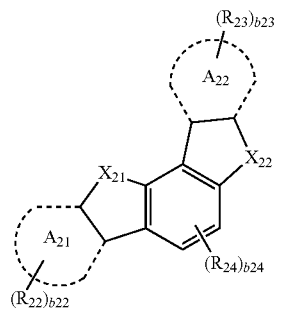

Formula 10B

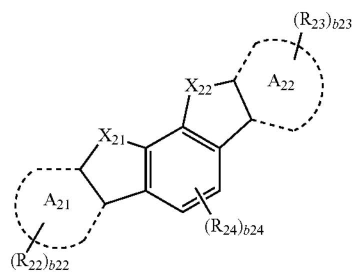

Formula 10C

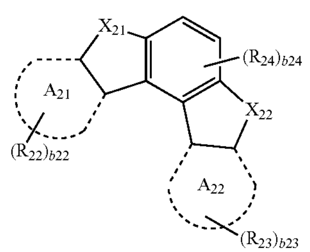

Formula 10D

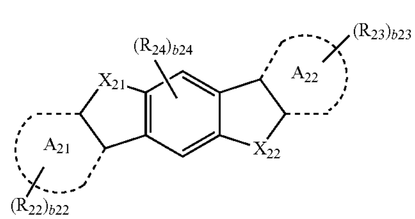

-continued

Formula 10E

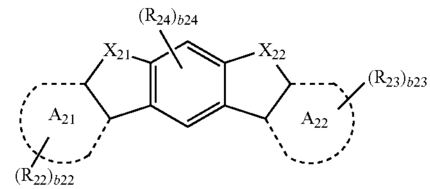

wherein, in Formulae 1, and 10A, 10B, 10C, 10D, and 10E, $A_{11}$ to $A_{14}$, $A_{21}$, and $A_{22}$ are each independently selected from benzene, naphthalene, pyridine, pyrimidine, pyrazine, quinoline, isoquinoline, 2,6-naphthyridine, 1,8-naphthyridine, 1,5-naphthyridine, 1,6-naphthyridine, 1,7-naphthyridine, 2,7-naphthyridine, quinoxaline, phthalazine, and quinazoline;

$X_{11}$ is O, S, $C(R_{16})(R_{17})$, $Si(R_{16})(R_{17})$, $P(R_{16})$, $B(R_{16})$, $P(=O)(R_{16})$, or $N(R_{16})$;

$X_{21}$ and $X_{22}$ are each independently $N-(L_{21})_{a21}-R_{21}$, O, S, $C(R_{25})(R_{26})$, $Si(R_{25})(R_{26})$, $P(R_{25})$, $B(R_{25})$, or $P(=O)(R_{25})$;

$L_{11}$ is selected from:

a nitrogen (N)-containing $C_1$-$C_{60}$ heteroarylene group; and a $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

a11 is an integer selected from 0 to 5;

$R_{11}$, $R_{16}$, and $R_{17}$ are each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and $—N(Q_{11})(Q_{12})$; and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

$L_{21}$ is selected from:

a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_1$-$C_{60}$ heteroarylene group, a divalent nonaromatic condensed polycyclic group, and a divalent nonaromatic condensed heteropolycyclic group; and a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_2$-$C_{60}$ heteroarylene group, a divalent nonaromatic condensed polycyclic group, and a divalent nonaromatic condensed heteropolycyclic group, each substituted with at least one selected from a deuterium; —F; —Cl; —Br; —I; a $C_1$-$C_{60}$ alkyl group; a $C_6$-$C_{60}$ aryl group; a monovalent nonaromatic condensed polycyclic group; and a monovalent nonaromatic condensed heteropolycyclic group; except for (i.e, the substituent does not include) a nitrogen (N)-containing $C_1$-$C_{60}$ heteroarylene group, and a nitrogen (N)-containing $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

a21 is an integer selected from 0 to 5;

$R_{21}$, $R_{25}$, and $R_{26}$ are each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium; —F; —Cl; —Br; —I; a $C_1$-$C_{60}$ alkyl group; a $C_6$-$C_{60}$ aryl group; a monovalent nonaromatic condensed polycyclic group; and a monovalent nonaromatic condensed heteropolycyclic group; except for (i.e, the substituent does not include) a nitrogen (N)-containing $C_1$-$C_{60}$ heteroaryl group, and a nitrogen (N)-containing $C_1$-$C_{60}$ heteroaryl group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

$R_{12}$ to $R_{15}$, and $R_{22}$ to $R_{24}$ are each independently selected from:

a hydrogen, a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group; and

—N($Q_{21}$)($Q_{22}$);

b12 to b15, and b22 to b24 are each independently an integer selected from 1 to 5; and $Q_{11}$, $Q_{12}$, $Q_{21}$, and $Q_{22}$ are each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group.

BRIEF DESCRIPTION OF THE DRAWING

These and/or other aspects will become apparent and more readily appreciated from the following description of the embodiments, taken in conjunction with the accompanying drawing in which:

The drawing is a schematic view of a structure of an organic light-emitting device according to an embodiment of the present disclosure.

DETAILED DESCRIPTION

Reference will now be made in more detail to embodiments, examples of which are illustrated in the accompanying drawing, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. In the drawing, the sizes or thicknesses of layers and regions are exaggerated for clarity, and thus are not limited thereto. As used herein, the term “and/or” includes any and all combinations of one or more of the associated listed items. Expressions such as “at least one of,” when preceding a list of elements, modify the entire list of elements and do not modify the individual elements of the list. Further, the use of “may” when describing embodiments of the present invention refers to “one or more embodiments of the present invention.”

As used herein, the term “organic layer” refers to a single layer and/or a plurality of layers disposed between the first and second electrodes of the organic light-emitting device. A material in the “organic layer” is not limited to an organic material.

The drawing is a schematic sectional view of an organic light-emitting device 10 according to an embodiment of the present disclosure. Referring to the drawing, the organic light-emitting device 10 includes a first electrode 110, an organic layer 150, and a second electrode 190.

A substrate may be disposed under the first electrode 110 or on the second electrode 190 in the drawing. The substrate may be a glass or transparent plastic substrate with good mechanical strength, thermal stability, transparency, surface smoothness, ease of handling, and water resistance.

For example, the first electrode 110 may be formed by depositing or sputtering a first electrode-forming material on the substrate. When the first electrode 110 is an anode, a material having a high work function may be used (utilized) as the first electrode-forming material to facilitate hole injection. The first electrode 110 may be a reflective electrode, a semi-transmissive electrode, or a transmissive electrode. Transparent and conductive materials (such as ITO, IZO, $SnO_2$, or ZnO) may be used (utilized) to form the first electrode. The first electrode 110 as a semi-transmissive electrode or a reflective electrode may be formed of at least one material selected from magnesium (Mg), aluminum (Al), aluminum-lithium (Al—Li), calcium (Ca), magnesium-indium (Mg—In), and magnesium-silver (Mg—Ag).

The first electrode 110 may have a single-layer structure or a multi-layer structure including a plurality of layers. For example, the first electrode 110 may have a three-layered structure of ITO/Ag/ITO, but is not limited thereto.

The organic layer 150 may be disposed on the first electrode 110. The organic layer 150 may include an emission layer (EML).

The organic layer 150 may further include a hole transport region disposed between the first electrode and the EML. The organic layer 150 may further include an electron transport region between the EML and the second electrode.

For example, the hole transport region may include at least one of a hole injection layer (HIL), a hole transport layer (HTL), a buffer layer, and an electron blocking layer (EBL). For example, the electron transport layer may include at least one of a hole blocking layer (HBL), an electron transport layer (ETL), and an electron injection layer (EIL). However, embodiments of the present disclosure are not limited thereto.

The hole transport region may have a single-layered structure including a single material, a single-layered structure including a plurality of materials, or a multi-layered structure including a plurality of layers including different materials.

In some embodiments, the electron transport region may have a single-layered structure including a plurality of materials, or a multi-layered structure of HIL/HTL, HIL/HTL/buffer layer, HIL/buffer layer, HTL/buffer layer, or HIL/HTL/EBL, wherein these layers forming a multi-layered structure are sequentially disposed on the first electrode 110 in the order stated above. However, embodiments of the present disclosure are not limited thereto.

When the hole transport region includes an HIL, the HIL may be formed on the first electrode 110 by using (utilizing) any of a variety of suitable methods, for example, by using (utilizing) vacuum deposition, spin coating, casting, Langmuir-Blodgett (LB) deposition, inkjet printing, laser printing, laser induced thermal imaging (LITI), or the like.

When the HIL is formed using (utilizing) vacuum deposition, the deposition conditions may vary depending on the material that is used (utilized) to form the HIL and the structure of the HIL. For example, the deposition conditions may be selected from the following conditions: a deposition temperature of about 100° C. to about 500° C., a degree of vacuum of about $10^{-8}$ to about $10^{-3}$ torr, and a deposition rate of about 0.01 to 100 Å/sec.

When the HIL is formed using (utilizing) spin coating, the coating conditions may vary depending on the material that is used (utilized) to form the HIL and the structure of the HIL. For example, the coating conditions may be selected from the following conditions: a coating rate of about 2,000 rpm to about 5,000 rpm, and a heat treatment temperature of about 800° C. to about 200° C.

When the hole transport region includes an HTL, the HTL may be formed on the first electrode 110 or the HIL by using (utilizing) any of a variety of suitable methods, for example, by using (utilizing) vacuum deposition, spin coating, casting, Langmuir-Blodgett (LB) deposition, inkjet printing, laser printing, laser induced thermal imaging (LITI), or the like. When the HTL is formed using (utilizing) vacuum deposition or spin coating, the conditions for deposition and coating may be similar to the above-described deposition and coating conditions for forming the HIL, and accordingly will not be described in more detail.

In some embodiments, the hole transport region may include at least one of m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine (TCTA), polyaniline/dodecylbenzene sulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrenesulfonate) (PANI/PSS), a compound represented by Formula 201 below, and a compound represented by Formula 202 below.

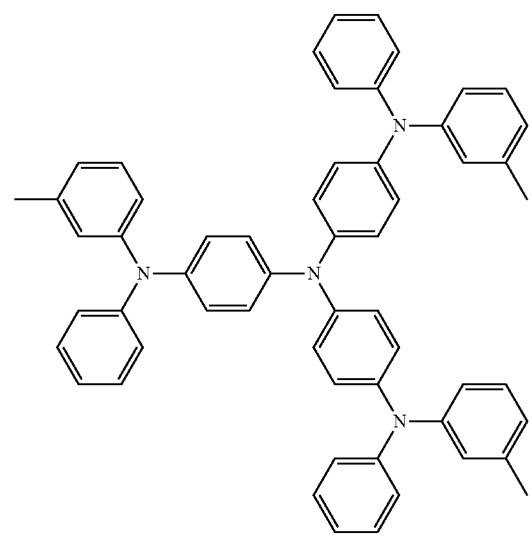

m-MTDATA

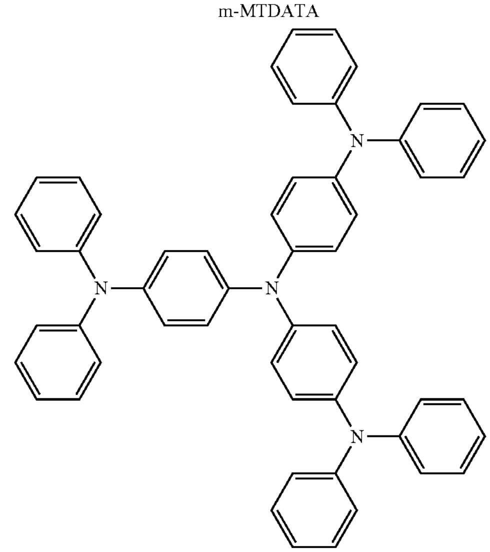

TDATA

-continued

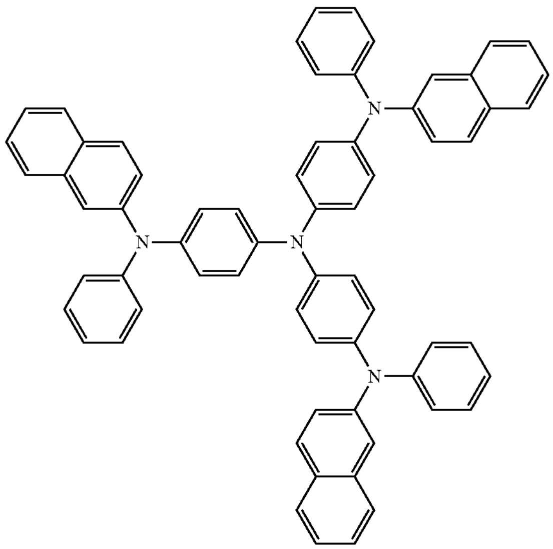

2-TNATA

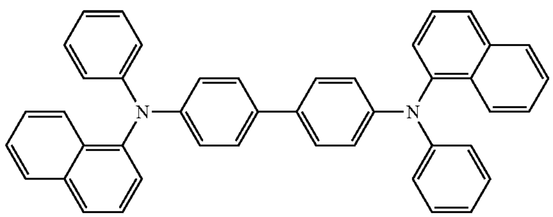

NPB

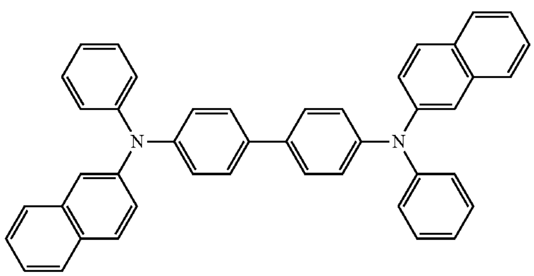

β-NPB

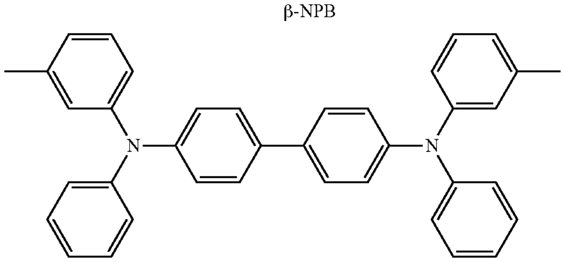

TPD

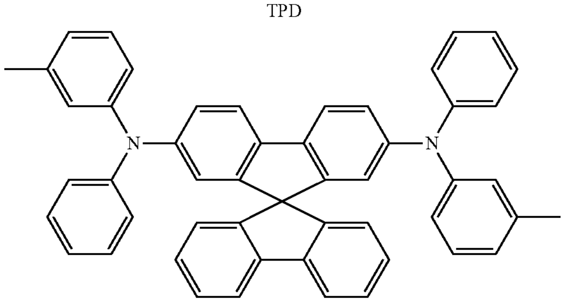

Spiro-TPD

-continued

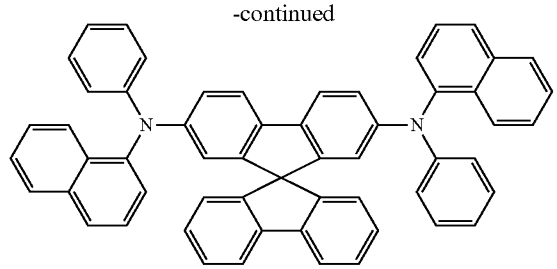

Spiro-NPB

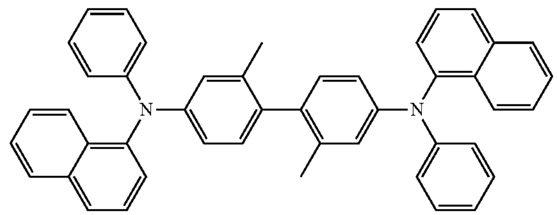

α-NPB

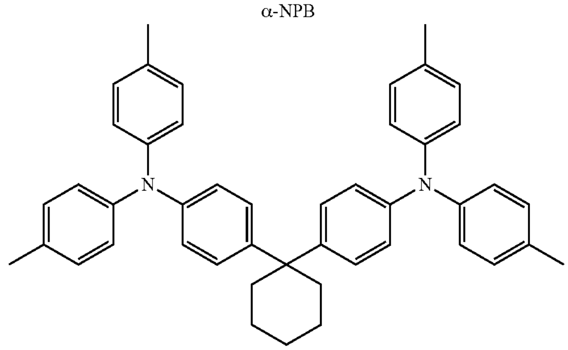

TAPC

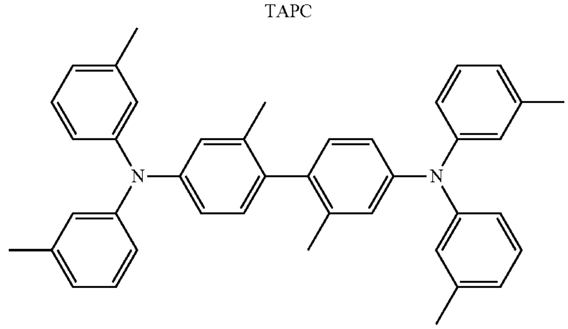

HMTPD

Formula 201

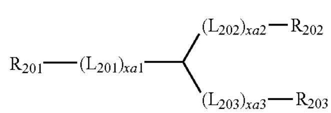

Formula 202

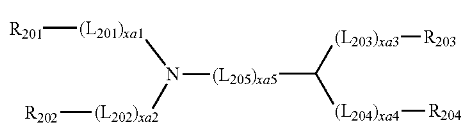

In Formulae 201 and 202, $L_{201}$ to $L_{205}$ may be each independently selected from a substituted or unsubstituted $C_3$-$C_{10}$ cycloalkylene group, a substituted or unsubstituted $C_3$-$C_{10}$ heterocycloalkylene group, a substituted or unsubstituted $C_3$-$C_{10}$ cycloalkenylene group, a substituted or unsubstituted $C_3$-$C_{10}$ heterocycloalkenylene group, a substituted or unsubstituted $C_6$-$C_{60}$arylene group, a substituted or unsubstituted $C_2$-$C_{60}$ heteroarylene group, and a substituted or unsubstituted divalent non-aromatic condensed polycyclic group;

at least one substituent of the substituted $C_3$-$C_{10}$ cycloalkylene group, the substituted $C_3$-$C_{10}$ heterocycloalkylene group, the substituted $C_3$-$C_{10}$ cycloalkenylene group, the substituted $C_3$-$C_{10}$ heterocycloalkenylene group, the substituted $C_6$-$C_{60}$arylene group, the substituted $C_2$-$C_{60}$ heteroarylene group, and the substituted divalent non-aromatic condensed polycyclic group, may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ hetero aryl group, a divalent non-aromatic condensed polycyclic group, —N($Q_{201}$)($Q_{202}$), —Si($Q_{203}$)($Q_{204}$)($Q_{205}$), and —B($Q_{206}$)($Q_{207}$);

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ hetero aryl group, a divalent non-aromatic condensed polycyclic group, —N($Q_{211}$)($Q_{212}$), —Si($Q_{213}$)($Q_{214}$)($Q_{215}$), and —B($Q_{216}$)($Q_{217}$); and —N($Q_{221}$)($Q_{222}$), —Si($Q_{223}$)($Q_{224}$)($Q_{225}$), and —B($Q_{226}$)($Q_{227}$);

xa1 to xa4 may be each independently selected from 0, 1, 2, and 3;

xa5 may be selected from 1, 2, 3, 4, and 5;

$R_{201}$ to $R_{205}$ may be each independently selected from:

a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ hetero aryl group, a divalent non-aromatic condensed polycyclic group —N($Q_{231}$) ($Q_{232}$), —Si($Q_{233}$)($Q_{234}$)($Q_{235}$), and —B($Q_{236}$)($Q_{237}$);

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ hetero aryl group, a divalent non-aromatic condensed polycyclic group, —N($Q_{241}$)($Q_{242}$), —Si($Q_{243}$)($Q_{244}$)($Q_{245}$), and —B($Q_{246}$)($Q_{247}$); and $Q_{201}$ to $Q_{207}$, $Q_{211}$ to $Q_{217}$, $Q_{221}$ to $Q_{227}$, $Q_{231}$ to $Q_{237}$, and $Q_{241}$ to $Q_{247}$ may be each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group.

In Formulae 201 and 202, $L_{201}$ to $L_{205}$ may be defined as described above herein in conjunction with $L_1$, and $R_{201}$ to $R_{205}$ may be defined as described above herein in conjunction with $R_{11}$.

For example, in Formulae 201 and 202, $L_{201}$ to $L_{205}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3;

$R_{201}$ to $R_{205}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but are not limited thereto.

For example, the compound of Formula 201 may be a compound represented by Formula 201A below:

Formula 201A

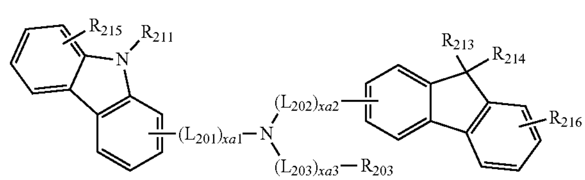

The compound of Formula 201 may be a compound represented by Formula 201A-1 below, but is not limited thereto:

Formula 201A-1

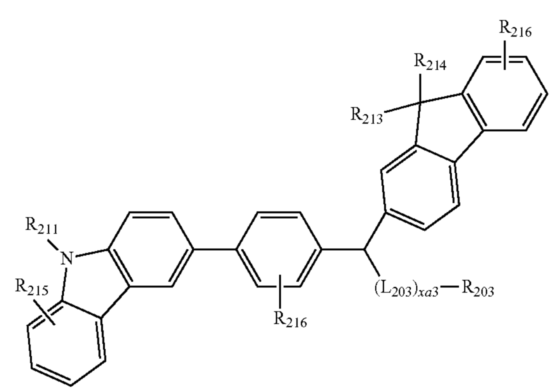

The compound of Formula 202 may be a compound represented by Formula 202A below, but is not limited thereto:

Formula 202A

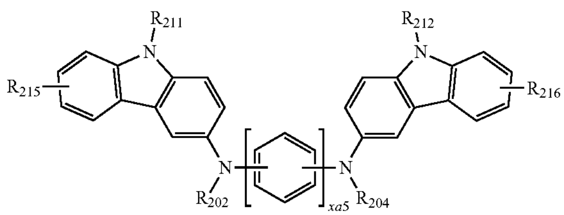

In Formulae 201A, 201A-1, and 202A, $L_{201}$ to $L_{203}$, xa1 to xa3, xa5, and $R_{202}$ to $R_{204}$ may be the same as those described above herein;

$R_{211}$ and $R_{212}$ may be defined as described above herein in conjunction with $R_{203}$;

$R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group.

For example, in Formulae 201A, 201A-1, and 202A, $L_{201}$ to $L_{203}$ may be each independently selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{203}$, $R_{211}$, and $R_{212}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from:

a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from:

a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof;

a $C_1$-$C_{20}$ alkyl group, and a $C_1$-$C_{20}$ alkoxy group;

a $C_1$-$C_{20}$ alkyl group, and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

In Formulae 201A and 201A-1, $R_{213}$ and $R_{214}$ may be linked to each other to form a saturated or unsaturated ring.

The compound of Formula 201 and the compound of Formula 202 may each independently be selected from Compounds HT1 to HT20, but are not limited thereto.

HT1

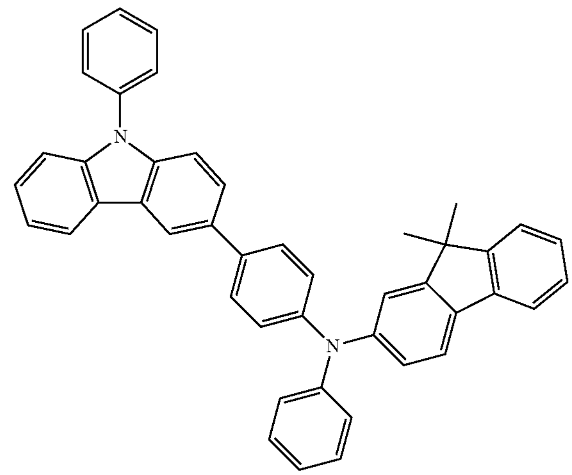

HT2

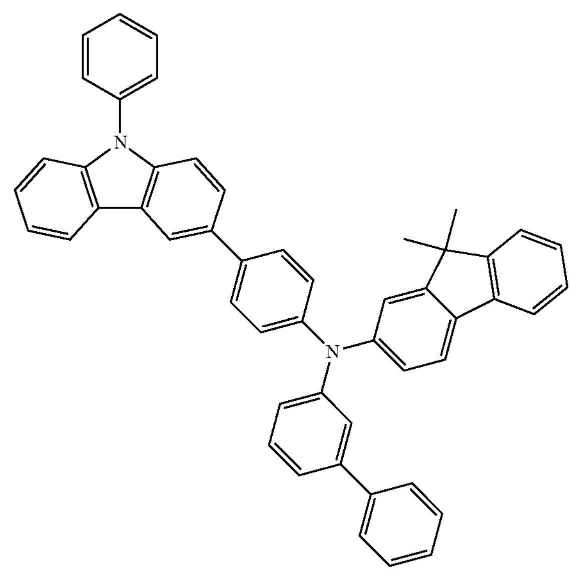

HT3

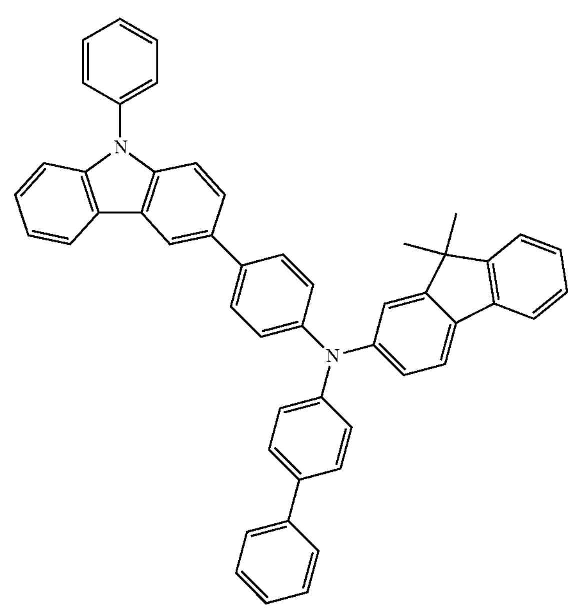

-continued
HT4
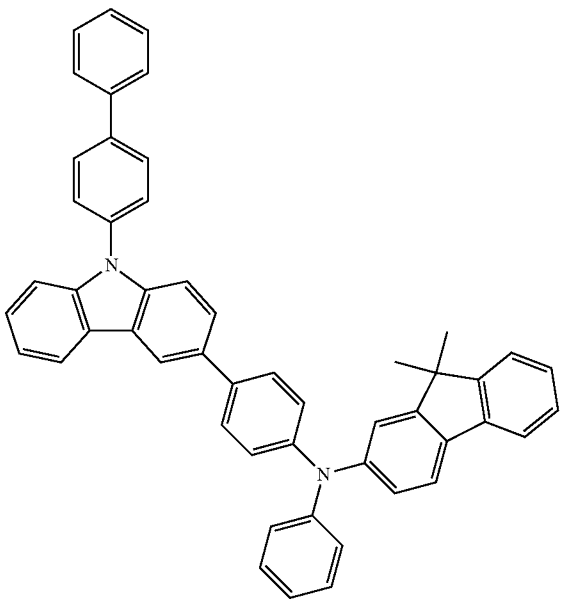
HT5
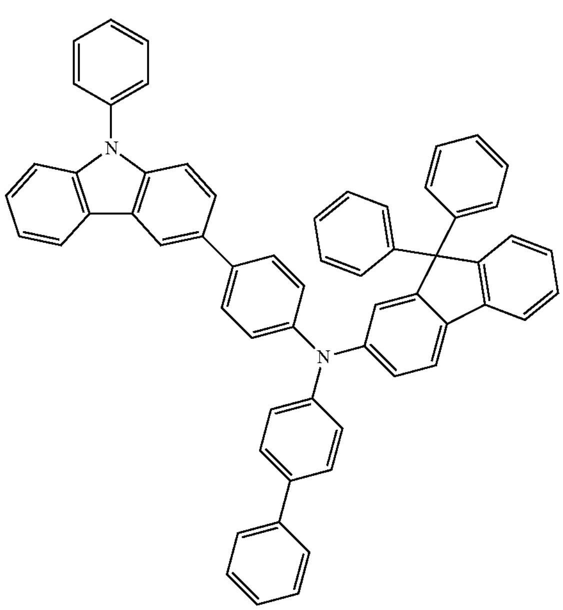
-continued
HT6
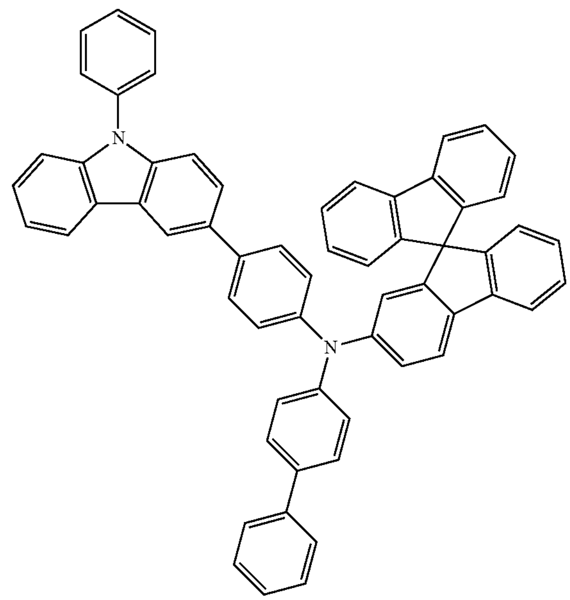
HT7
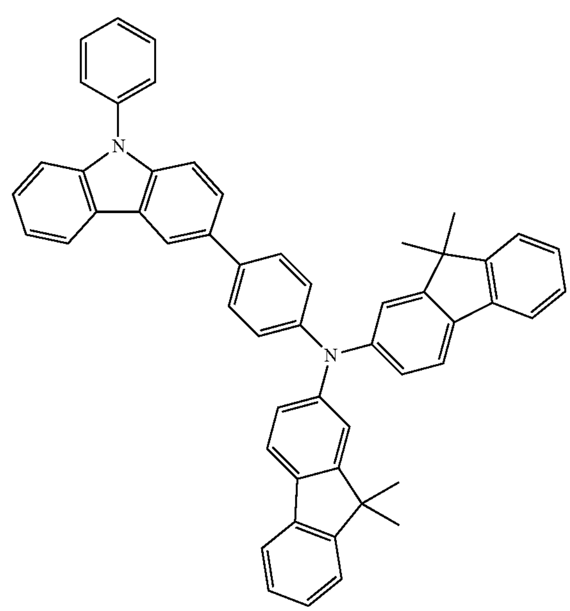

-continued
HT8
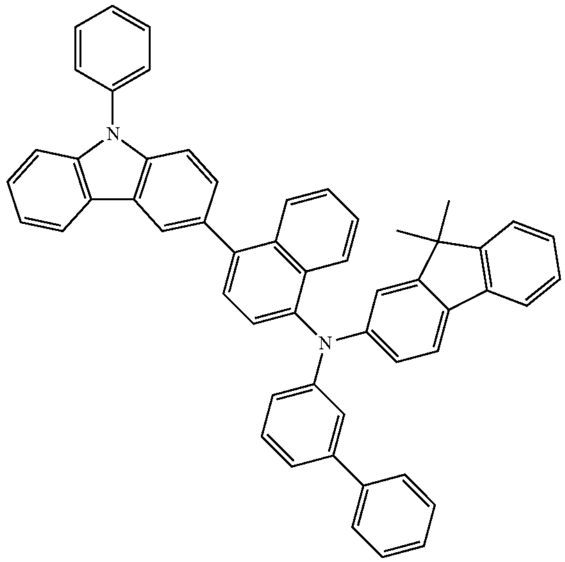
HT9
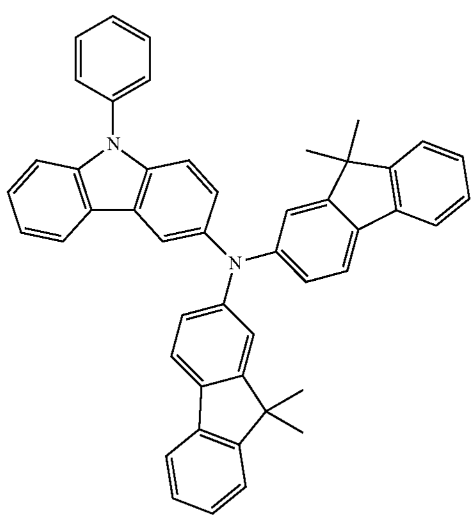
-continued
HT10
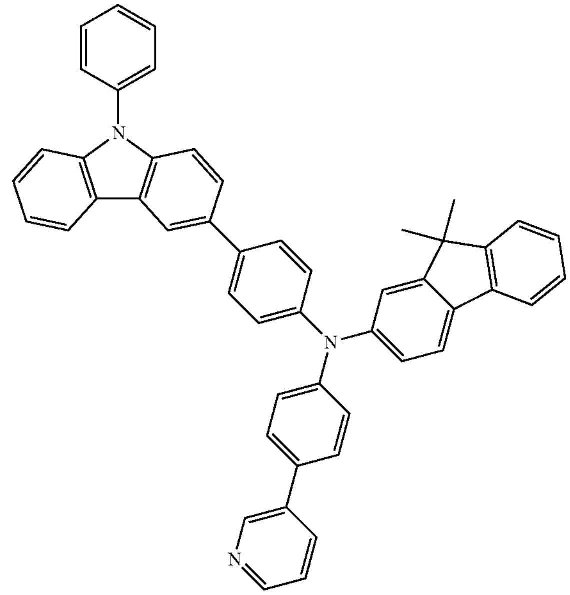
HT11
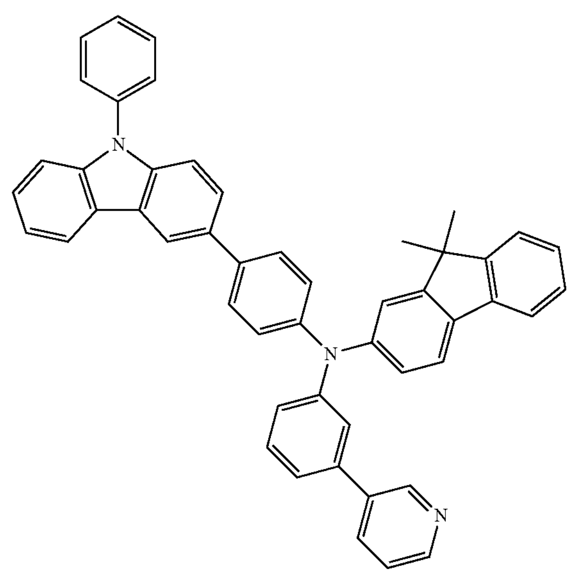

-continued
HT12
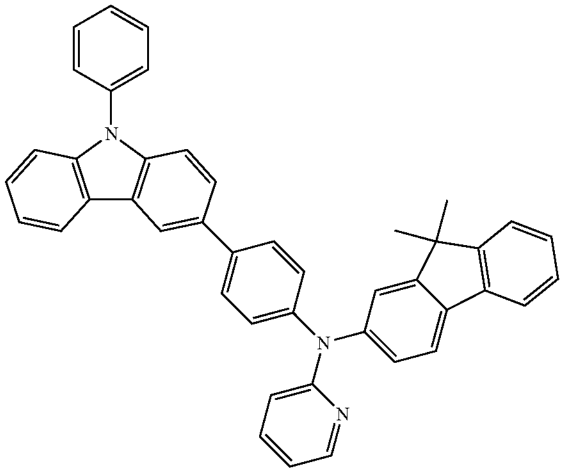
HT13
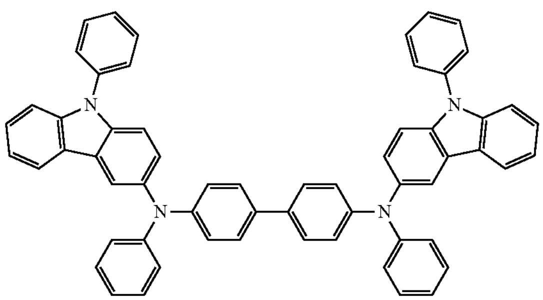
HT14
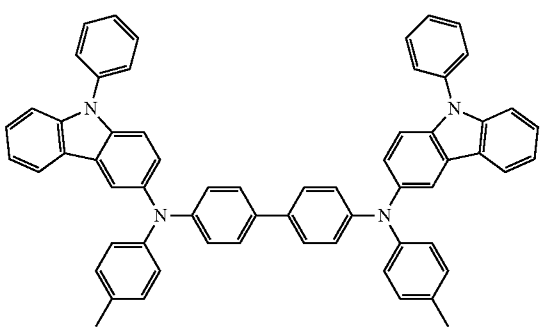
HT15
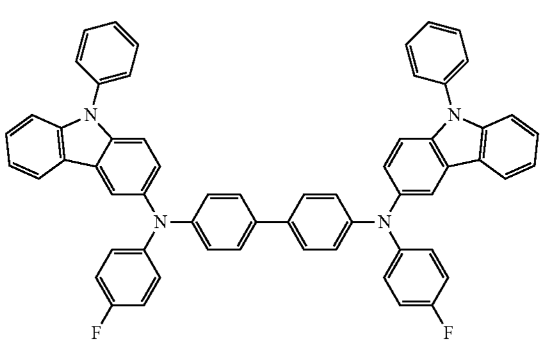
-continued
HT16
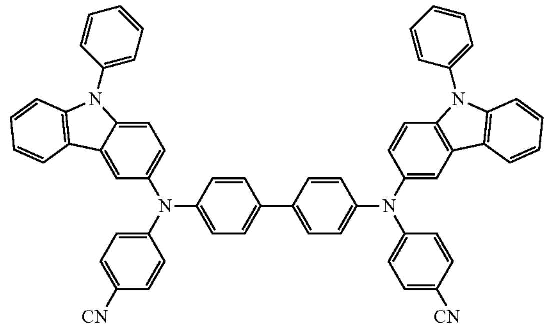
HT17
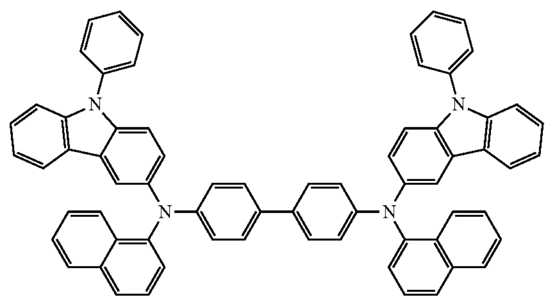
HT18
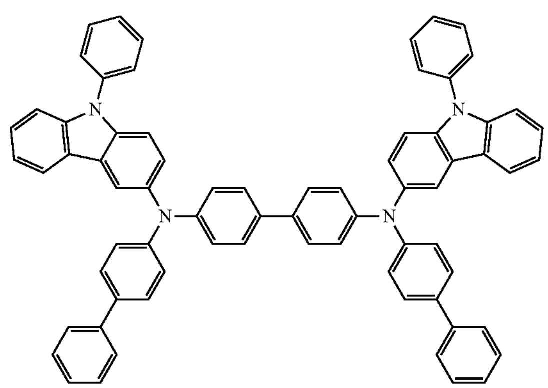
HT19
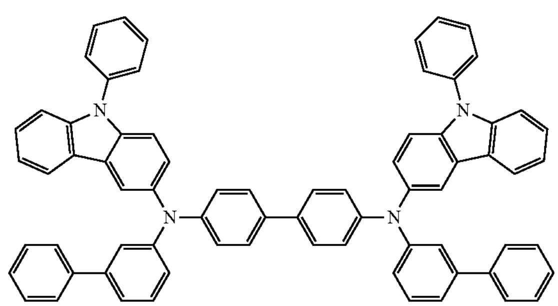

-continued

HT20

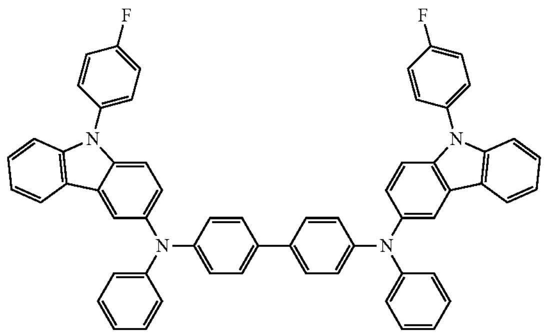

A thickness of the hole transport region may be from about 100 Å to about 10000 Å, and in some embodiments, from about 100 Å to about 1000 Å. When the hole transport region includes an HIL and an HTL, a thickness of the HIL may be from about 100 Å to about 10,000 Å, and in some embodiments, from about 100 Å to about 1,000 Å; and a thickness of the HTL may be from about 50 Å to about 2,000 Å, and in some embodiments, from about 100 Å to about 1,500 Å. In one embodiment, when the thicknesses of the hole transport region, the HIL, and the HTL are within these ranges, satisfactory hole transport characteristics are obtained without a substantial increase in driving voltage.

The hole transport region may further include a charge-generating material to improve conductivity, in addition to the materials as described above. The charge-generating material may be homogeneously or inhomogeneously dispersed in the hole transport region.

The charge-generating material may be, for example, a p-dopant. The p-dopant may be one of quinine derivatives, metal oxides, and cyano group-containing compounds, but is not limited thereto. Non-limiting examples of the p-dopant are quinone derivatives (such as tetracyanoquinonedimethane (TCNQ), 2,3,5,6-tetrafluoro-tetracyano-1,4-benzoquinonedimethane (F4-TCNQ), or the like); metal oxides (such as tungsten oxide, molybdenum oxide, or the like); and a Compound HT-D1 below.

Compound HT-D1

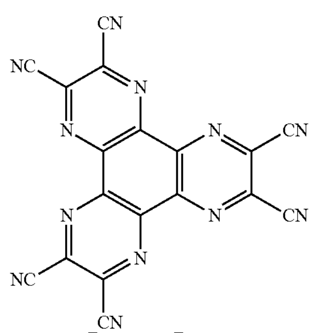

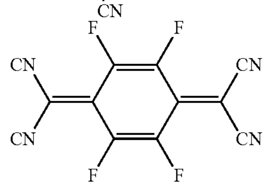

F4-TCNQ

The hole transport region may further include at least one of a buffer layer and an EBL, in addition to the HIL and HTL described above. The buffer layer may compensate for an optical resonance distance of light according to a wavelength of the light emitted from the EML, and thus may improve light-emission efficiency. A material in the buffer layer may be any suitable material used (utilized) in the hole transport region. The EBL may block migration of electrons from the electron transport region into the EML.

The EML may be formed on the first electrode 110 or the hole transport region by using (utilizing) any of a variety of suitable methods, for example, by using (utilizing) vacuum deposition, spin coating, casting, Langmuir-Blodgett (LB) deposition, inkjet printing, laser printing, laser induced thermal imaging (LITI), or the like. When the EML is formed using (utilizing) vacuum deposition or spin coating, the deposition and coating conditions for forming the EML may be similar to the above-described deposition and coating conditions for forming the HIL, and accordingly will not be described in more detail.

When the organic light-emitting device 10 is a full color organic light-emitting device, the EML may be patterned into a red emission layer, a green emission layer, and a blue emission layer to correspond to individual subpixels, respectively. In some embodiments, the EML may have a structure in which a red emission layer, a green emission layer and a blue emission layer are stacked upon one another, or a structure including a mixture of a red light-emitting material, a green light-emitting material, and a blue light-emitting material without separation of layers for the different color emission, and thus may emit white light. In some embodiments, the EML may be a white EML. In this regard, the EML may further include a color converting layer or a color filter to convert white light into light of a desired color.

The EML may include a host.

In some embodiments, the EML may include at least one (compound) selected from carbazole-based compounds represented by Formula 1, and at least one (compound) selected from heterocyclic compounds represented by Formulae 10A, 10B, 10C, 10D, and 10E:

Formula 1

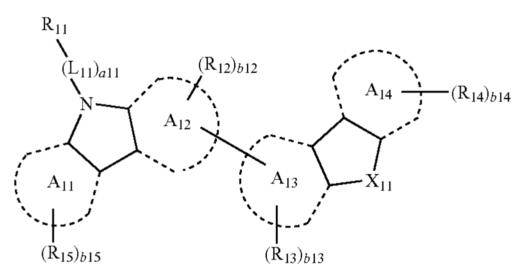

Formula 10A

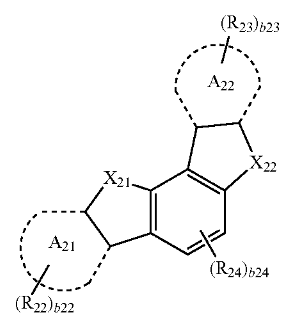

-continued

Formula 10B

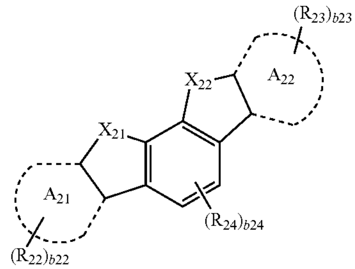

Formula 10C

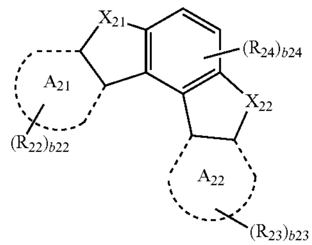

Formula 10D

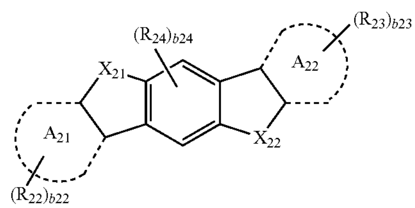

Formula 10E

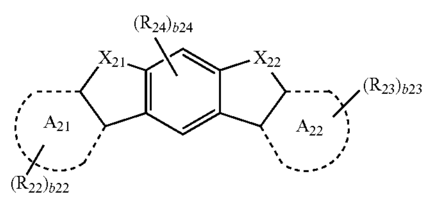

In Formulae 1, 10A, 10B, 10C, 10D, and 10E, $A_{11}$ to $A_{14}$, $A_{21}$, and $A_{22}$ may be each independently selected from benzene, naphthalene, pyridine, pyrimidine, pyrazine, quinoline, isoquinoline, 2,6-naphthyridine, 1,8-naphthyridine, 1,5-naphthyridine, 1,6-naphthyridine, 1,7-naphthyridine, 2,7-naphthyridine, quinoxaline, phthalazine, and quinazoline.

For example, in Formulae 1, 10A, 10B, 10C, 10D, and 10E, $A_{11}$ to $A_{14}$, $A_{21}$, and $A_{22}$ may be each independently selected from, but not limited to, benzene, naphthalene, pyridine, pyrimidine, pyrazine, quinoline, and isoquinoline.

For example, $A_{11}$ to $A_{14}$ in Formula 1 may be each independently selected from, but not limited to, benzene and naphthalene. For example, in Formula 1, each of $A_{11}$ and $A_{14}$ may be naphthalene or benzene; and each of $A_{12}$ and $A_{13}$ may be benzene. However, embodiments of the present disclosure are not limited thereto. For example, each of $A_{11}$ to $A_{14}$ in Formula 1 may be benzene, but are not limited thereto.

In some embodiments, in Formulae 10A, 10B, 10C, 10D, and 10E, $A_{21}$ and $A_{22}$ may be each independently selected from, but not limited to, benzene, naphthalene, and pyridine.

In Formula 1, $X_{11}$ may be O, S, $C(R_{16})(R_{17})$, $Si(R_{16})(R_{17})$, $P(R_{16})$, $B(R_{16})$, $P({=}O)(R_{16})$, or $N(R_{16})$, wherein $R_{16}$ and $R_{17}$ may be each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and $—N(Q_{11})(Q_{12})$; and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group. However, the substituent does not include a nitrogen (N)-containing $C_1$-$C_{60}$ heteroaryl group, and a nitrogen (N)-containing $C_1$-$C_{60}$ heteroaryl group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formula 1, $X_{11}$ may be O, S, $C(R_{16})(R_{17})$, or $N(R_{16})$, wherein $R_{16}$ and $R_{17}$ may be optionally linked to each other to form a saturated ring or an unsaturated ring, and $R_{16}$ and $R_{17}$ may be each independently selected from:

a hydrogen, a $C_1$-$C_{60}$ alkyl group, a $C_6$-$C_{60}$ aryl group, and $—N(Q_{11})(Q_{12})$; and a $C_1$-$C_{60}$ alkyl group and a $C_6$-$C_{60}$ aryl group, each substituted with at least one selected from a deuterium, —F, —Cl, —Br, —I, a $C_1$-$C_{60}$ alkyl group, a $C_6$-$C_{60}$ aryl group, and monovalent nonaromatic condensed polycyclic group; and $Q_{11}$ and $Q_{12}$ may be each independently selected from, but not limited to, a hydrogen, a $C_1$-$C_{60}$ alkyl group, and a $C_6$-$C_{60}$ aryl group.

For example, in Formula 1, $X_{11}$ may be O, S, $C(R_{16})(R_{17})$, or $N(R_{16})$, wherein $R_{16}$ and $R_{17}$ may be each independently selected from, but not limited to, a hydrogen, a methyl group, an ethyl group, a phenyl group, and a naphthyl group; and a phenyl group, and a naphthyl group, each substituted with at least one selected from a deuterium, —F, —Cl, —Br, —I, an alkyl group, a methyl group, a phenyl group, and a naphthyl group.

In Formula 1, $L_{11}$ may be selected from, but not limited to, a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_1$-$C_{60}$ heteroarylene group, a divalent nonaromatic condensed polycyclic group, and a divalent nonaromatic condensed heteropolycyclic group; and a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_2$-$C_{60}$ heteroarylene group, a divalent nonaromatic condensed polycyclic group, and a divalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group. However, the substituent does not include a nitrogen (N)-containing $C_1$-$C_{60}$ heteroarylene group, and a nitrogen (N)-containing $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formula 1, $L_{11}$ may be selected from, but not limited to, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, and an ovalenylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, and an ovalenylene group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formula 1, $L_{11}$ may be selected from, but not limited to, a phenylene group, a naphthylene group, a fluorenylene group, a spiro-fluorenylene group, a benzofluorenylene group, a dibenzofluorenylene group, a phenanthrenylene group, an anthracenylene group, a triphenylenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a triphenylenylene group, a pyrenylene group, and a chrysenylene group, each substituted with at least one selected from a deuterium, —F, —Cl, —Br, —I, a $C_1$-$C_{20}$ alkyl group, a phenyl group, and a naphthyl group.

In some embodiments, $L_{11}$ in Formula 1 may be selected from the groups represented by Formulae 3-1 to 3-8, but are not limited thereto:

3-1

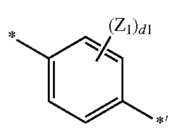

3-2

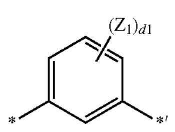

3-3

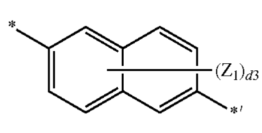

-continued 3-4

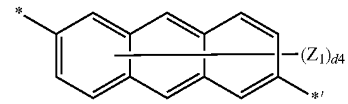

3-5

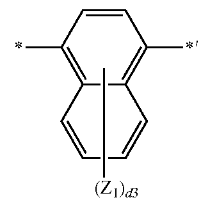

3-6

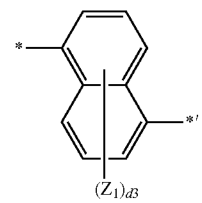

3-7

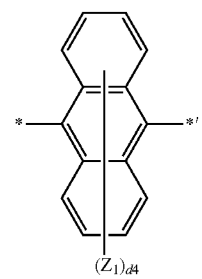

3-8

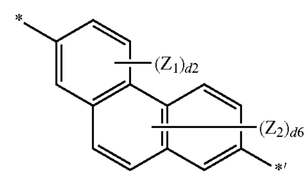

In Formulae 3-1 to 3-8, $Z_1$ and $Z_2$ may be each independently selected from a hydrogen, a deuterium, —F, —Cl, —Br, —I, a $C_1$-$C_{20}$ alkyl group, a phenyl group, and a naphthyl group;

d1 may be an integer selected from 1 to 4;

d2 may be an integer selected from 1 to 3;

d3 may be an integer selected from 1 to 6;

d4 may be an integer selected from 1 to 8;

d6 may be an integer selected from 1 to 5; and

* and *' each indicate a binding site with an adjacent atom.

In some other embodiments, $L_{11}$ in Formula 1 may be selected from the groups represented by Formulae 4-1 to 4-8, but are not limited thereto:

4-1

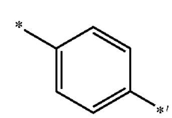

4-2

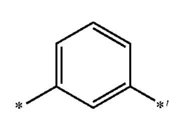

-continued 4-3

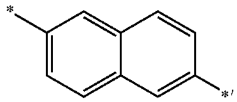

4-4

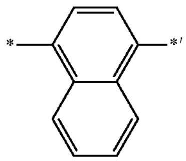

4-5

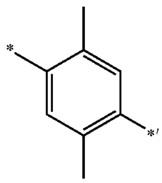

4-6

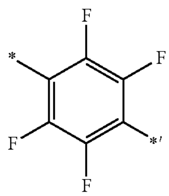

4-7

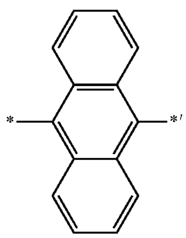

4-8

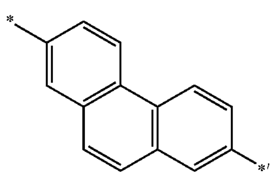

In Formulae 4-1 to 4-8, * and *' each indicate a binding site with an adjacent atom.

In Formula 1, a11 may be an integer selected from 0 to 5. For example, a11 in Formula 1 may be 0 or 1, but is not limited thereto.

In Formula 1, $R_{11}$ may be selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group. However, the substituent does not include a nitrogen (N)-containing $C_1$-$C_{60}$ heteroaryl group, and a nitrogen (N)-containing $C_1$-$C_{60}$ heteroaryl group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

$Q_{11}$, and $Q_{12}$ may be each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group.

For example, $R_{11}$ in Formula 1 may be selected from a $C_6$-$C_{60}$ aryl group, a monovalent nonaromatic condensed polycyclic group, a monovalent nonaromatic condensed heteropolycyclic group, and —N($Q_{11}$)($Q_{12}$); and a $C_6$-$C_{60}$ aryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, and a $C_6$-$C_{60}$ aryl group, wherein $Q_{11}$ and $Q_{12}$ may be each independently selected from a $C_6$-$C_{60}$ aryl group, and a $C_6$-$C_{60}$ aryl group substituted with a $C_6$-$C_{60}$ aryl group. However, embodiments of the present disclosure are not limited thereto.

For example, $R_{11}$ in Formula 1 may be selected from a phenyl group, a naphthyl group, an anthracenyl group, a triphenylenyl group, a phenanthrenyl group, a pyrenyl group, a chrysenyl group, a fluorenyl group, a carbazolyl group, a dibenzofuranyl group, a dibenzothienyl group, and —N($Q_{11}$)($Q_{12}$); and a phenyl group, a naphthyl group, an anthracenyl group, a triphenylenyl group, a phenanthrenyl group, a pyrenyl group, a chrysenyl group, a fluorenyl group, a carbazolyl group, a dibenzofuranyl group, and a dibenzothienyl group, each substituted with at least one selected from a deuterium, —F, —Cl, —Br, —I, a $C_1$-$C_{60}$ alkyl group, and a $C_6$-$C_{60}$ aryl group, wherein $Q_{11}$ and $Q_{12}$ may be each independently selected from:

a phenyl group, a naphthyl group, an anthracenyl group, a triphenylenyl group, a phenanthrenyl group, a pyrenyl group, and a chrysenyl group; and a phenyl group, a naphthyl group, an anthracenyl group, a triphenylenyl group, a phenanthrenyl group, a pyrenyl group, and a chrysenyl group, each substituted with at least one selected from a phenyl group, a naphthyl group, an anthracenyl group, a triphenylenyl group, a pyrenyl group, and a chrysenyl group. However, embodiments of the present disclosure are not limited thereto.

For example, $R_{11}$ in Formula 1 may be selected from the groups represented by Formulae 5-1 to 5-31, but is not limited thereto:

5-1

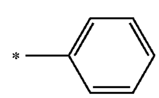

5-2

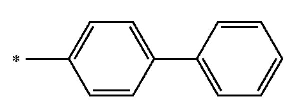

-continued
5-3
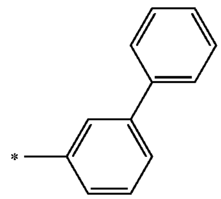
5-4
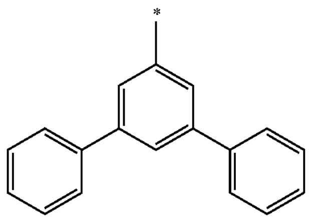
5-5
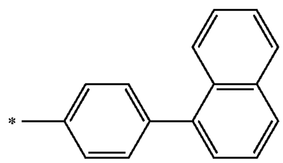
5-6
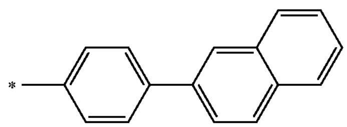
5-7
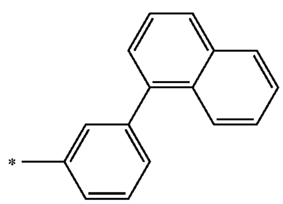
5-8
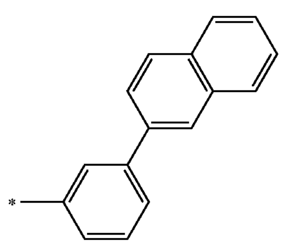
5-9
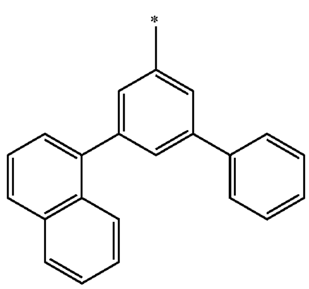
-continued
5-10
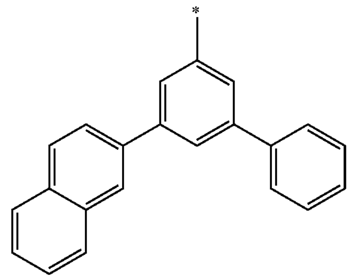
5-11
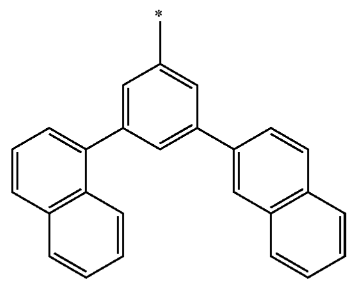
5-12
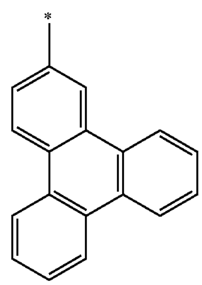
5-13
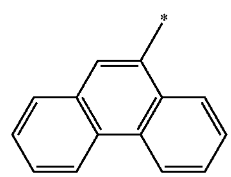
5-14
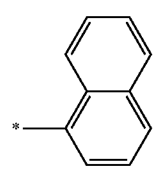
5-15
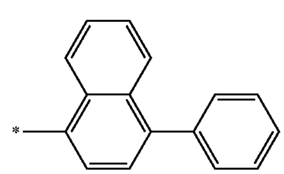
5-16
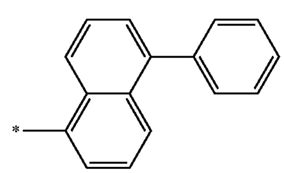

-continued 5-17

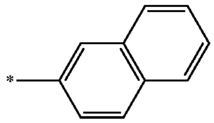

5-18

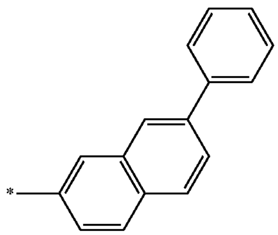

5-19

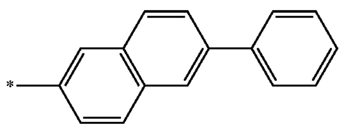

5-20

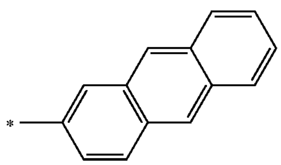

5-21

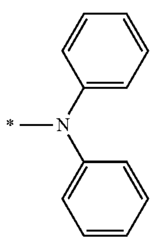

5-22

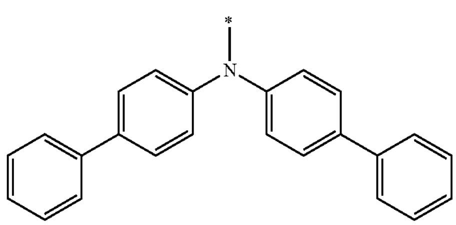

5-23

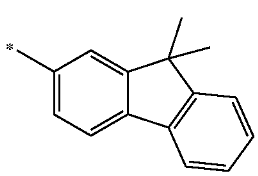

5-24

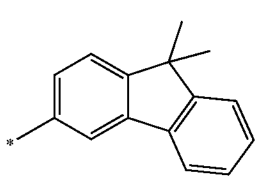

-continued 5-25

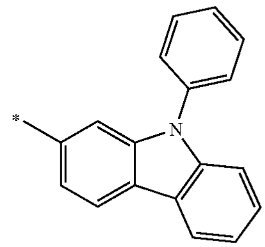

5-26

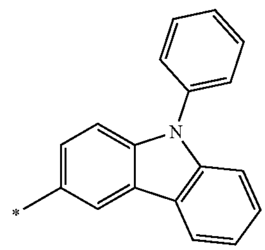

5-27

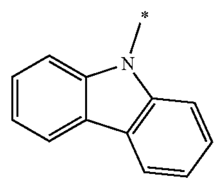

5-28

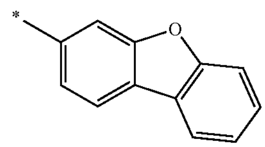

5-29

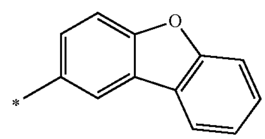

5-30

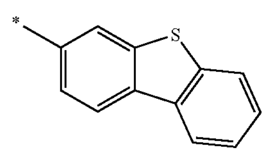

5-31

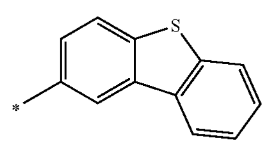

In Formulae 5-1 to 5-31, * indicates a binding site with an adjacent atom.

In Formulae 10A, 10B, 10C, 10D, and 10E, $X_{21}$ and $X_{22}$ may be each independently N-$(L_{21})_{a21}$-$R_{21}$, O, S, C($R_{25}$)($R_{26}$), Si($R_{25}$)($R_{26}$), P($R_{25}$), B($R_{25}$), or P(=O)($R_{25}$), wherein $R_{25}$ and $R_{26}$ may be each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formulae 10A, 10B, 10C, 10D, and 10E, $X_{21}$ and $X_{22}$ may be each independently N-$(L_{21})_{a21}$-$R_{21}$, O, S, or $C(R_{25})(R_{26})$, wherein $R_{25}$ and $R_{26}$ may be optionally linked to each other to form a saturated or unsaturated ring; and $R_{25}$ and $R_{26}$ may be each independently selected from:

a hydrogen, a $C_1$-$C_{60}$ alkyl group, a $C_6$-$C_{60}$ aryl group, and —$N(Q_{11})(Q_{12})$; and a $C_1$-$C_{60}$ alkyl group and a $C_6$-$C_{60}$ aryl group, each substituted with at least one selected from a deuterium, —F, —Cl, —Br, —I, a $C_1$-$C_{60}$ alkyl group, a $C_6$-$C_{60}$ aryl group, and monovalent nonaromatic condensed polycyclic group, wherein $Q_{11}$ and $Q_{12}$ may be each independently selected from a hydrogen, a $C_1$-$C_{60}$ alkyl group, and a $C_6$-$C_{60}$ aryl group. However, embodiments of the present disclosure are not limited thereto.

For example, in Formulae 10A, 10B, 10C, 10D, and 10E, $X_{21}$ and $X_{22}$ may be each independently N-$(L_{21})_{a21}$-$R_{21}$, O, S, or $C(R_{25})(R_{26})$, wherein $R_{25}$ and $R_{26}$ may be each independently selected from:

a hydrogen, a methyl group, an ethyl group, a phenyl group, and a naphthyl group; and a phenyl group and a naphthyl group, each substituted with at least one selected from a deuterium, —F, —Cl, —Br, —I, an alkyl group, a methyl group, a phenyl group, and a naphthyl group. However, embodiments of the present disclosure are not limited thereto.

In Formulae 10A, 10B, 10C, 10D, and 10E, $L_{21}$ may be selected from:

a nitrogen (N)-containing $C_1$-$C_{60}$ heteroarylene group; and a $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formulae 10A, 10B, 10C, 10D, and 10E, $L_{21}$ may be selected from, but not limited to, a pyrrolylene group, an imidazolylene group, a pyrazolylene group, a pyridinylene group, a pyrazinylene group, a pyrimidinylene group, an indolylene group, a quinolinylene group, an isoquinolinylene group, a benzoquinolinylene group, a phenanthridinylene group, an acridinylene group, a phenanthrolinylene group, a triazolylene group, and a tetrazolylene group; and a pyrrolylene group, an imidazolylene group, a pyrazolylene group, a pyridinylene group, a pyrazinylene group, a pyrimidinylene group, an indolylene group, a quinolinylene group, an isoquinolinylene group, a benzoquinolinylene group, a phenanthridinylene group, an acridinylene group, a phenanthrolinylene group, a triazolylene group, and a tetrazolylene group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formulae 10A, 10B, 10C, 10D, and 10E, $L_{21}$ may be selected from, but not limited to, a pyridinylene group, a pyrazinylene group, a pyrimidinylene group, an indolylene group, a quinolinylene group, an isoquinolinylene group, a phenanthridinylene group, an acridinylene group, a phenanthrolinylene group, a triazolylene group, and a tetrazolylene group; and a pyridinylene group, a pyrazinylene group, a pyrimidinylene group, an indolylene group, a quinolinylene group, an isoquinolinylene group, a phenanthridinylene group, an acridinylene group, a phenanthrolinylene group, a triazolylene group, and a tetrazolylene group, each substituted with at least one selected from a deuterium, —F, —Cl, —Br, —I, a $C_1$-$C_{20}$ alkyl group, a phenyl group, and a naphthyl group.

For example, in Formulae 10A, 10B, 10C, 10D, and 10E, $L_{21}$ may be a group represented by one of Formulae 3-9 to 3-26, but is not limited thereto:

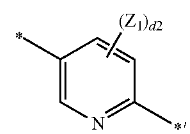

3-9

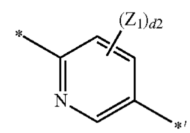

3-10

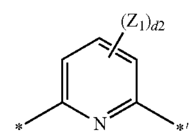

3-11

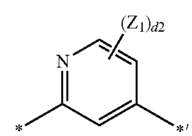

3-12

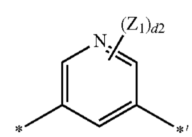

3-13

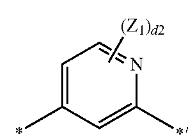

3-14

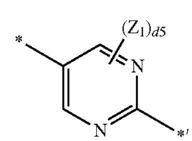

3-15

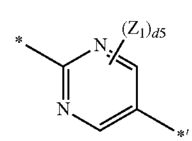

3-16

-continued 3-17

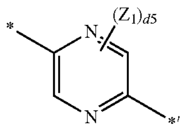

3-18

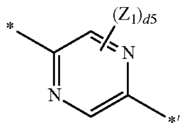

3-19

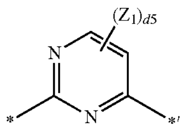

3-20

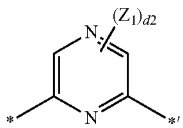

3-21

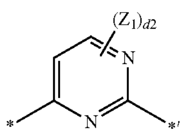

3-22

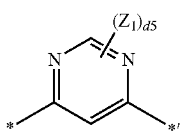

3-23

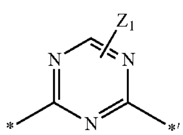

3-24

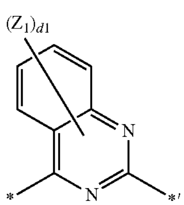

3-25

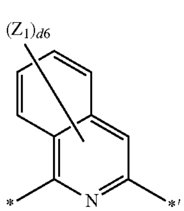

-continued 3-26

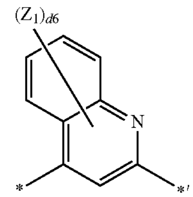

In Formulae 3-9 to 3-26, $Z_1$ and $Z_2$ may be each independently selected from a hydrogen, a deuterium, —F, —Cl, —Br, —I, a $C_1$-$C_{20}$ alkyl group, a phenyl group, and a naphthyl group;

d1 may be an integer selected from 1 to 4;

d2 may be an integer selected from 1 to 3;

d3 may be an integer selected from 1 to 6;

d4 may be an integer selected from 1 to 8;

d5 may be 1 or 2;

d6 may be an integer selected from 1 to 5; and

* and *' each indicate a binding site with an adjacent atom.

For example, in Formulae 10A, 10B, 10C, 10D, and 10E, $L_{21}$ may be a group represented by one of Formulae 4-9 to 4-14, but is not limited thereto:

4-9

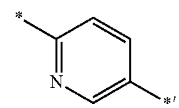

4-10

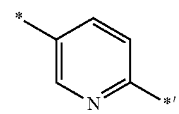

4-11

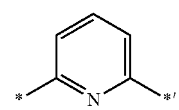

4-12

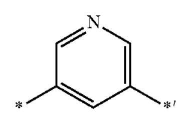

4-13

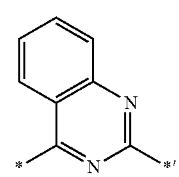

4-14

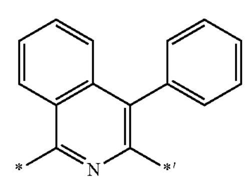

In Formulae 4-9 to 4-14, * and *' each indicate a binding site with an adjacent atom.

In Formulae 10A, 10B, 10C, 10D, and 10E, a21 may be an integer selected from 0 to 5. For example, in Formulae 10A, 10B, 10C, 10D, and 10E, a21 may be an integer of 1, but is not limited thereto.

In Formula 10A, 10B, 10C, 10D, and 10E, $R_{21}$ may be selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formulae 10A, 10B, 10C, 10D, and 10E, $R_{21}$ may be selected from:

a hydrogen, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —N($Q_{11}$)($Q_{12}$); and a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, wherein $Q_{11}$ and $Q_{12}$ may be each independently selected from a $C_6$-$C_{60}$ aryl group, and a $C_6$-$C_{60}$ aryl group substituted with a $C_6$-$C_{60}$ aryl group. However, embodiments of the present disclosure are not limited thereto.

For example, in Formulae 10A, 10B, 10C, 10D, and 10E, $R_{21}$ may be selected from a hydrogen, and groups represented by Formulae H1 to H28, H37 to H41, H68 to H76, and H80, but is not limited thereto:

H1

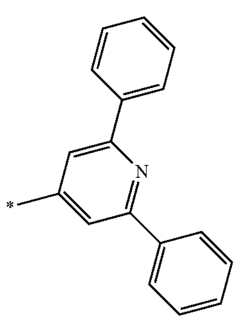

H2

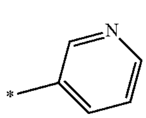

-continued

H3

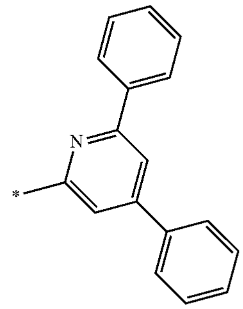

H4

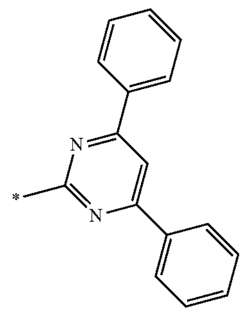

H5

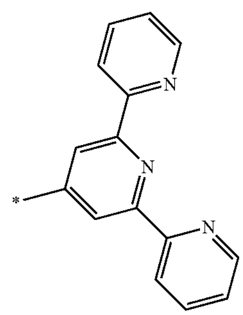

H6

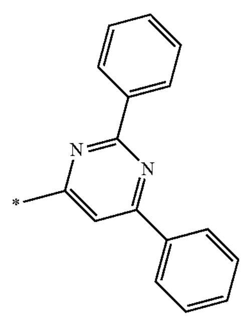

H7

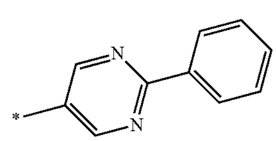

H8

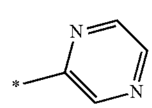

H9

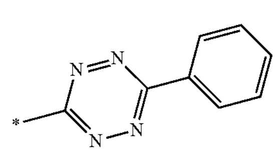

-continued
H10
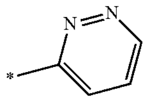
H11
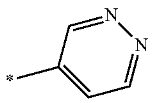
H12
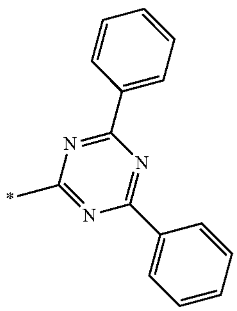
H13
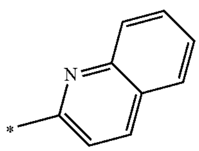
H14
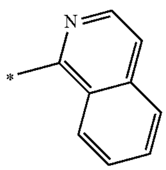
H15
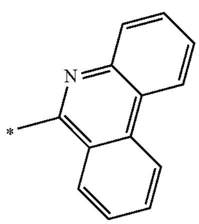
H16
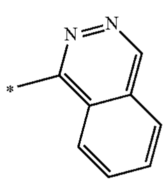
H17
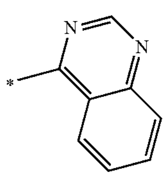
H18
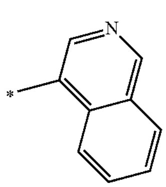
-continued
H19
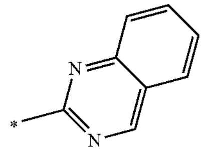
H20
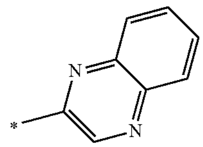
H21
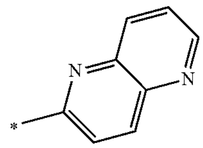
H22
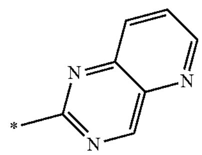
H23
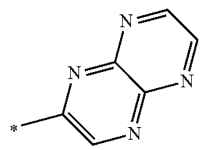
H24
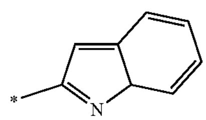
H25
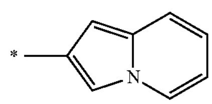
H26
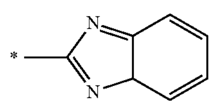
H27
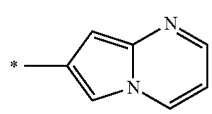
H28
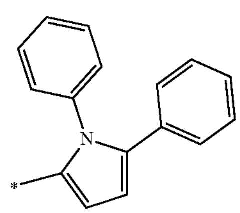
H29
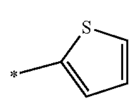

-continued
H30
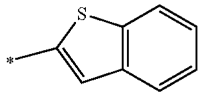
H31
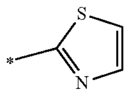
H32
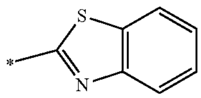
H33
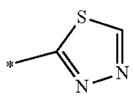
H34
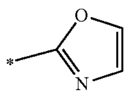
H35
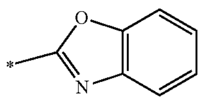
H36
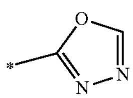
H37
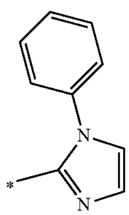
H38
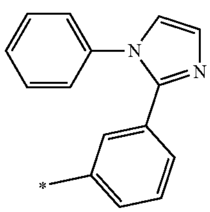
H39
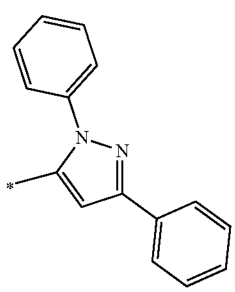
-continued
H40
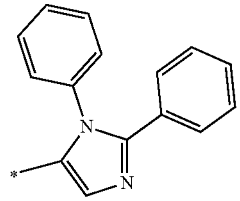
H41
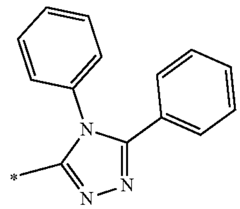
H42
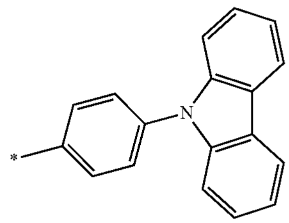
H43
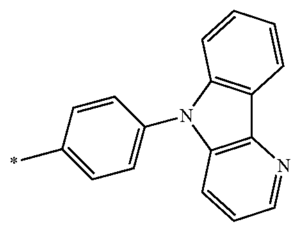
H44
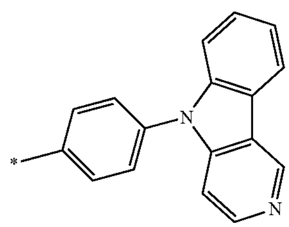
H45
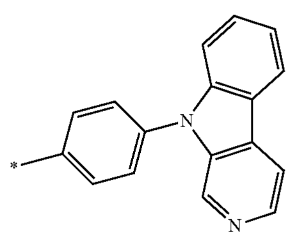
H46
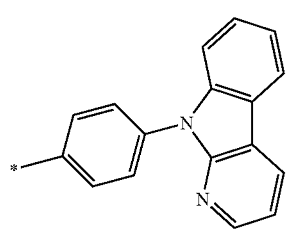

-continued
H47
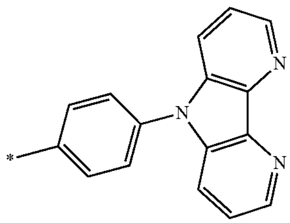
H48
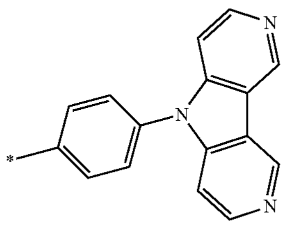
H49
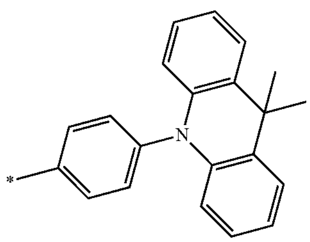
H50
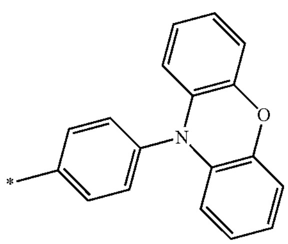
H51
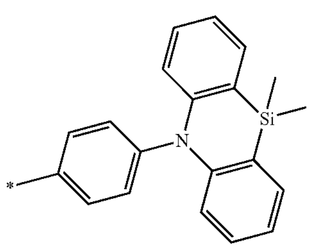
H52
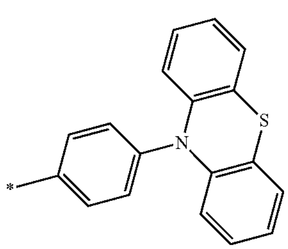
-continued
H53
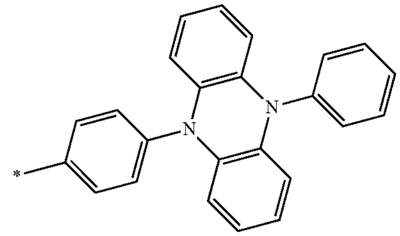
H54
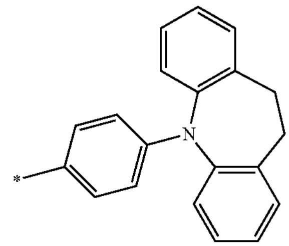
H55
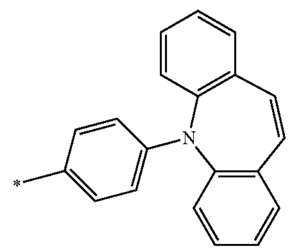
H56
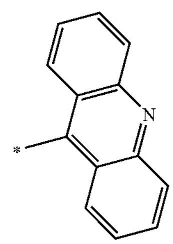
H57
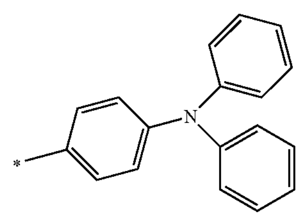
H58
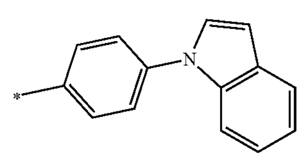
H59
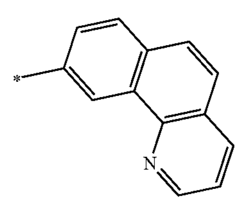

-continued
H60
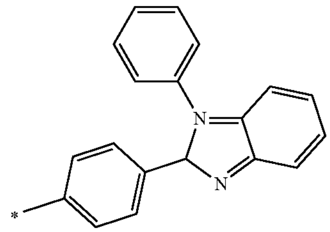
H61
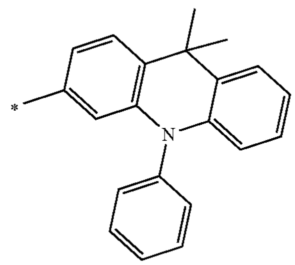
H62
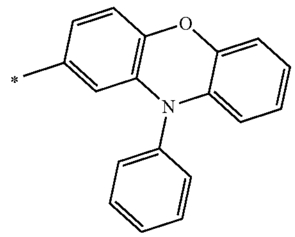
H63
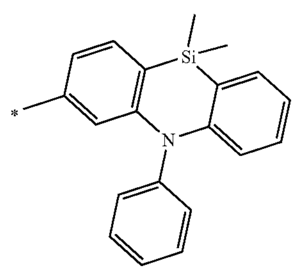
H64
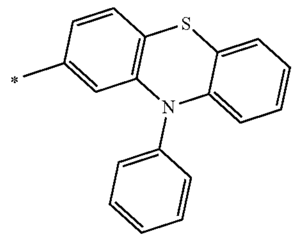
H65
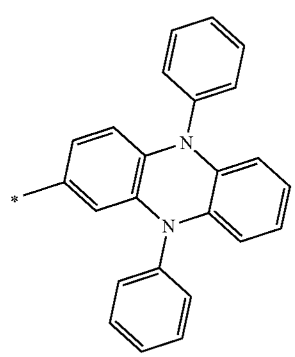
-continued
H66
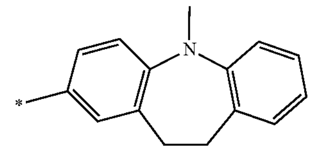
H67
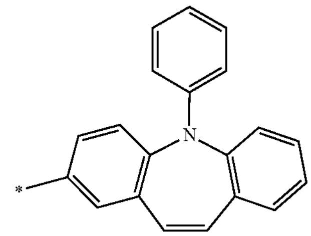
H68
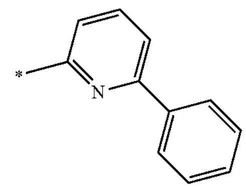
H69
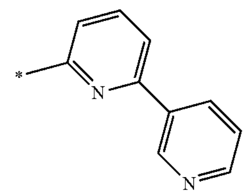
H70
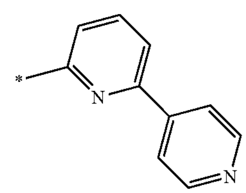
H71
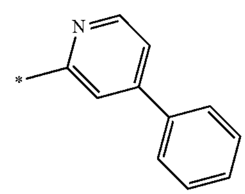
H72
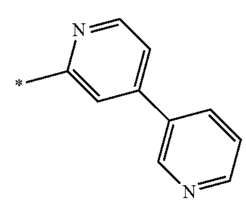
H73
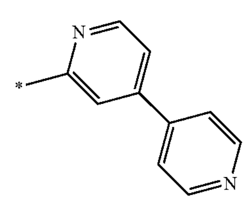

-continued

H74

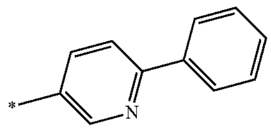

H75

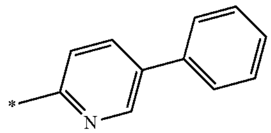

H76

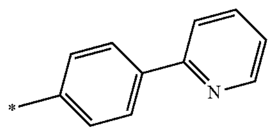

H77

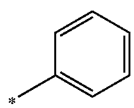

H78

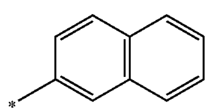

H79

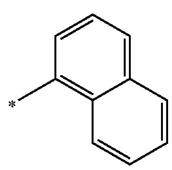

H80

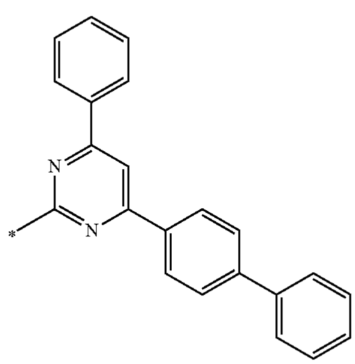

H81

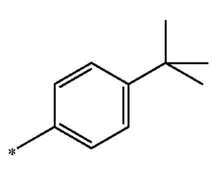

In Formulae H1 to H81, * indicates a binding site with an adjacent atom.

In Formulae 1, 10A, 1 CB, 1C, 10D, and 1E, $R_{12}$ to $R_{15}$, and $R_{22}$ to $R_{24}$ may be each independently selected from:

a hydrogen, a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group; and

—N($Q_{21}$)($Q_{22}$), wherein $Q_{21}$ and $Q_{22}$ may be each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group.

For example, in Formula 1, 10A, 10B, 10C, 10D, and 10E, $R_{12}$ to $R_{15}$, and $R_{22}$ to $R_{24}$ may be each independently selected from a hydrogen, a deuterium, —F, —Cl, —Br, —I, a $C_1$-$C_{60}$ alkyl group, a $C_6$-$C_{60}$ aryl group, a $C_2$-$C_{60}$ heteroaryl group, and —N($Q_{21}$)($Q_{22}$), wherein $Q_{21}$ and $Q_{22}$ may be each independently selected from a $C_6$-$C_{60}$ aryl group, and a $C_6$-$C_{60}$ aryl group substituted with a $C_6$-$C_{60}$ aryl group. However, embodiments of the present disclosure are not limited thereto.

For example, in Formulae 1, 10A, 10B, 10C, 10D, and 10E, $R_{12}$ to $R_{15}$, and $R_{22}$ to $R_{24}$ may be each independently selected from a hydrogen, a deuterium, —F, —Cl, —Br, —I, a $C_1$-$C_{60}$ alkyl group, phenyl group, a naphthyl group, a pyridinyl group, a quinolinyl group, and —N($Q_{21}$)($Q_{22}$), wherein $Q_{21}$ and $Q_{22}$ may be each independently selected from a phenyl group, a naphthyl group, and a biphenyl group. However, embodiments of the present disclosure are not limited thereto.

In Formulae 1, 10A, 10B, 10C, 10D, and 10E, b12 to b15, and b22 to b24 may be each independently selected from an integer selected from 1 to 5.

In some embodiments, the carbazole-based compound represented by Formula 1 may be selected from Compounds 101A to 163A, and the heterocyclic compound represented by Formulae 10A, 10B, 10C, 10D, and 10E may be selected from Compounds 101 to 236. However, embodiments of the present disclosure are not limited thereto:

101A

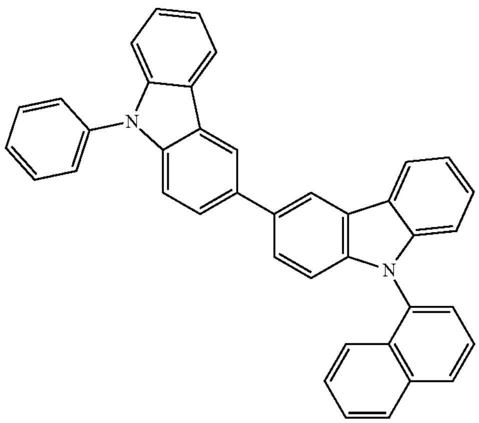

102A

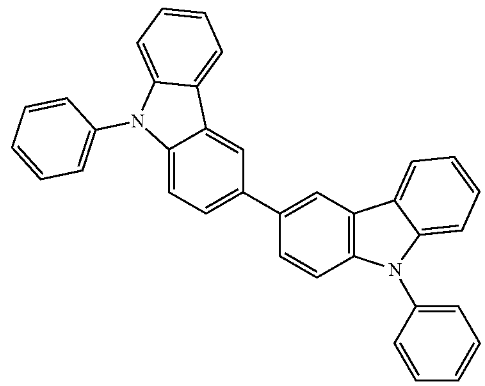

103A

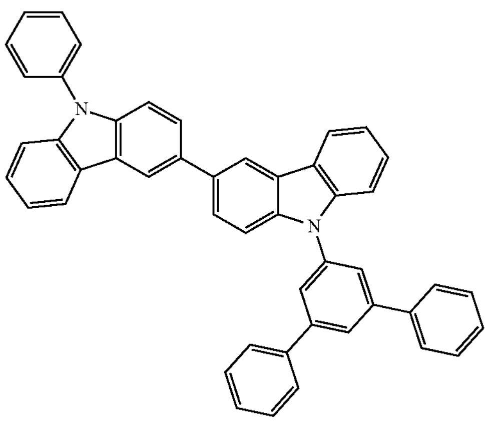

104A

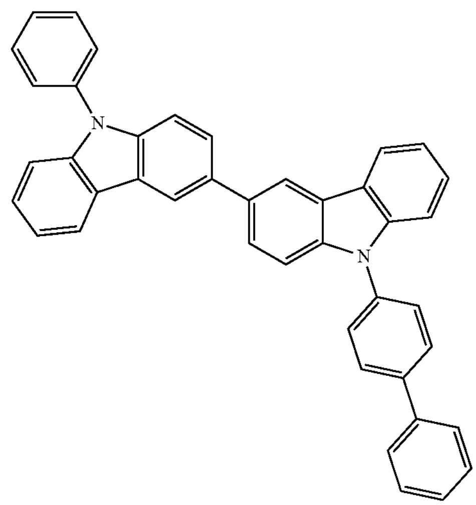

105A

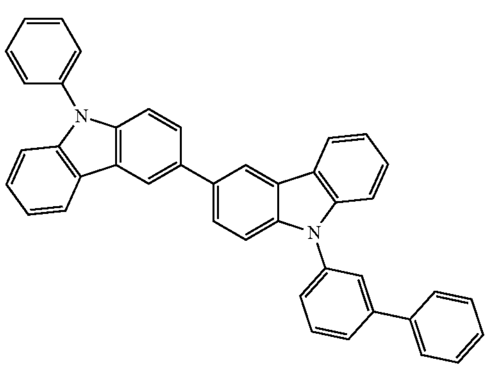

106A

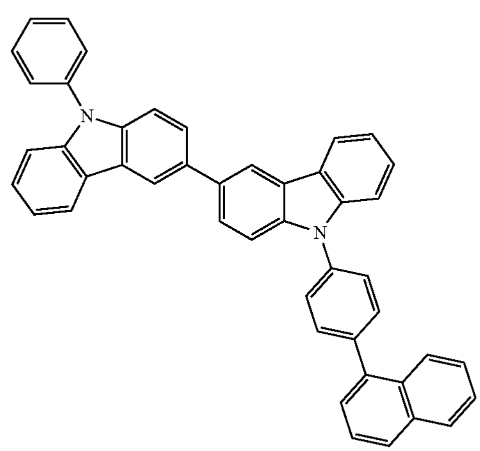

-continued
107A
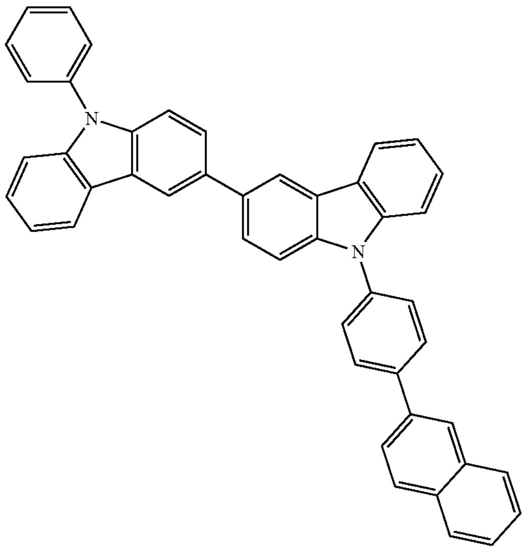
108A
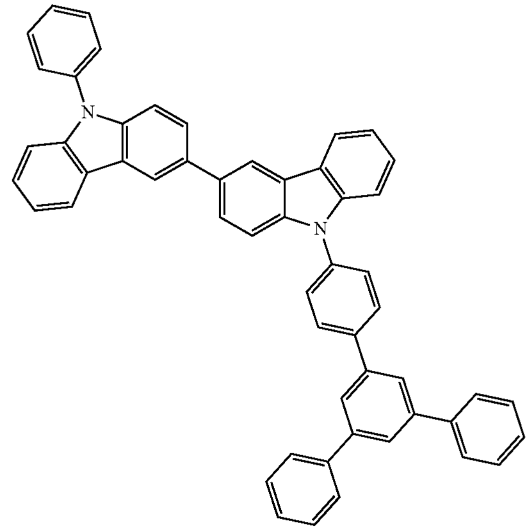
109A
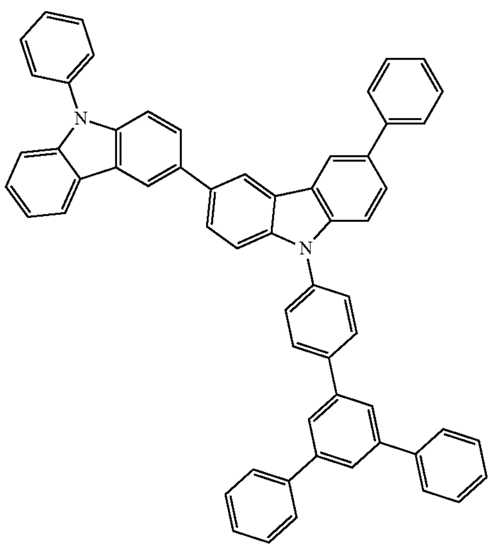
110A
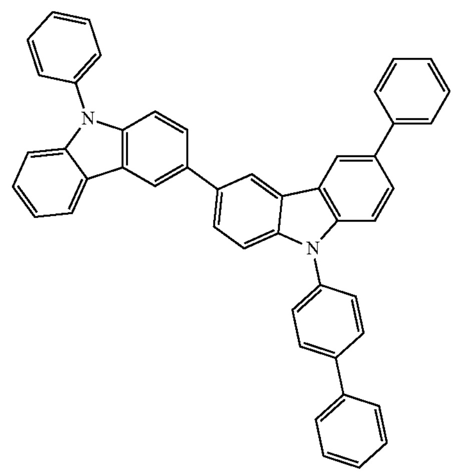
111A
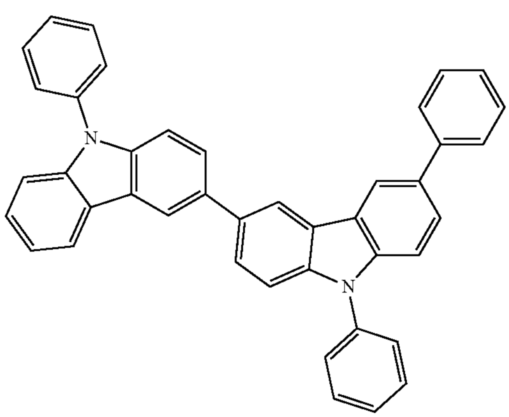
112A
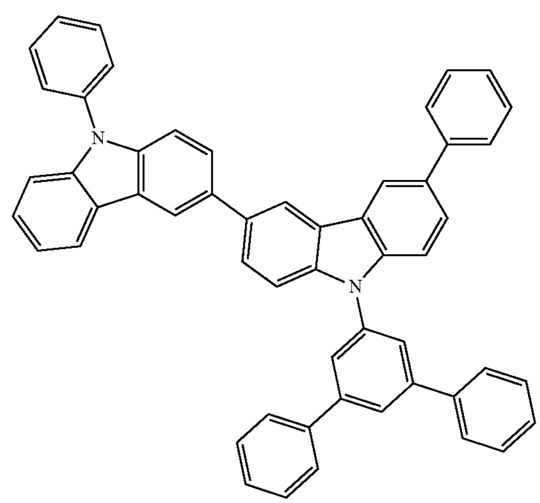

-continued
113A
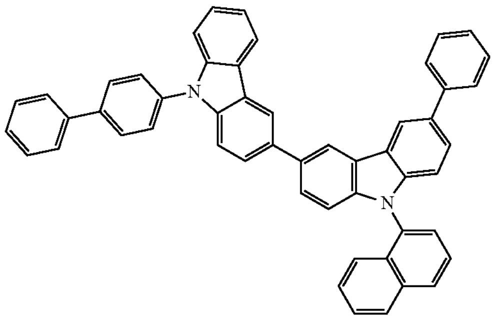
114A
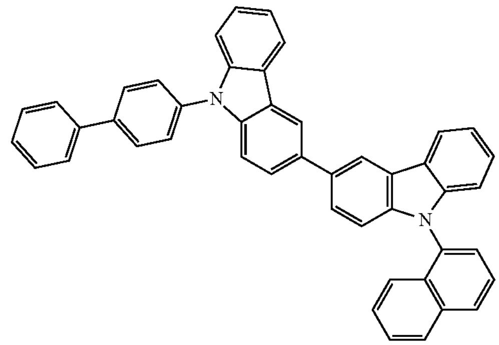
115A
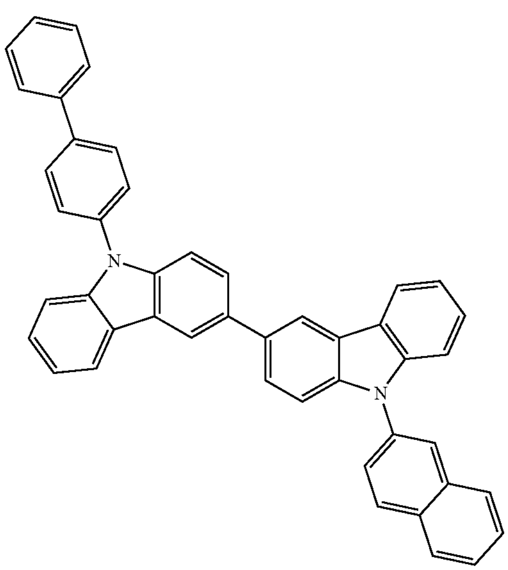
116A
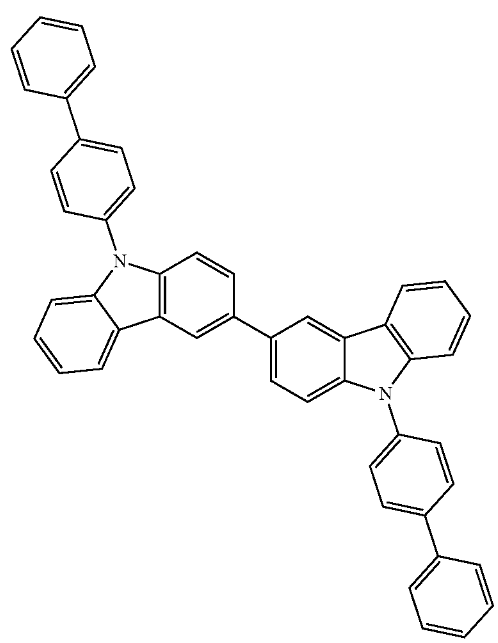

-continued
117A
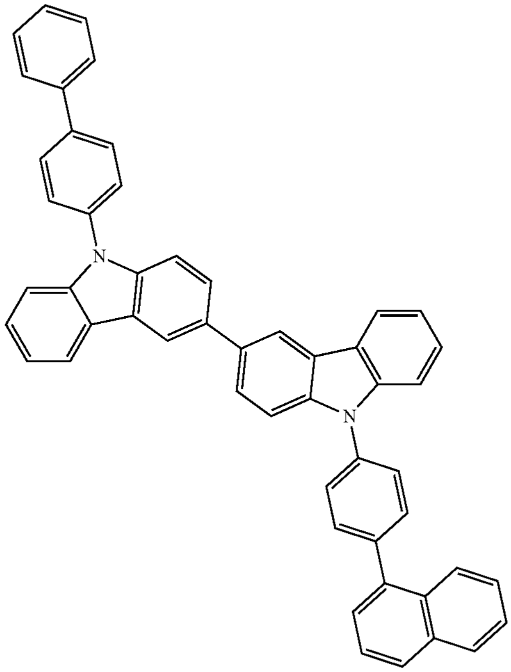
118A
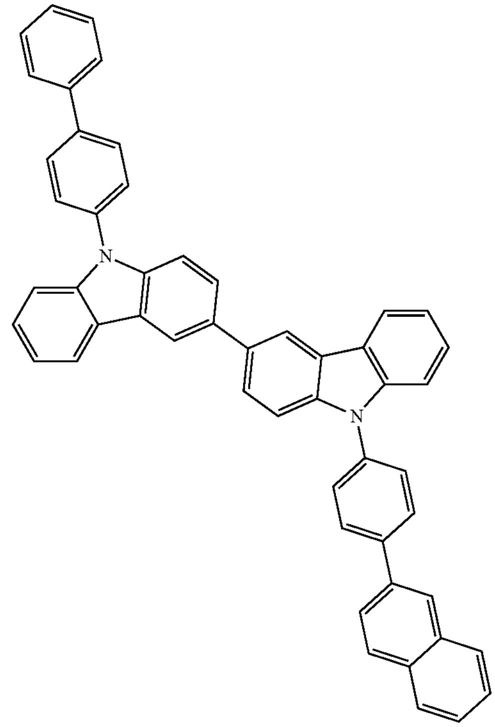
119A
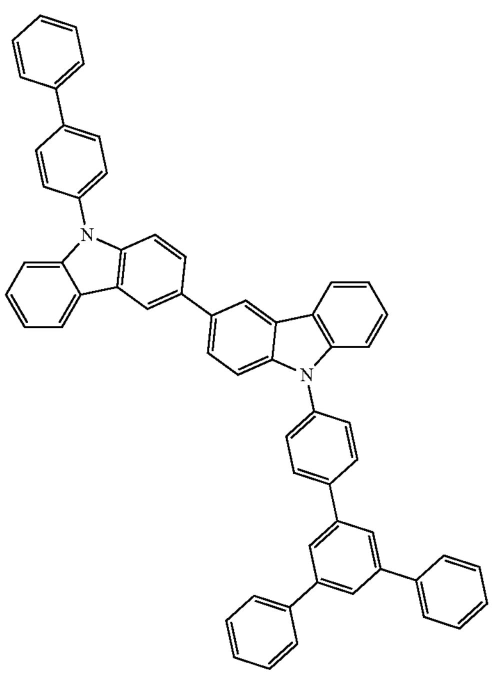
120A
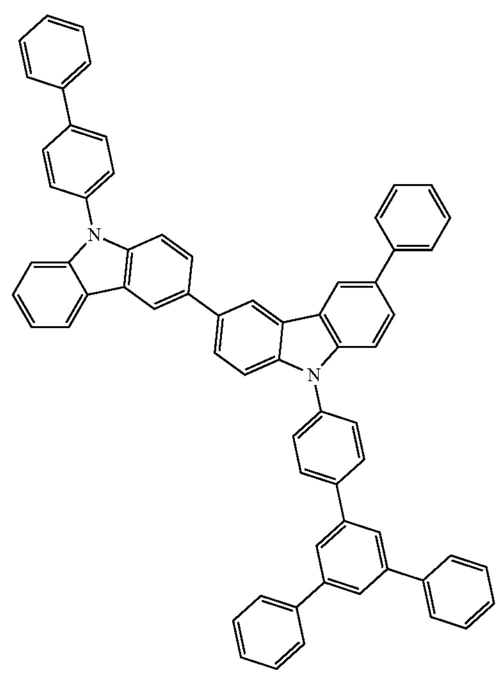

-continued
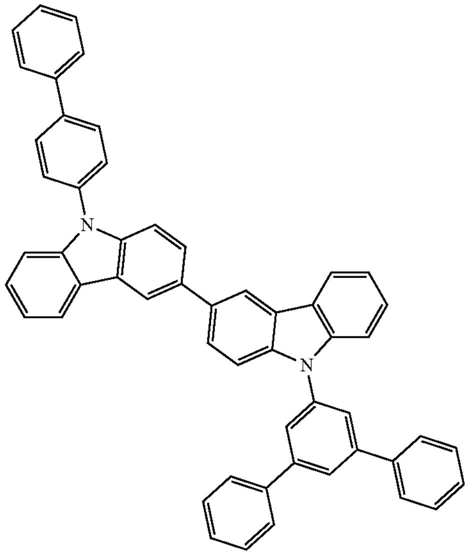
121A
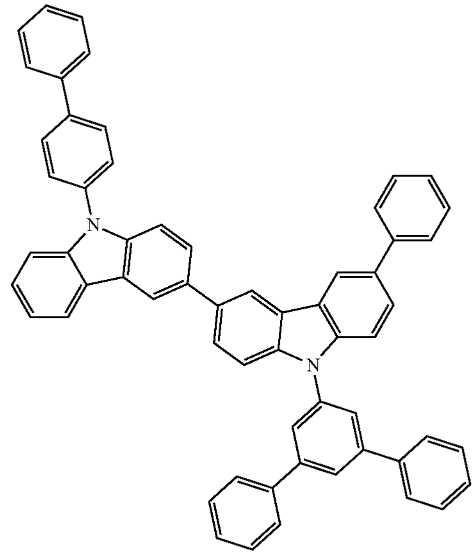
122A
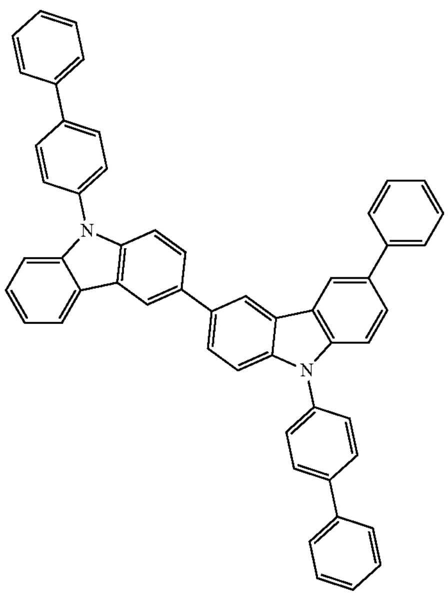
123A
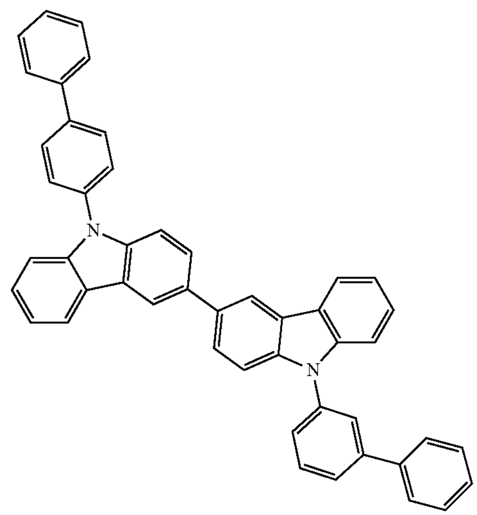
124A
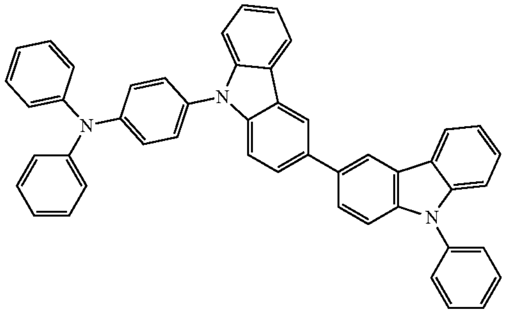
125A
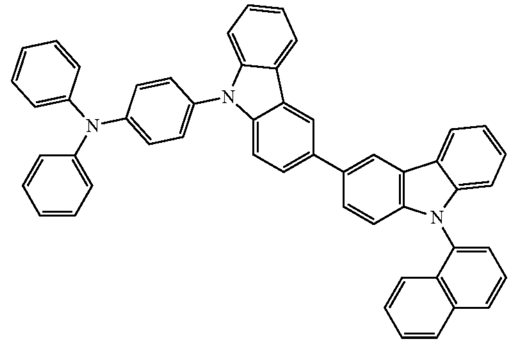
126A -continued
127A
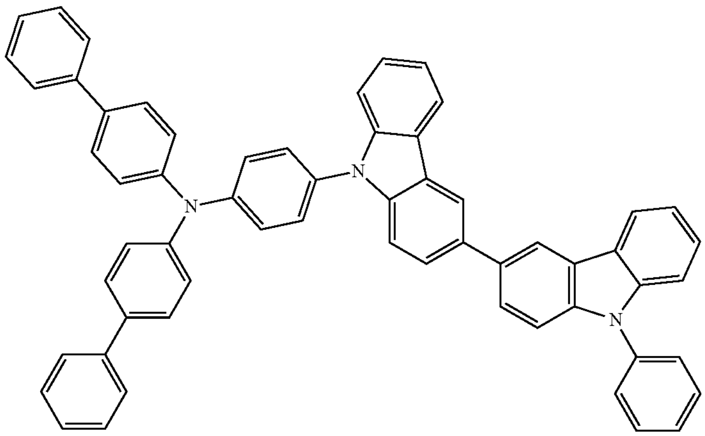
128A
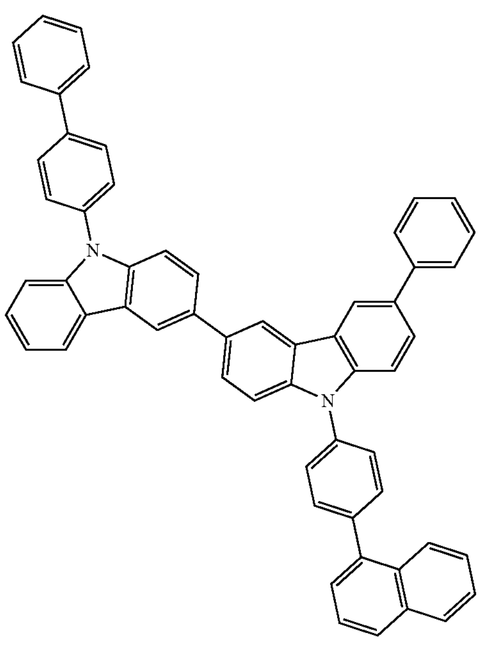
129A
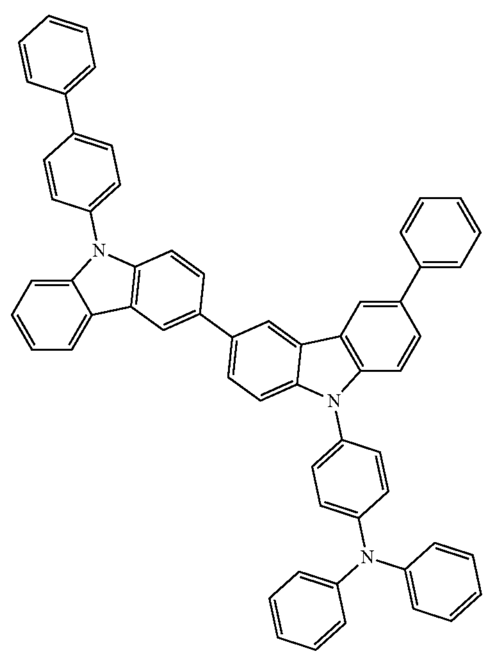

-continued
130A
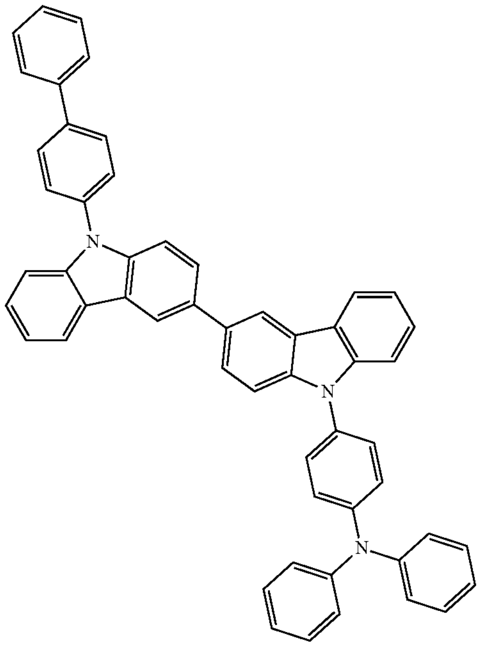
131A
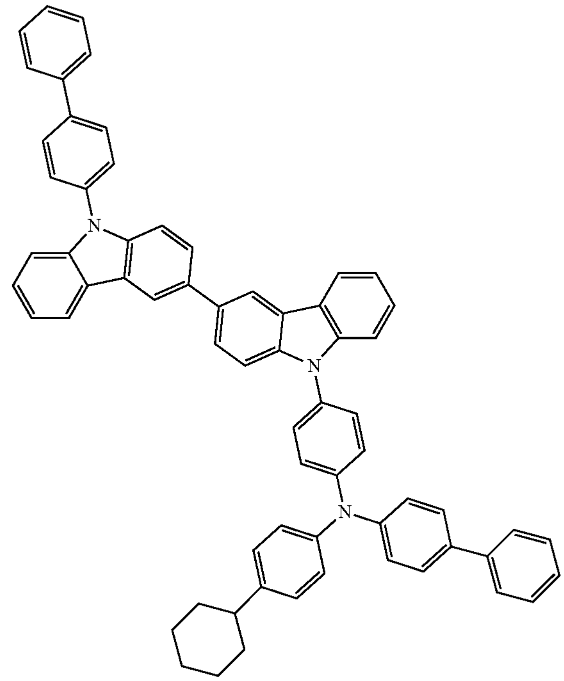
132A
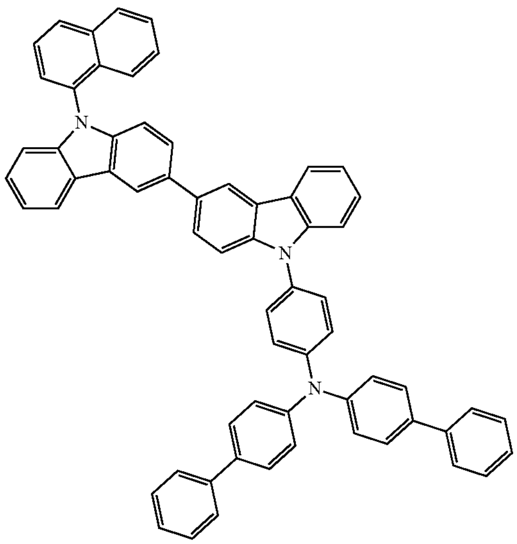
133A
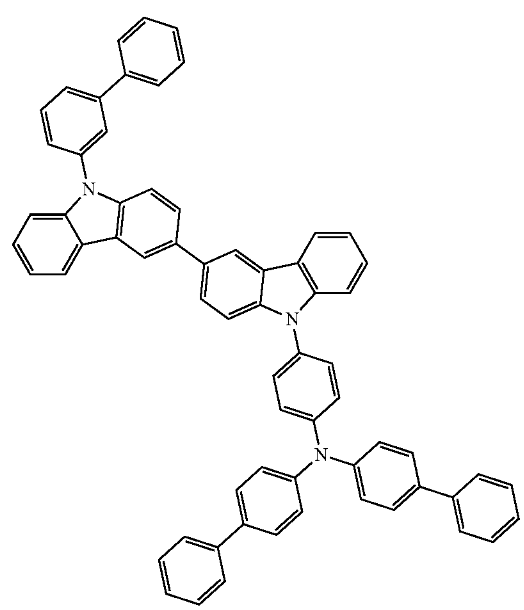

-continued
134A
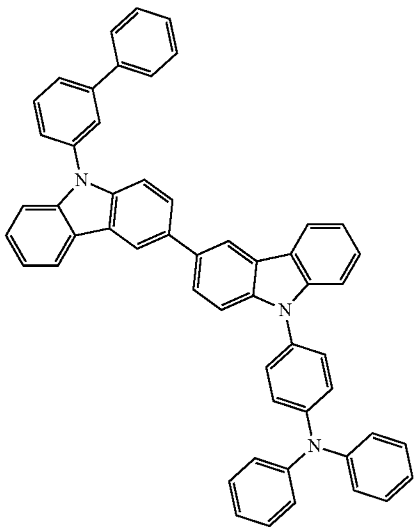
135A
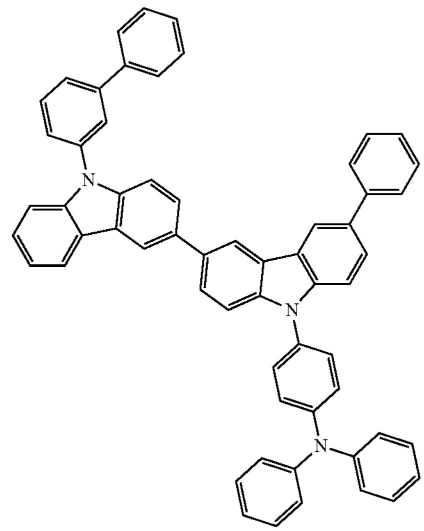
136A
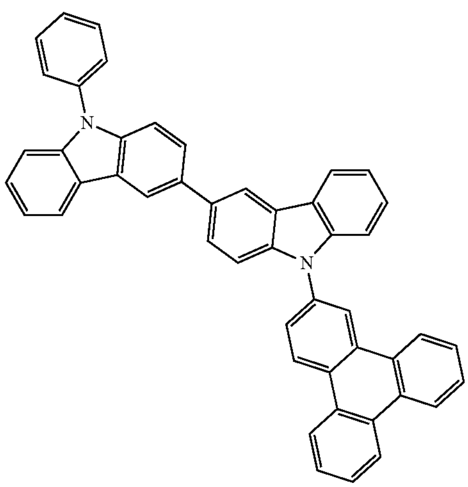
137A
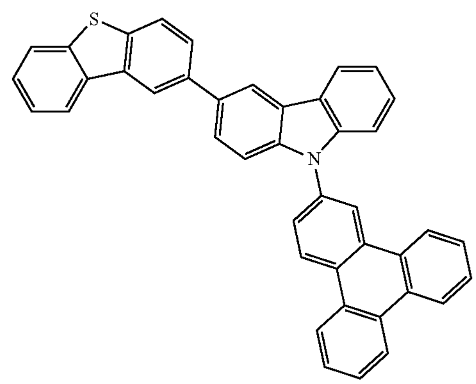
138A
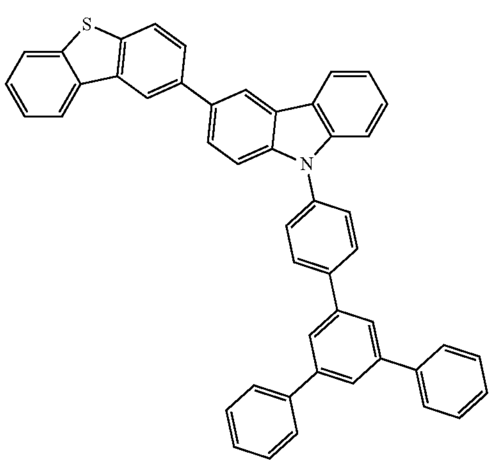
139A
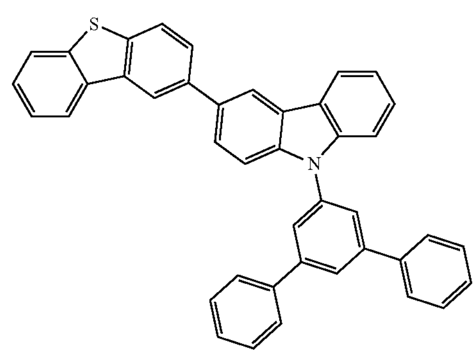

-continued
140A
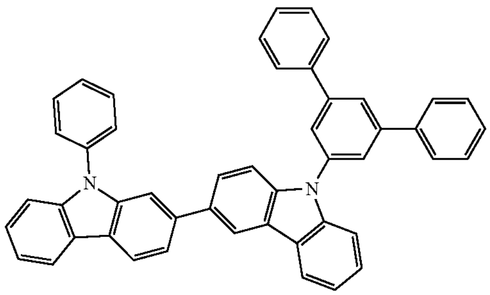
141A
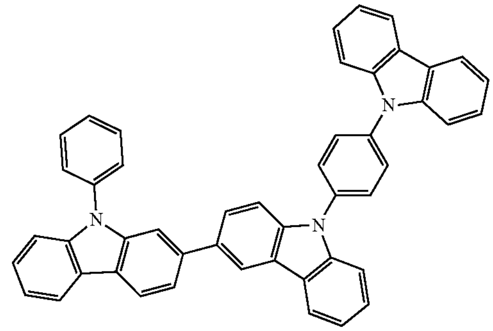
142A
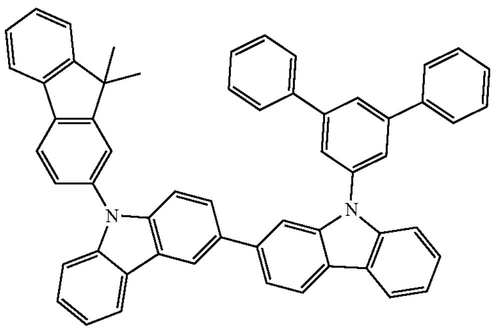
143A
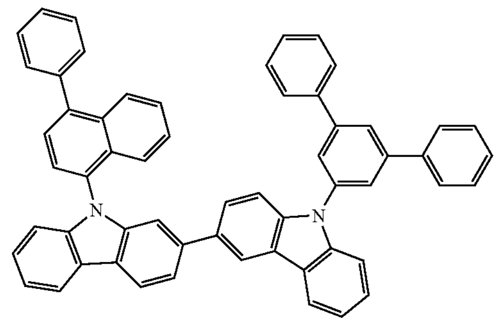
144A
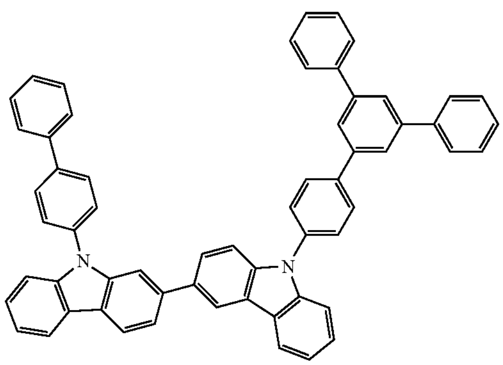
145A
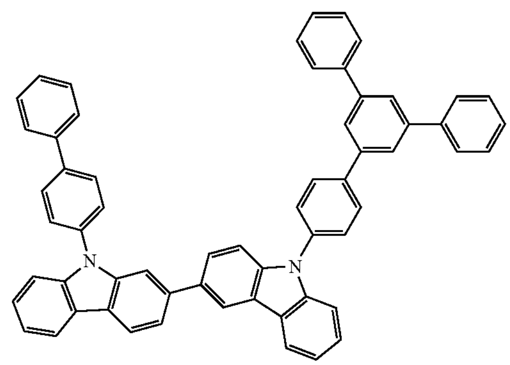
146A
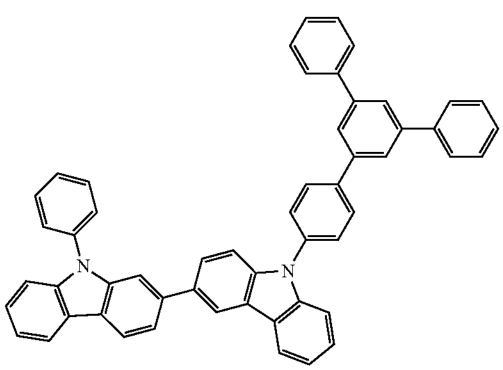
147A
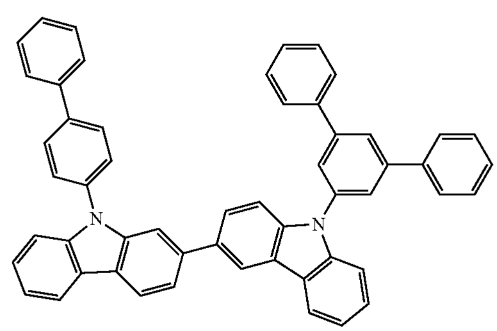

-continued
148A
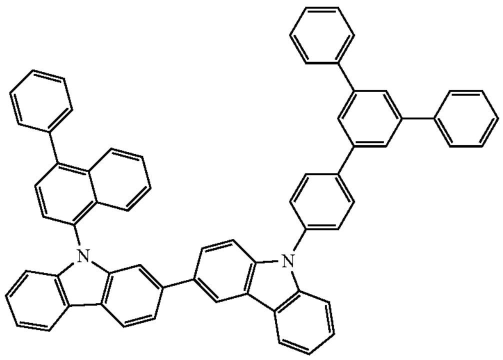
149A
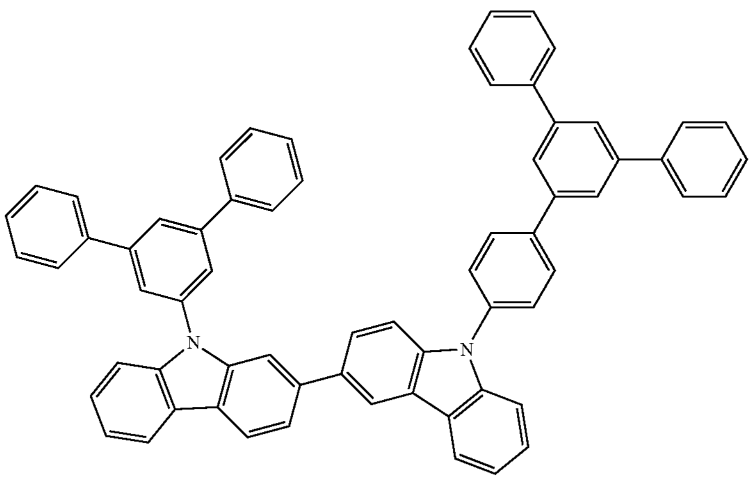
150A
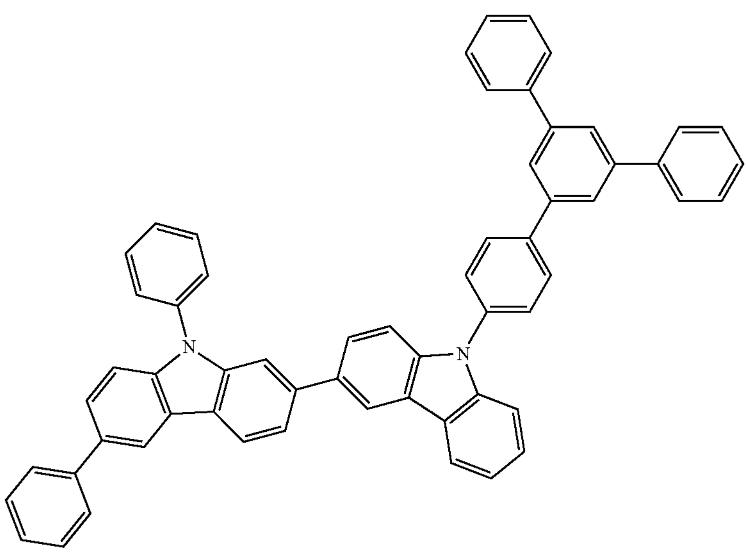

-continued
151A
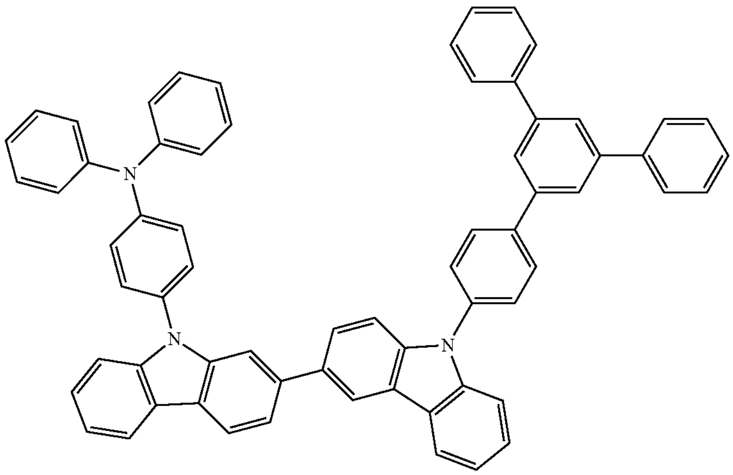
152A
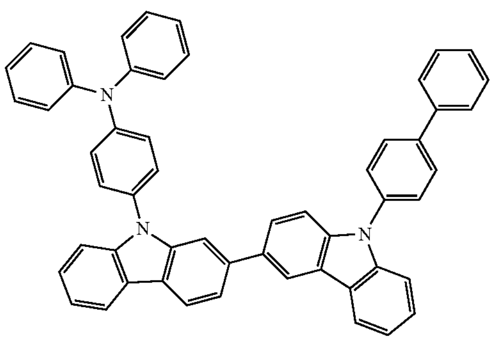
153A
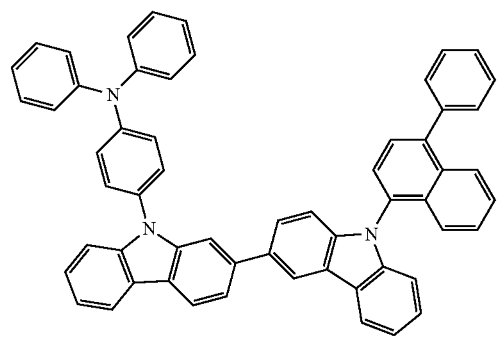
154A
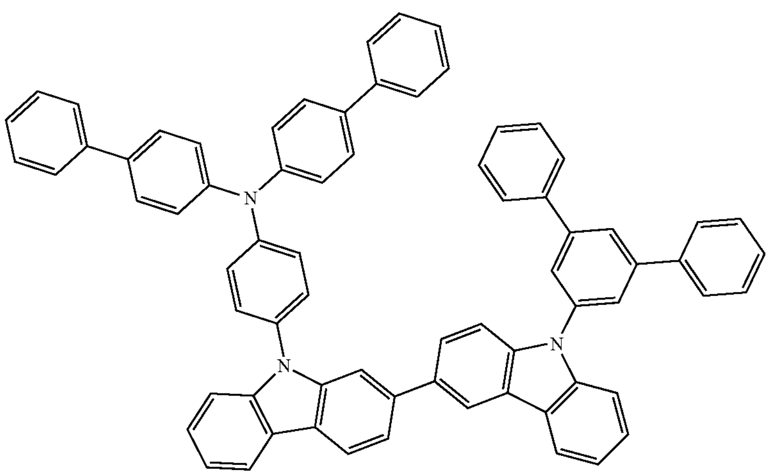
155A
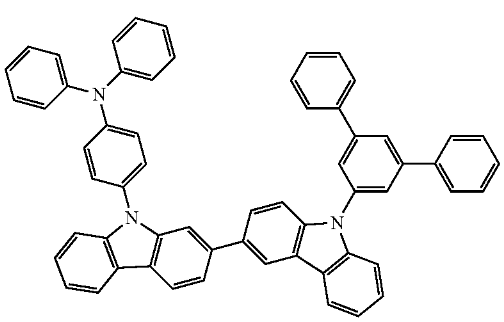
156A
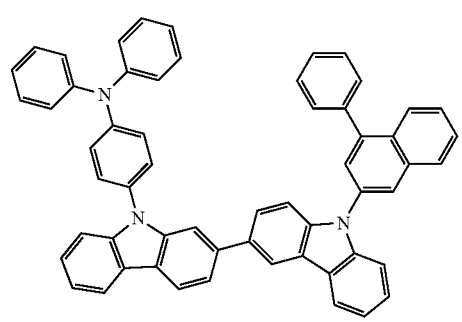

-continued
157A
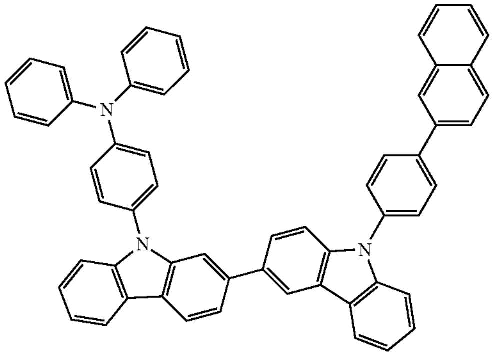
158A
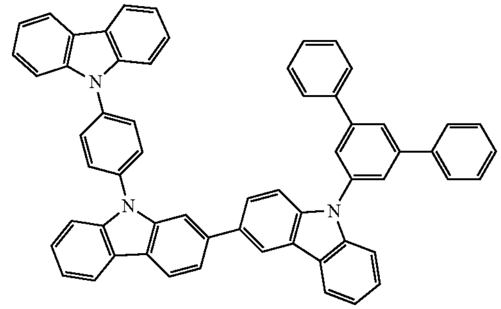
159A
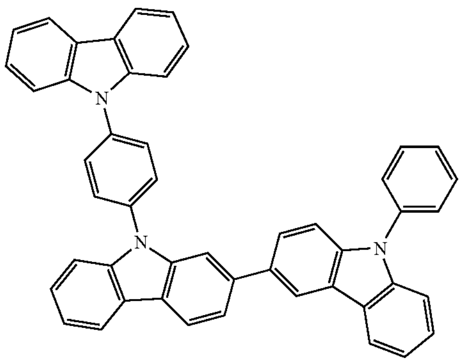
160A
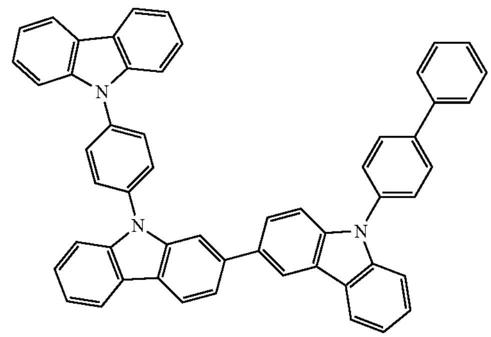
161A
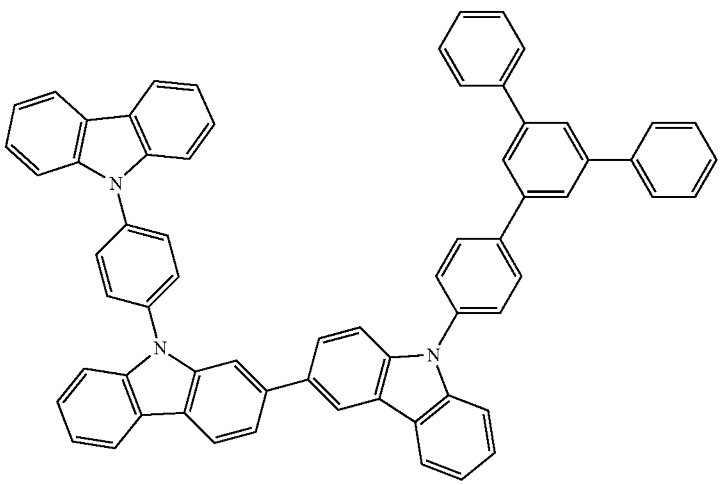
162A
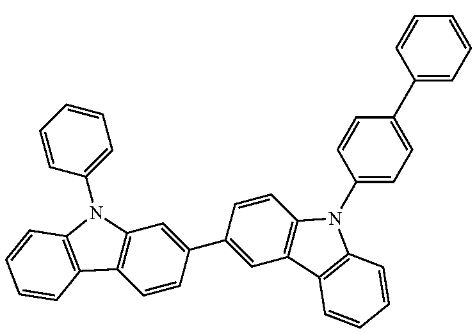
163A
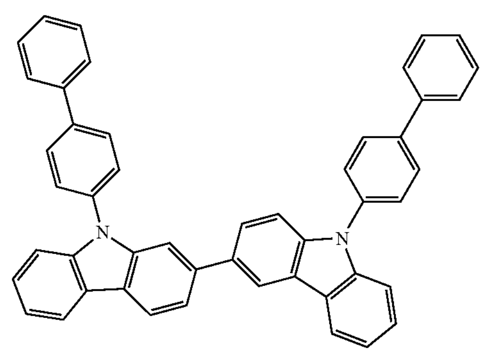

-continued
100
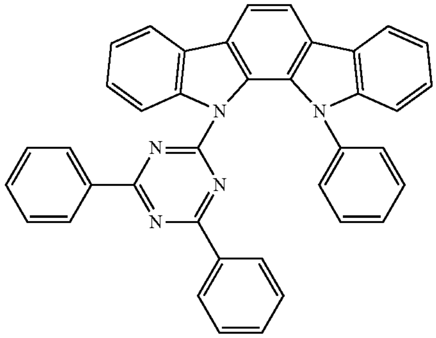
101
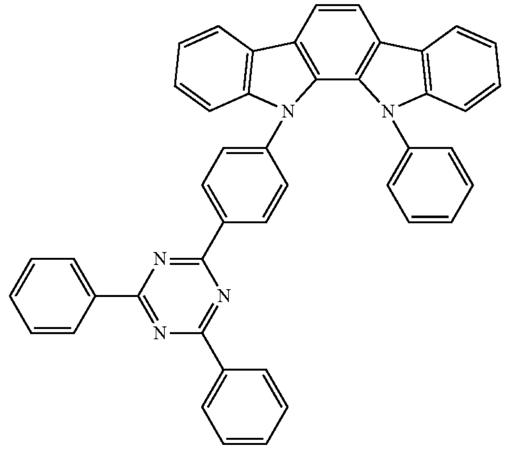
102
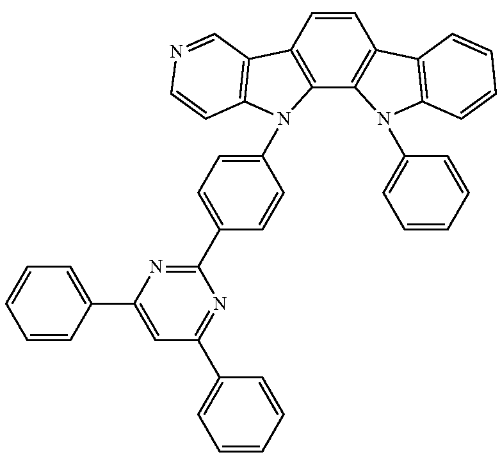
103
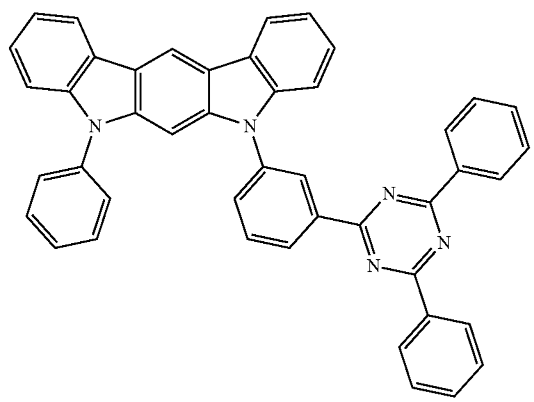
104
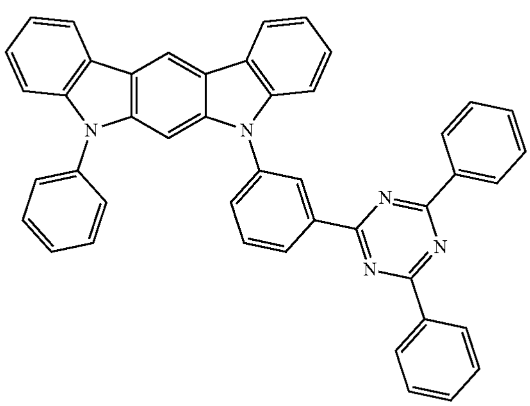
105
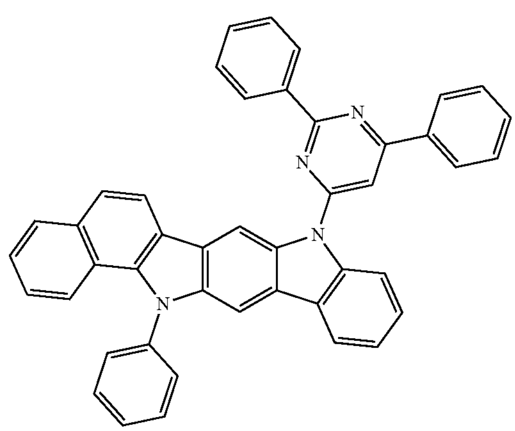

-continued
107
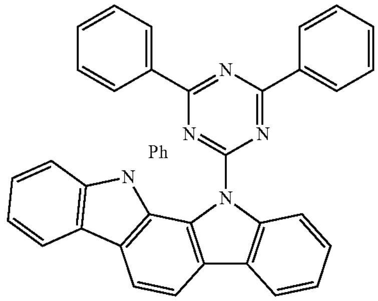
108
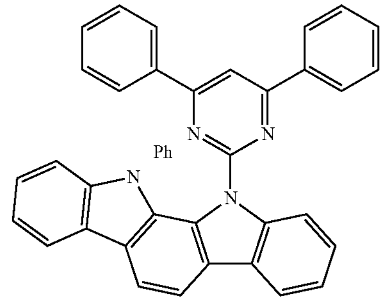
109
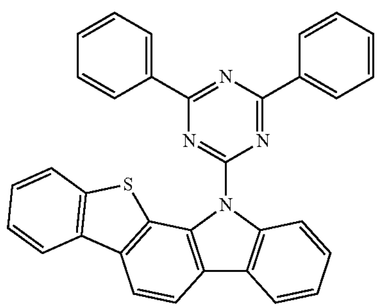
110
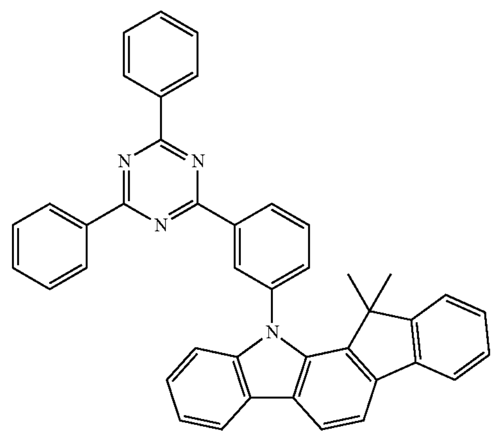
111
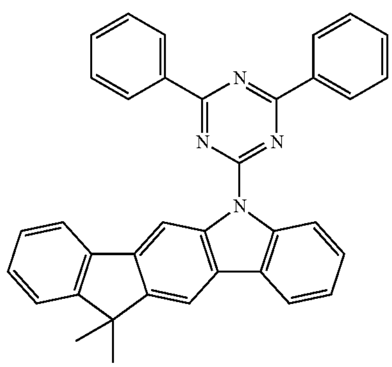
112
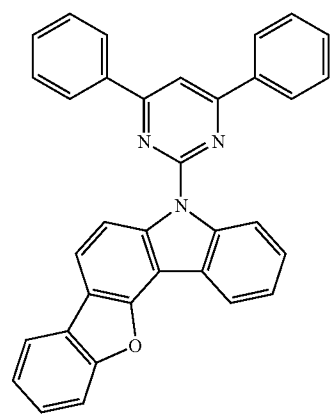

-continued
113
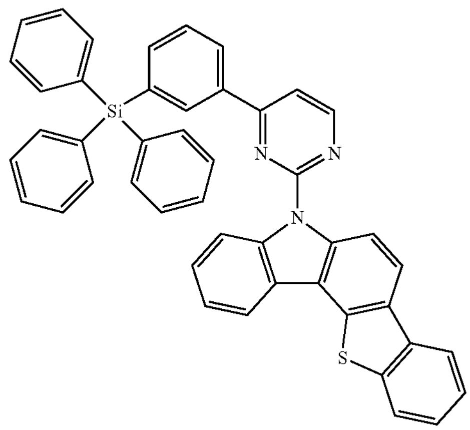
114
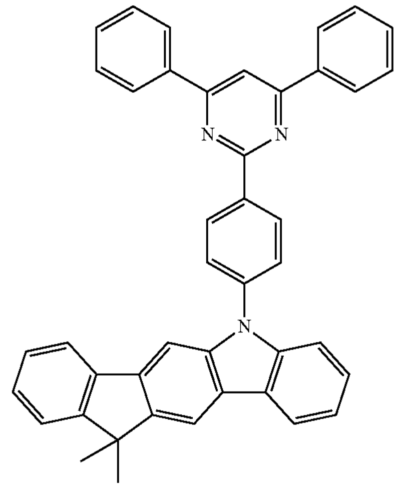
115
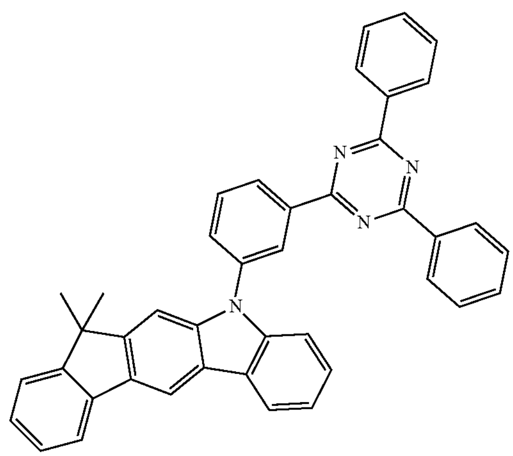
116
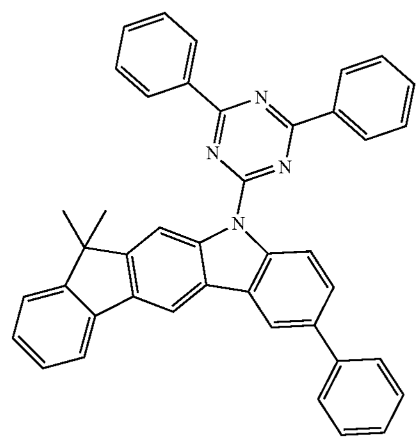
117
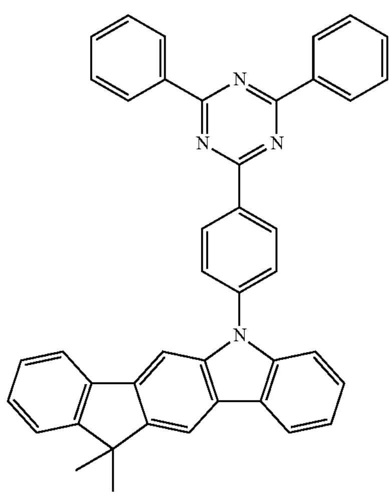
118
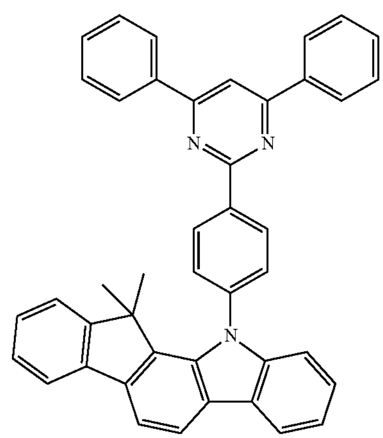

-continued
119
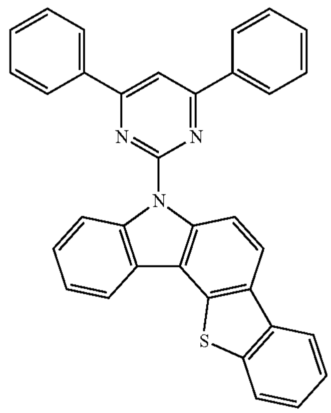
120
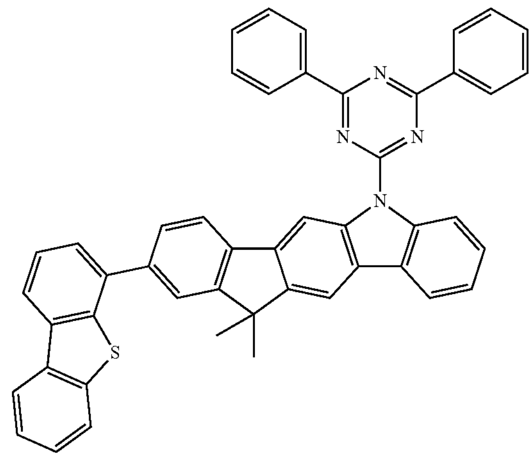
121
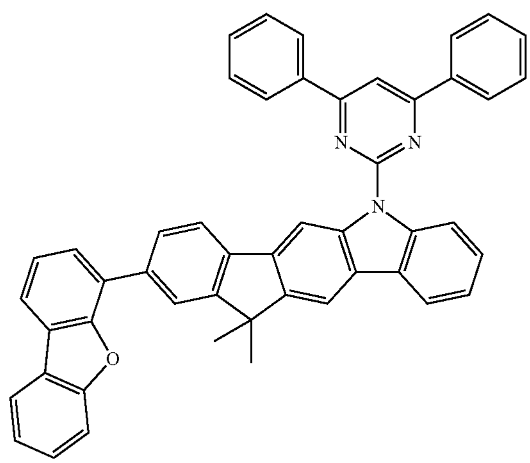
122
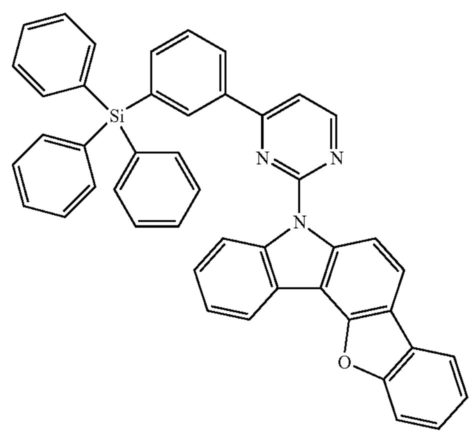
125
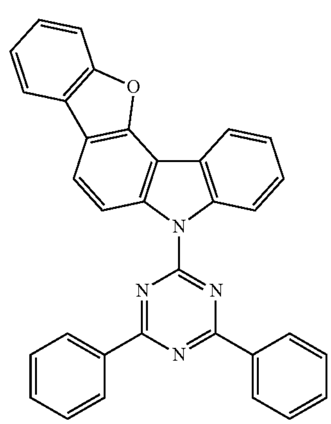
126
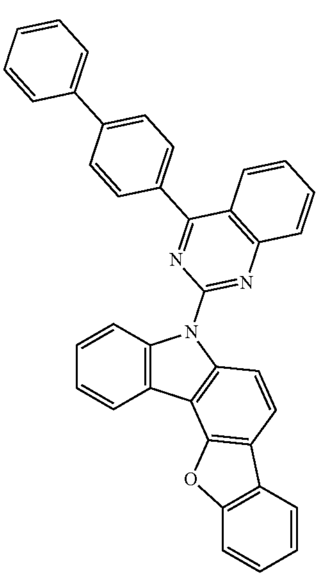

-continued
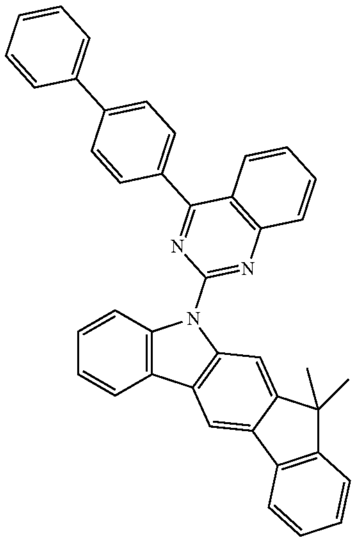
127
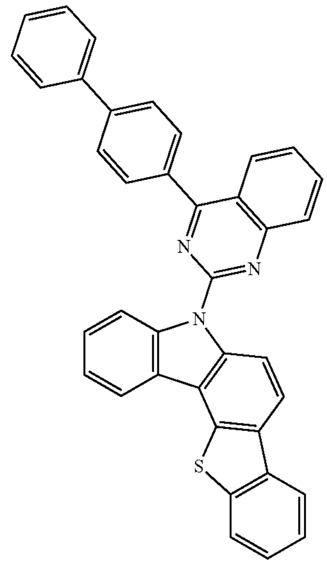
128
129
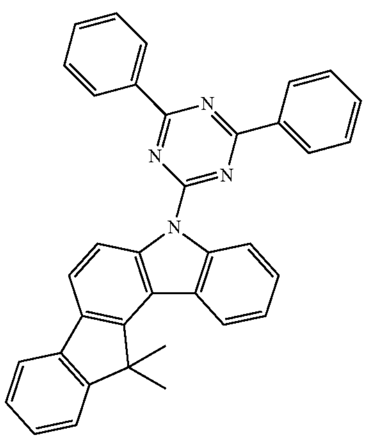
130
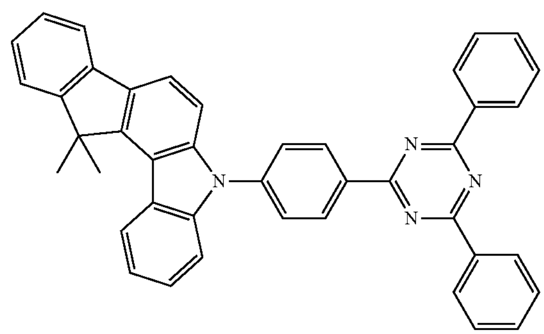
131
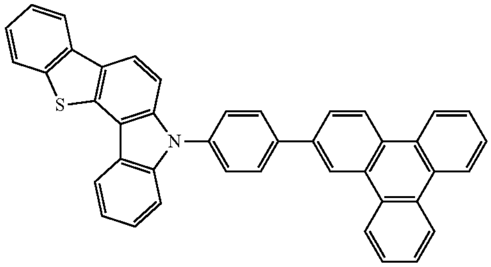
132
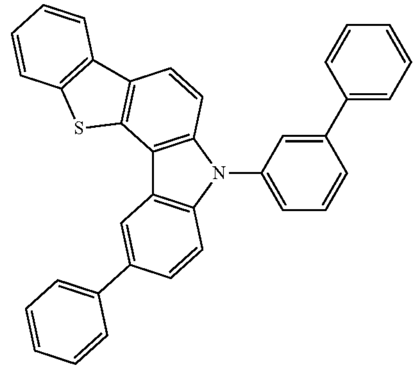

-continued
133
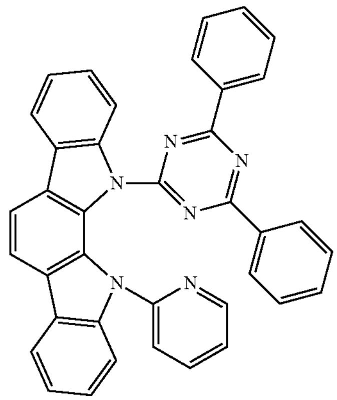
134
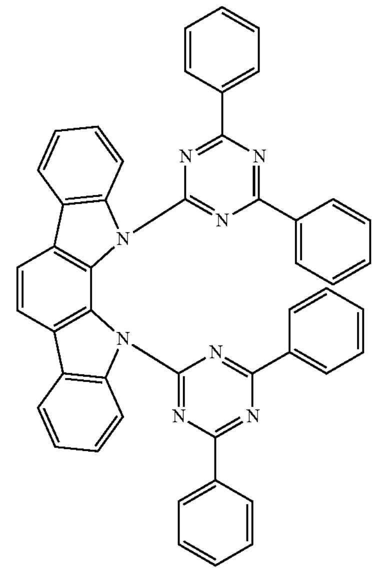
135
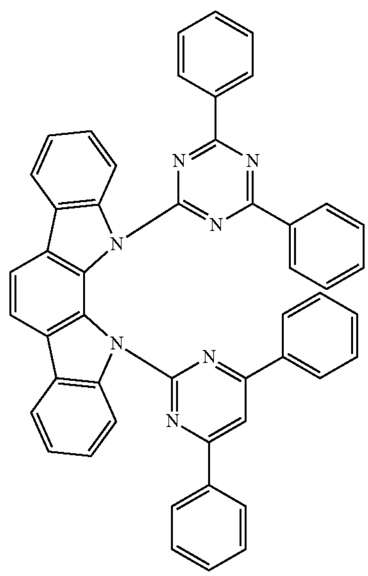
136
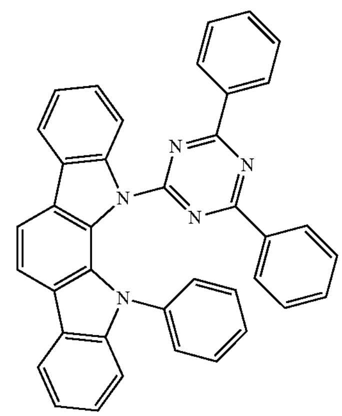
137
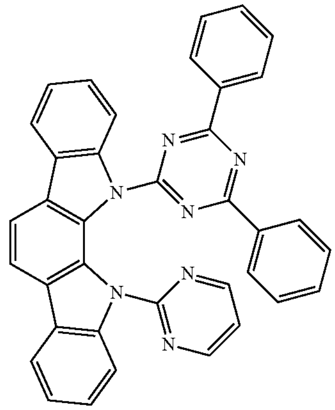
138
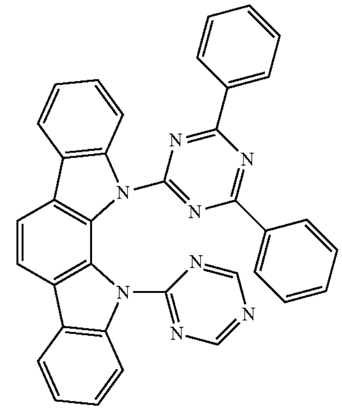

-continued
139
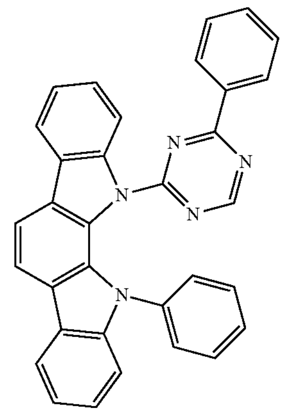
140
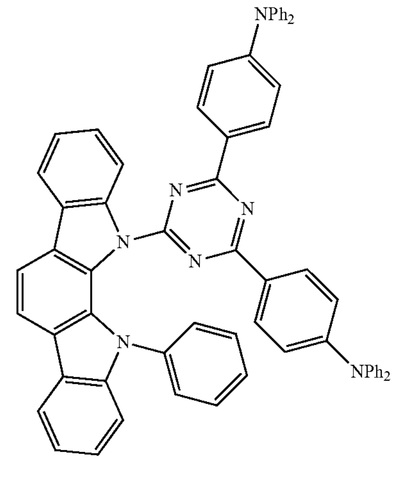
141
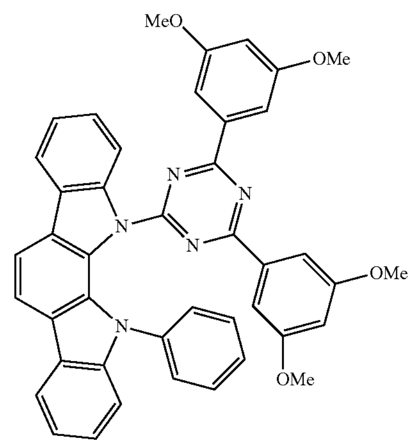
142
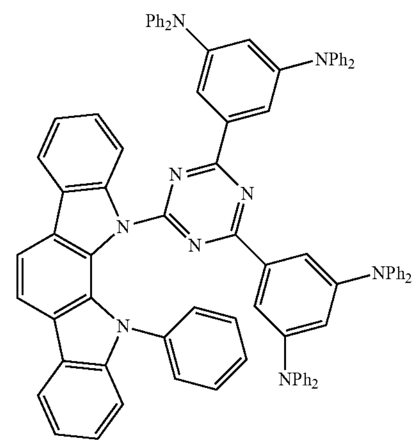
143
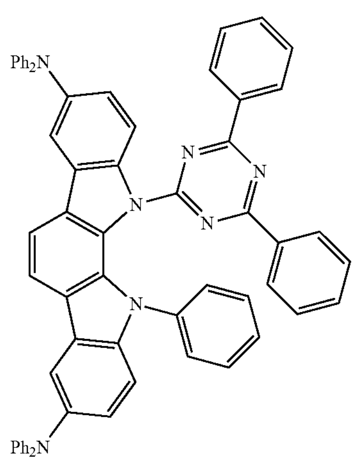
144
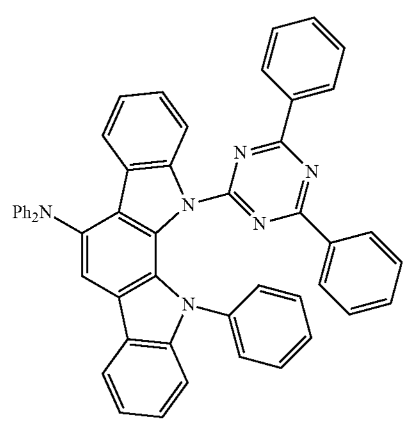

-continued
145
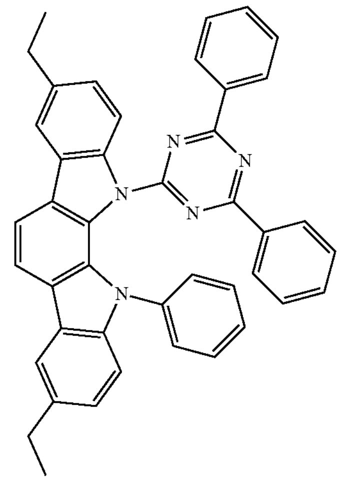
146
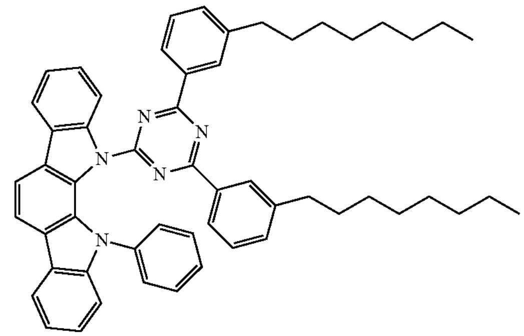
147
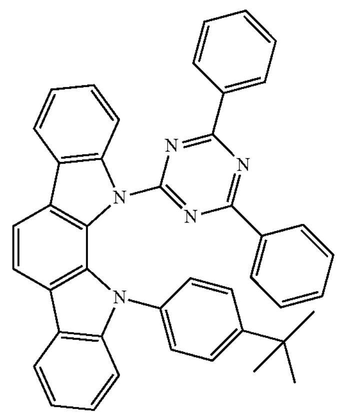
148
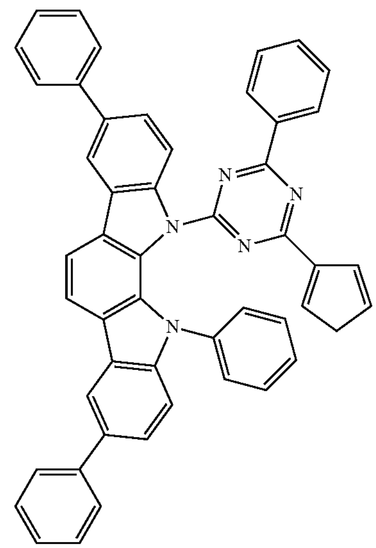
149
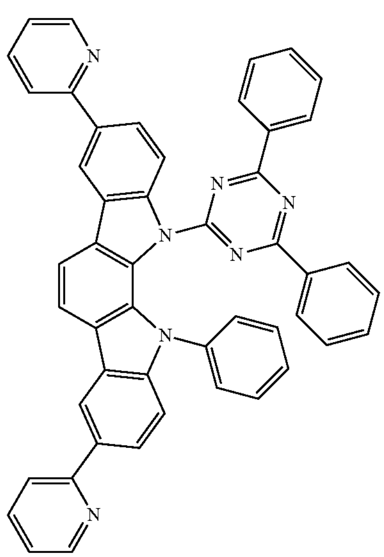
150
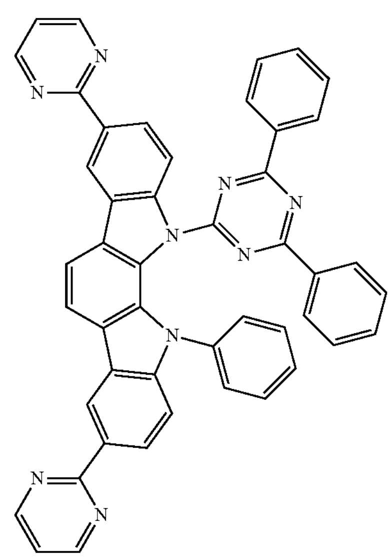

-continued
151
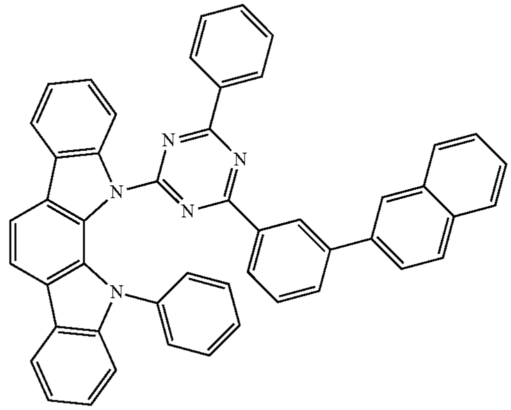
152
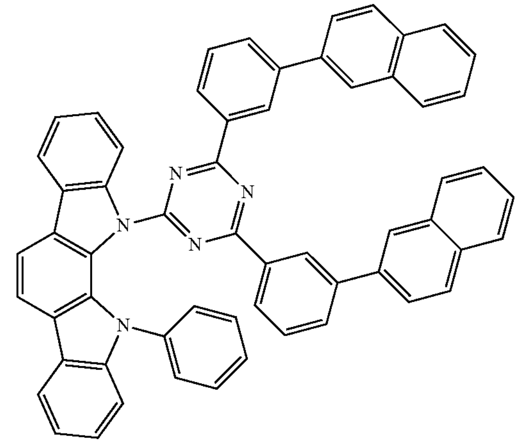
153
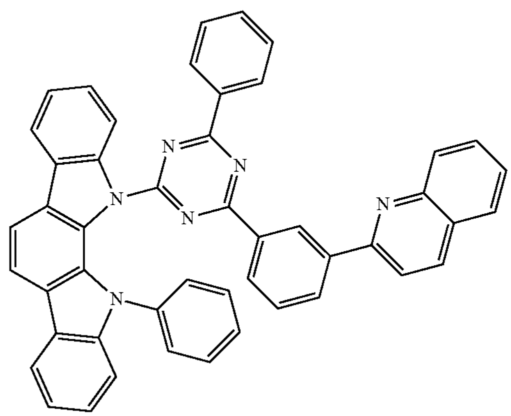
154
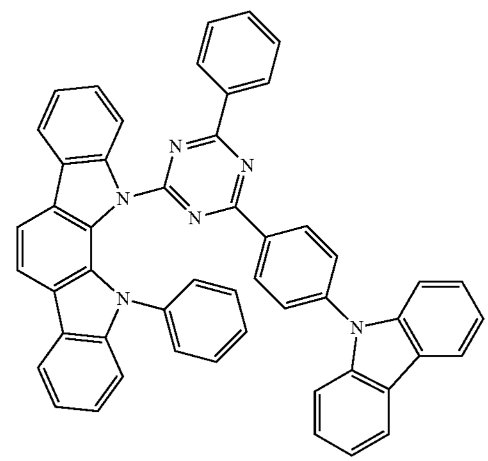
155
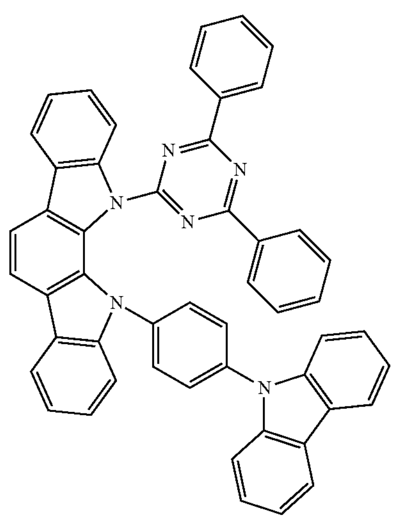
156
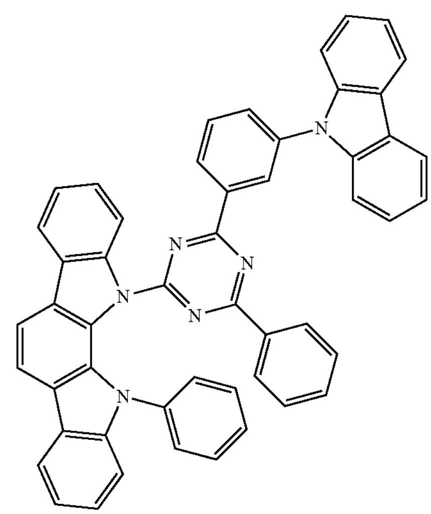

-continued
157
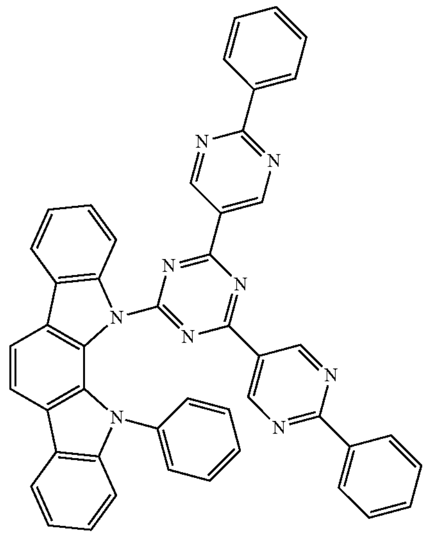
158
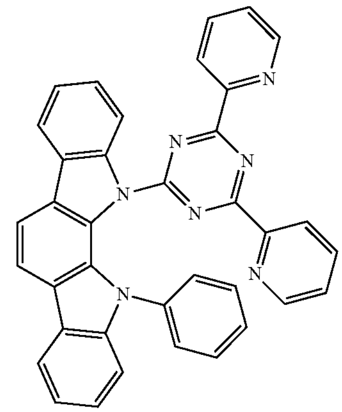
159
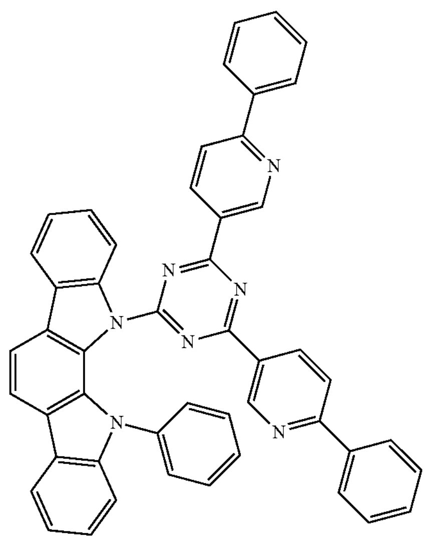
160
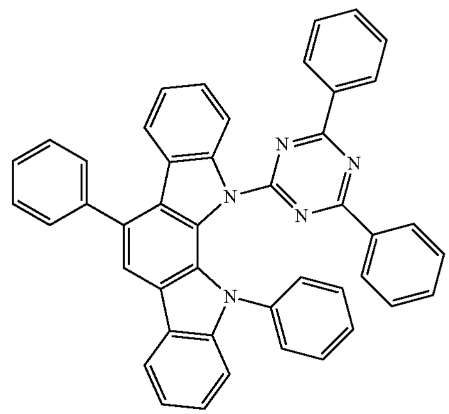
161
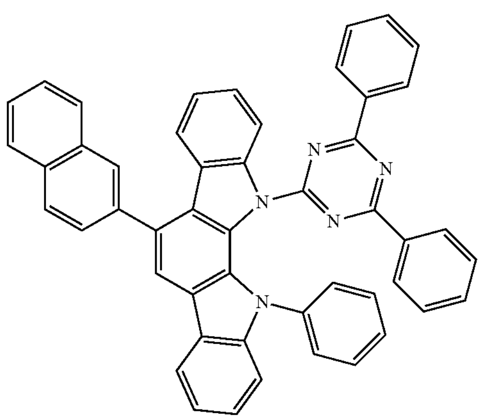
162
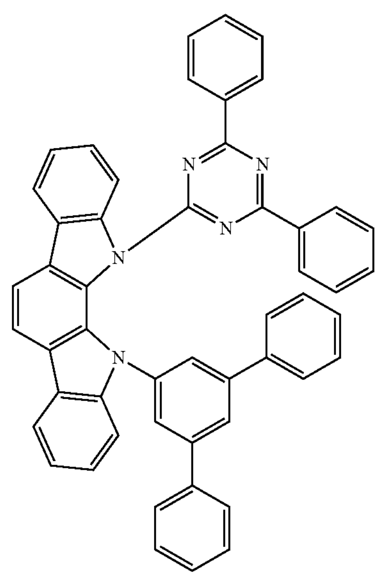

-continued
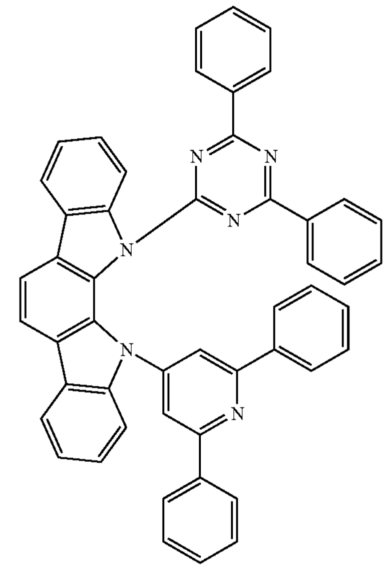
163
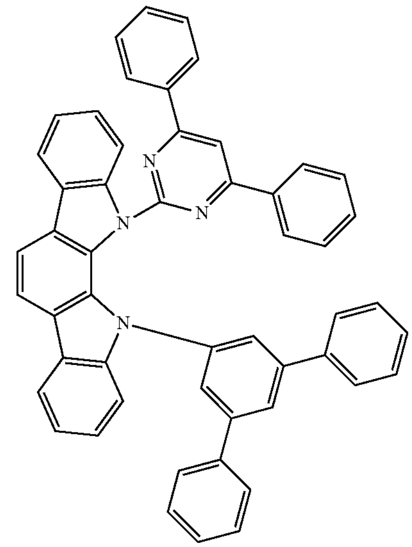
164
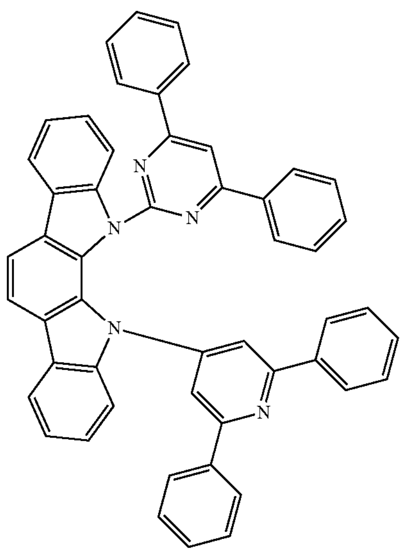
165
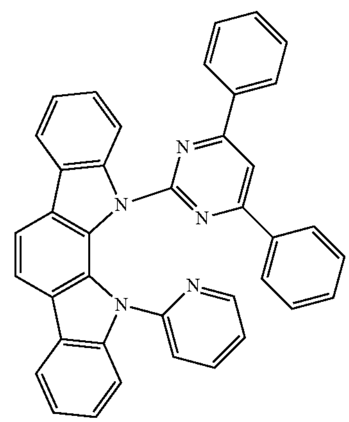
166
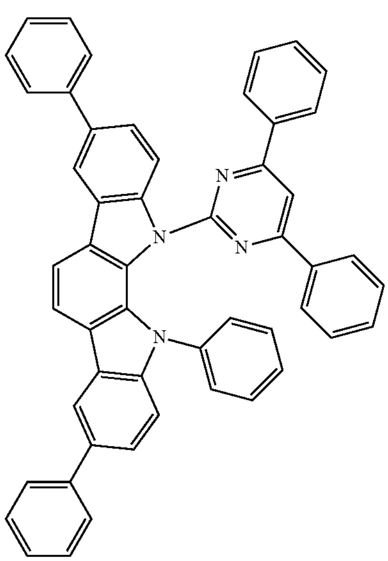
167
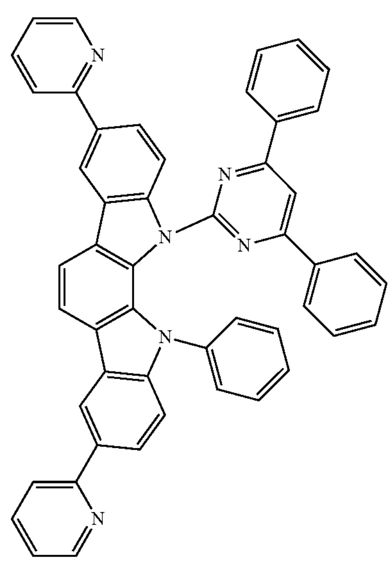
168

-continued
169
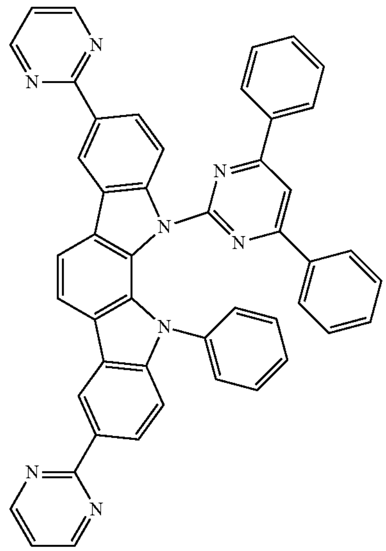
170
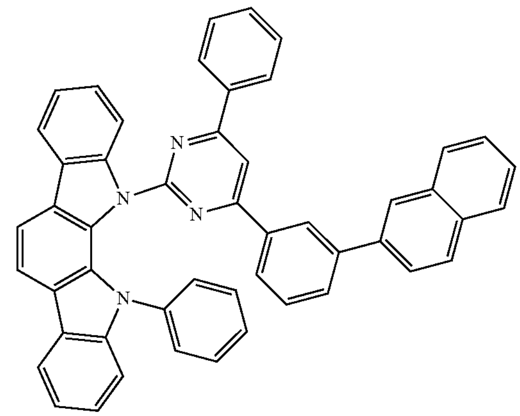
171
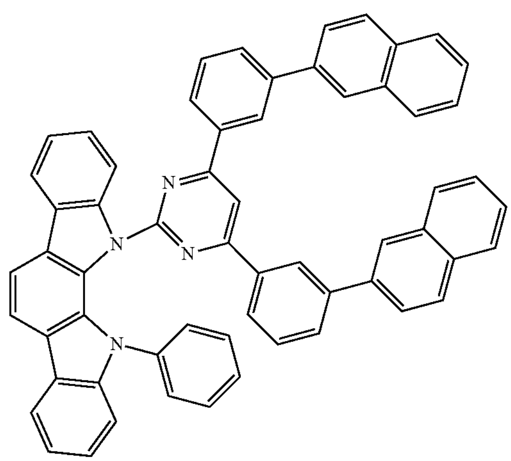
172
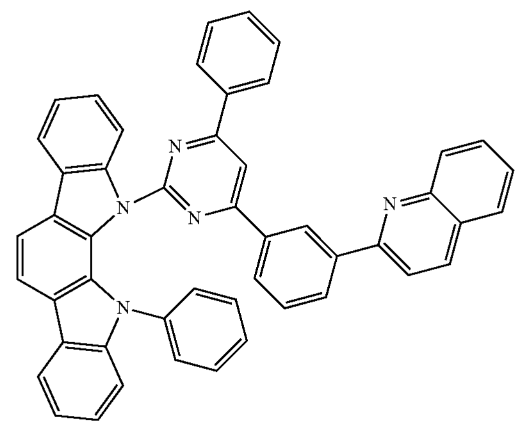
173
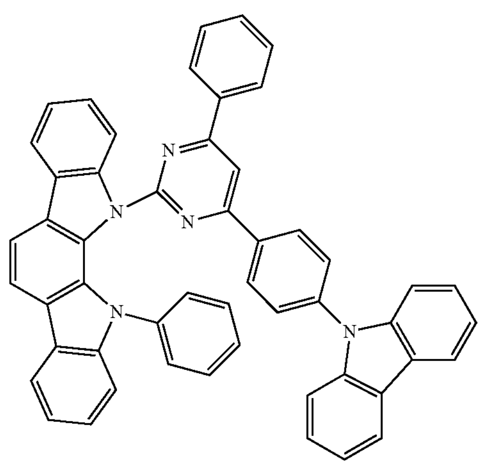
174
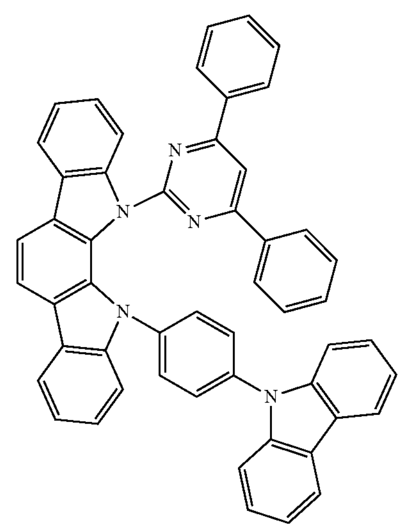

-continued
175
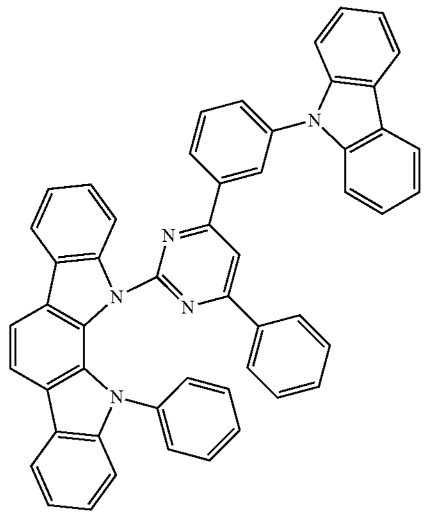
176
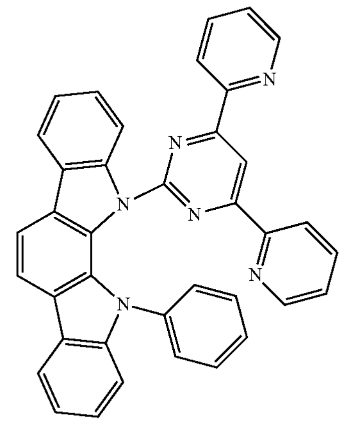
177
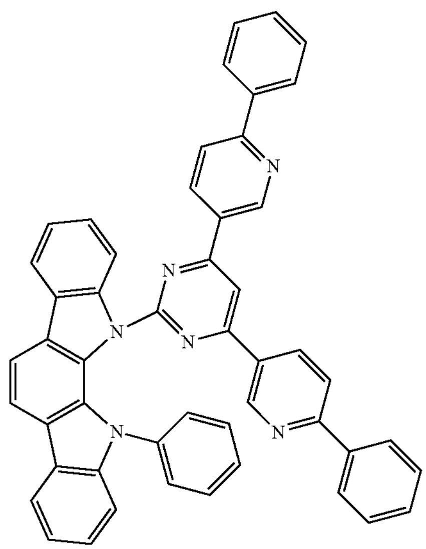
178
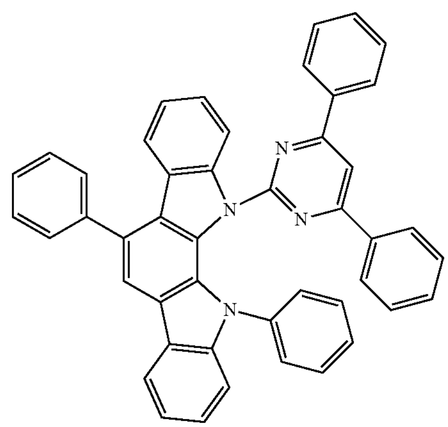
179
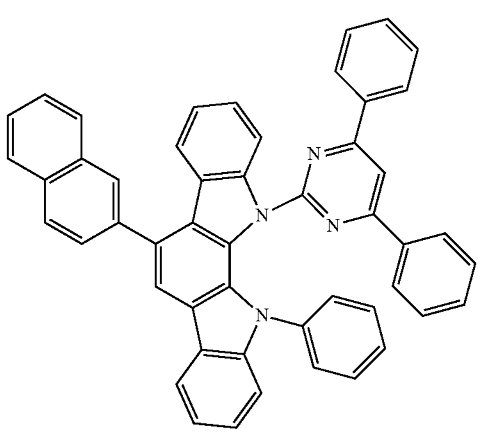
180
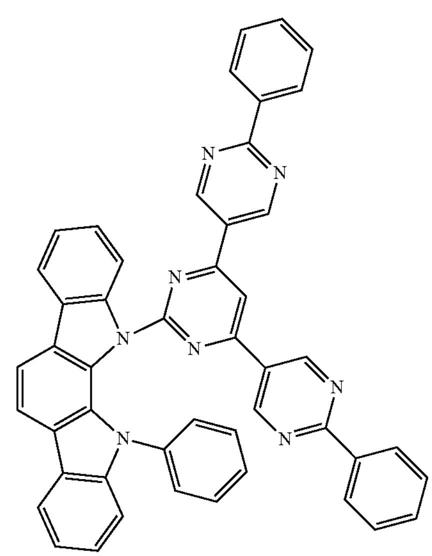

-continued
181
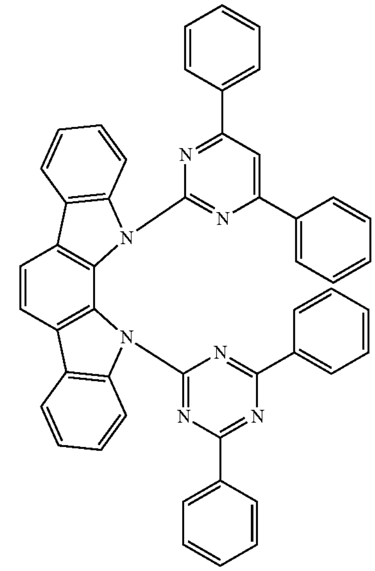
182
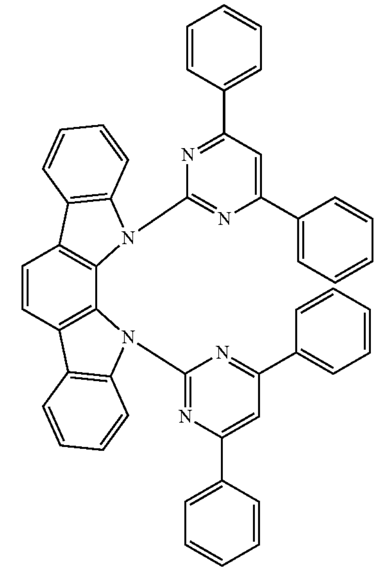
183
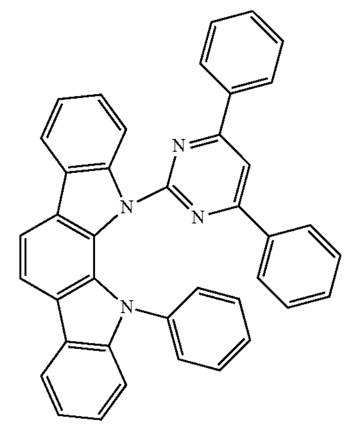
184
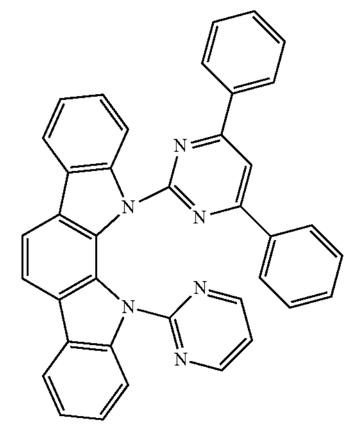
185
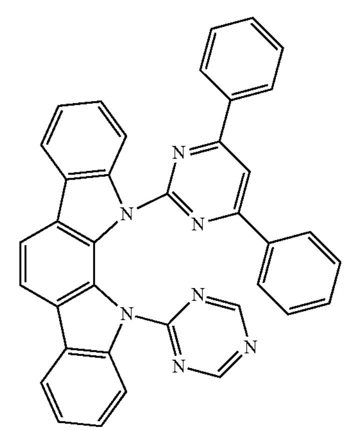
186
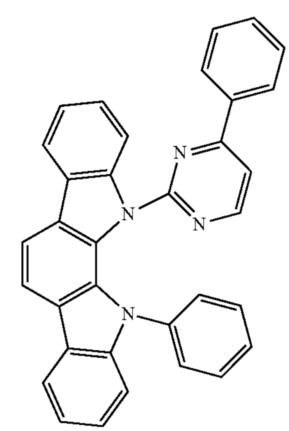

-continued
187
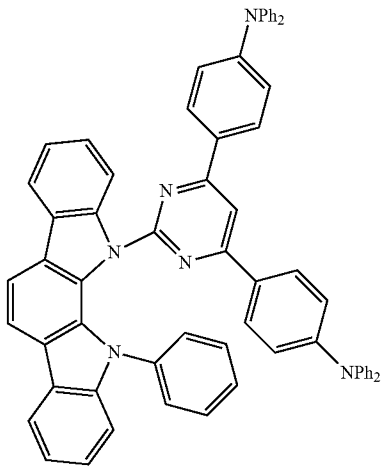
188
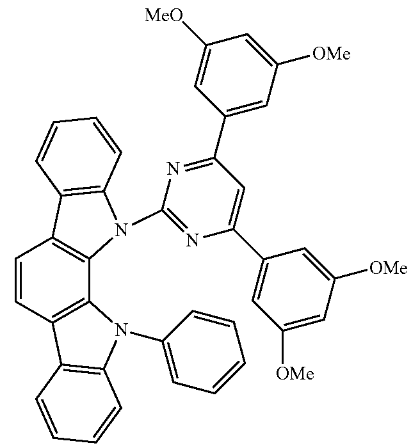
189
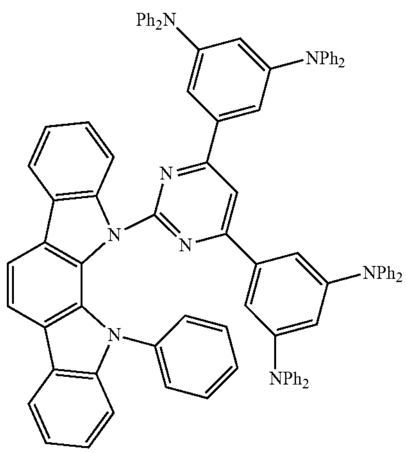
190
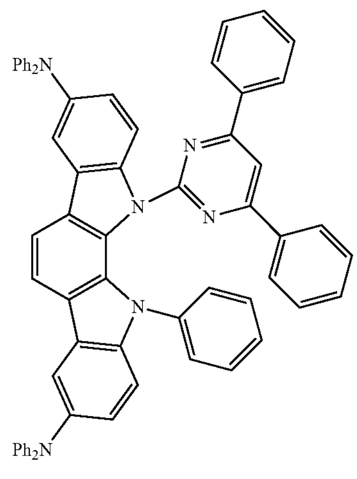
191
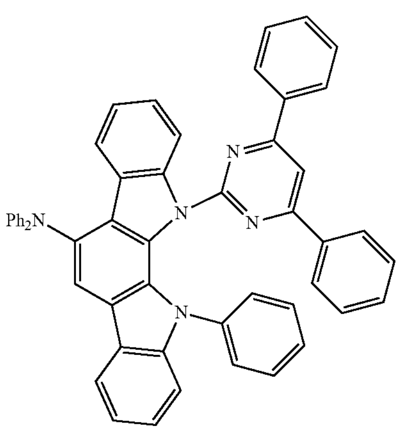
192
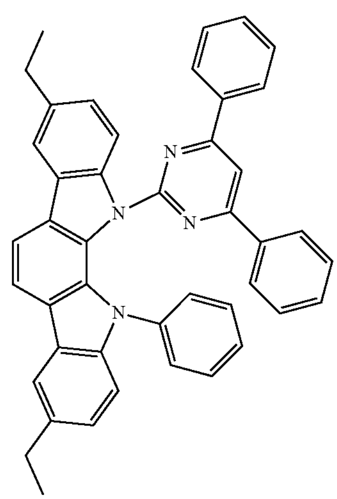

-continued
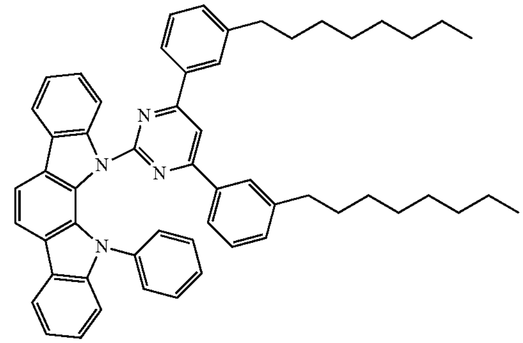
193
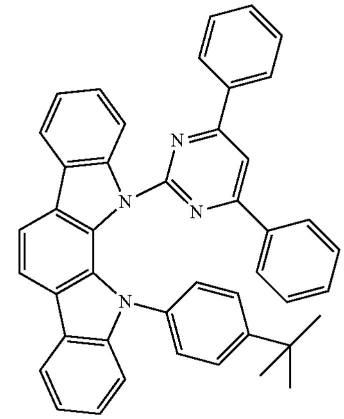
194
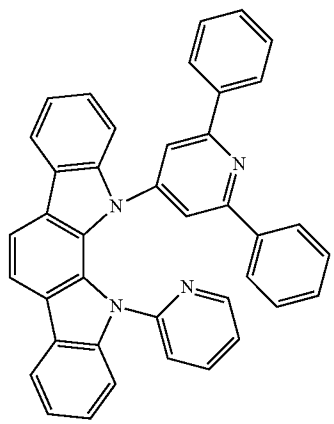
195
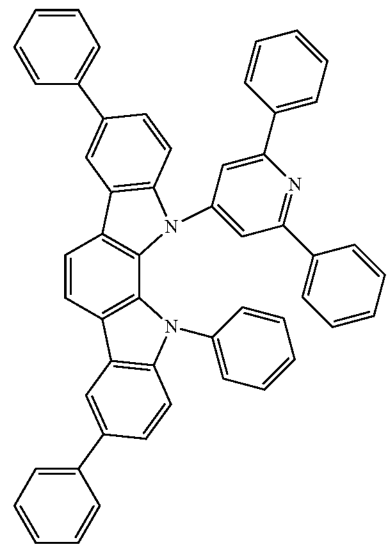
196
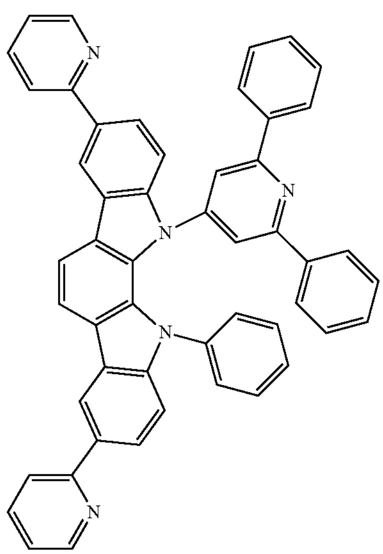
197
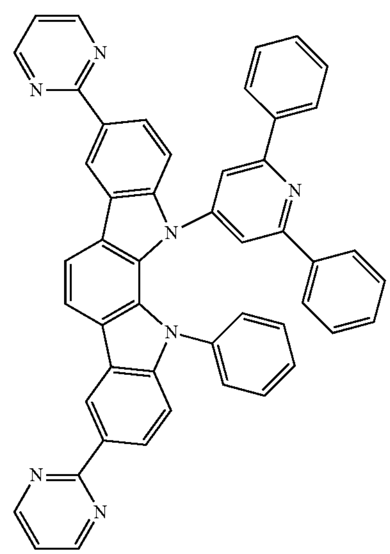
198

-continued
199
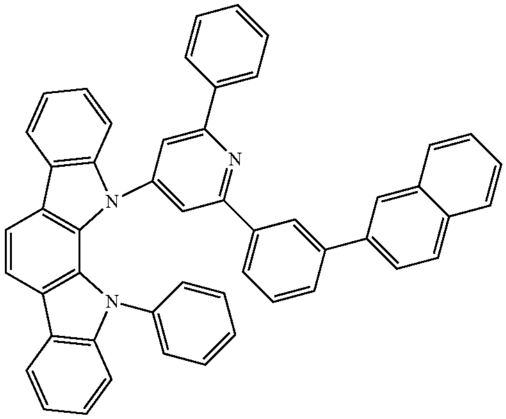
200
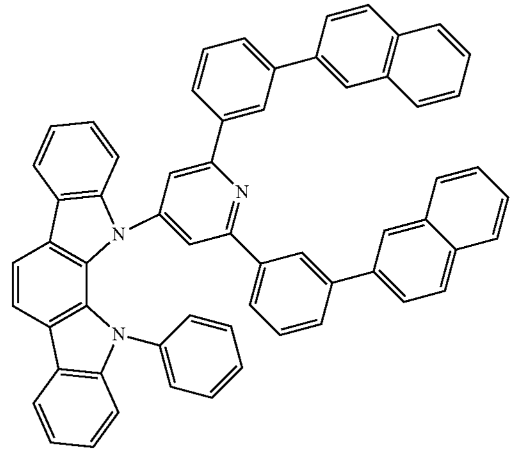
201
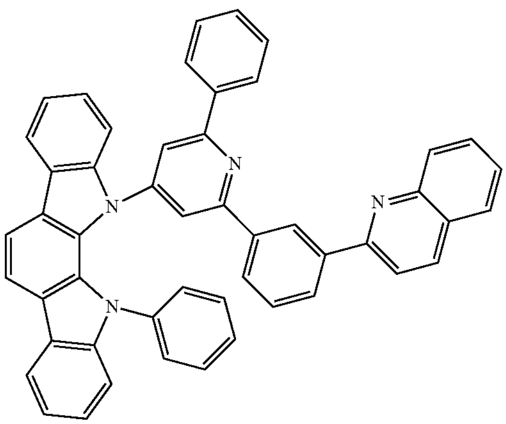
202
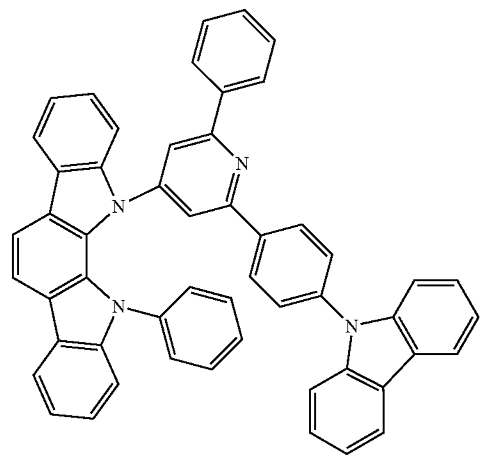
203
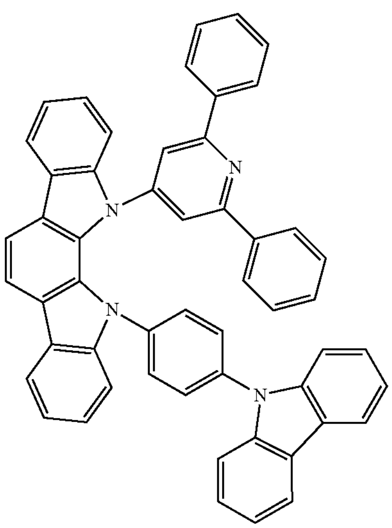
204
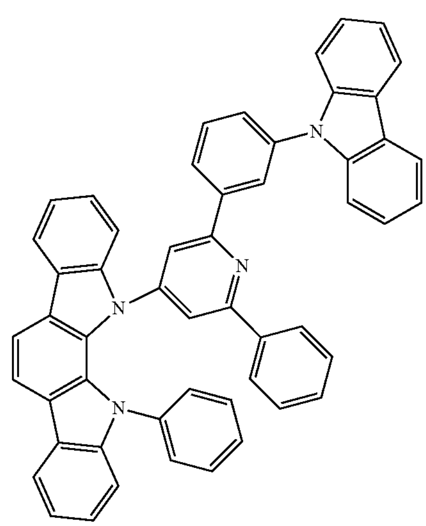

-continued
205
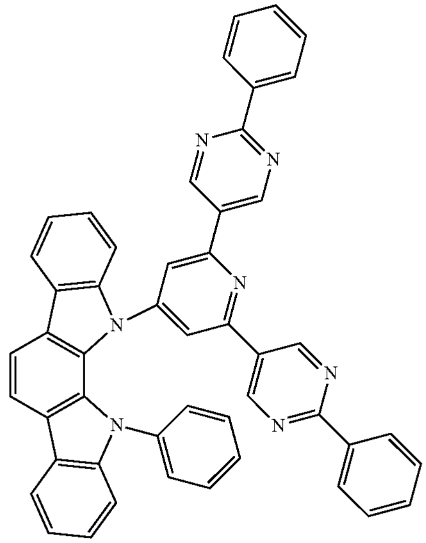
206
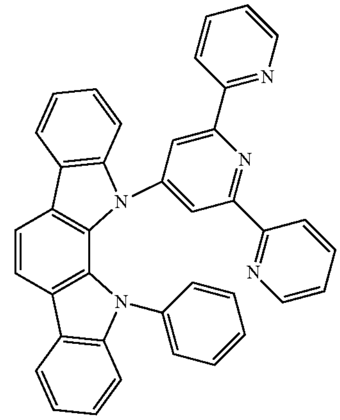
207
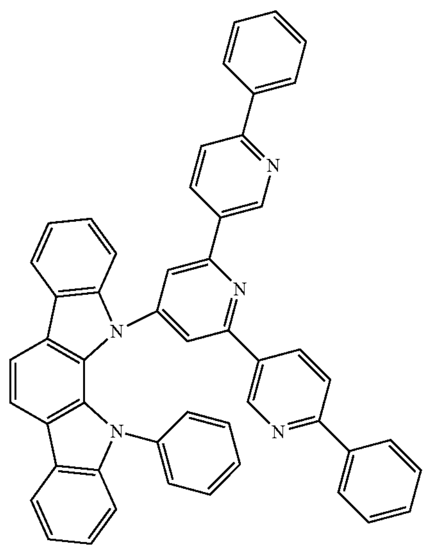
208
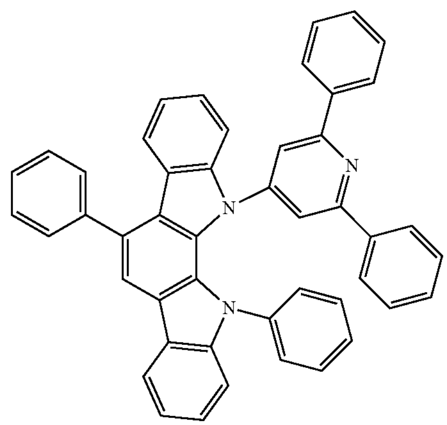
209
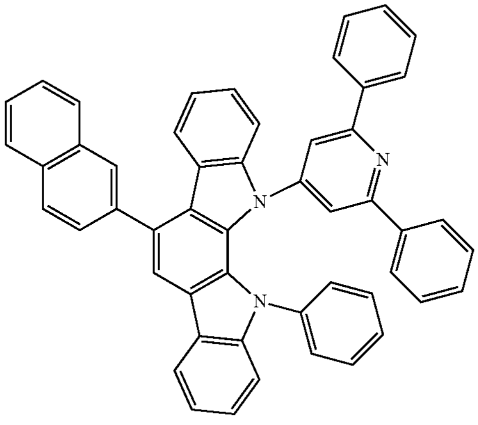

-continued
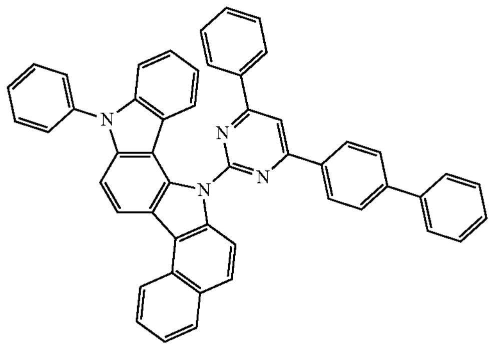
210
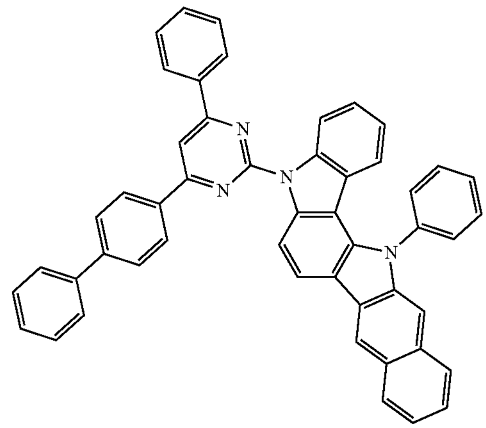
211
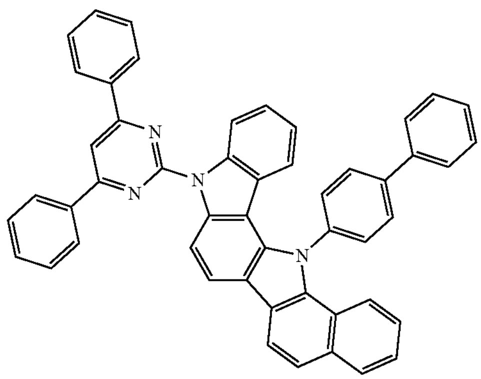
212
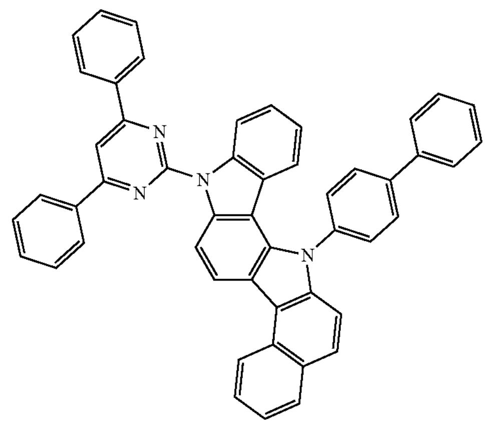
213
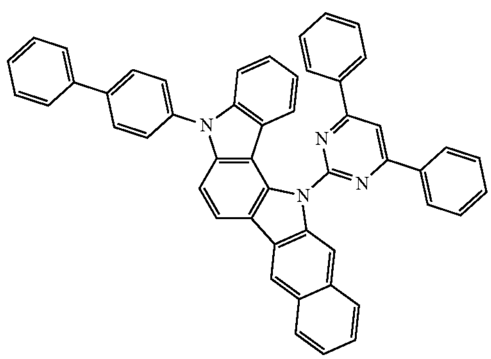
214
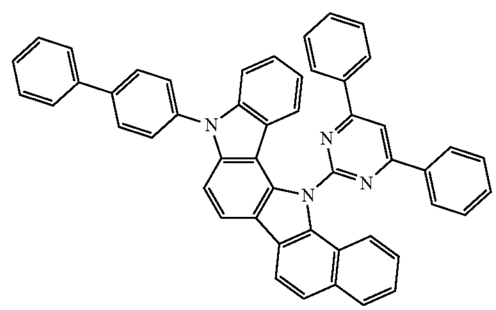
215
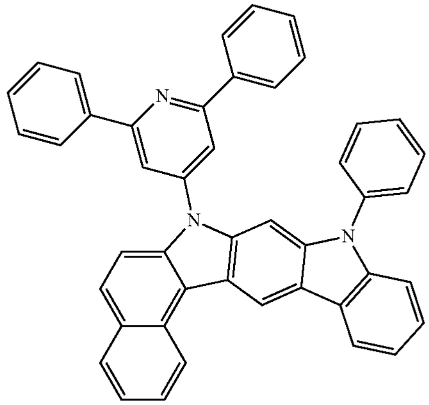
216
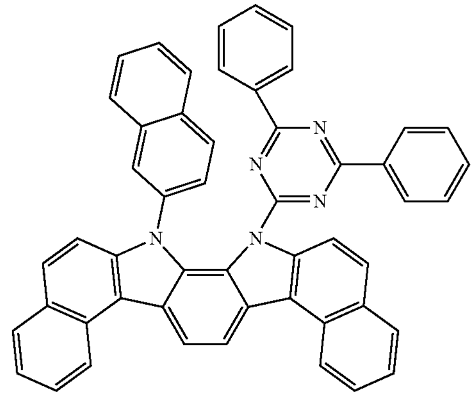
217

-continued
218
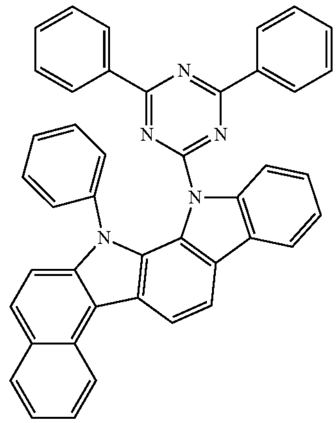
219
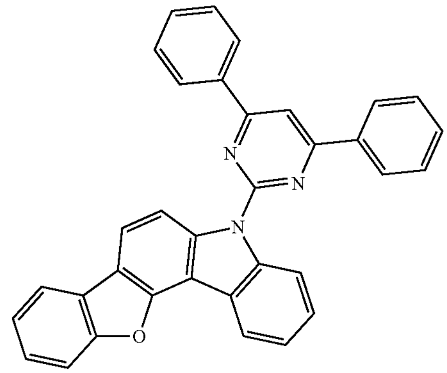
220
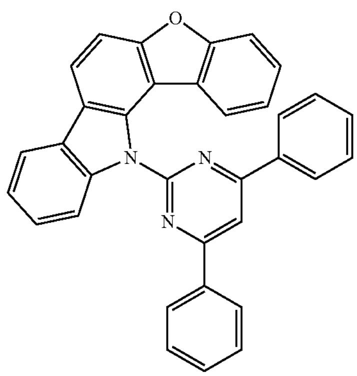
221
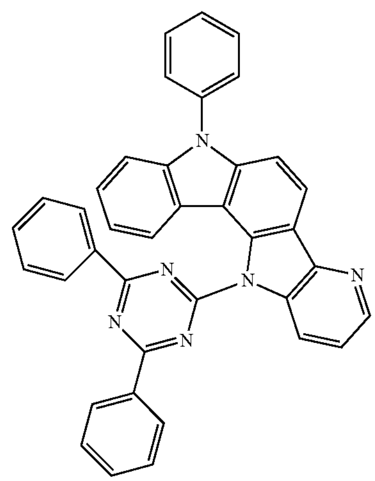
222
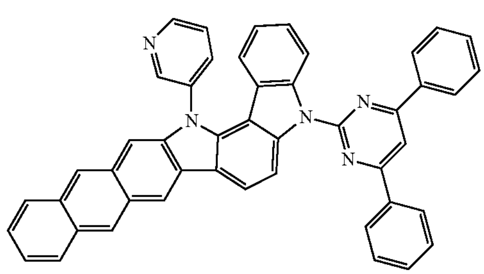
223
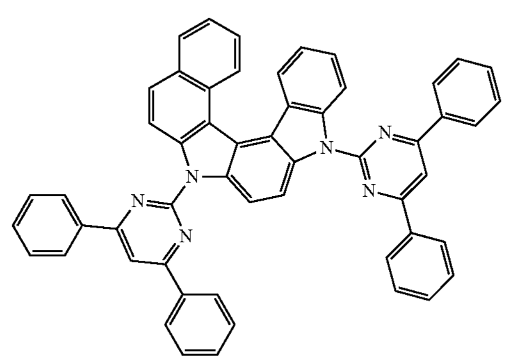

-continued
224
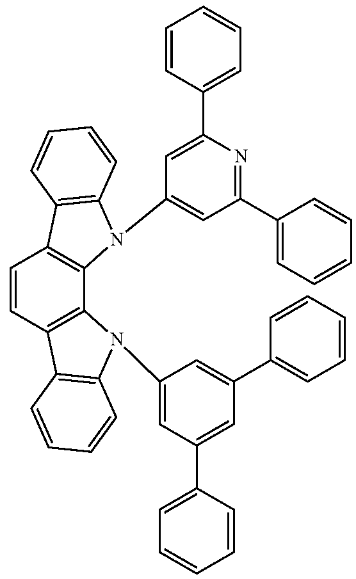
225
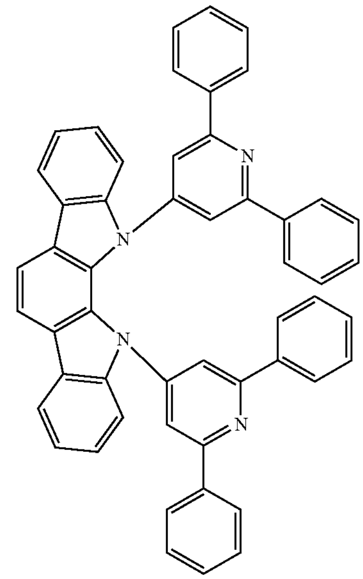
226
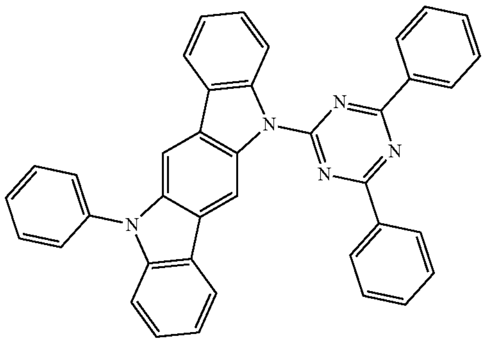
227
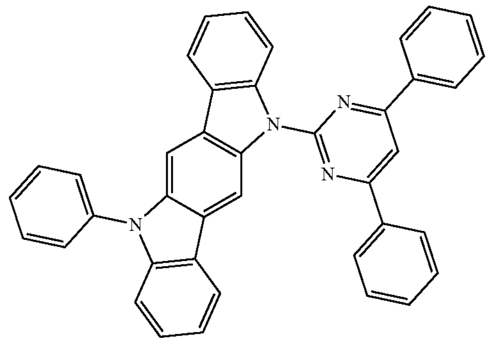
228
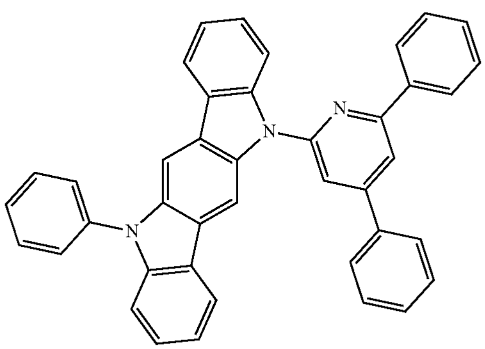
229
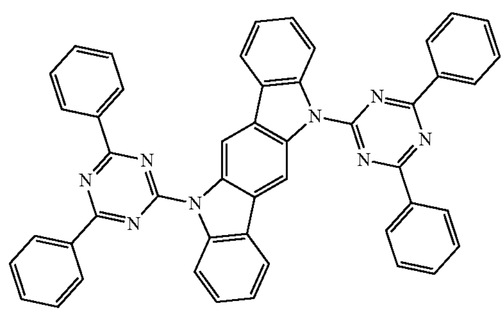
230
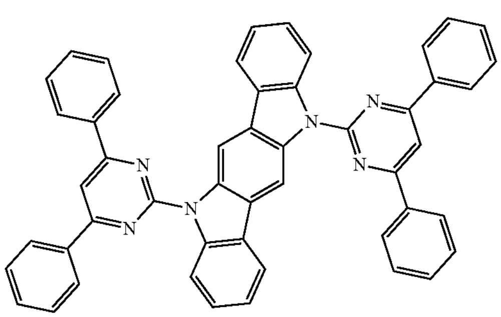
231
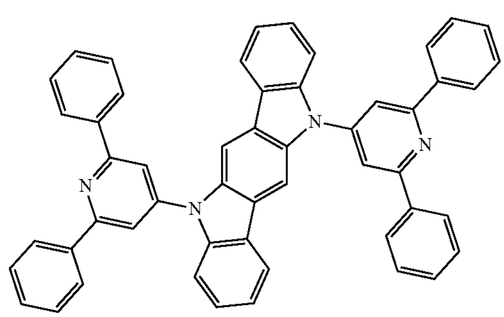

-continued
232
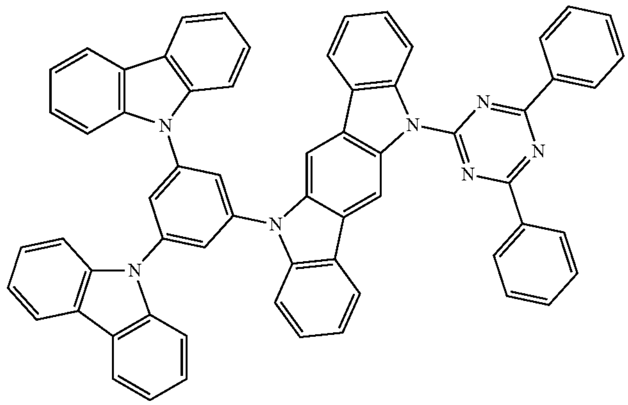
233
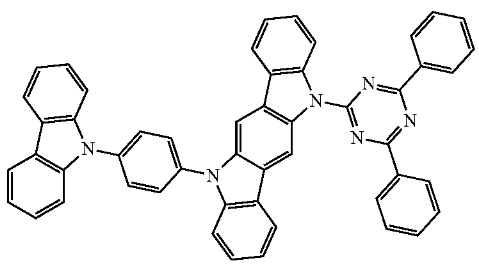
234
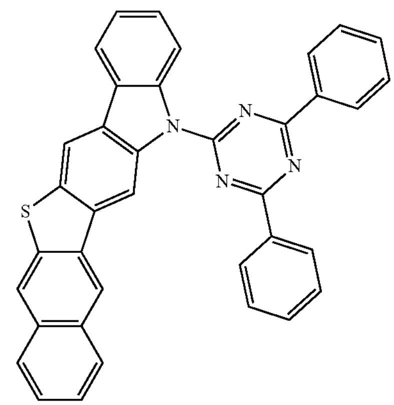
235
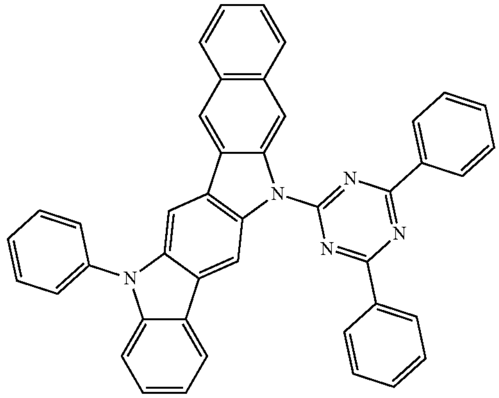
236
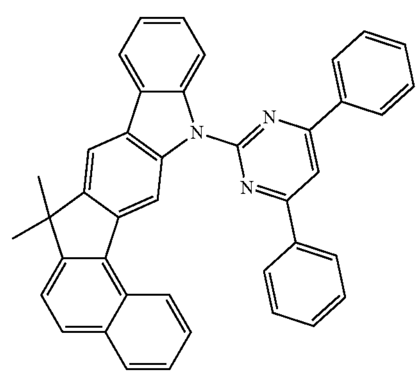

In some embodiments, the EML of the organic light-emitting device may include at least one (compound) selected from carbazole-based compounds represented by Formula 1, and at least one (compound) selected from heterocyclic compounds represented by Formulae 10A, 10B, 10C, 10D, and 10E:

Formula 1

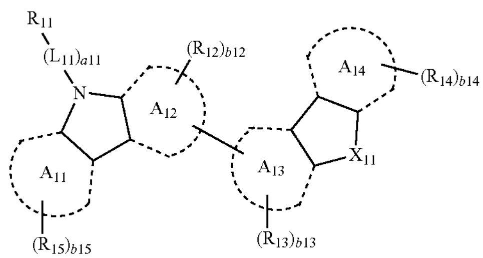

Formula 10A

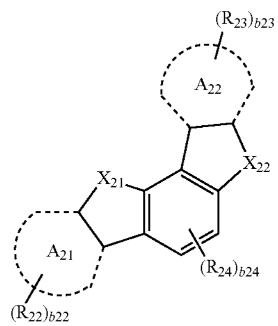

Formula 10B

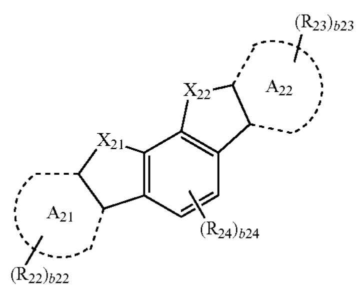

Formula 10C

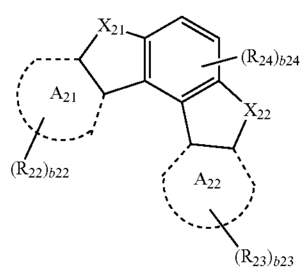

Formula 10D

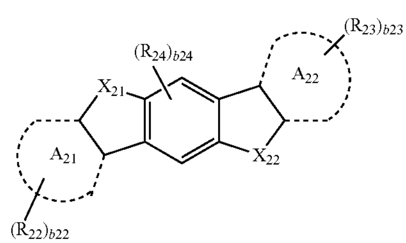

-continued

Formula 10E

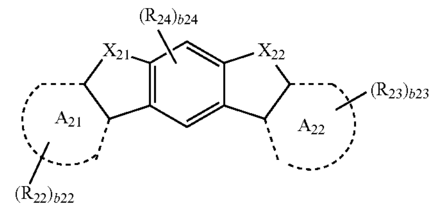

In Formulae 1, and 10A, 10B, 10C, 10D, and 10E, $A_{11}$ to $A_{14}$, $A_{21}$, and $A_{22}$ may be each independently selected from benzene, naphthalene, pyridine, pyrimidine, pyrazine, quinoline, isoquinoline, 2,6-naphthyridine, 1,8-naphthyridine, 1,5-naphthyridine, 1,6-naphthyridine, 1,7-naphthyridine, 2,7-naphthyridine, quinoxaline, phthalazine, and quinazoline.

For example, in Formulae 1, and 10A, 10B, 10C, 10D, and 10E, $A_{11}$ to $A_{14}$, $A_{21}$, and $A_{22}$ may be each independently selected from, but not limited to, benzene, naphthalene, pyridine, pyrimidine, pyrazine, quinoline, and isoquinoline.

For example, in Formula 1, $A_{11}$ to $A_{14}$ may be each independently selected from, but not limited to, benzene and naphthalene. For example, in Formula 1, $A_{11}$ and $A_{14}$ may be each independently naphthalene or benzene, and $A_{12}$ and $A_{13}$ may be each independently benzene. However, embodiments of the present disclosure are not limited thereto. For example, in Formula 1, $A_{11}$ to $A_{14}$ may be each independently benzene, but are not limited thereto.

For example, in Formulae 10A, 10B, 10C, 10D, and 10E, $A_{21}$ and $A_{22}$ may be each independently selected from benzene, naphthalene, and pyridine, but are not limited thereto.

In Formula 1, $X_{11}$ may be O, S, $C(R_{16})(R_{17})$, $Si(R_{16})(R_{17})$, $P(R_{16})$, $B(R_{16})$, $P(=O)(R_{16})$, or $N(R_{16})$, wherein $R_{16}$, and $R_{17}$ may be each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and $-N(Q_{11})(Q_{12})$; and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, wherein $Q_{11}$ and $Q_{12}$ may be each independently selected from, a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group. However, embodiments of the present disclosure are not limited thereto.

For example, in Formula 1, $X_{11}$ may be O, S, $C(R_{16})(R_{17})$, or $N(R_{16})$, wherein $R_{16}$ and $R_{17}$ may be optionally linked to each other to form a saturated or unsaturated ring, and $R_{16}$ and $R_{17}$ may be each independently selected from:

a hydrogen, a $C_1$-$C_{60}$ alkyl group, a $C_6$-$C_{60}$ aryl group, and —N($Q_{11}$)($Q_{12}$); and a $C_1$-$C_{60}$ alkyl group and a $C_6$-$C_{60}$ aryl group, each substituted with at least one selected from a deuterium, —F, —Cl, —Br, —I, a $C_1$-$C_{60}$ alkyl group, a $C_6$-$C_{60}$ aryl group, and monovalent nonaromatic condensed polycyclic group, wherein $Q_{11}$ and $Q_{12}$ may be each independently selected from a hydrogen, a $C_1$-$C_{60}$ alkyl group, and a $C_6$-$C_{60}$ aryl group. However, embodiments of the present disclosure are not limited thereto.

For example, in Formula 1, $X_{11}$ may be O, S, C($R_{16}$)($R_{17}$), or N($R_{16}$), wherein $R_{16}$ and $R_{17}$ may be each independently selected from:

a hydrogen, a methyl group, an ethyl group, a phenyl group, and a naphthyl group; and a phenyl group and a naphthyl group, each substituted with at least one selected from a deuterium, —F, —Cl, —Br, —I, an alkyl group, a methyl group, a phenyl group, and a naphthyl group. However, embodiments of the present disclosure are not limited thereto.

In Formula 1, $L_{11}$ may be selected from:

a N-containing $C_1$-$C_{60}$ heteroarylene group; and a $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formula 1, $L_{11}$ may be selected from, but not limited to, a pyrrolylene group, an imidazolylene group, a pyrazolylene group, a pyridinylene group, a pyrazinylene group, a pyrimidinylene group, an indolylene group, a quinolinylene group, an isoquinolinylene group, a benzoquinolinylene group, a phenanthridinylene group, an acridinylene group, a phenanthrolinylene group, a triazolylene group, and a tetrazolylene group; and a pyrrolylene group, an imidazolylene group, a pyrazolylene group, a pyridinylene group, a pyrazinylene group, a pyrimidinylene group, an indolylene group, a quinolinylene group, an isoquinolinylene group, a benzoquinolinylene group, a phenanthridinylene group, an acridinylene group, a phenanthrolinylene group, a triazolylene group, and a tetrazolylene group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formula 1, $L_{11}$ may be selected from, but not limited to, a pyridinylene group, a pyrazinylene group, a pyrimidinylene group, an indolylene group, a quinolinylene group, an isoquinolinylene group, a phenanthridinylene group, an acridinylene group, a phenanthrolinylene group, a triazolylene group, and a tetrazolylene group; and a pyridinylene group, a pyrazinylene group, a pyrimidinylene group, an indolylene group, a quinolinylene group, an isoquinolinylene group, a phenanthridinylene group, an acridinylene group, a phenanthrolinylene group, a triazolylene group, and a tetrazolylene group, each substituted with at least one selected from a deuterium, —F, —Cl, —Br, —I, a $C_1$-$C_{20}$ alkyl group, a phenyl group, and a naphthyl group.

For example, in Formula 1, $L_{11}$ may be selected from the groups represented by Formulae 3-9 to 3-26, but is not limited thereto:

3-9

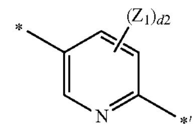

3-10

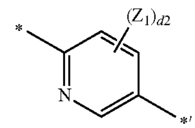

3-11

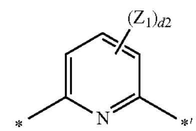

3-12

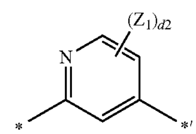

3-13

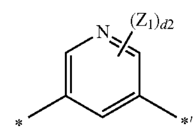

3-14

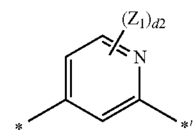

3-15

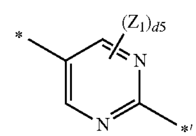

3-16

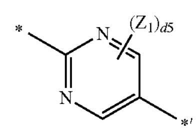

3-17

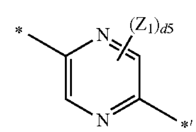

3-18

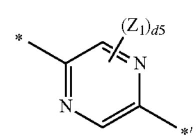

3-19

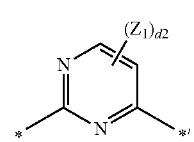

-continued 3-20

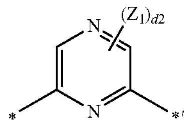

3-21

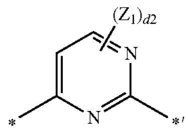

3-22

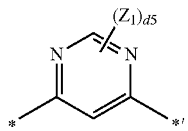

3-23

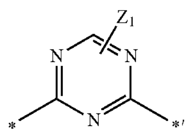

3-24

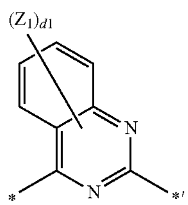

3-25

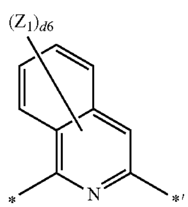

3-26

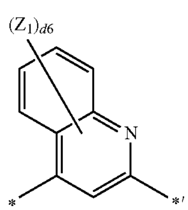

In Formulae 3-9 to 3-26, $Z_1$ and $Z_2$ may be each independently selected from a hydrogen, a deuterium, —F, —Cl, —Br, —I, a $C_1$-$C_{20}$ alkyl group, a phenyl group, and a naphthyl group;

d1 may be an integer selected from 1 to 4;

d2 may be an integer selected from 1 to 3;

d3 may be an integer selected from 1 to 6;

d4 may be an integer selected from 1 to 8;

d5 may be 1 or 2;

d6 may be an integer selected from 1 to 5; and

* and *' each indicate a binding site with an adjacent atom.

For example, in Formula 1, $L_{11}$ may be selected from the groups represented by Formulae 4-9 to 4-14, but is not limited thereto:

4-9

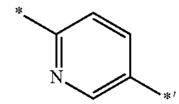

4-10

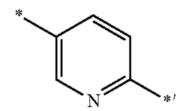

4-11

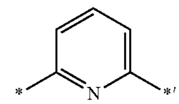

4-12

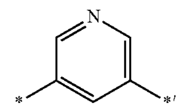

4-13

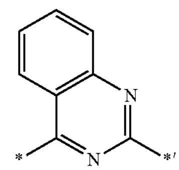

4-14

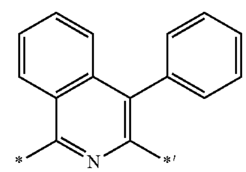

In Formulae 4-9 to 4-14, * and *' each indicate a binding site with an adjacent atom.

In Formula 1, a11 may be an integer selected from 0 to 5. For example, in Formula 1, a11 may be an integer of 1.

In Formula 1, $R_{11}$ may be selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, wherein $Q_{11}$ and $Q_{12}$ may be each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group.

For example, in Formula 1, $R_{11}$ may be selected from:

a hydrogen, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —N($Q_{11}$)($Q_{12}$); and a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, wherein $Q_{11}$ and $Q_{12}$ may be each independently selected from a $C_6$-$C_{60}$ aryl group, and a $C_6$-$C_{60}$ aryl group substituted with a $C_6$-$C_{60}$ aryl group. However, embodiments of the present disclosure are not limited thereto.

For example, in Formula 1, $R_{11}$ may be selected from a hydrogen, and groups represented by Formulae H1 to H28, H37 to H41, H68 to H76, and H80, but is not limited thereto:

H1

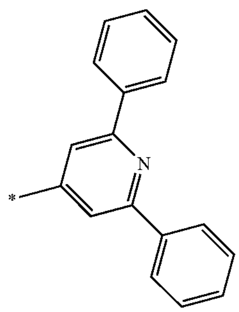

H2

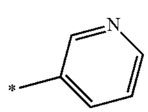

H3

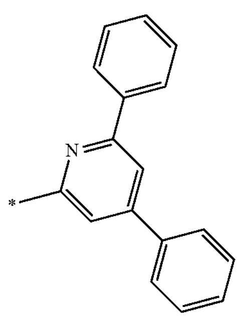

H4

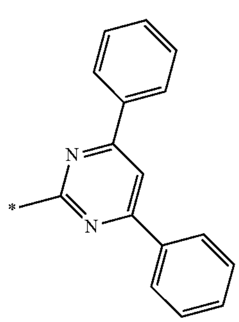

-continued

H5

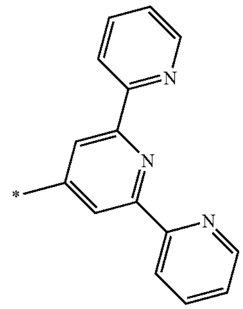

H6

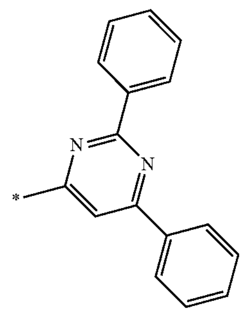

H7

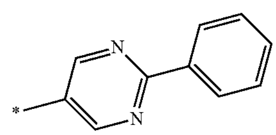

H8

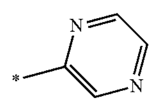

H9

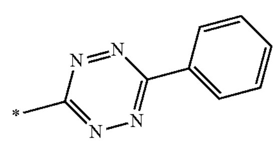

H10

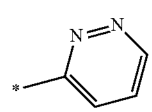

H11

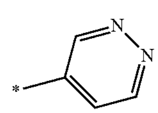

H12

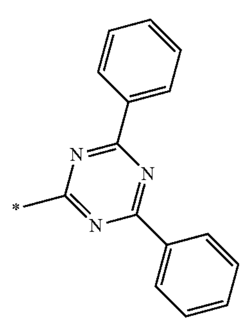

-continued
H13
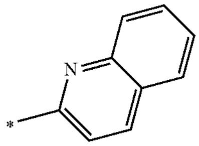
H14
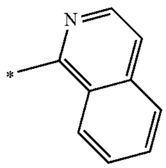
H15
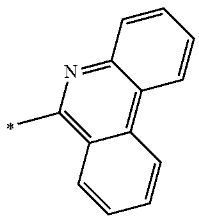
H16
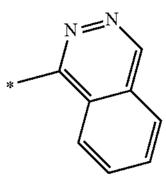
H17
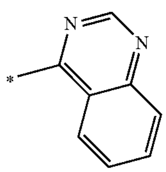
H18
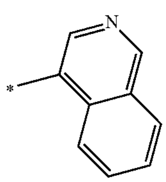
H19
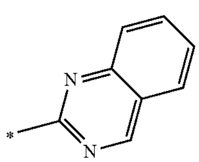
H20
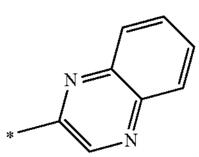
H21
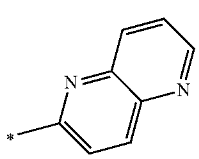
-continued
H22
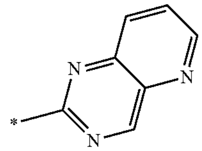
H23
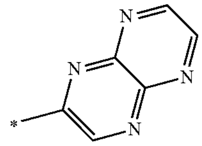
H24
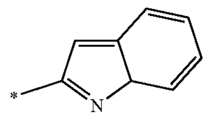
H25
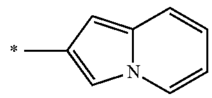
H26
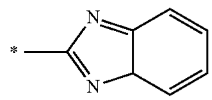
H27
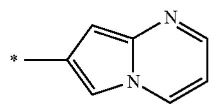
H28
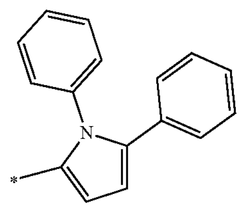
H29
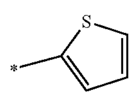
H30
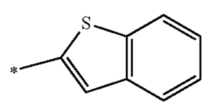
H31
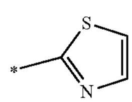
H32
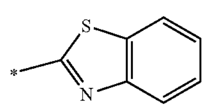
H33
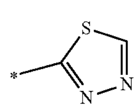
H34
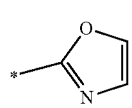

-continued
H35
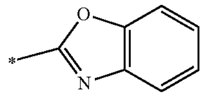
H36
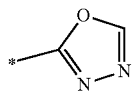
H37
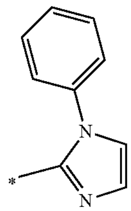
H38
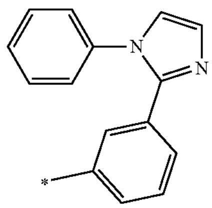
H39
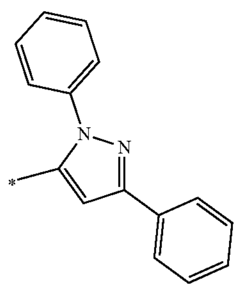
H40
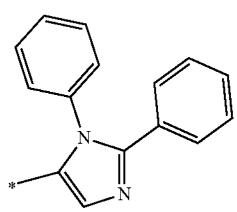
H41
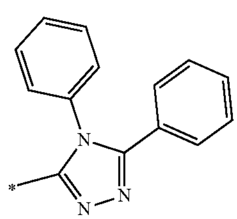
H42
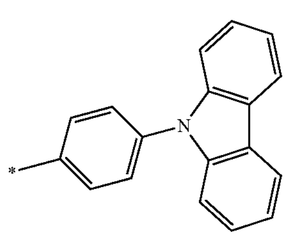
-continued
H43
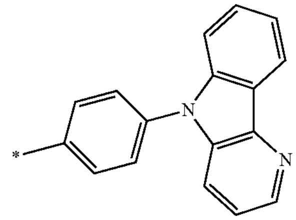
H44
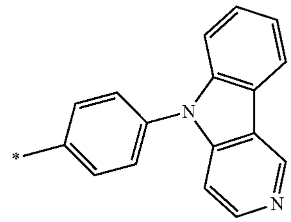
H45
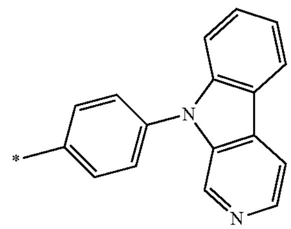
H46
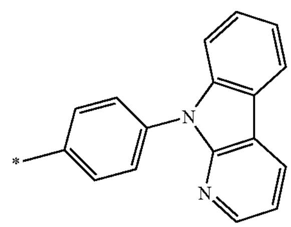
H47
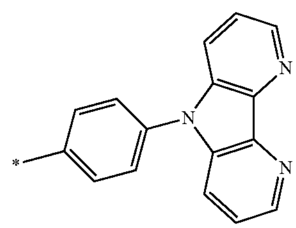
H48
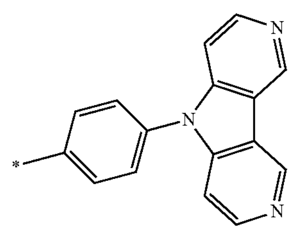
H49
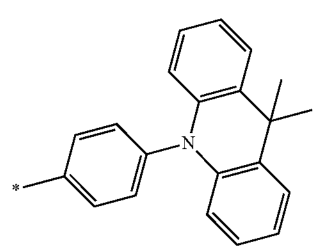

-continued
H50
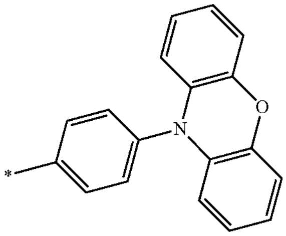
H51
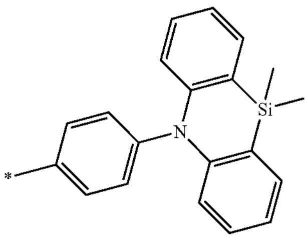
H52
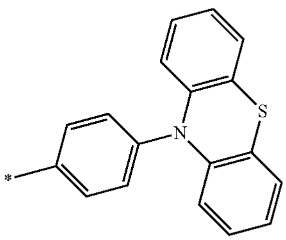
H53
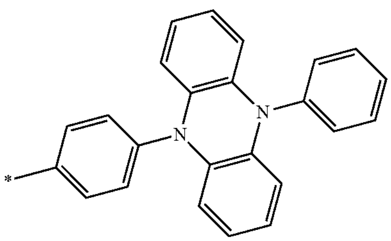
H54
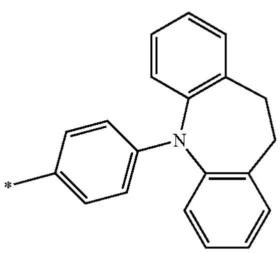
H55
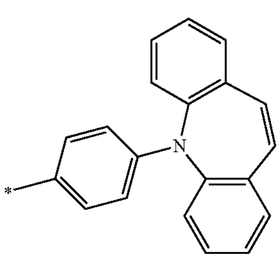
-continued
H56
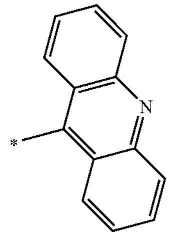
H57
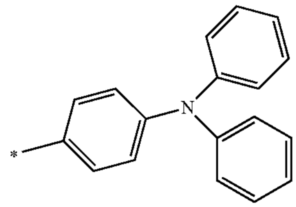
H58
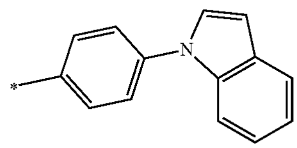
H59
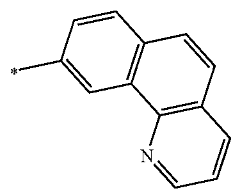
H60
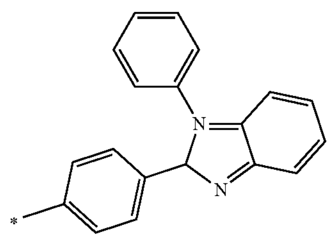
H61
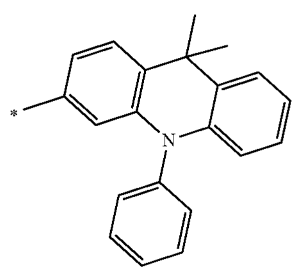
H62
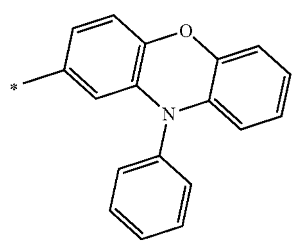

-continued
H63
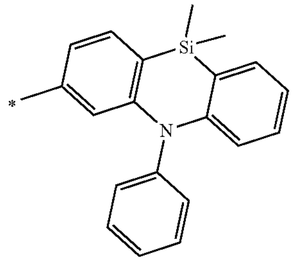
H64
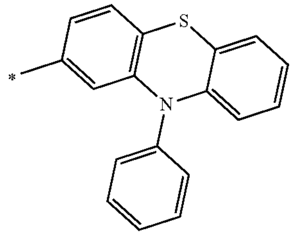
H65
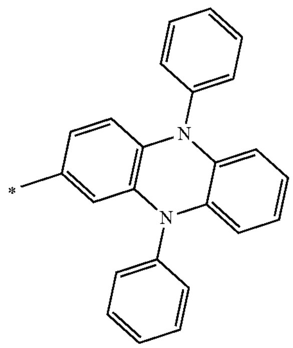
H66
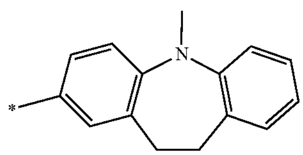
H67
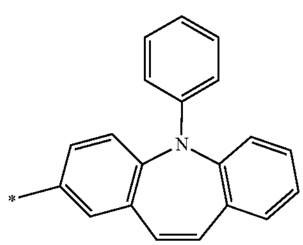
H68
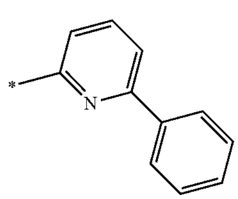
-continued
H69
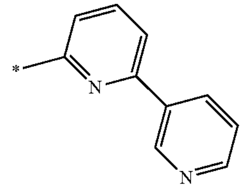
H70
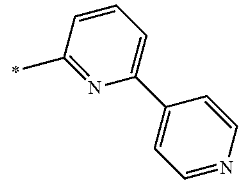
H71
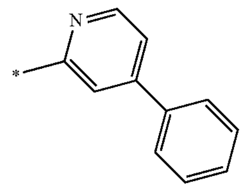
H72
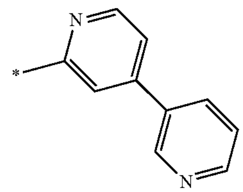
H73
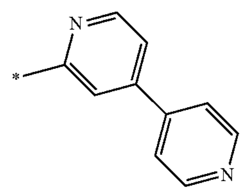
H74
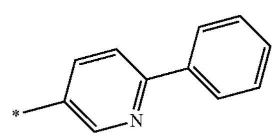
H75
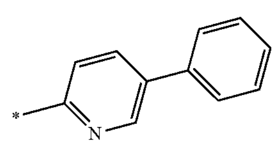
H76
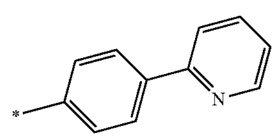
H77
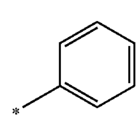

-continued

H78

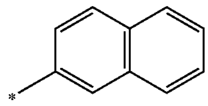

H79

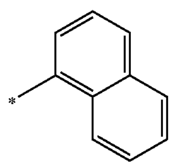

H80

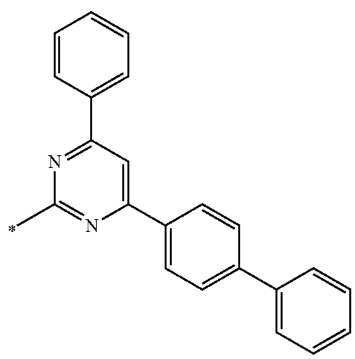

H81

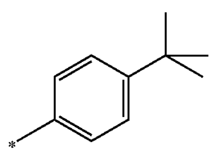

In Formulae H1 to H81, * indicates a binding site with an adjacent atom.

In Formulae 10A, 10B, 10C, 10D, and 10E, $X_{21}$ and $X_{22}$ may be each independently N-$(L_{21})_{a21}$-$R_{21}$, O, S, C($R_{25}$)($R_{26}$), Si($R_{25}$)($R_{26}$), P($R_{25}$), B($R_{25}$), or P(═O)($R_{25}$), wherein $R_{25}$ and $R_{26}$ may be each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, except for (i.e., the substituent does not include) a nitrogen (N)-containing $C_1$-$C_{60}$ heteroaryl group, and a nitrogen (N)-containing $C_1$-$C_{60}$ heteroaryl group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, wherein $Q_{11}$ and $Q_{12}$ may be each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group.

For example, in Formulae 10A, 10B, 10C, 10D, and 10E, $X_{21}$, and $X_{22}$ may be each independently N-$(L_{21})_{a21}$-$R_{21}$, O, S, or C($R_{25}$)($R_{26}$), wherein $R_{25}$ and $R_{26}$ may be optionally linked to each other to form a saturated ring or a unsaturated ring, and $R_{25}$ and $R_{26}$ may be each independently selected from:

a hydrogen, a $C_1$-$C_{60}$ alkyl group, a $C_6$-$C_{60}$ aryl group, and —N($Q_{11}$)($Q_{12}$); and a $C_1$-$C_{60}$ alkyl group and a $C_6$-$C_{60}$ aryl group, each substituted with at least one selected from a deuterium, —F, —Cl, —Br, —I, a $C_1$-$C_{60}$ alkyl group, a $C_6$-$C_{60}$ aryl group, and monovalent nonaromatic condensed polycyclic group, wherein $Q_{11}$ and $Q_{12}$ may be each independently selected from a hydrogen, a $C_1$-$C_{60}$ alkyl group, and a $C_6$-$C_{60}$ aryl group. However, embodiments of the present disclosure are not limited thereto.

For example, in Formulae 10A, 10B, 10C, 10D, and 10E, $X_{21}$ and $X_{22}$ may be each independently N-$(L_{21})_{a21}$-$R_{21}$, O, S, or C($R_{25}$)($R_{26}$), wherein $R_{25}$, and $R_{26}$ may be each independently selected from:

a hydrogen, a methyl group, an ethyl group, a phenyl group, and a naphthyl group; and a phenyl group and a naphthyl group, each substituted with at least one selected from a deuterium, —F, —Cl, —Br, —I, an alkyl group, a methyl group, a phenyl group, and a naphthyl group. However, embodiments of the present disclosure are not limited thereto.

In Formulae 10A, 10B, 10C, 10D, and 10E, $L_{21}$ may be selected from:

a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_1$-$C_{60}$ heteroarylene group, a divalent nonaromatic condensed polycyclic group, and a divalent nonaromatic condensed heteropolycyclic group; and a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_2$-$C_{60}$ heteroarylene group, a divalent nonaromatic condensed polycyclic group, and a divalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, except for (i.e., the substituent does not include) nitrogen (N)-containing $C_1$-$C_{60}$ heteroarylene group, and a nitrogen (N)-containing $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formulae 10A, 10B, 10C, 10D, and 10E, $L_{21}$ may be selected from, but not limited to, a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, and an ovalenylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, and an ovalenylene group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

For example, in Formulae 10A, 10B, 10C, 10D, and 10E, $L_{21}$ may be selected from, but not limited to, a phenylene group, a naphthylene group, a fluorenylene group, a spiro-fluorenylene group, a benzofluorenylene group, a dibenzofluorenylene group, a phenanthrenylene group, an anthracenylene group, a triphenylenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a triphenylenylene group, a pyrenylene group, and a chrysenylene group, each substituted with at least one selected from a deuterium, —F, —Cl, —Br, —I, a $C_1$-$C_{20}$ alkyl group, a phenyl group, and a naphthyl group.

For example, in Formulae 10A, 10B, 10C, 10D, and 10E, $L_{21}$ may be selected from the groups represented by Formulae 3-1 to 3-8, but is not limited thereto:

3-1

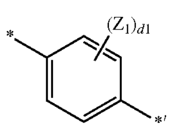

3-2

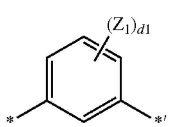

3-3

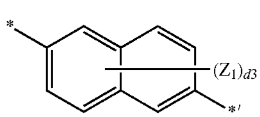

3-4

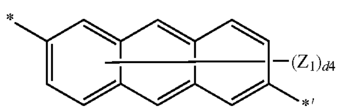

3-5

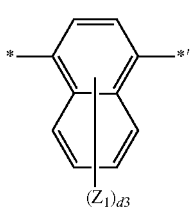

-continued 3-6

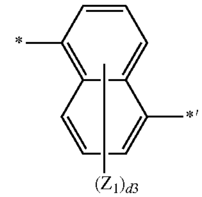

3-7

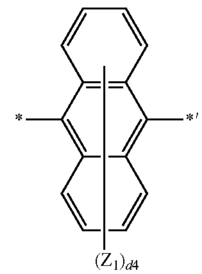

3-8

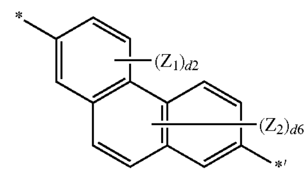

In Formulae 3-1 to 3-8, $Z_1$ and $Z_2$ may be each independently selected from a hydrogen, a deuterium, —F, —Cl, —Br, —I, a $C_1$-$C_{20}$ alkyl group, a phenyl group, and a naphthyl group;

d1 may be an integer selected from 1 to 4;

d2 may be an integer selected from 1 to 3;

d3 may be an integer selected from 1 to 6;

d4 may be an integer selected from 1 to 8;

d6 may be an integer selected from 1 to 5; and

* and *' each indicate a binding site with an adjacent atom.

For example, in Formulae 10A, 10B, 10C, 10D, and 10E, $L_{21}$ may be selected from the groups represented by Formulae 4-1 to 4-8, but is not limited thereto:

4-1

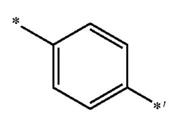

4-2

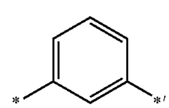

4-3

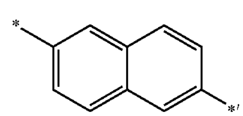

4-4

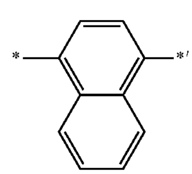

-continued 4-5

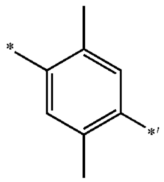

4-6

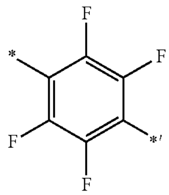

4-7

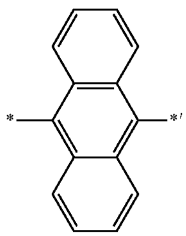

4-8

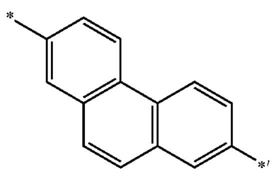

In Formulae 4-1 to 4-8, * and *' each indicate a binding site with an adjacent atom.

In Formulae 10A, 10B, 10C, 10D, and 10E, a21 may be an integer selected from 0 to 5. For example, in Formulae 10A, 10B, 10C, 10D, and 10E, a21 may be 0 or 1. However, embodiments of the present disclosure are not limited thereto.

In Formulae 10A, 10B, 10C, 10D, and 10E, $R_{21}$ may be selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, and —N($Q_{11}$)($Q_{12}$); and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, except for a nitrogen (N)-containing $C_1$-$C_{60}$ heteroaryl group, and a nitrogen (N)-containing $C_1$-$C_{60}$ heteroaryl group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group, wherein $Q_{11}$ and $Q_{12}$ may be each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group.

For example, in Formulae 10A, 10B, 10C, 10D, and 10E, $R_{21}$ may be selected from:

a $C_6$-$C_{60}$ aryl group, a monovalent nonaromatic condensed polycyclic group, a monovalent nonaromatic condensed heteropolycyclic group, and —N($Q_{11}$)($Q_{12}$); and a $C_6$-$C_{60}$ aryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, and a $C_6$-$C_{60}$ aryl group, wherein $Q_{11}$, and $Q_{12}$ may be each independently selected from a $C_6$-$C_{60}$ aryl group, and a $C_6$-$C_{60}$ aryl group substituted with a $C_6$-$C_{60}$ aryl group. However, embodiments of the present disclosure are not limited thereto.

For example, in Formulae 10A, 10B, 10C, 10D, and 10E, $R_{21}$ may be selected from:

a phenyl group, a naphthyl group, an anthracenyl group, a triphenylenyl group, a phenanthrenyl group, a pyrenyl group, a chrysenyl group, a fluorenyl group, a carbazolyl group, a dibenzofuranyl group, and a dibenzothienyl group, and —N($Q_{11}$)($Q_{12}$); and a phenyl group, a naphthyl group, an anthracenyl group, a triphenylenyl group, a phenanthrenyl group, a pyrenyl group, a chrysenyl group, a fluorenyl group, a carbazolyl group, a dibenzofuranyl group, and a dibenzothienyl group, each substituted with at least one selected from a deuterium, —F, —Cl, —Br, —I, a $C_1$-$C_{60}$ alkyl group, and a $C_6$-$C_{60}$ aryl group, wherein $Q_{11}$ and $Q_{12}$ may be each independently selected from:

a phenyl group, a naphthyl group, an anthracenyl group, a triphenylenyl group, a phenanthrenyl group, a pyrenyl group, and a chrysenyl group; and a phenyl group, a naphthyl group, an anthracenyl group, a triphenylenyl group, a phenanthrenyl group, a pyrenyl group, and a chrysenyl group, each substituted with at least one selected from phenyl group, a naphthyl group, an anthracenyl group, a triphenylenyl group, a pyrenyl group, and a chrysenyl group. However, embodiments of the present disclosure are not limited thereto.

For example, in Formulae 10A, 10B, 10C, 10D, and 10E, $R_{21}$ may be selected from the groups represented by Formulae 5-1 to 5-31, but is not limited thereto:

5-1

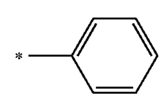

5-2

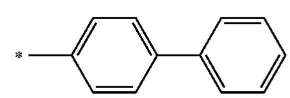

5-3

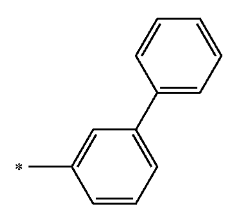

-continued
5-4
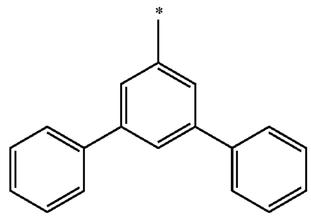
5-5
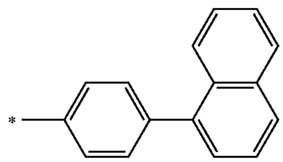
5-6
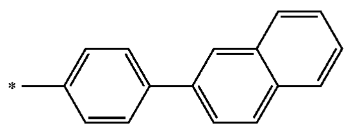
5-7
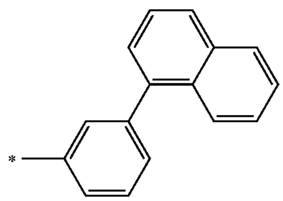
5-8
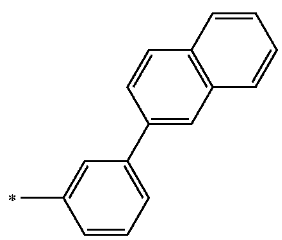
5-9
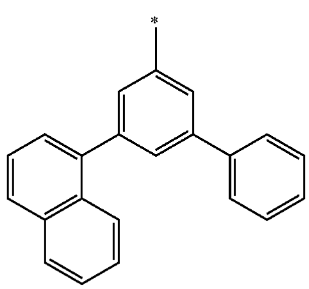
5-10
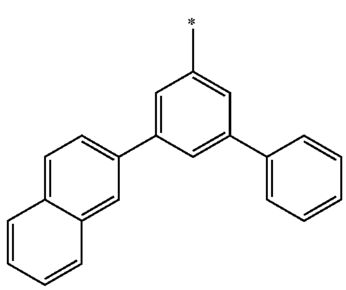
-continued
5-11
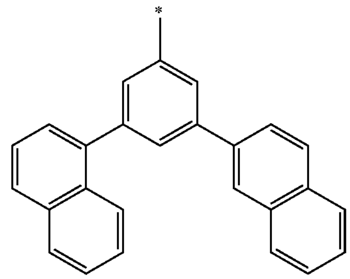
5-12
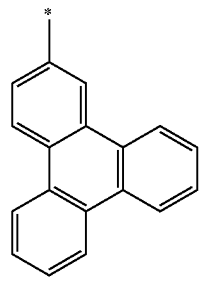
5-13
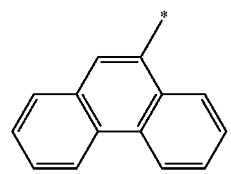
5-14
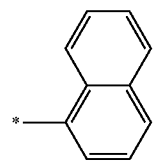
5-15
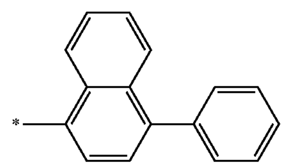
5-16
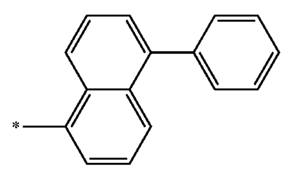
5-17
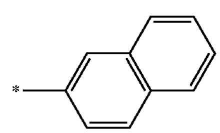
5-18
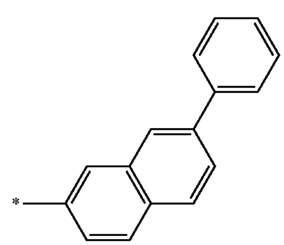

-continued 5-19

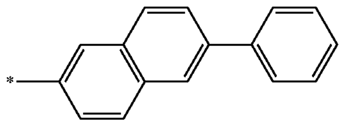

5-20

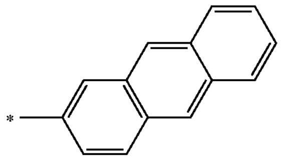

5-21

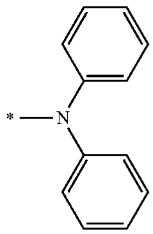

5-22

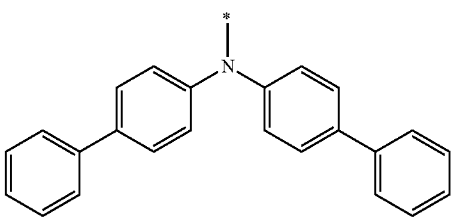

5-23

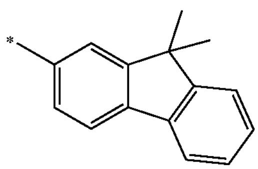

5-24

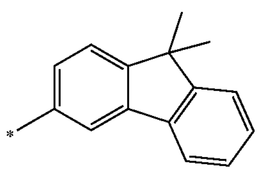

5-25

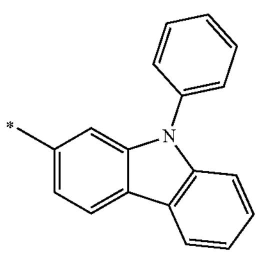

5-26

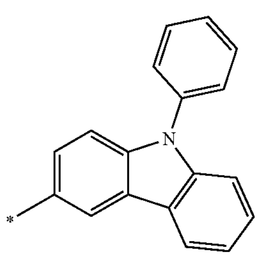

-continued 5-27

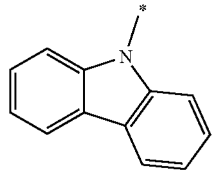

5-28

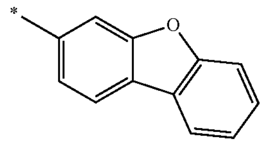

5-29

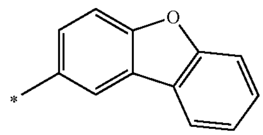

5-30

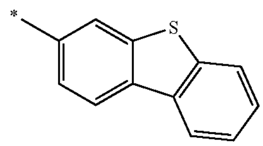

5-31

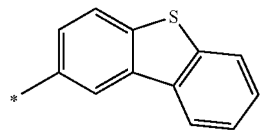

In Formulae 5-1 to 5-31, * indicates a binding site with an adjacent atom.

In Formulae 1, and 10A, 10B, 10C, 10D, and 10E, $R_{12}$ to $R_{15}$, and $R_{22}$ to $R_{24}$ may be each independently selected from:

a hydrogen, a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group; and

—N($Q_{21}$)($Q_{22}$), wherein $Q_{21}$ and $Q_{22}$ may be each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group.

For example, in Formulae 10A, 10B, 10C, 10D, and 10E, $R_{12}$ to $R_{15}$, and $R_{22}$ to $R_{24}$ may be each independently selected from a hydrogen, a deuterium, —F, —Cl, —Br, —I, a $C_1$-$C_{60}$ alkyl group, a $C_6$-$C_{60}$ aryl group, a $C_2$-$C_{60}$ heteroaryl group, and —N($Q_{21}$)($Q_{22}$), wherein $Q_{21}$ and $Q_{22}$ may be each independently selected from a $C_6$-$C_{60}$ aryl group, and a $C_6$-$C_{60}$ aryl group substituted with a $C_6$-$C_{60}$ aryl group. However, embodiments of the present disclosure are not limited thereto.

For example, in Formulae 10A, 10B, 10C, 10D, and 10E, $R_{12}$ to $R_{15}$, and $R_{22}$ to $R_{24}$ may be each independently selected from a hydrogen, a deuterium, —F, —Cl, —Br, —I, a $C_1$-$C_{60}$ alkyl group, a phenyl group, a naphthyl group, a pyridinyl group, a quinolinyl group, and —N($Q_{21}$)($Q_{22}$), wherein $Q_{21}$ and $Q_{22}$ may be each independently selected from a phenyl group, a naphthyl group, and a biphenyl group. However, embodiments of the present disclosure are not limited thereto.

In Formulae 10A, 10B, 10C, 10D, and 10E, b12 to b15, and b22 to b24 may be each independently an integer selected from 1 to 5.

In some embodiments, the carbazole-based compound represented by Formula 1 may be selected from Compounds 101B to 190B, and the heterocyclic compound represented by Formulae 10A, 10B, 10C, 10D, and 10E may be selected from Compounds 301 to 369. However, embodiments of the present disclosure are not limited thereto:

101B

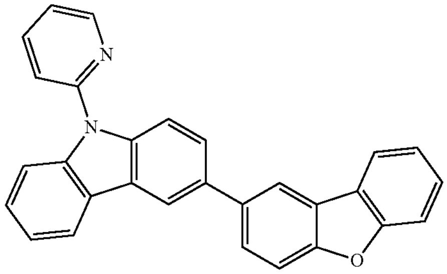

-continued

102B

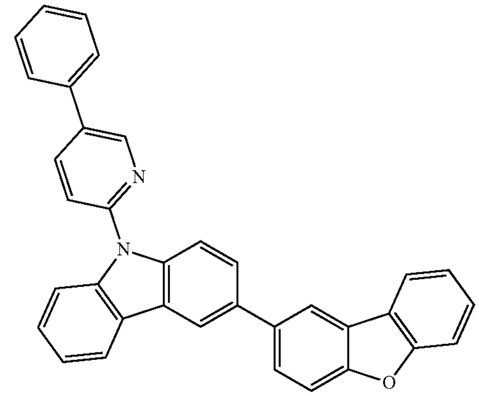

103B

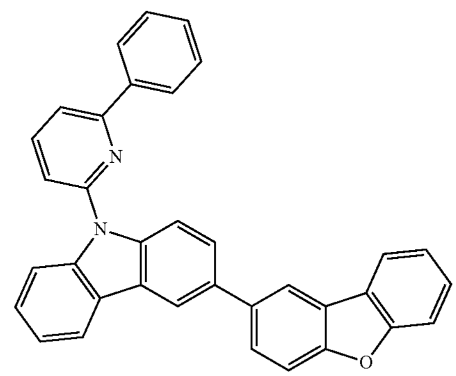

104B

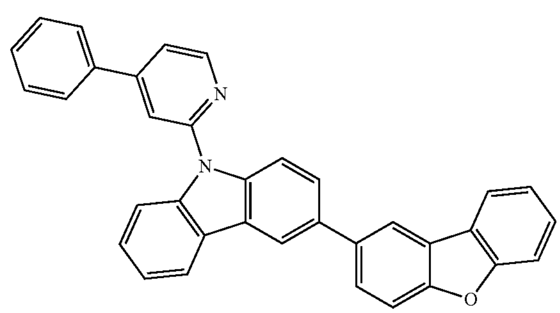

105B

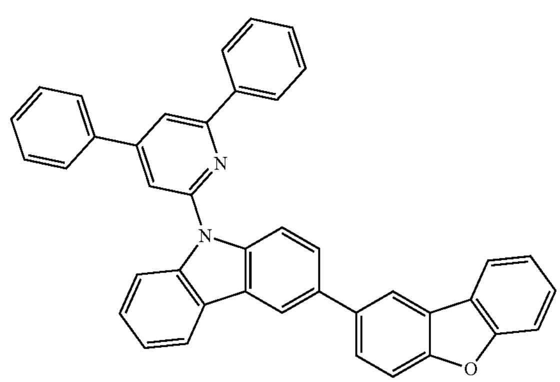

-continued
106B
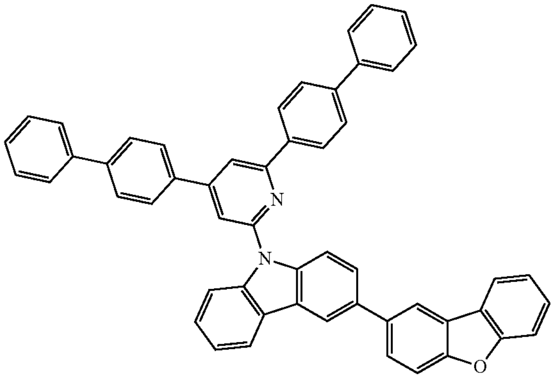
107B
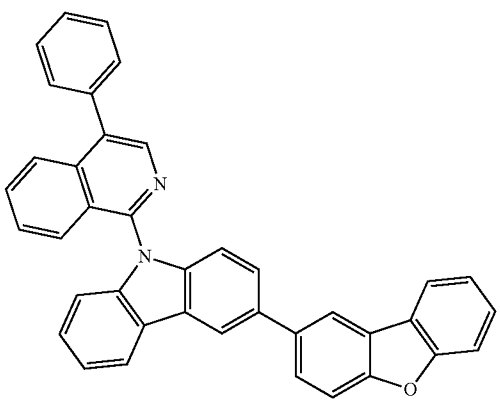
108B
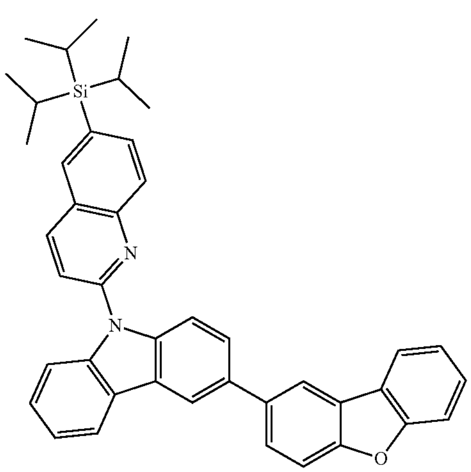
-continued
109B
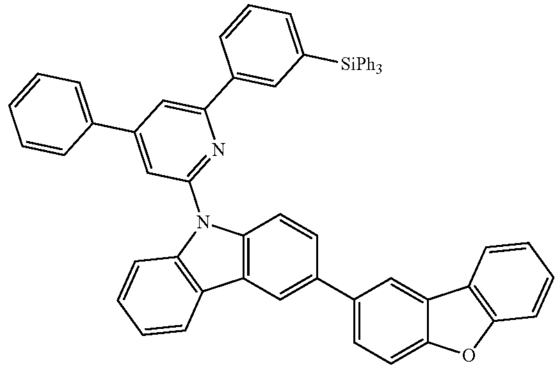
110B
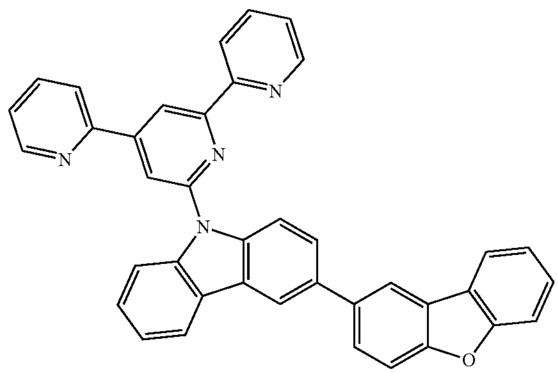
111B
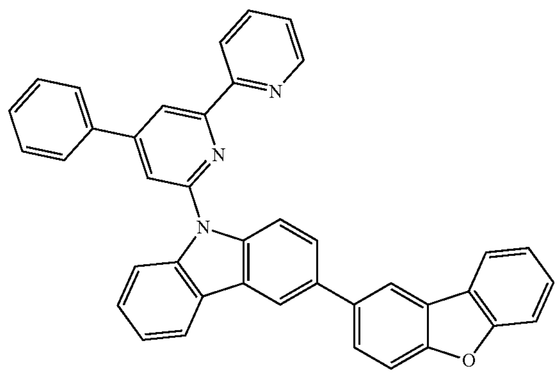
112B
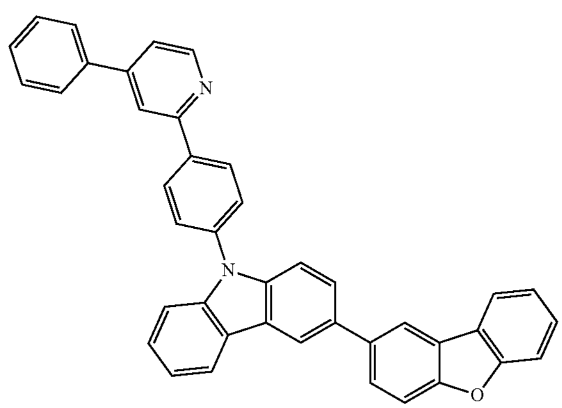

-continued
113B
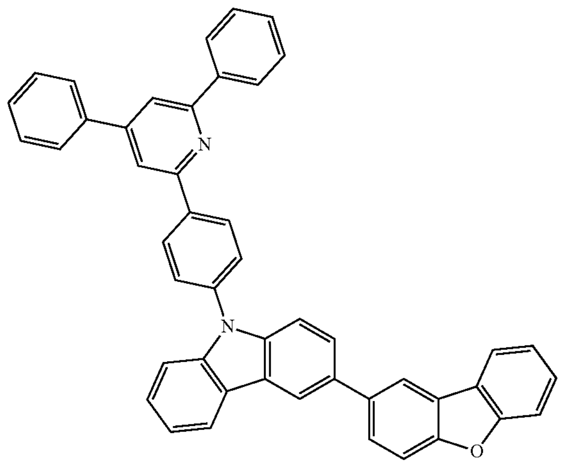
114B
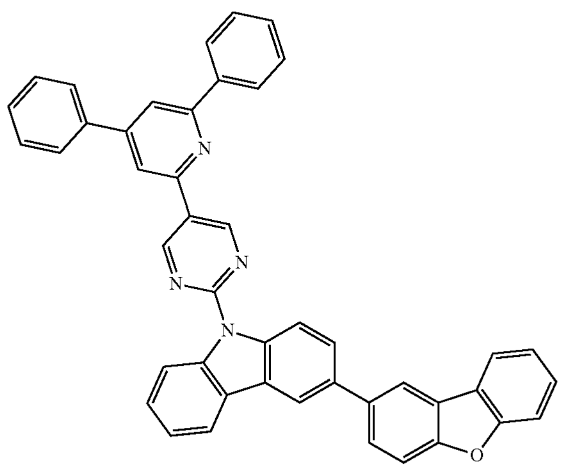
115B
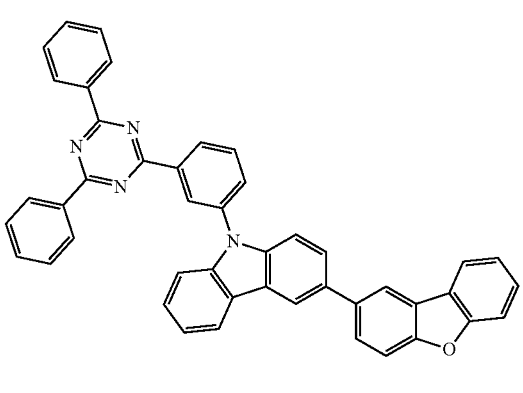
-continued
116B
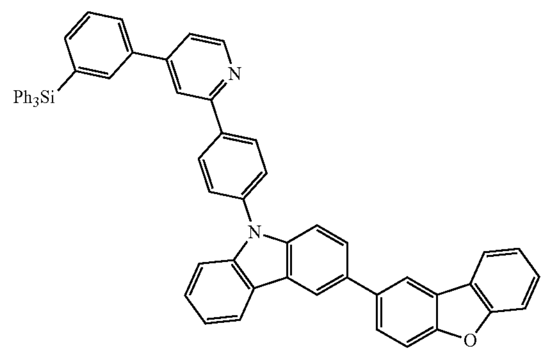
117B
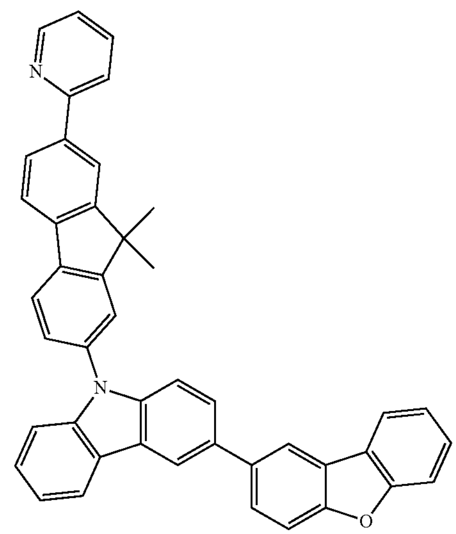
118B
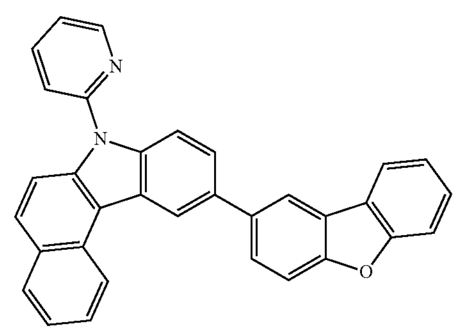
119B
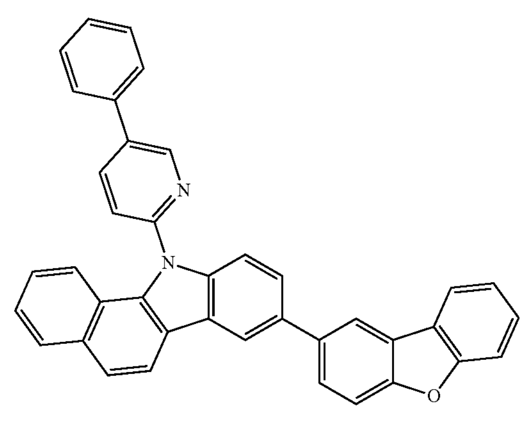

-continued
120B
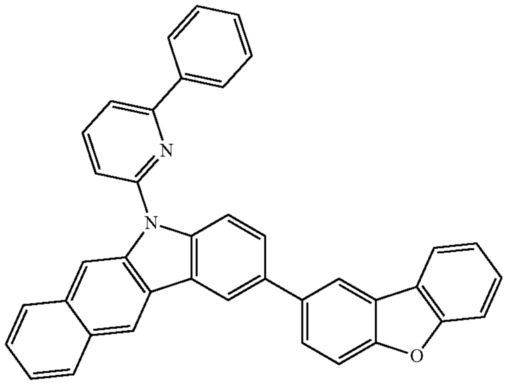
121B
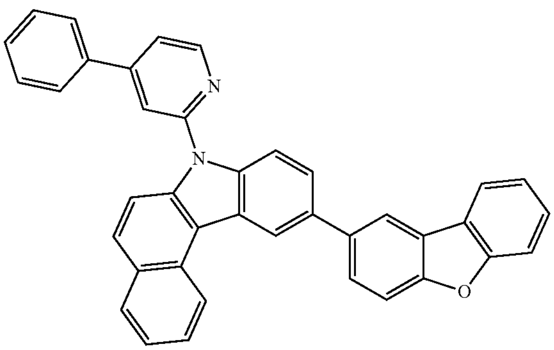
122B
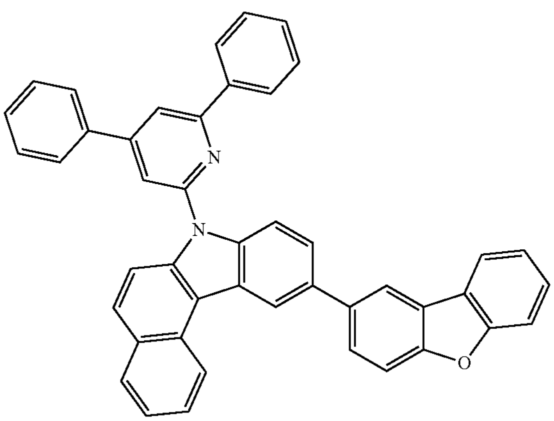
123B
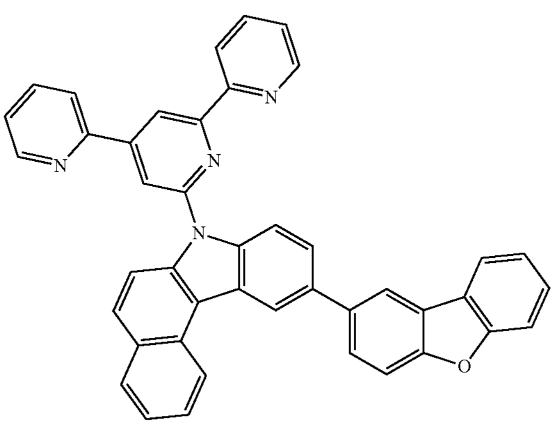
-continued
124B
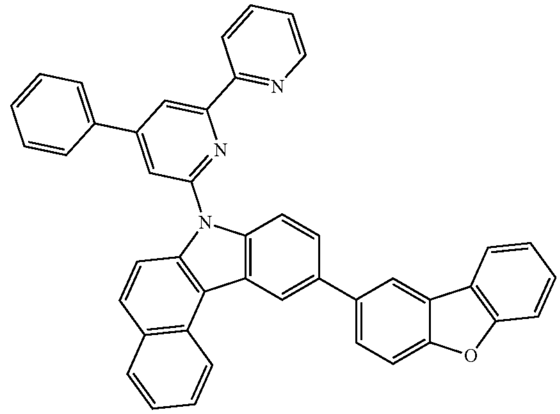
125B
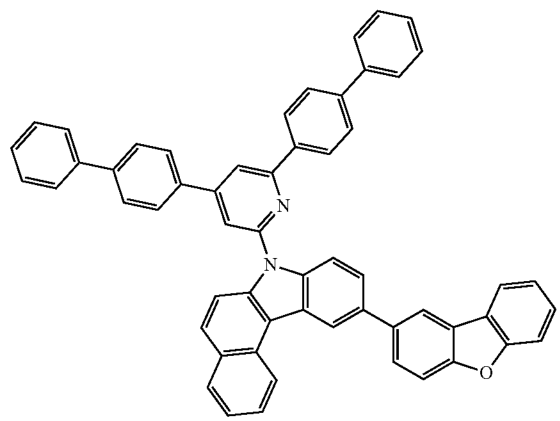
126B
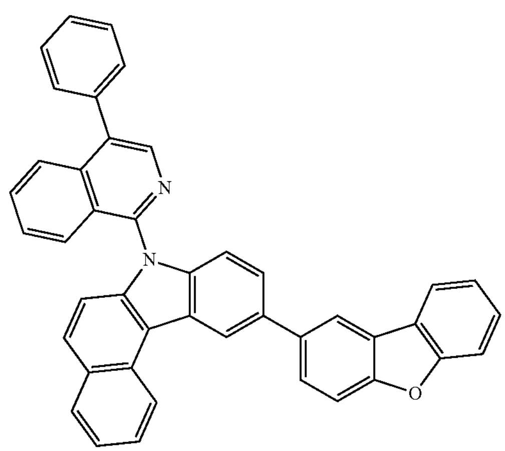

-continued
127B
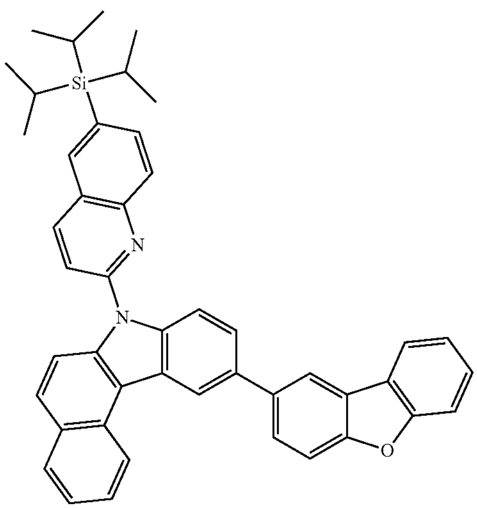
128B
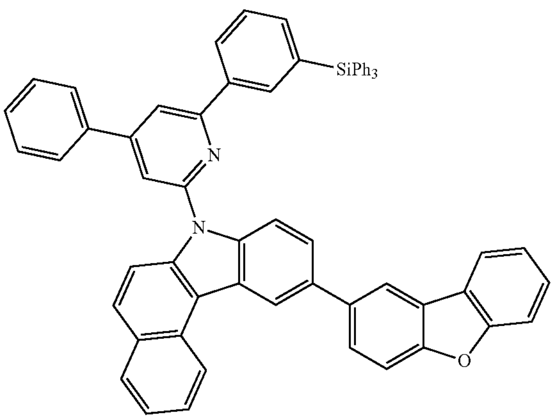
129B
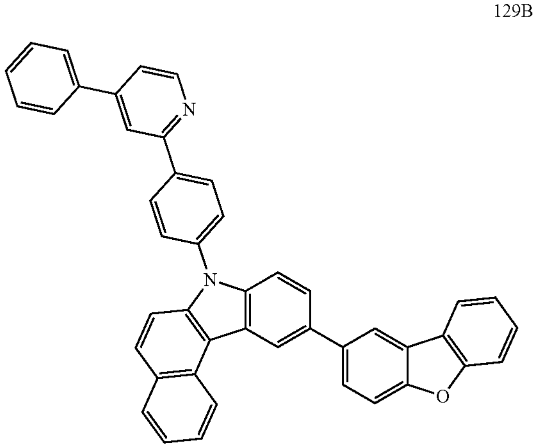
-continued
130B
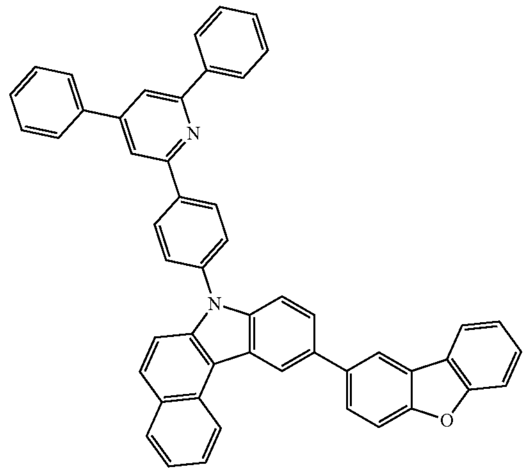
131B
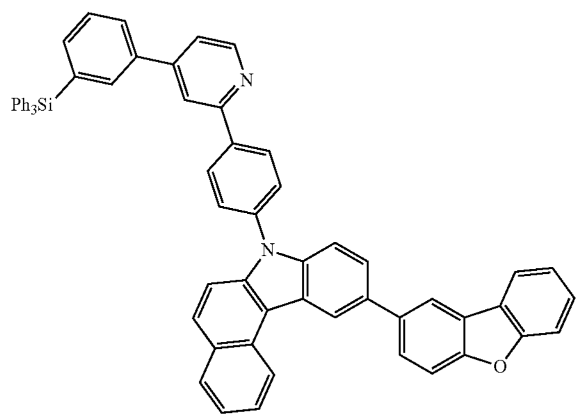
132B
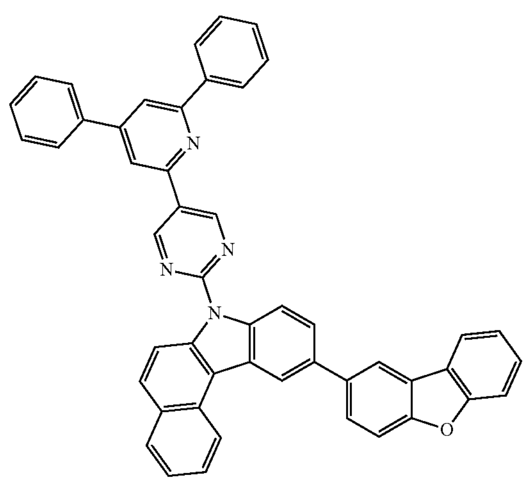

133B
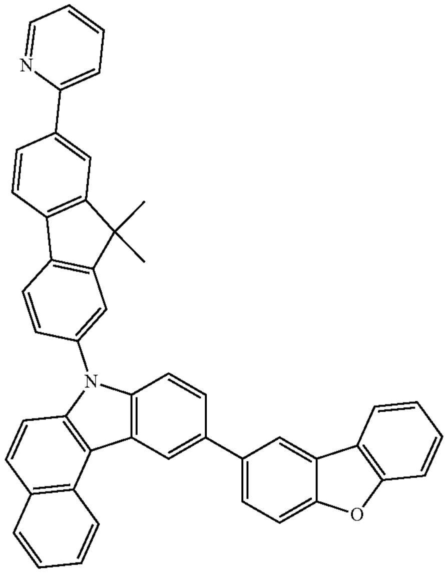
134B
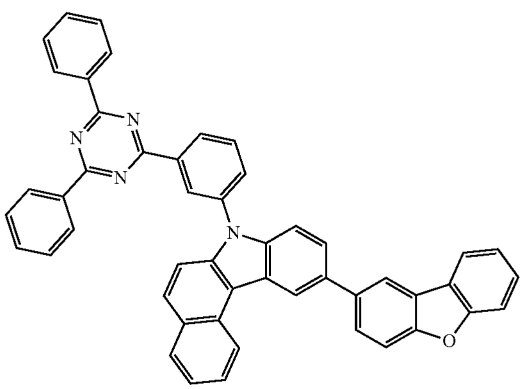
135B
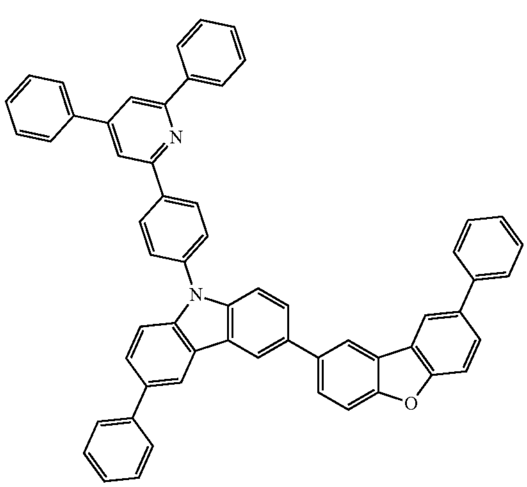
136B
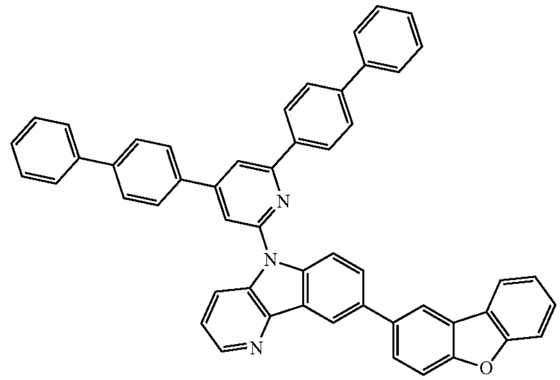
137B
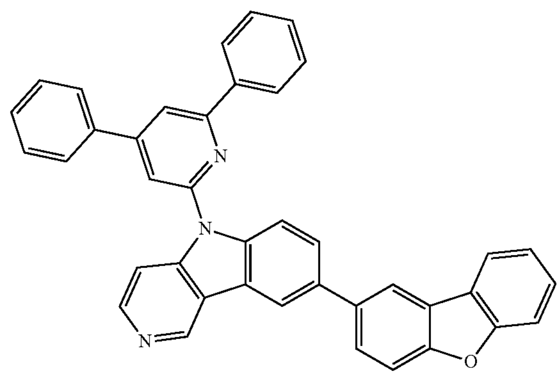
138B
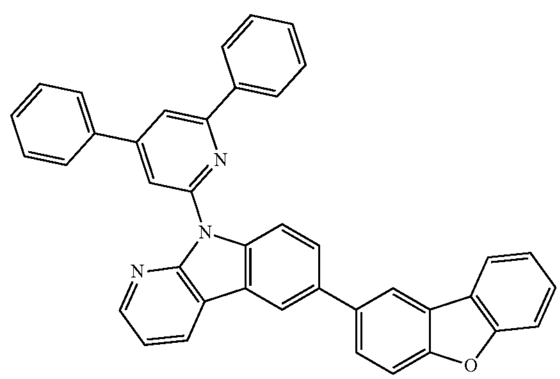
139B
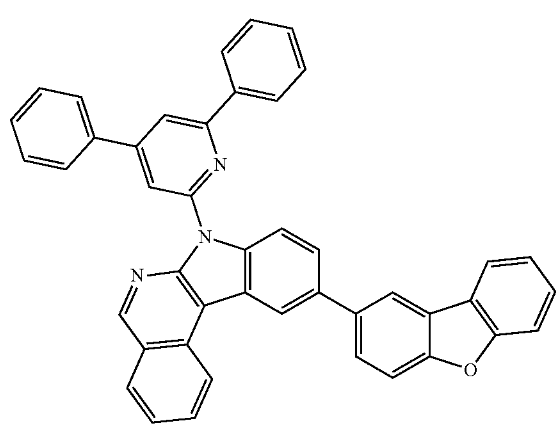

-continued
140B
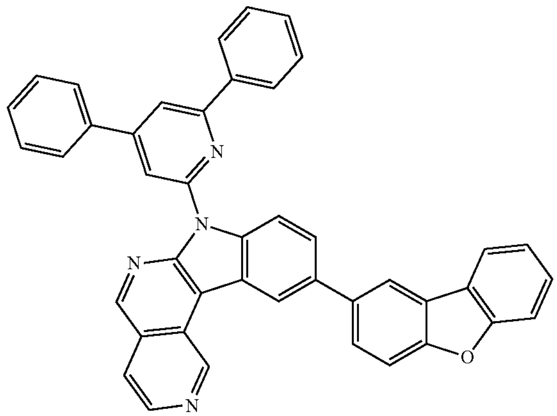
141B
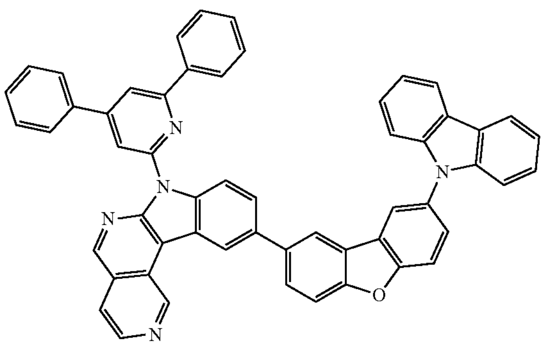
142B
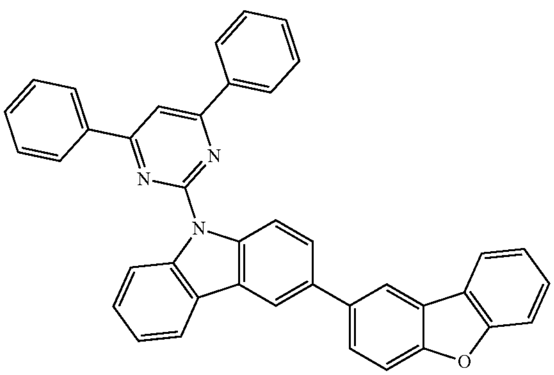
143B
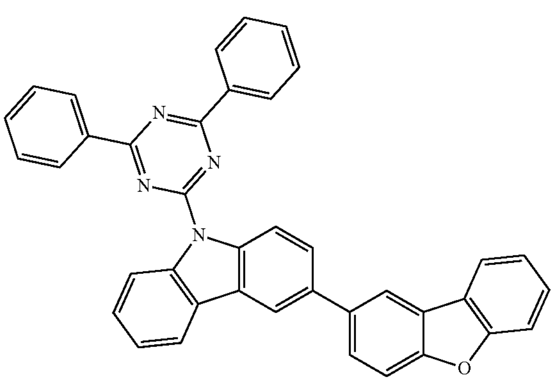
-continued
144B
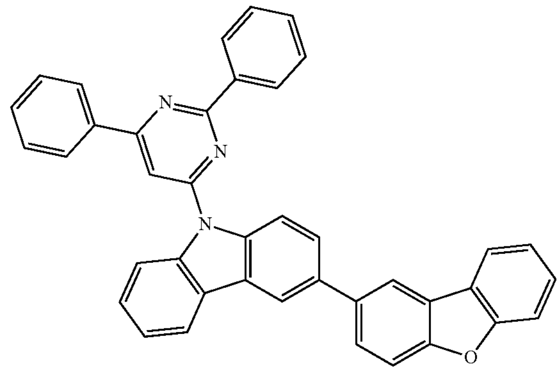
145B
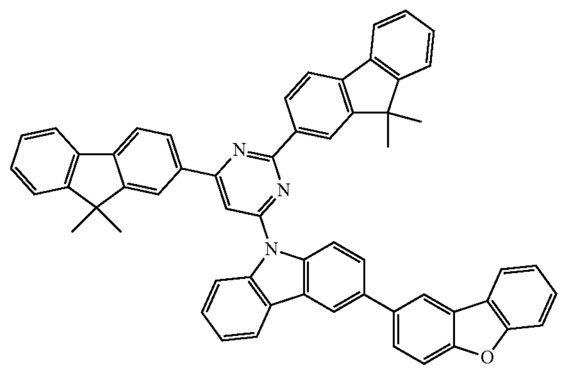
146B
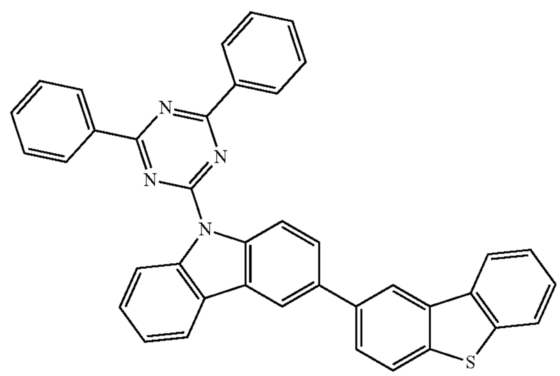
147B
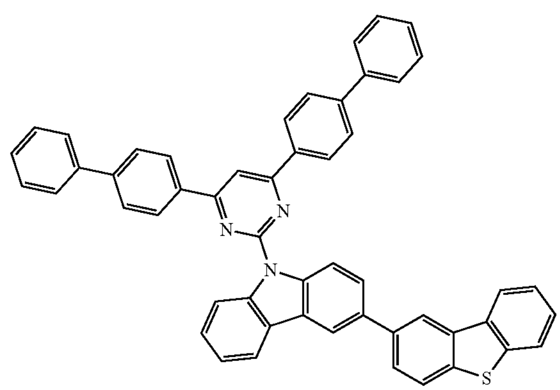

-continued
148B
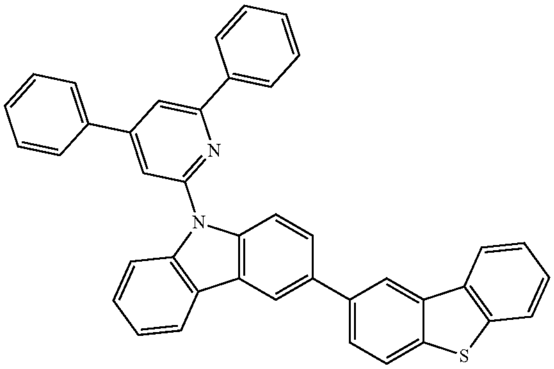
149B
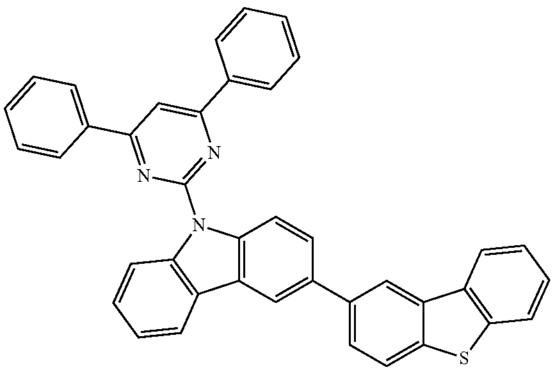
150B
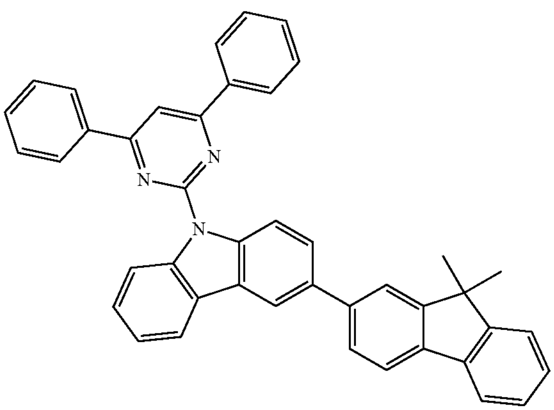
151B
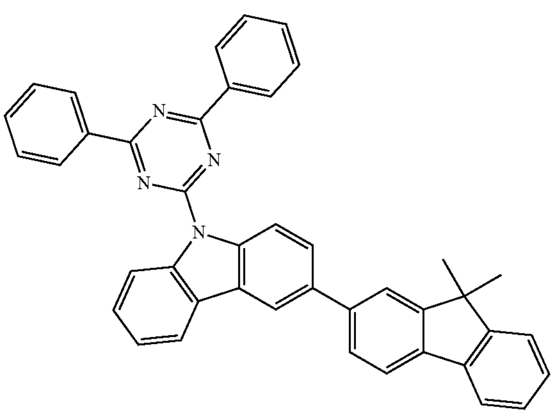
-continued
152B
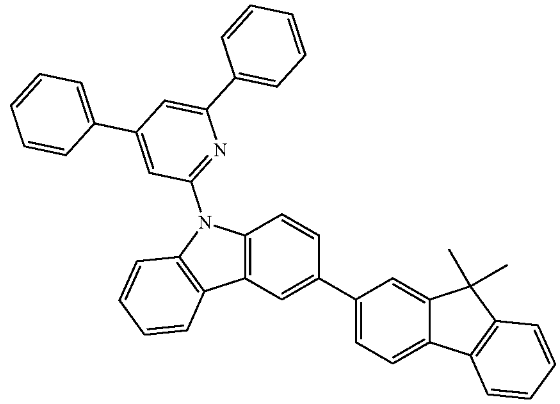
153B
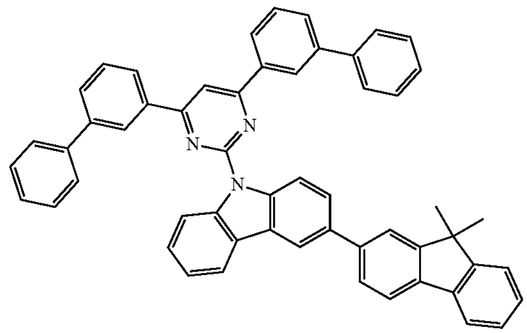
154B
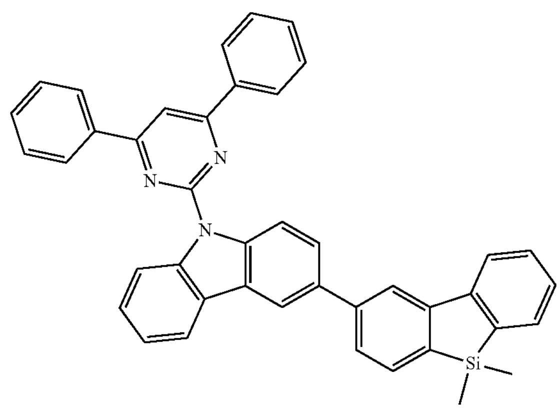
155B
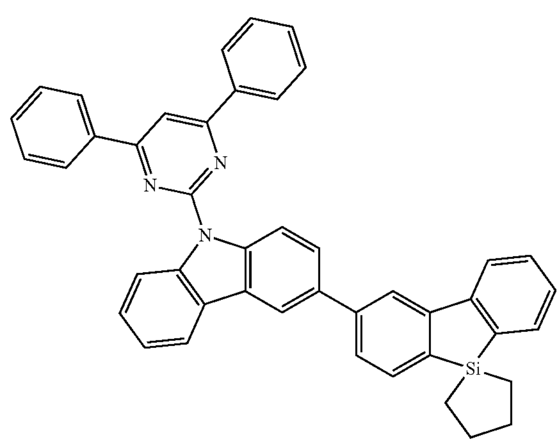

-continued
156B
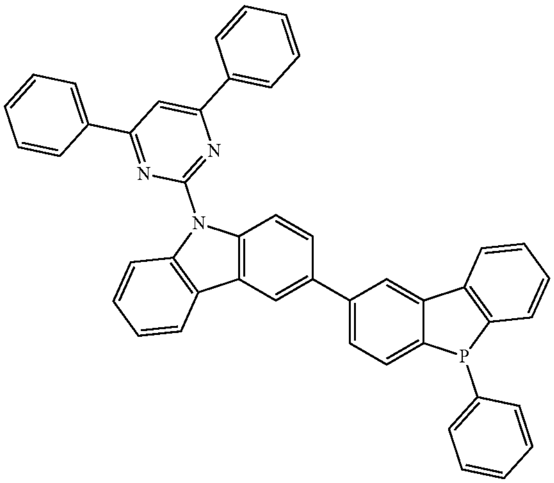
157B
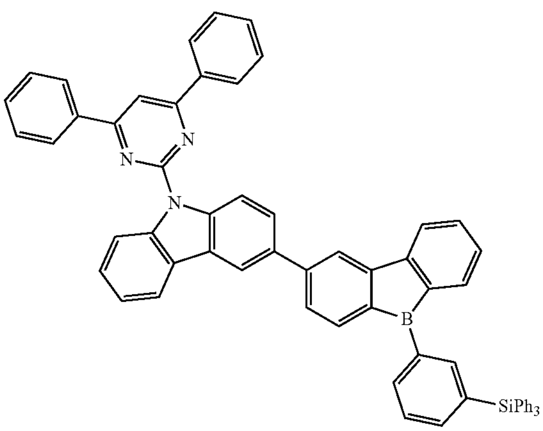
158B
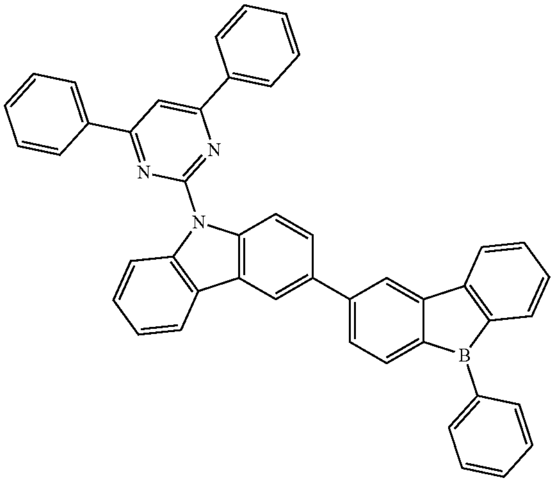
-continued
159B
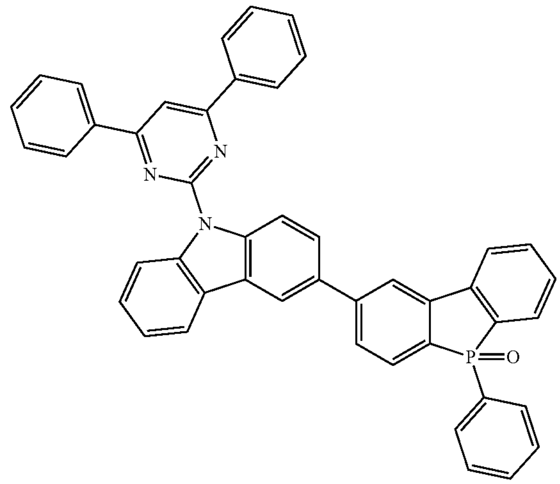
160B
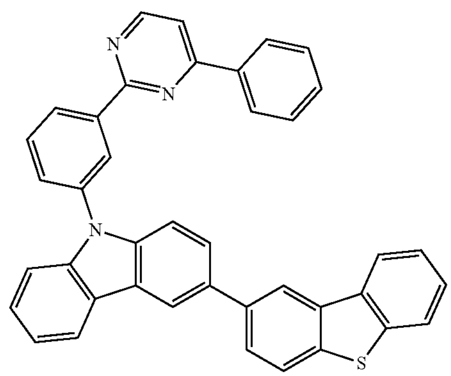
161B
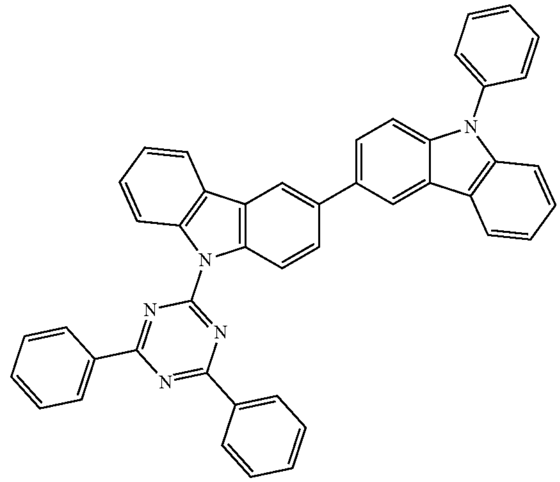

162B
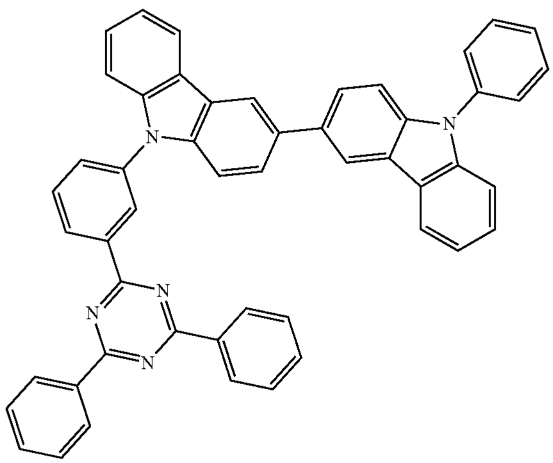
163B
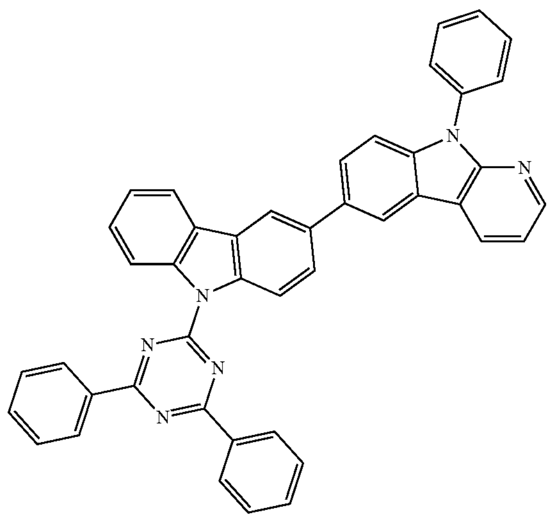
164B
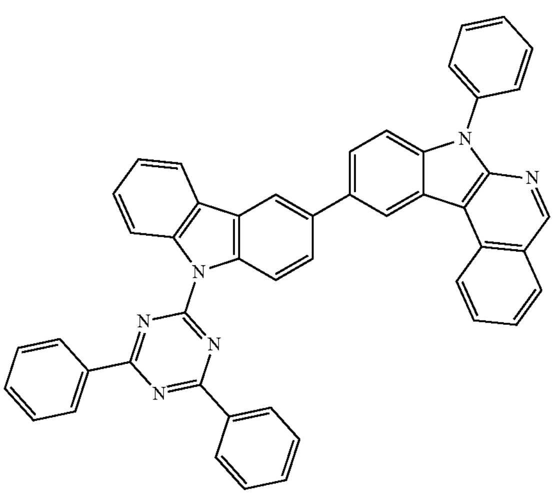
165B
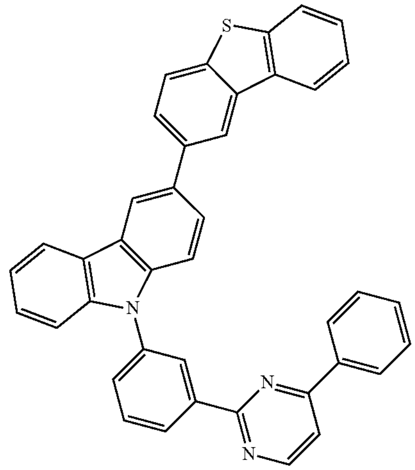
166B
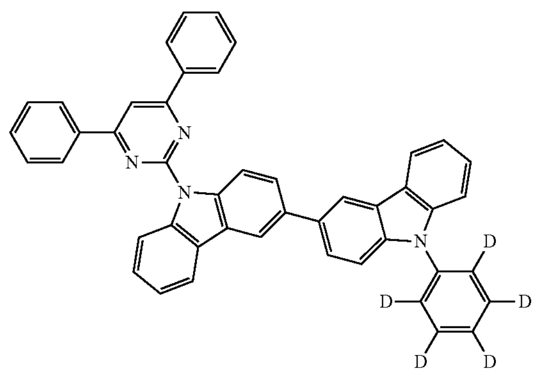
167B
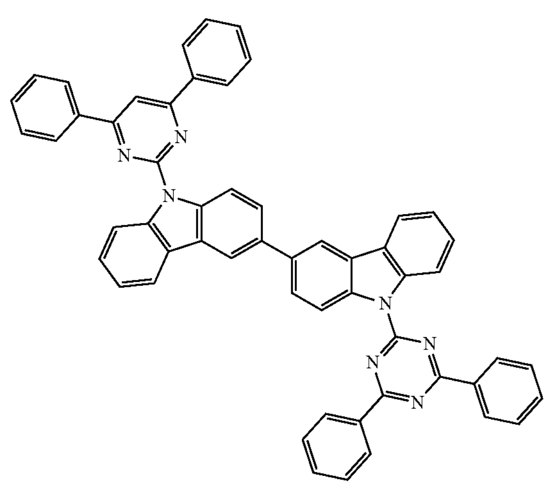

168B
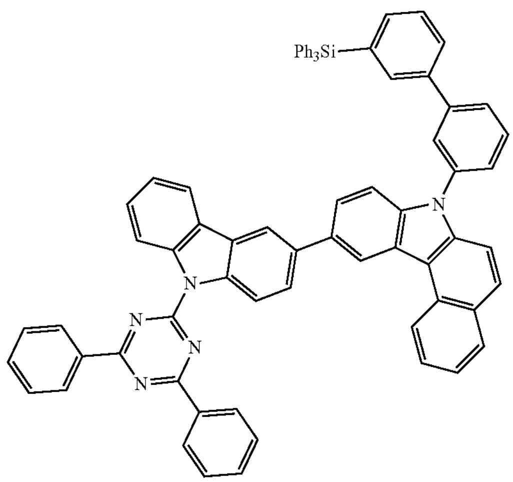
169B
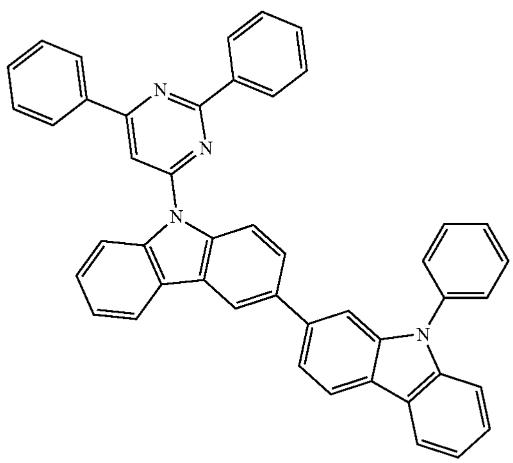
170B
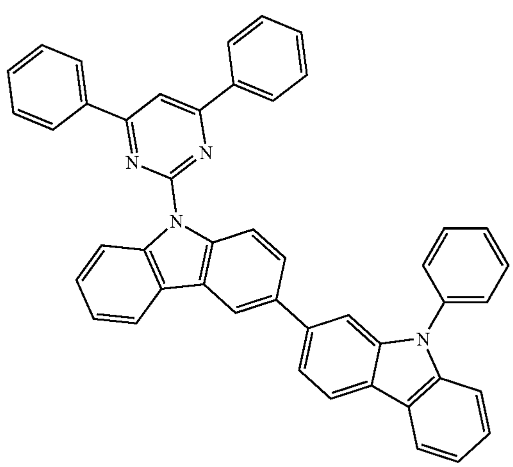
171B
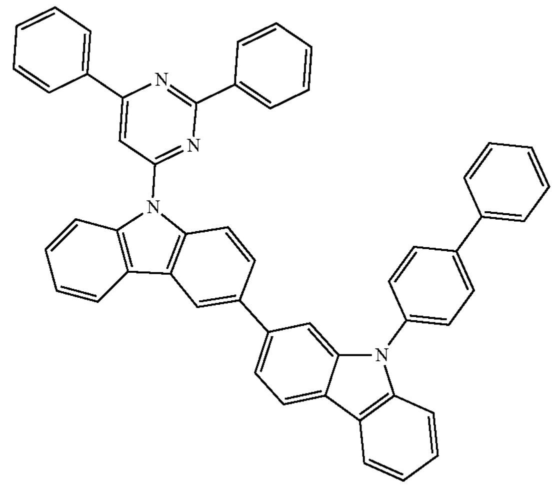
172B
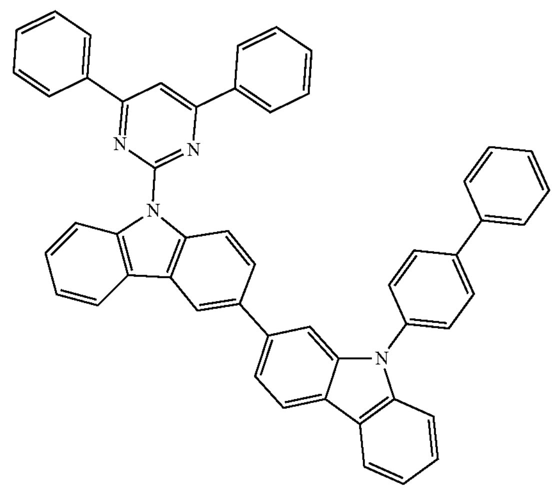
173B
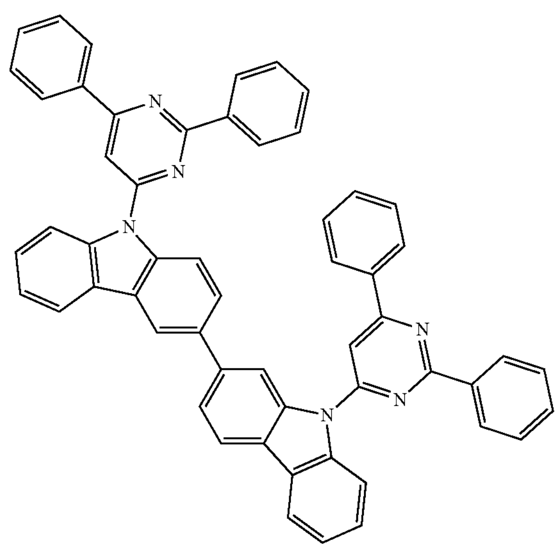

-continued
174B
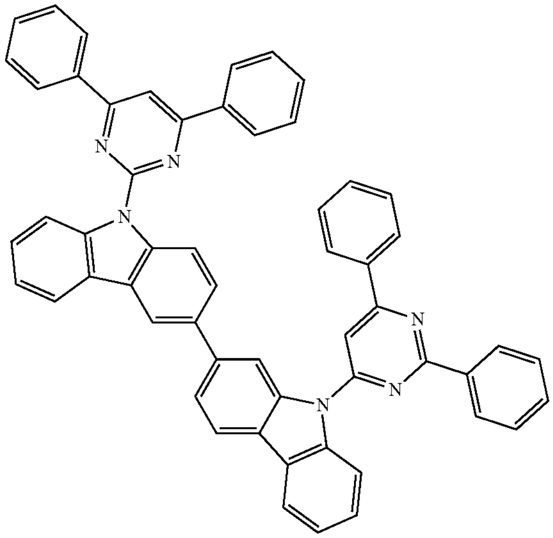
175B
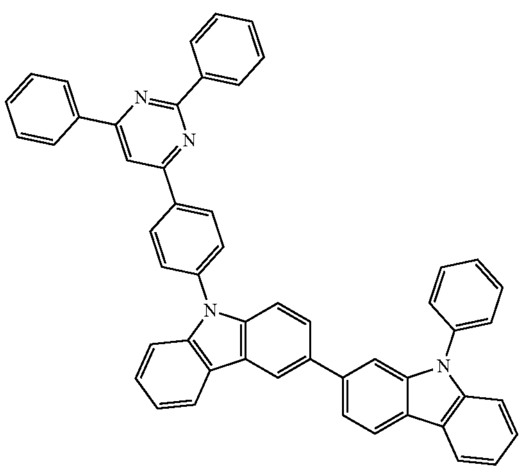
176B
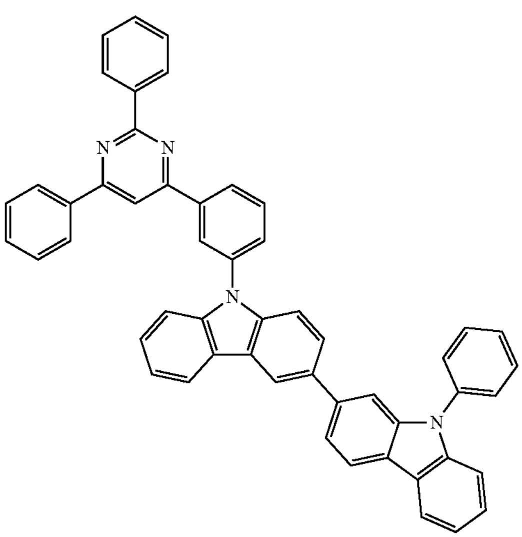
-continued
177B
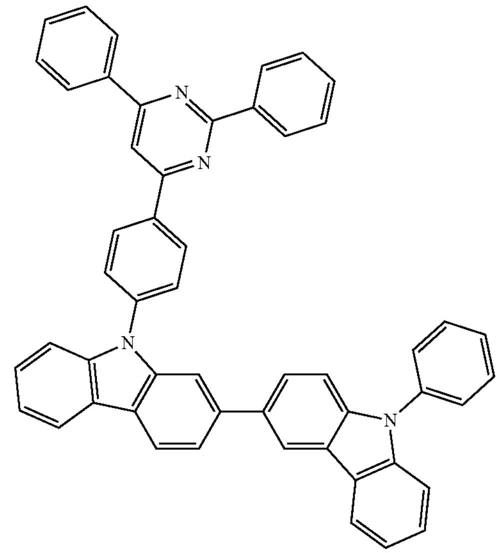
178B
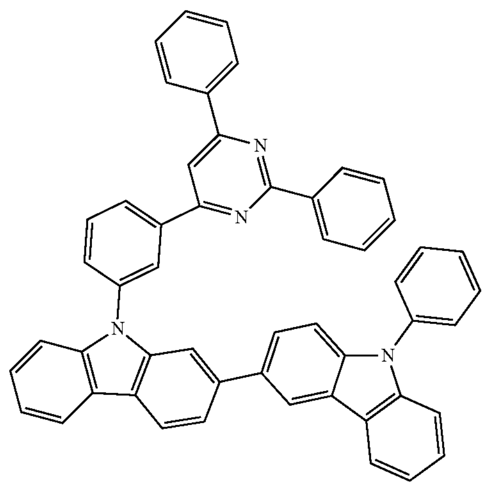
179B
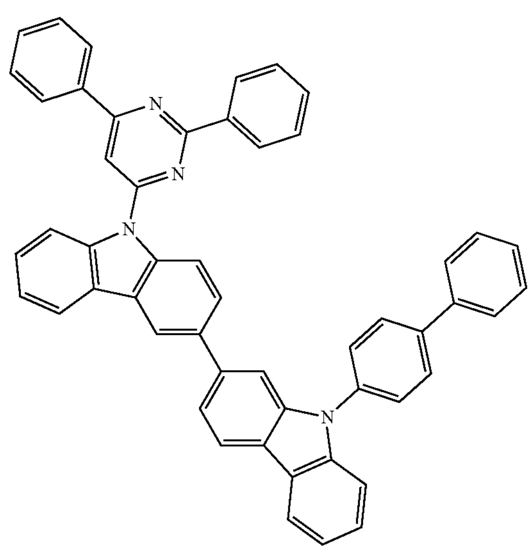

180B
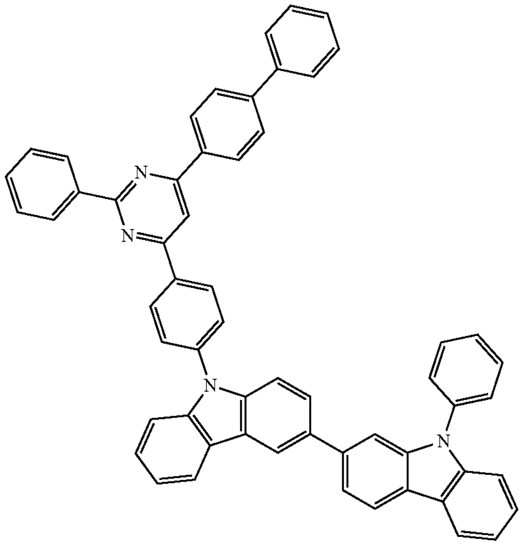
181B
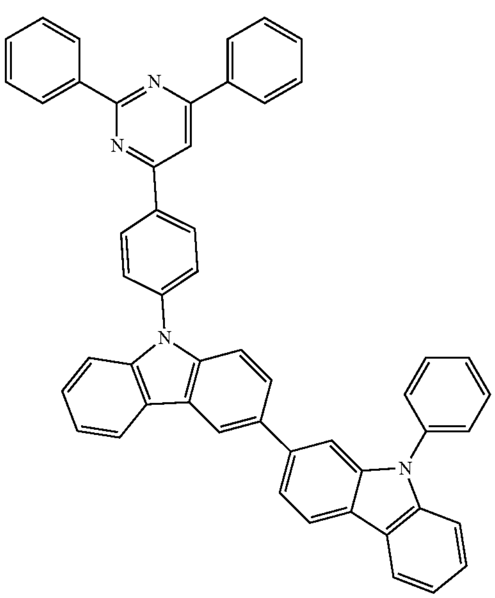
182B
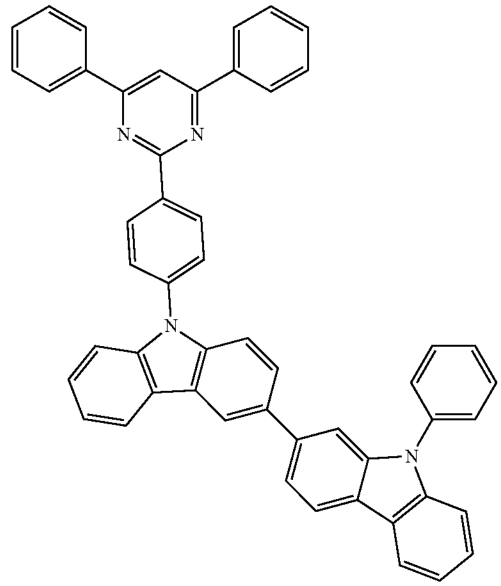
183B
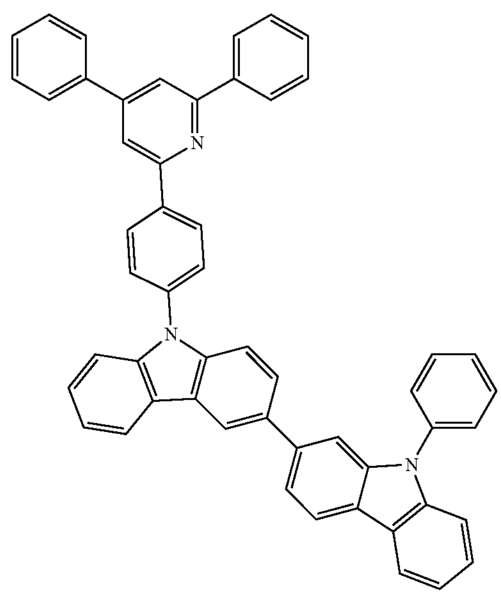

-continued
184B
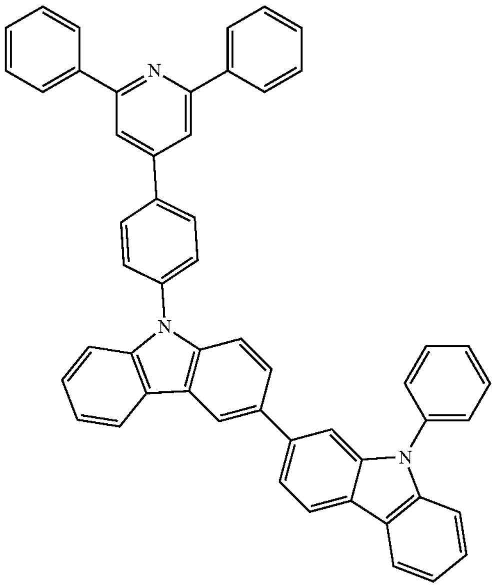
191B
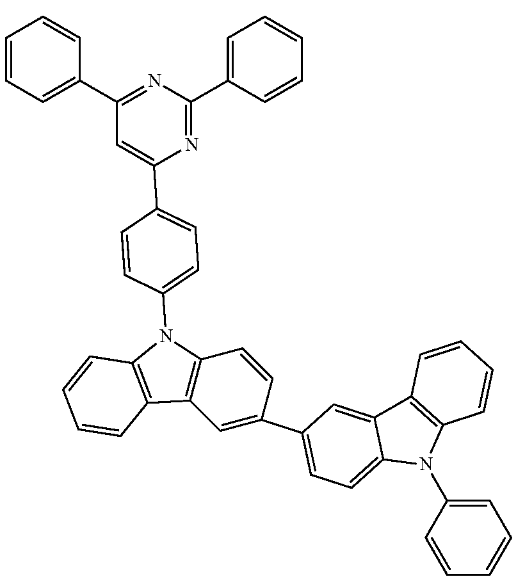
-continued
192B
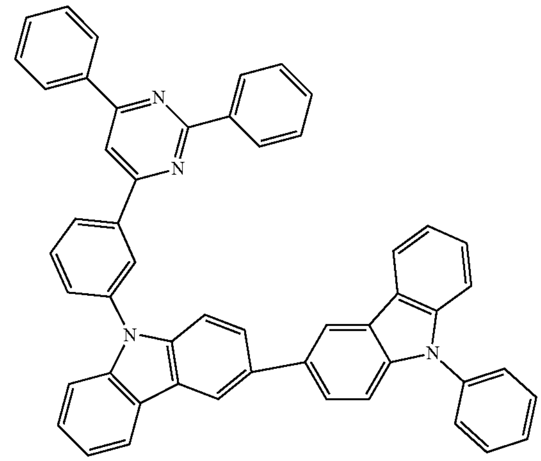
193B
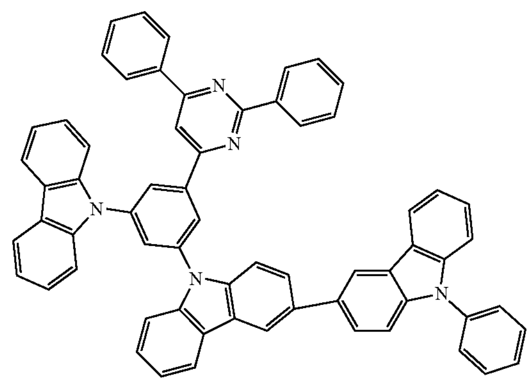
194B
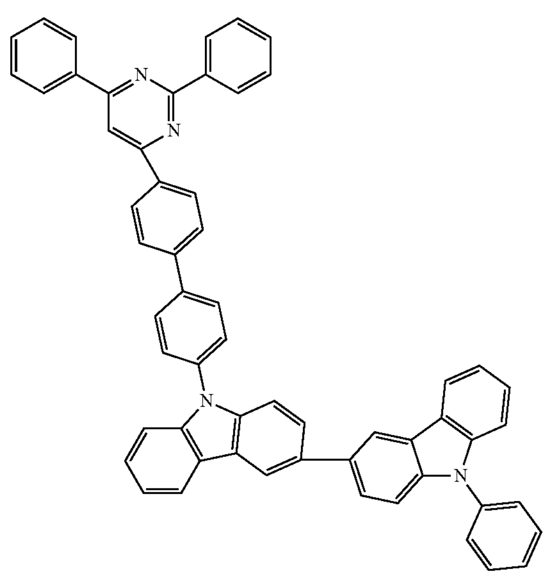

-continued
195B
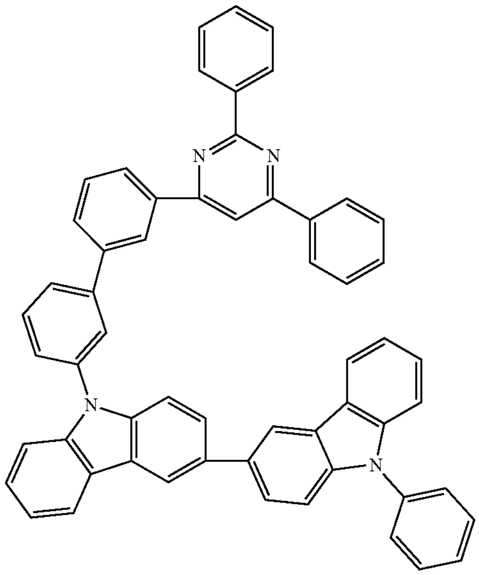
196B
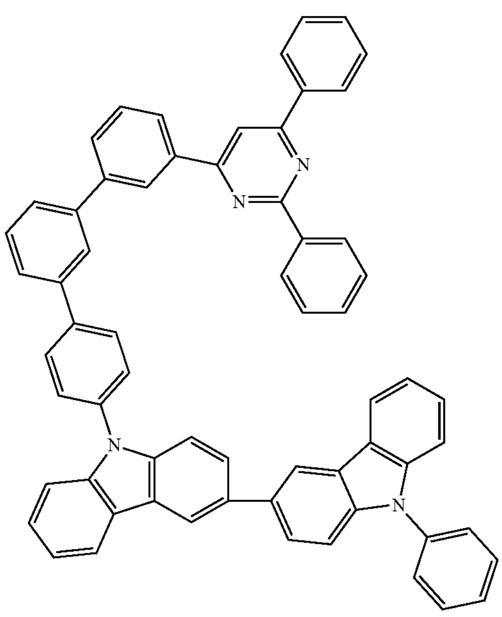
-continued
185B
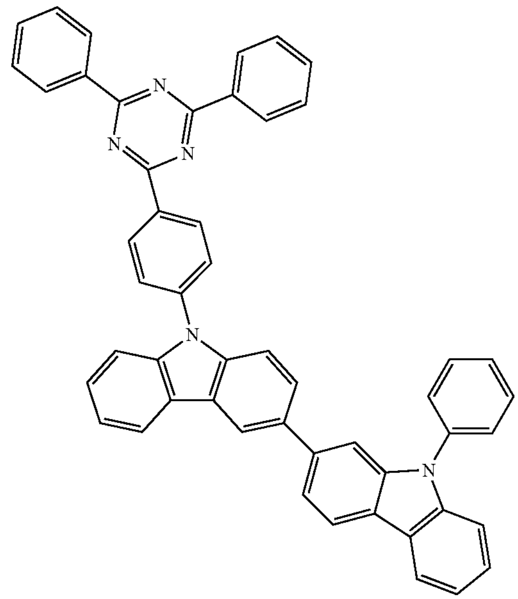
186B
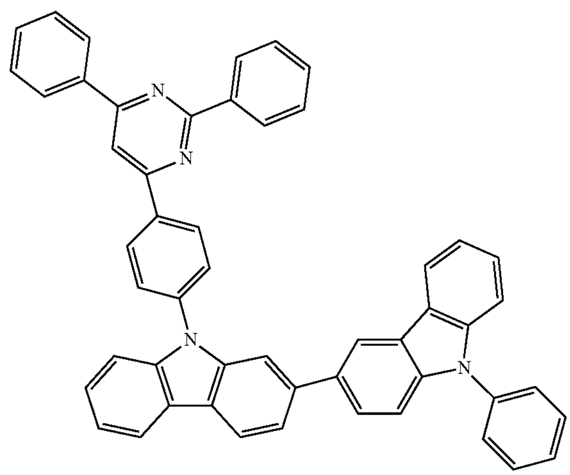
187B
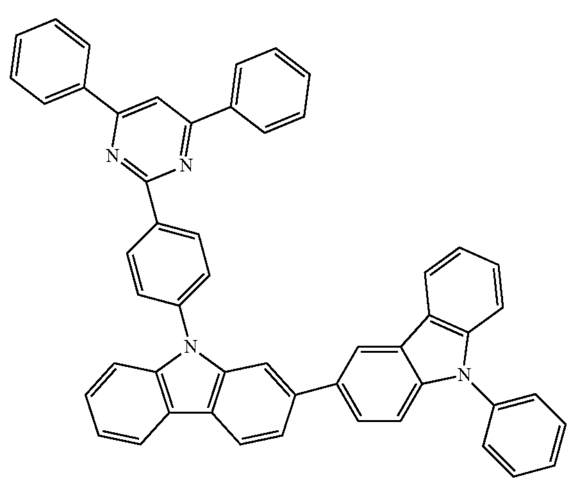

-continued
188B
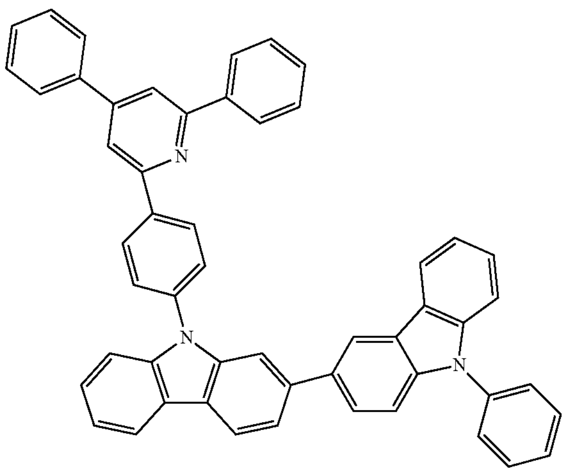
189B
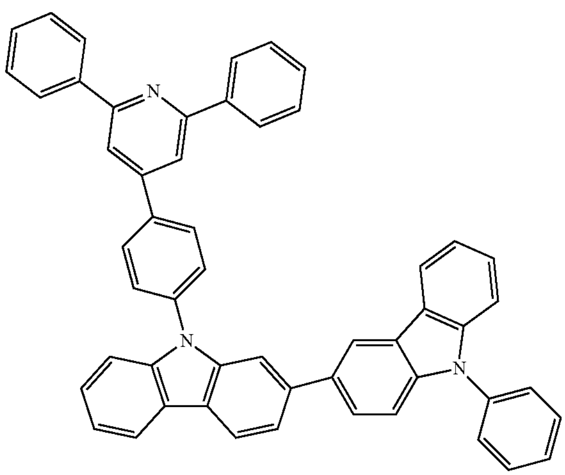
190B
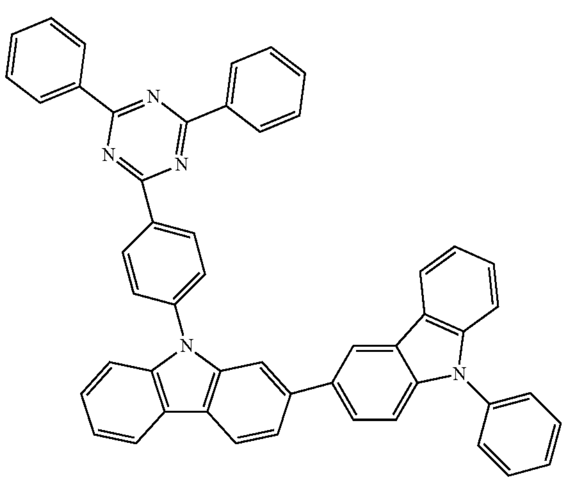
-continued
301
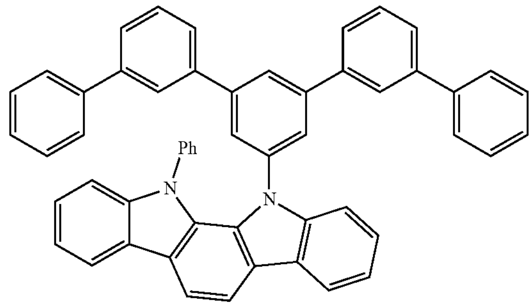
302
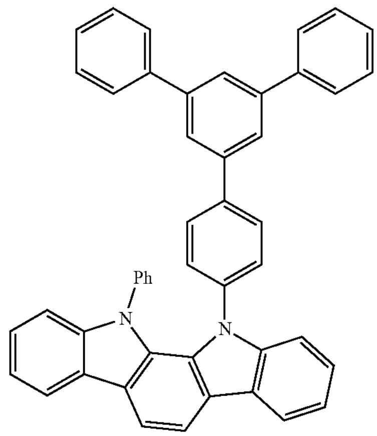
303
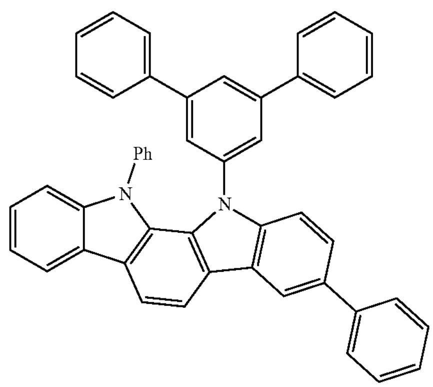
304
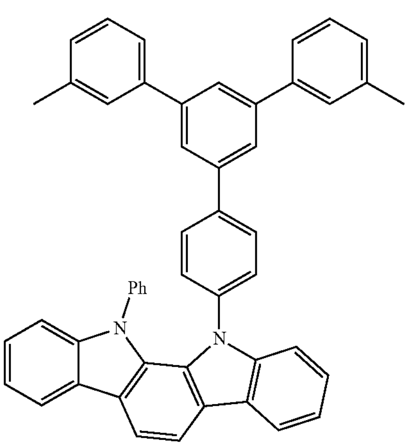

305
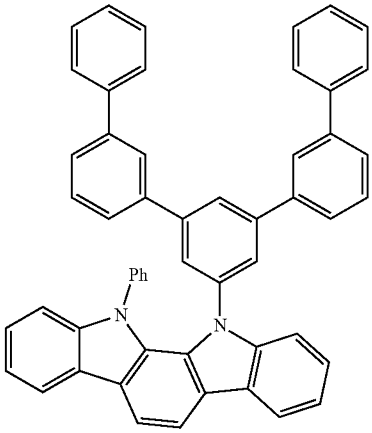
306
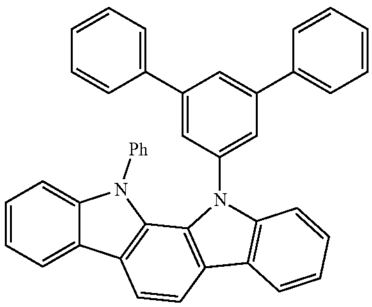
307
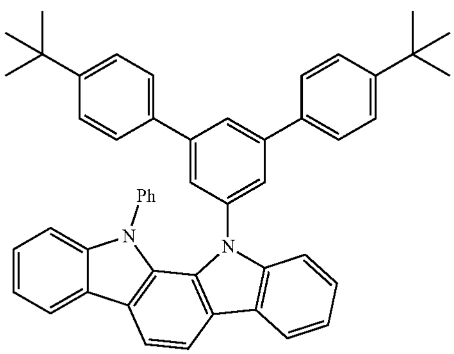
308
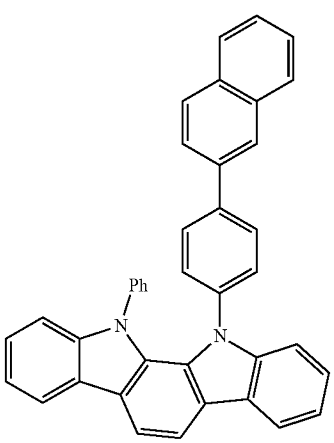
309
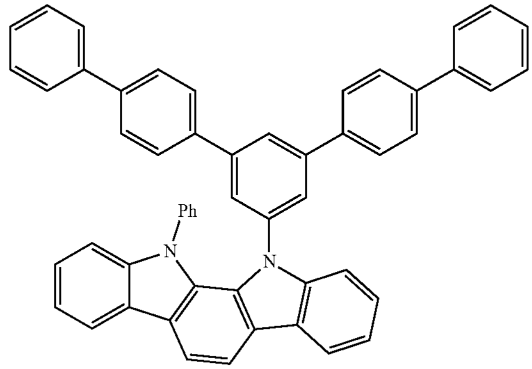
310
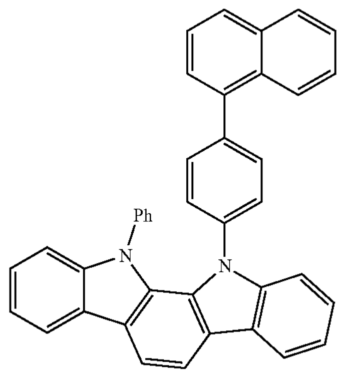
311
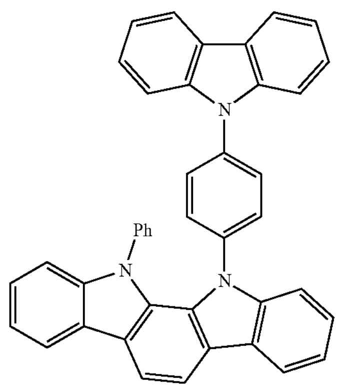
312
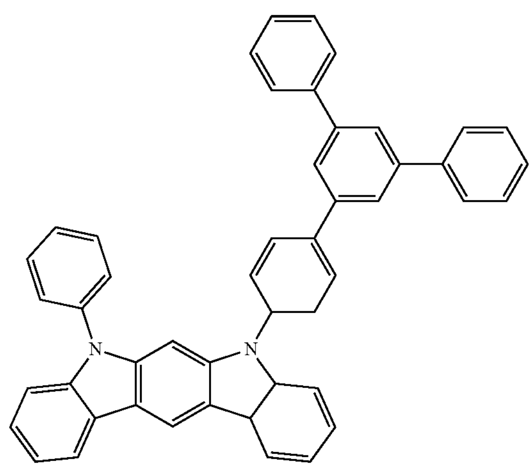

-continued
313
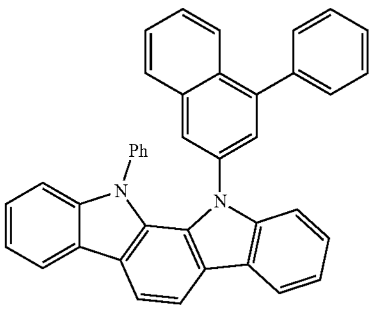
314
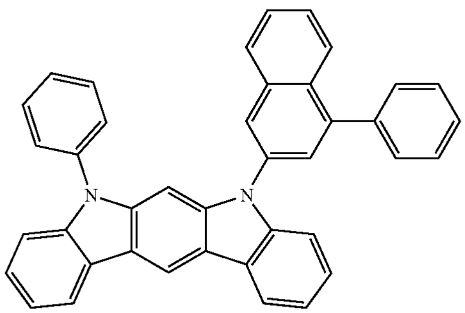
315
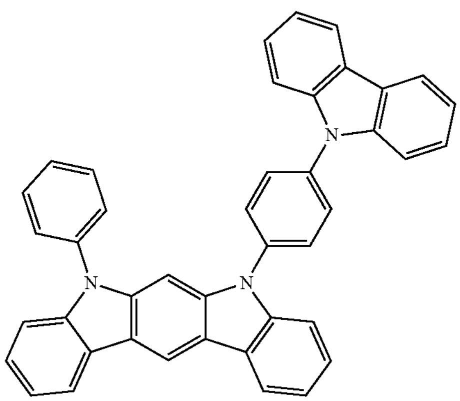
316
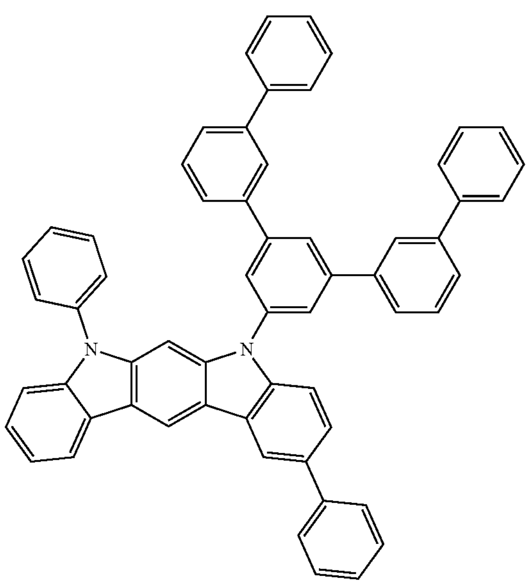
-continued
317
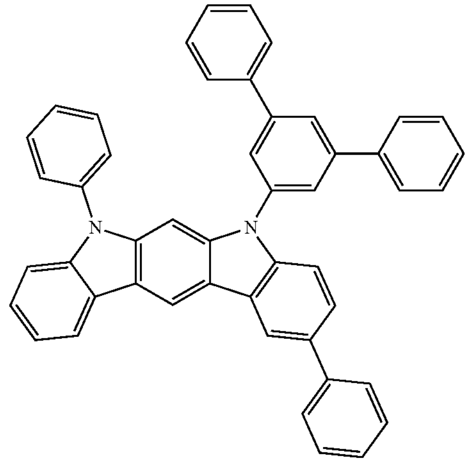
318
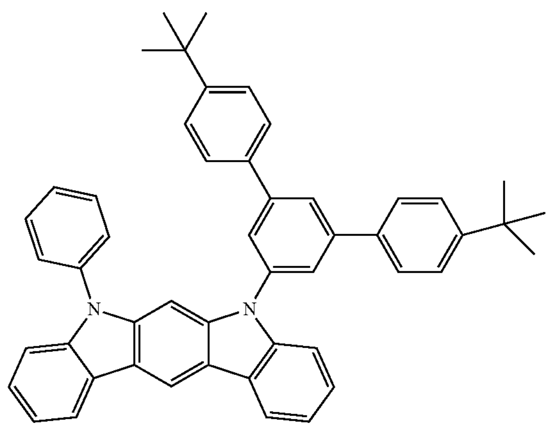
319
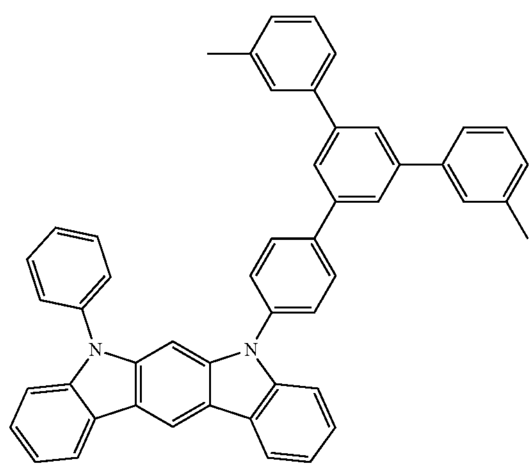

-continued
320
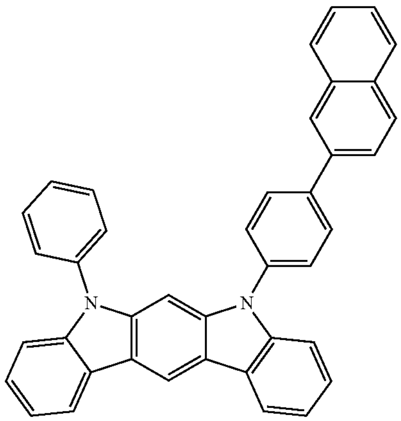
321
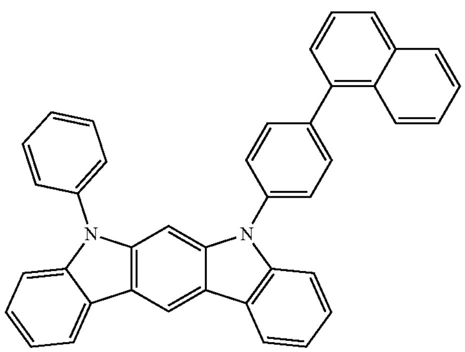
322
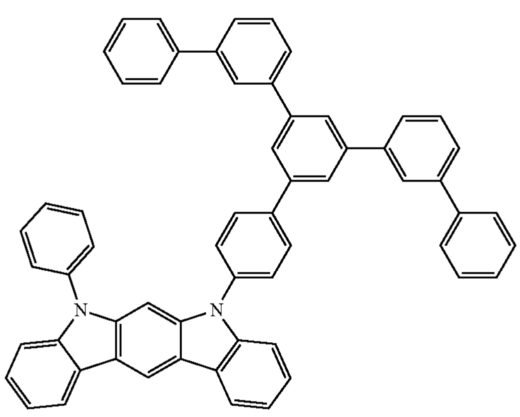
-continued
323
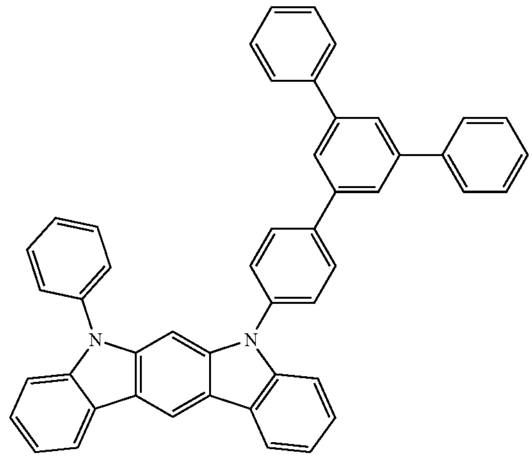
324
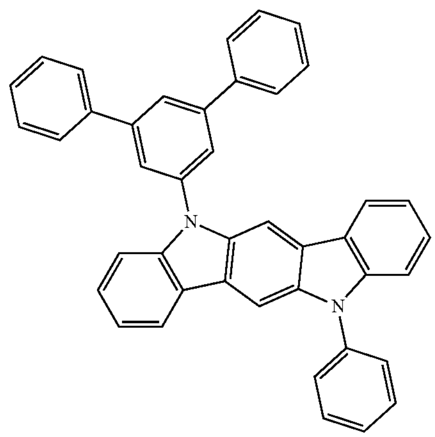
325
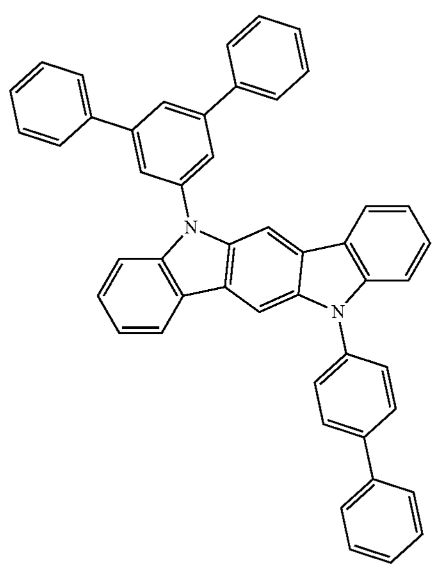

-continued
326
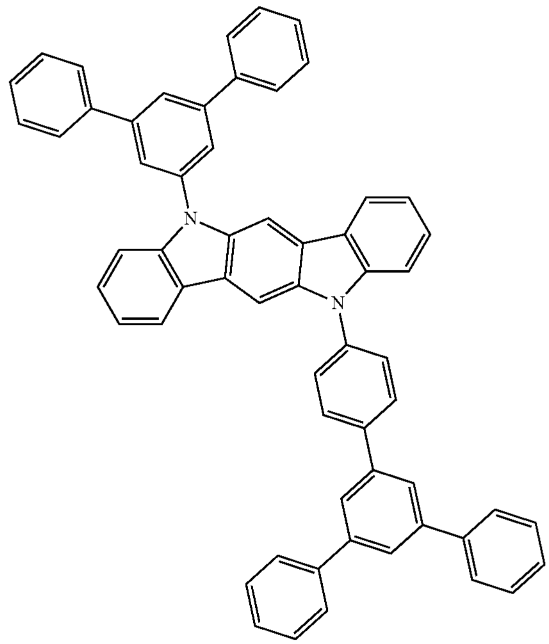
327
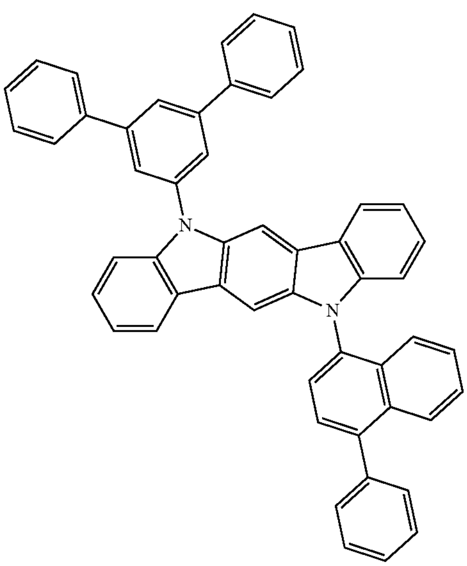
-continued
328
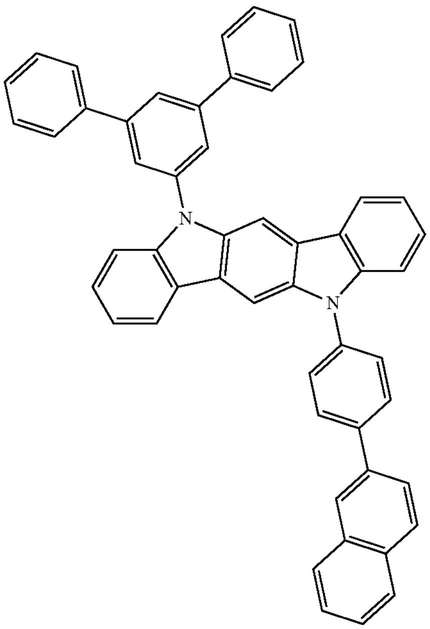
329
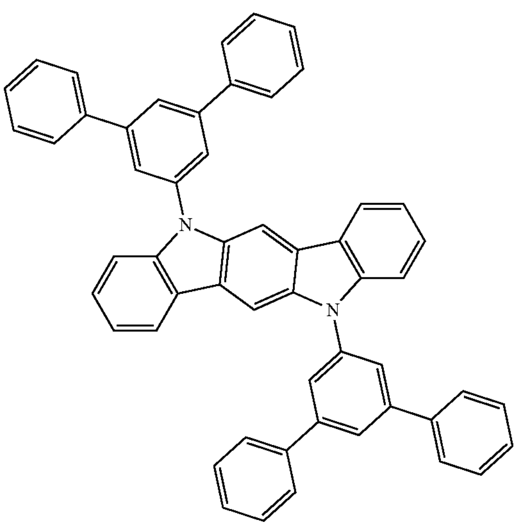

-continued
330
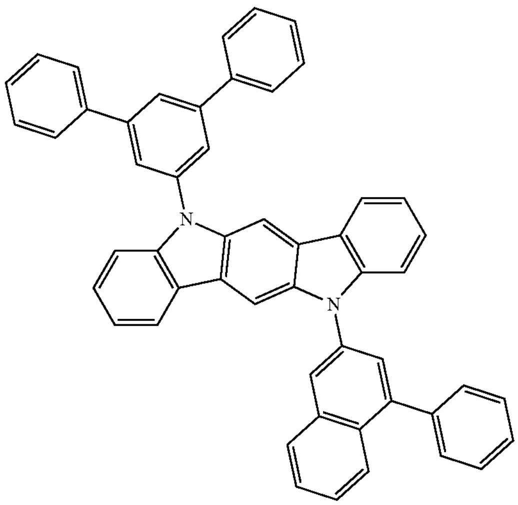
331
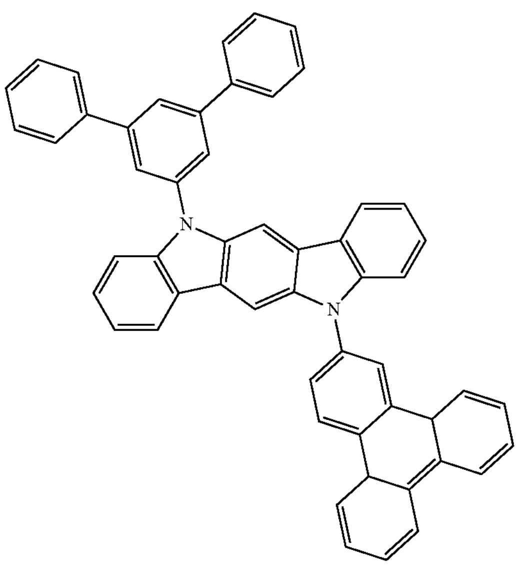
332
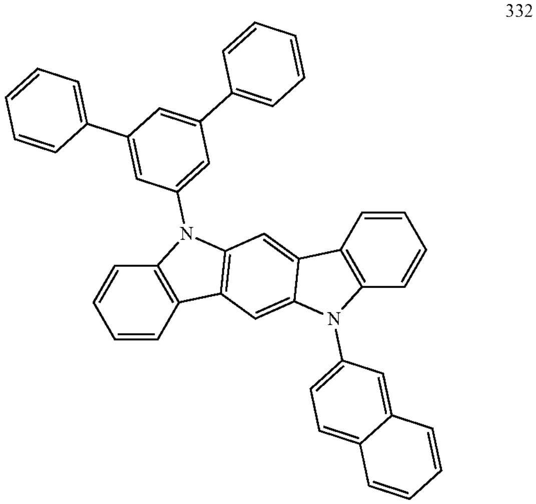
-continued
333
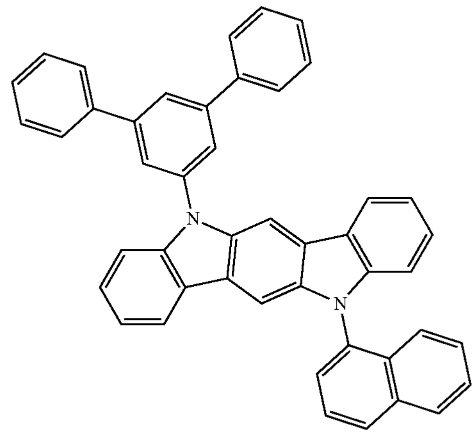
334
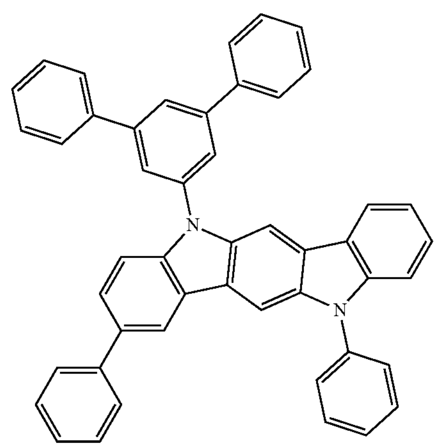
335
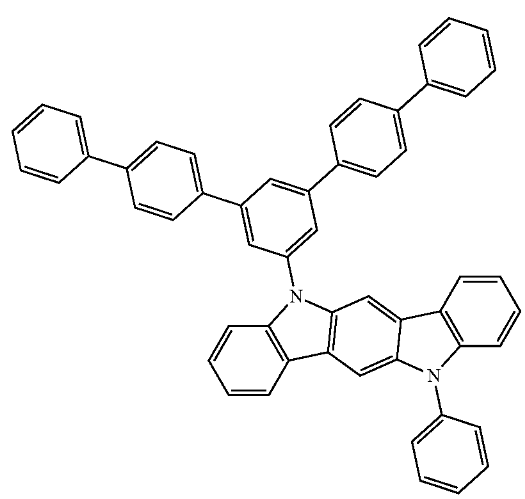

-continued
336
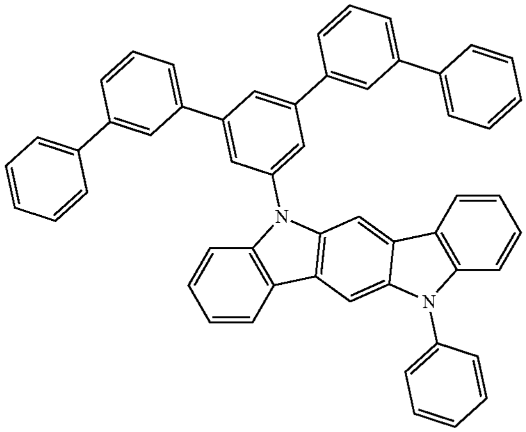
337
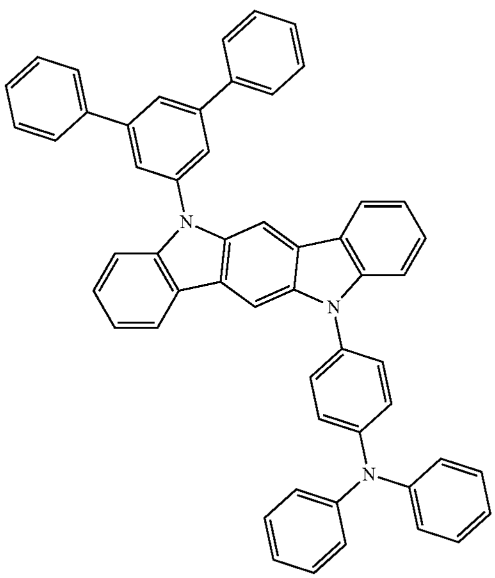
338
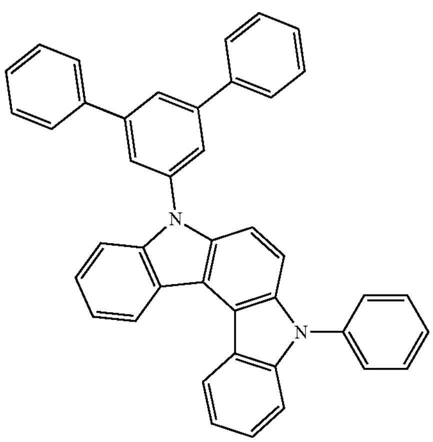
-continued
339
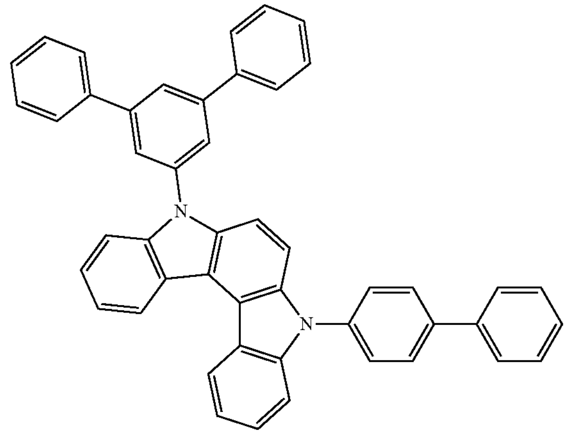
340
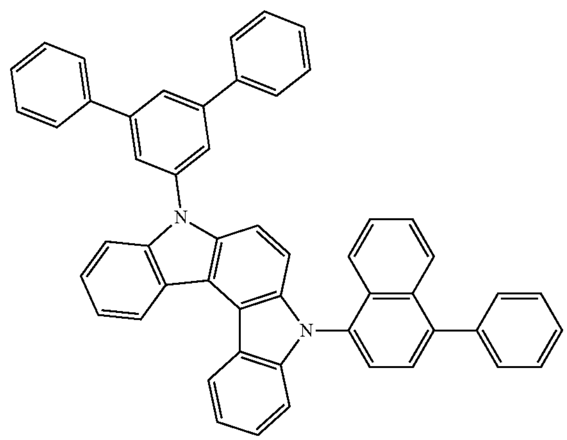
341
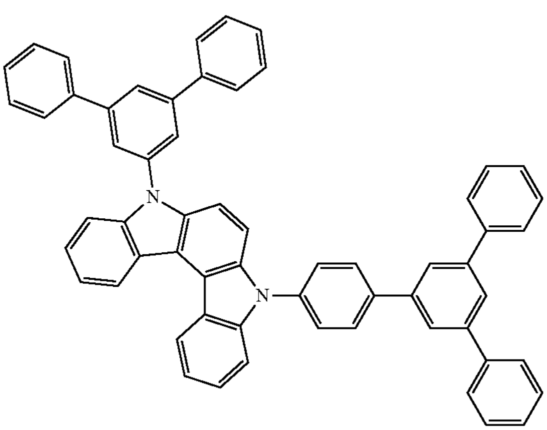

-continued
342
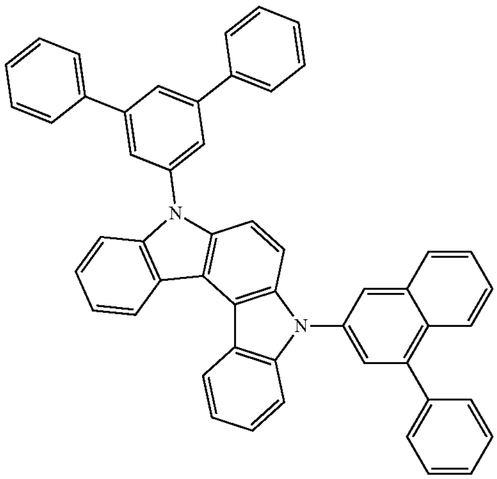
343
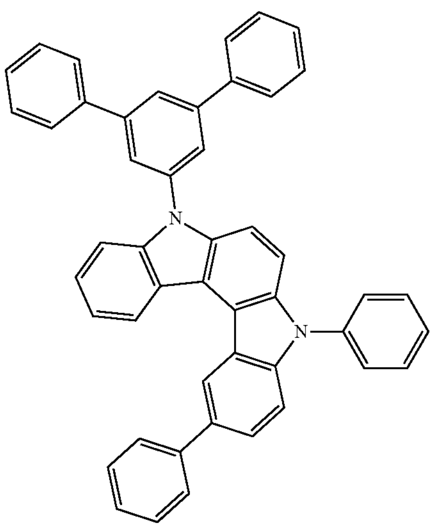
344
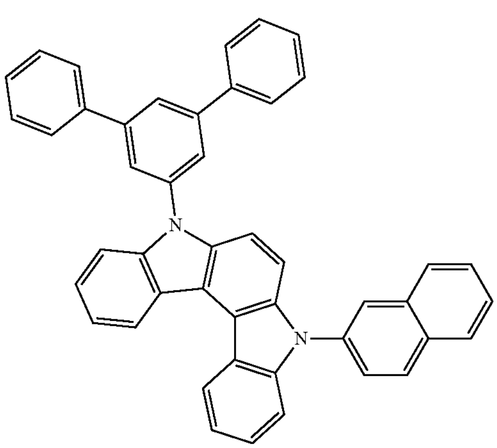
-continued
345
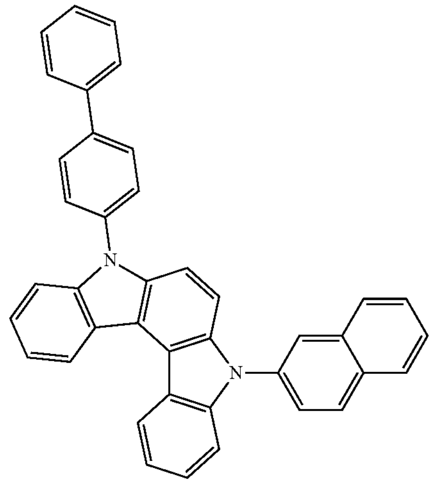
346
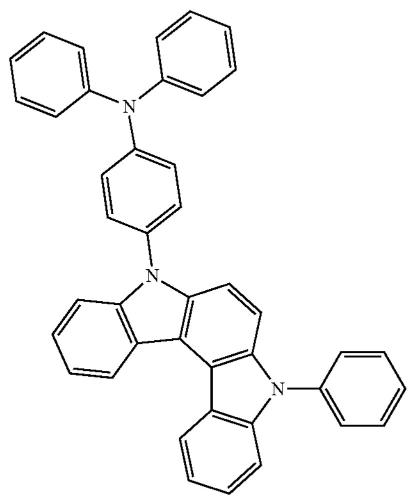
347
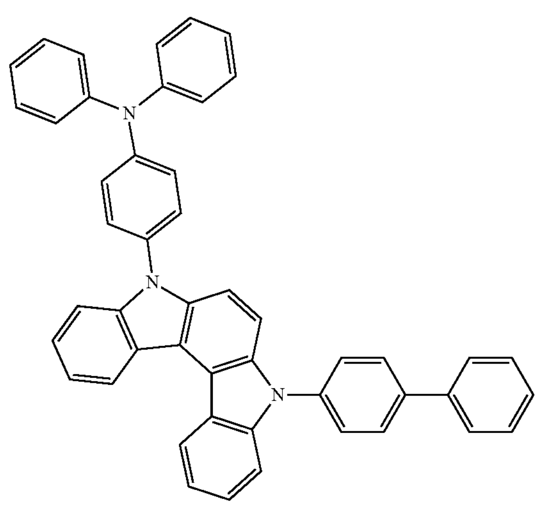

-continued
348
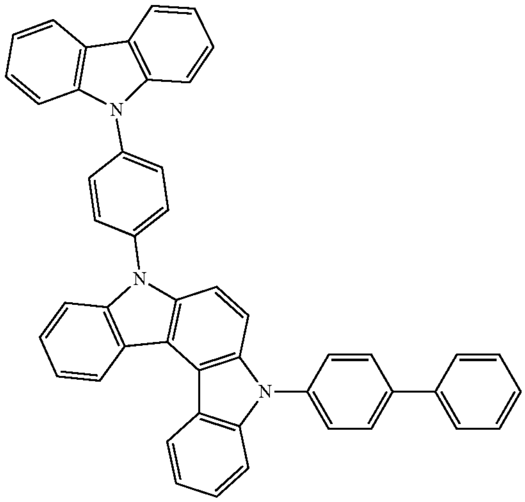
349
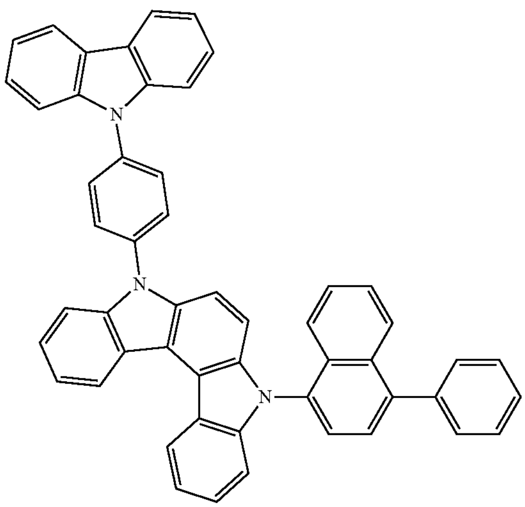
350
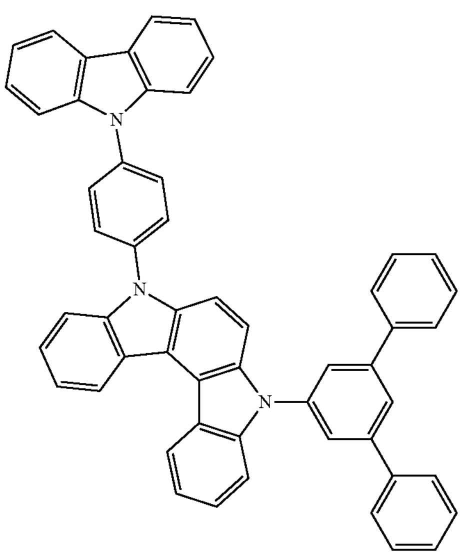
-continued
351
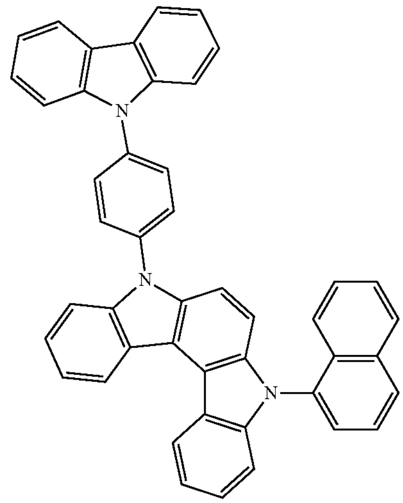
352
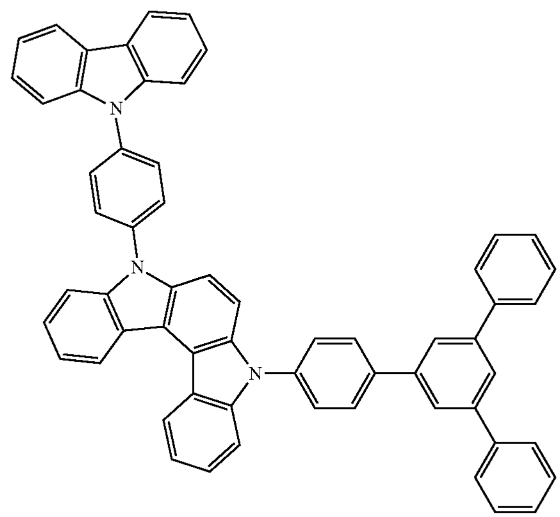
353
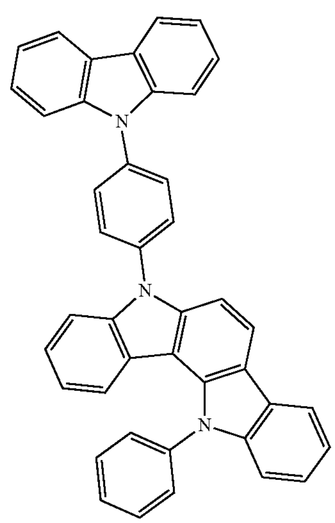

-continued
354
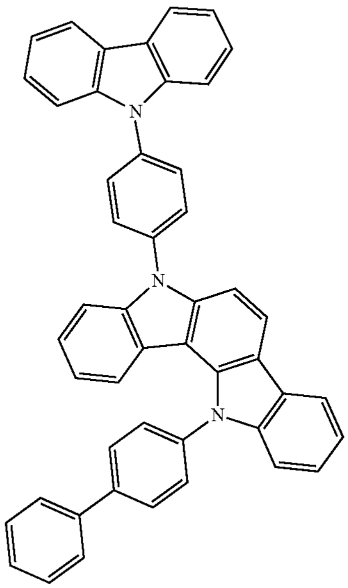
355
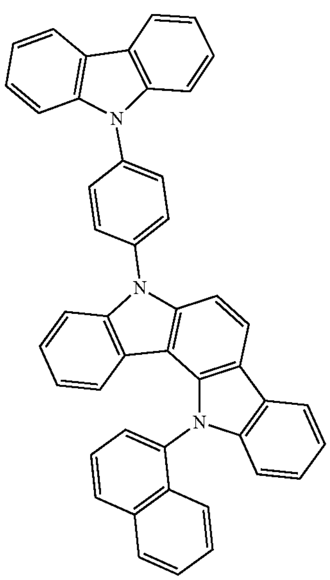
-continued
356
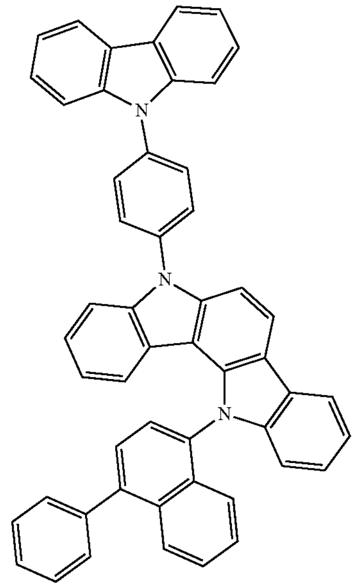
357
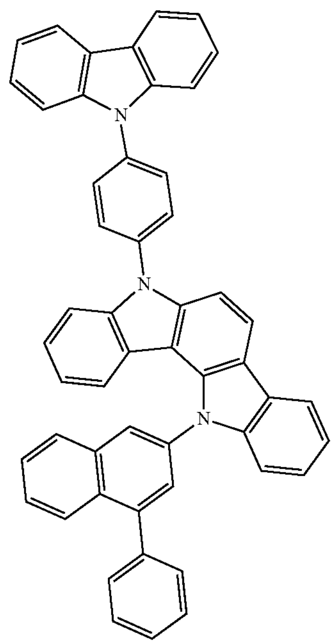

-continued
358
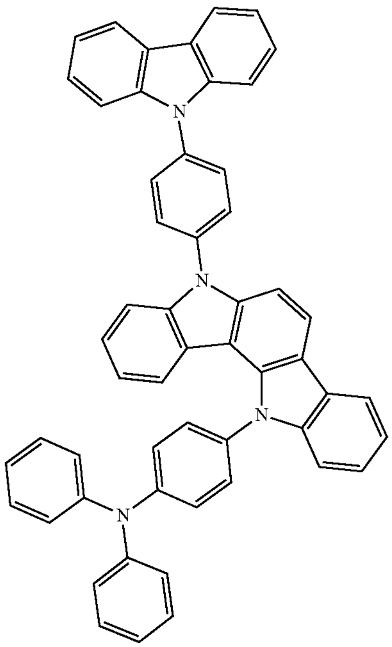
359
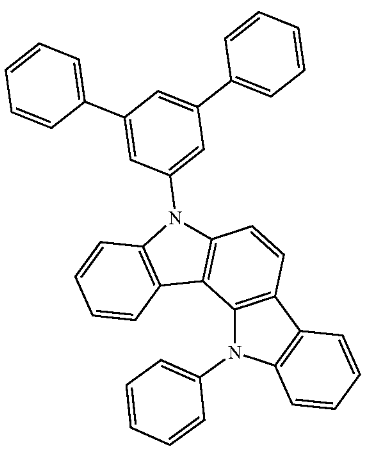
360
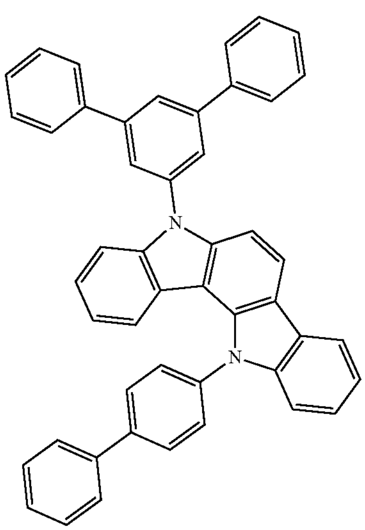
-continued
361
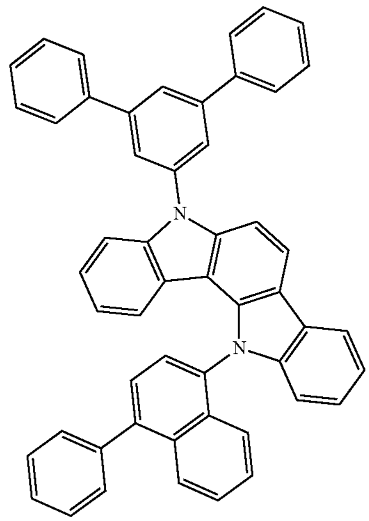
362
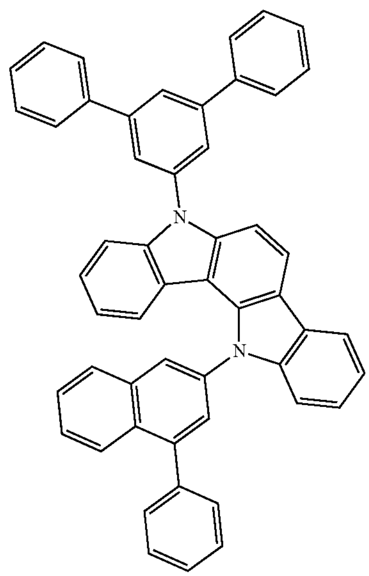
363
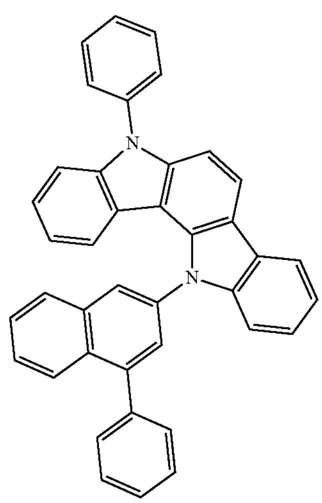

-continued
364
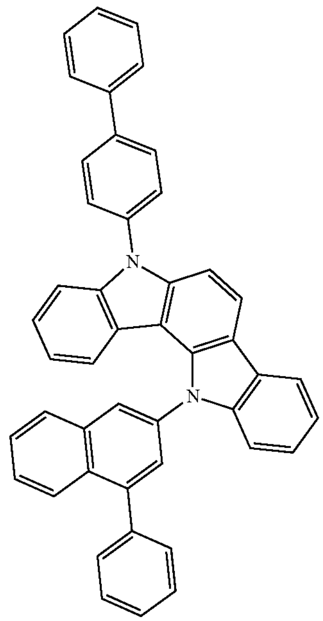
365
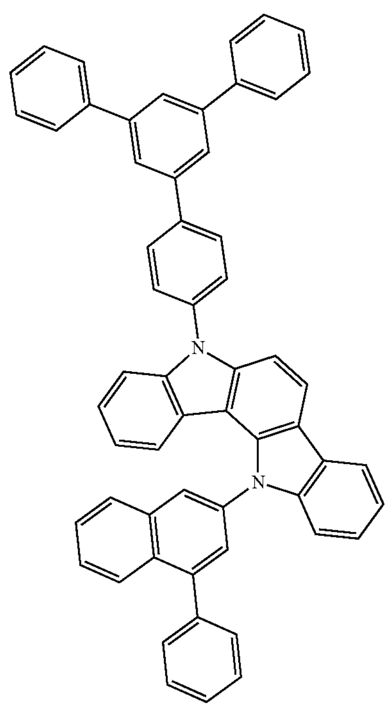
-continued
366
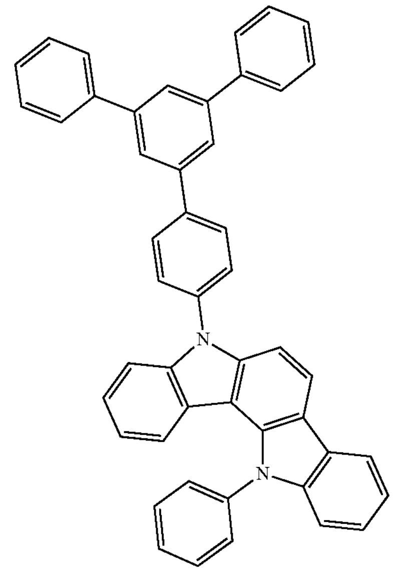
367
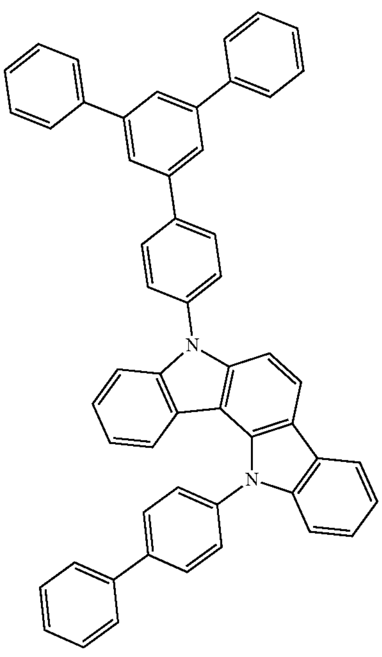

-continued

368

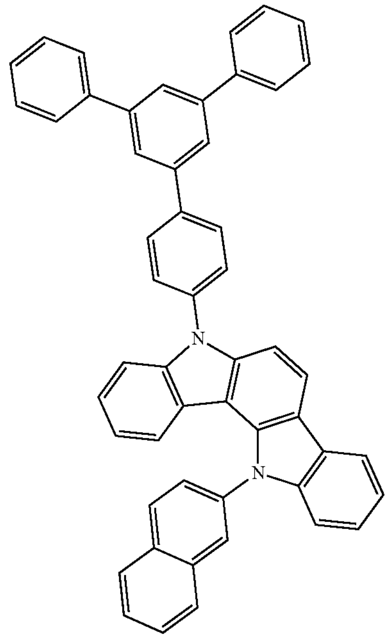

369

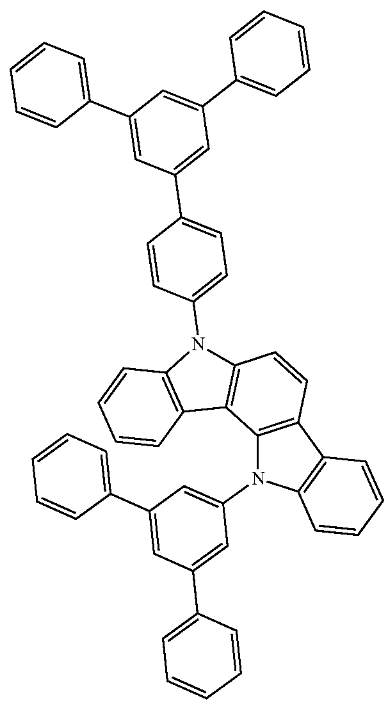

A ratio of the carbazole-based compound of Formula 1 to the heterocyclic compound of Formula 10A, 10B, 10C, 10D, and 10E may be in a range of about 0.01:0.99 to about 0.99:0.01, but is not limited thereto.

In some embodiments, the ratio of the carbazole-based compound of Formula 1 to the heterocyclic compound of Formula 10A, 10B, 10C, 10D, and 10E may be in a range of about 0.20:0.80 to about 0.80:0.20, for example, 0.50:0.50, but is not limited thereto.

One of the important factors affecting the efficiency and lifetime of an organic light-emitting device is a balance between electrons and holes in an emission layer of the organic light-emitting device. Another important factor is a wide distribution of an emission region in the emission layer, not biased toward a hole transport region or an electron transport region. However, these requirements may not be satisfied with only one material. Rather, using (utilizing) two materials having different substituent's characteristics may lead to satisfactory results. Accordingly, when the carbazole-based compound of Formula 1 includes an electron transporting cyclic group, the heterocyclic compounds of Formulae 10A to 10E may not include an electron transporting cyclic group. When the carbazole-based compound of Formula 1 does not include an electron transporting cyclic group, the heterocyclic compound of Formulae 10A to 10E may include an electron transporting cyclic group.

For example, when an OLED includes the carbazole-based compound of Formula 1 including triazine as a strong electron transporting cyclic group, and when the OLED further includes relatively large amount of the heterocyclic compound of Formulae 10A to 10E including no electron transporting cyclic compound, the OLED may have improved efficiency and lifetime characteristics. For example, when an OLED includes the carbazole-based compound of Formula 1 including pyridine or pyrimidine as a relatively weak electron transporting cyclic group, and when the OLED further includes relatively small amount of the heterocyclic compound of Formulae 10A to 10E including no electron transporting cyclic compound, the OLED may have improved efficiency and lifetime characteristics.

As described above, an appropriate ratio between the two hosts may vary depending on the electrical characteristics of each of the hosts.

For example, the heterocyclic compound of Formulae 10A to 10E not including an electron transporting cyclic group may have a wide band gap, and the heterocyclic compounds of Formulae 10A to 10E may effectively control the electron transport characteristics of the carbazole-based compound of Formula 1 including an electron transporting cyclic group having a relative narrow energy gap. This may reduce or prevent the emission region from being concentrated toward an interface between the hole transport layer and the emission layer, and consequentially improve the efficiency and lifetime characteristics of the organic light-emitting device. On the other hand, the heterocyclic compound of Formulae 10A to 10E including an electron transporting cyclic group may effectively control the electron transport characteristics of the carbazole-based compound of Formula 1 not including an electron transporting cyclic group. This may reduce or prevent the emission region from being concentrated toward the interface between the hole transport layer and the emission layer, and consequentially improve the efficiency and lifetime characteristics of the organic light-emitting device.

The EML may further include a dopant. For example, the dopant may be a phosphorescent dopant.

For example, the phosphorescent dopant may be selected from the organic metal complexes represented by Formula 401, but is not limited thereto:

Formula 401

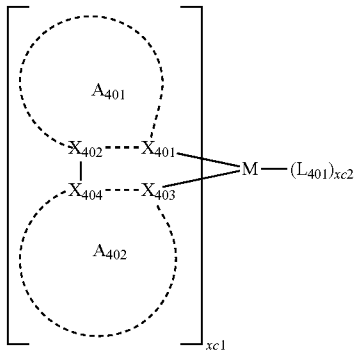

In Formula 401,

M may be selected from iridium (Ir), platinum (Pt), osmium (Os), titanium (Ti), zirconium (Zr), halfnium (Hf), europium (Eu), terbium (Tb), and thulium (Tm);

$X_{401}$ to $X_{404}$ may be each independently a nitrogen atom or a carbon atom;

$A_{401}$ and $A_{402}$ ring may be each independently selected from a substituted or unsubstituted benzene group, a substituted or unsubstituted naphthalene group, a substituted or unsubstituted fluorene group, a substituted or unsubstituted spiro-fluorene group, a substituted or unsubstituted indene group, a substituted or unsubstituted pyrrole group, a substituted or unsubstituted thiophene group, a substituted or unsubstituted furan group, a substituted or unsubstituted imidazole group, a substituted or unsubstituted pyrazole group, a substituted or unsubstituted thiazole group, a substituted or unsubstituted isothiazole group, a substituted or unsubstituted oxazole group, a substituted or unsubstituted isoxazole group, a substituted or unsubstituted pyridine group, a substituted or unsubstituted pyrazine group, a substituted or unsubstituted pyrimidine group, a substituted or unsubstituted pyridazine group, a substituted or unsubstituted quinoline group, a substituted or unsubstituted isoquinoline group, a substituted or unsubstituted benzoquinoline group, a substituted or unsubstituted quinoxaline group, a substituted or unsubstituted quinazoline group, a substituted or unsubstituted carbazole group, a substituted or unsubstituted benzoimidazole group, a substituted or unsubstituted benzofuran group, a substituted or unsubstituted benzothiophene group, a substituted or unsubstituted isobenzothiophene group, a substituted or unsubstituted benzoxazole group, a substituted or unsubstituted isobenzoxazole group, a substituted or unsubstituted triazole group, a substituted or unsubstituted oxadiazole group, a substituted or unsubstituted triazine group, a substituted or unsubstituted dibenzofuran group, and a substituted or unsubstituted dibenzothiophene group;

at least one substituent of the substituted benzene group, the substituted naphthalene group, the substituted fluorene group, the substituted spiro-fluorene group, the substituted indene group, the substituted pyrrole group, the substituted thiophene group, the substituted furan group, the substituted imidazole group, the substituted pyrazole group, the substituted thiazole group, the substituted isothiazole group, the substituted oxazole group, the substituted isoxazole group, the substituted pyridine group, the substituted pyrazine group, the substituted pyrimidine group, the substituted pyridazine group, the substituted quinoline group, the substituted isoquinoline group, the substituted benzoquinoline group, the substituted quinoxaline group, the substituted quinazoline group, the substituted carbazole group, the substituted benzoimidazole group, the substituted benzofuran group, the substituted benzothiophene group, the substituted isobenzothiophene group, the substituted benzoxazole group, the substituted isobenzoxazole group, the substituted triazole group, the substituted oxadiazole group, the substituted triazine group, the substituted dibenzofuran group, and the substituted dibenzothiophene group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ hetero aryl group, a divalent non-aromatic condensed polycyclic group, —N($Q_{401}$) ($Q_{402}$), —Si($Q_{403}$)($Q_{404}$)($Q_{405}$), and —B($Q_{406}$)($Q_{407}$);

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, and a divalent non-aromatic condensed polycyclic group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ hetero aryl group, and a divalent non-aromatic condensed polycyclic group, —N($Q_{411}$)($Q_{412}$), —Si($Q_{413}$)($Q_{414}$)($Q_{415}$), and —B($Q_{416}$)($Q_{417}$); and —N($Q_{421}$)($Q_{422}$), —Si($Q_{423}$)($Q_{424}$)($Q_{425}$), and —B($Q_{426}$)($Q_{427}$);

$L_{401}$ may be an organic ligand;

xc1 may be 1, 2, or 3; and xc2 may be 0, 1, 2, or 3.

For example, $L_{401}$ may be a monovalent, divalent, or trivalent organic ligand. For example, $L_{401}$ may be selected from a halogen ligand (for example, a Cl or F), a diketone ligand (for example, acetylacetonate, 1,3-diphenyl-1,3-propanedionate, 2,2,6,6-tetramethyl-3,5-heptanedionate, or hexafluoroacetonate), a carboxylic acid ligand (for example, picolinate, dimethyl-3-pyrazole carboxylate, or benzoate), a carbon monoxide ligand, an isonitrile ligand, a cyano ligand, and a phosphorous ligand (for example, phosphine or phosphaite), but is not limited thereto.

When $A_{401}$ in Formula 401 has at least two substituents, the at least two substituents of $A_{401}$ may be linked to each other to form a saturated or unsaturated ring.

When $A_{402}$ in Formula 401 has at least two substituents, the at least two substituents of $A_{402}$ may be linked to each other to form a saturated or unsaturated ring.

When xc1 in Formula 401 is 2 or greater, the plurality of ligands in Formula 401, represented by

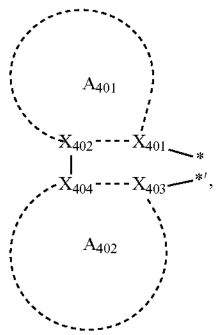

may be identical to or different from each other. When xc1 in Formula 401 is 2 or greater, $A_{401}$ and $A_{402}$ may be linked to $A_{401}$ and $A_{402}$ of another adjacent ligand directly or via a linker (for example, a $C_1$-$C_5$ alkylene group, —N(R')— (where R' is a $C_1$-$C_{10}$ alkyl group or a $C_6$-$C_{20}$ aryl group), or —C(=O)—).

In some embodiments, M in Formula 401 may be selected from iridium (Ir), platinum (Pt), and osmium (Os), but is not limited thereto.

In some embodiments, the phosphorescent dopant may be selected from Compounds PD1 to PD82, but is not limited thereto:

PD1

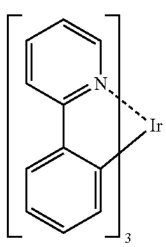

PD2

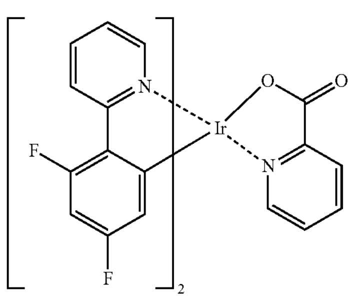

-continued

PD3

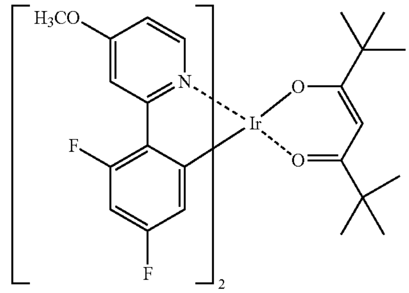

PD4

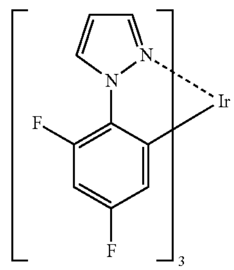

PD5

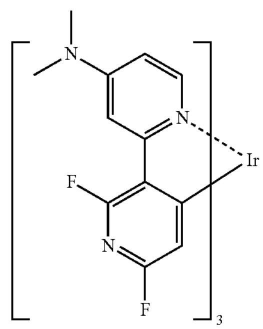

PD6

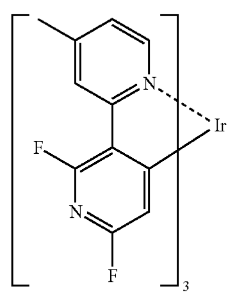

PD7

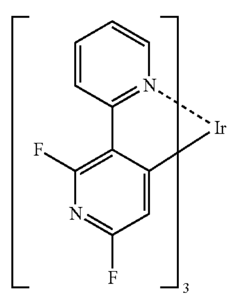

-continued
PD8
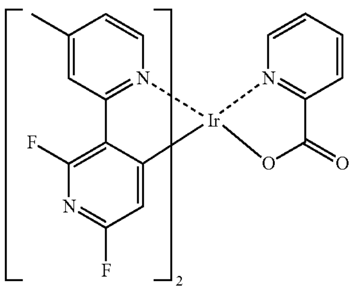
PD9
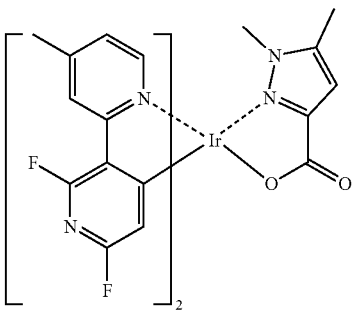
PD10
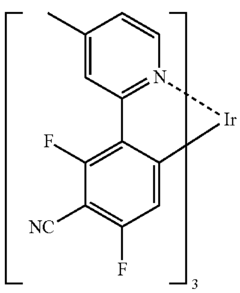
PD11
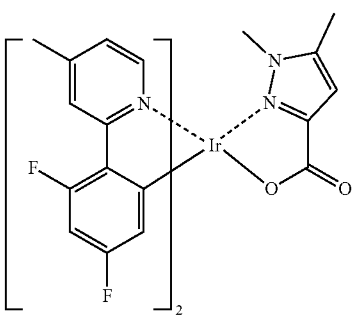
PD12
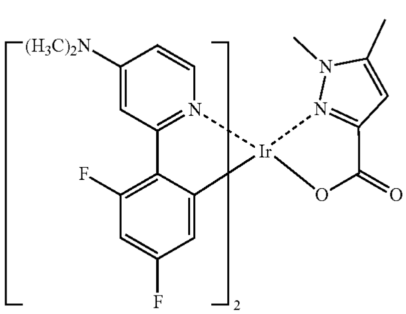
-continued
PD13
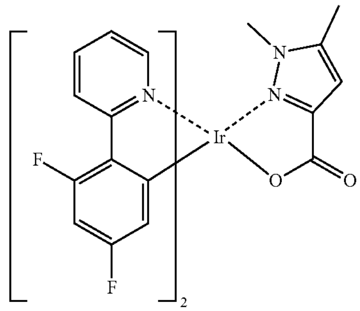
PD14
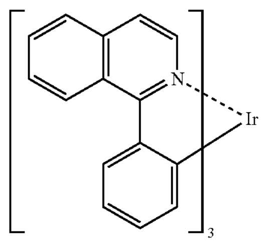
PD15
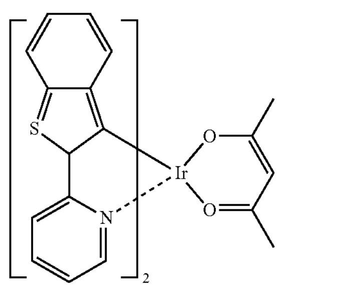
PD16
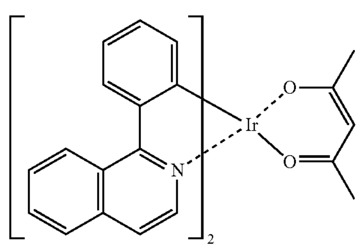
PD17
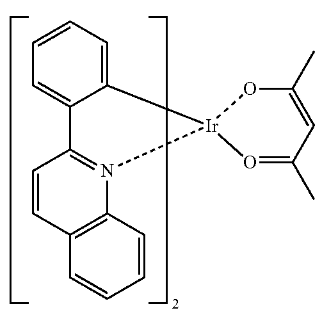

PD18
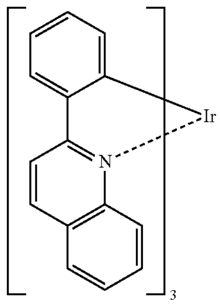
PD19
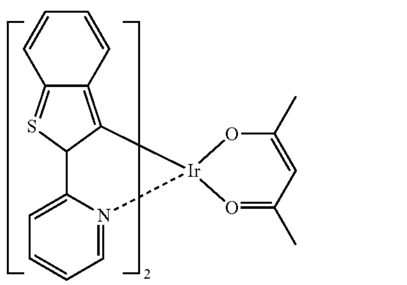
PD20
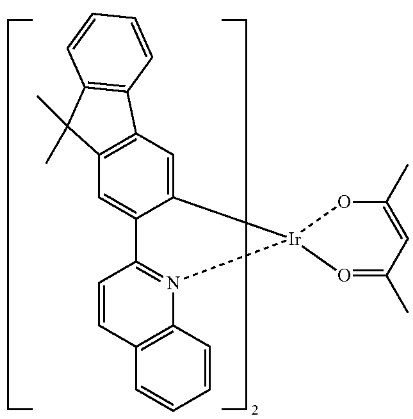
PD21
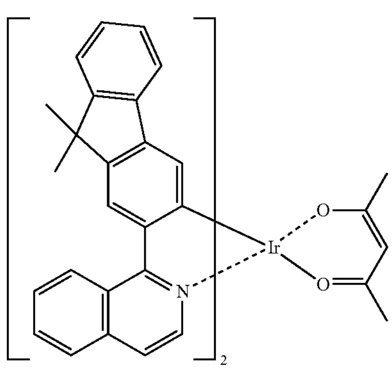
PD22
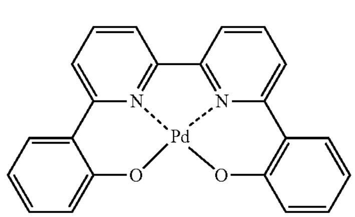
PD23
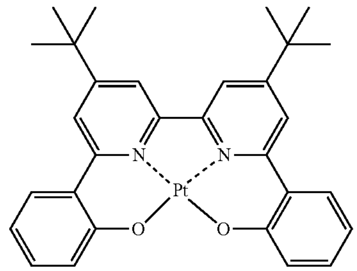
PD24
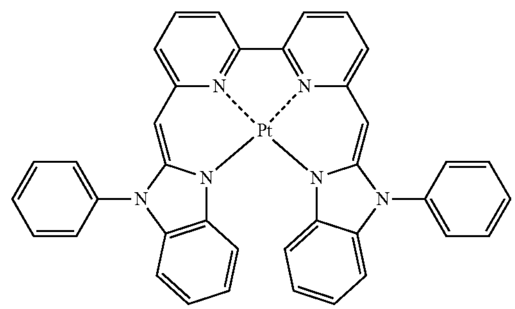
PD25
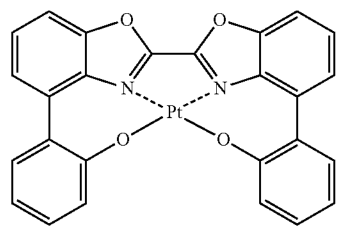
PD26
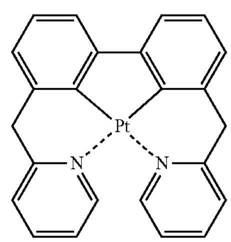
PD27
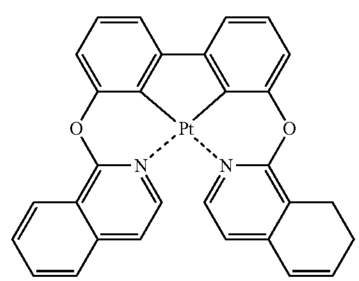
PD28
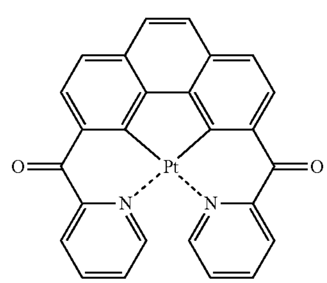

-continued
PD29
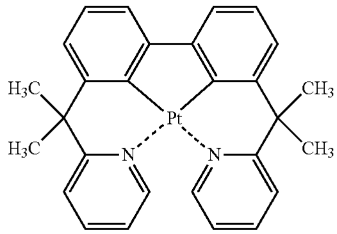
PD30
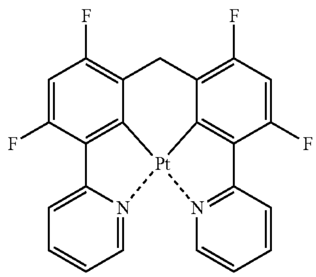
PD31
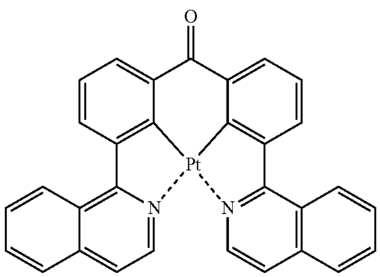
PD32
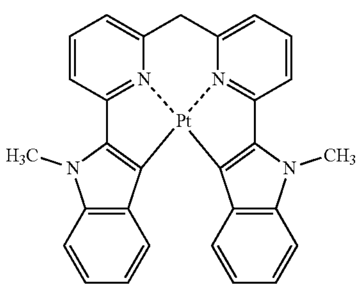
PD33
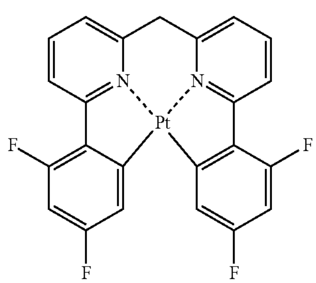
PD34
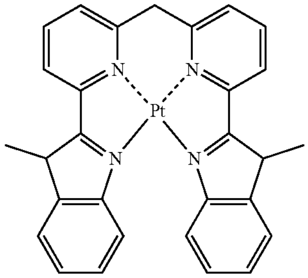
-continued
PD35
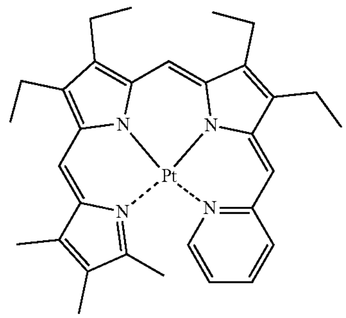
PD36
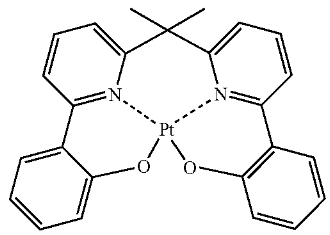
PD37
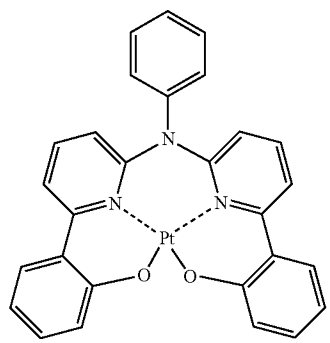
PD38
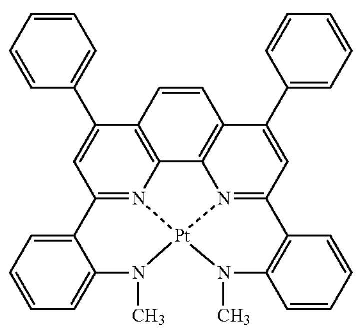
PD39
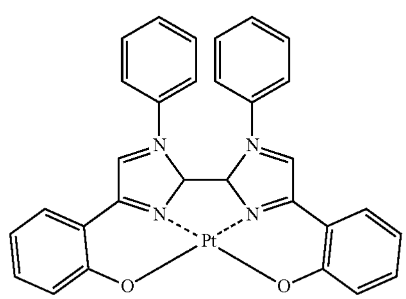

-continued
PD40
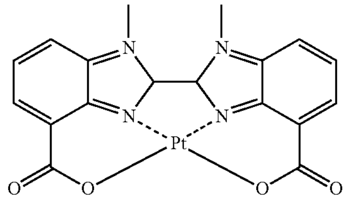
PD41
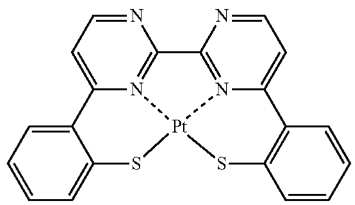
PD42
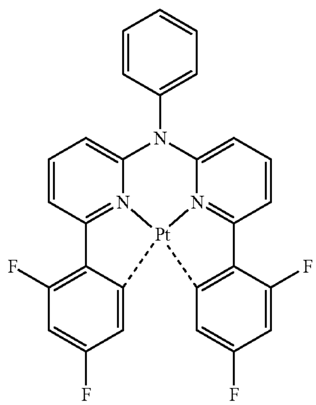
PD43
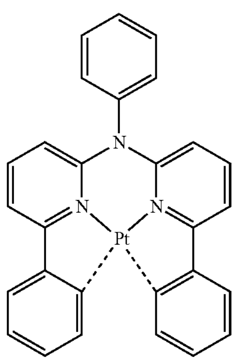
PD44
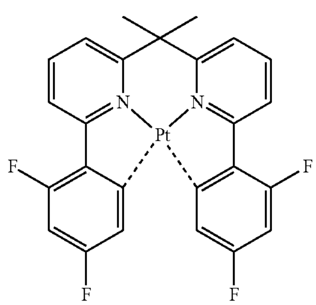
-continued
PD45
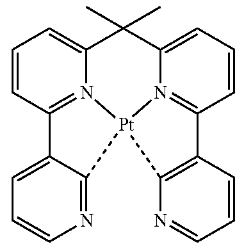
PD46
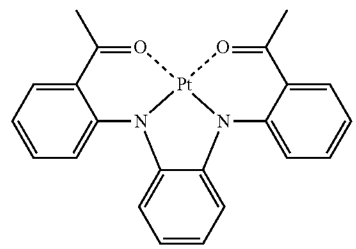
PD47
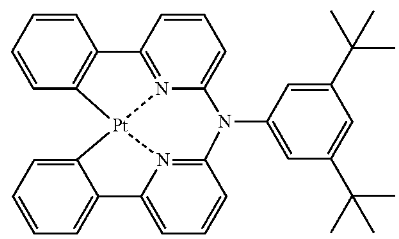
PD48
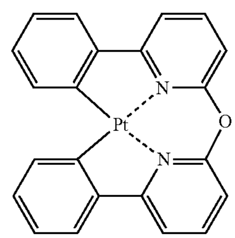
PD49
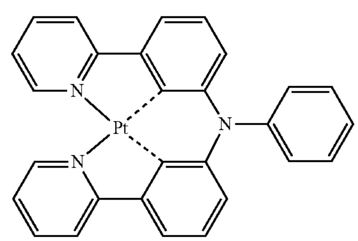
PD50
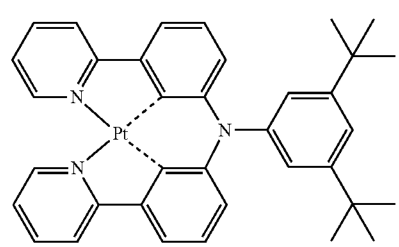

-continued
PD51
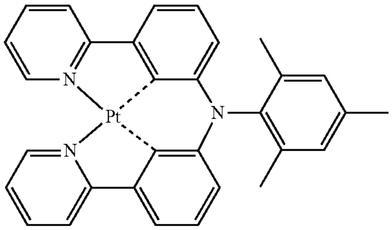
PD52
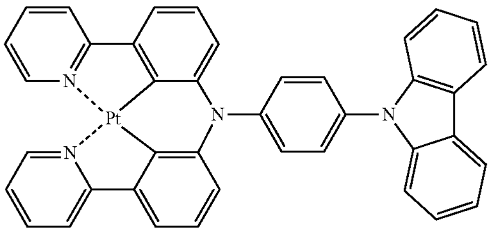
PD53
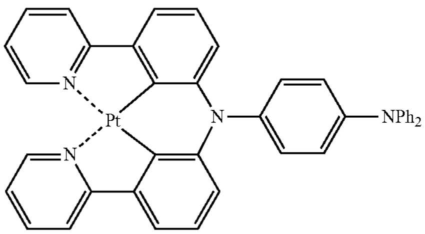
PD54
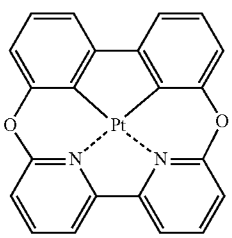
PD55
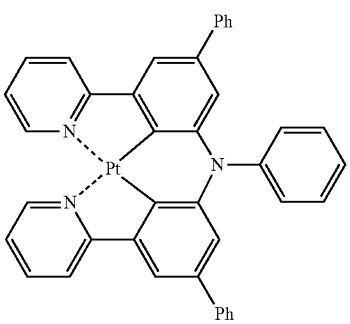
PD56
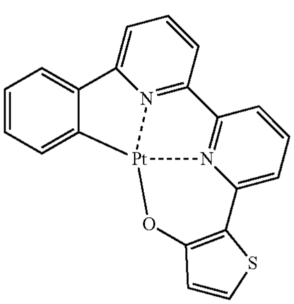
-continued
PD57
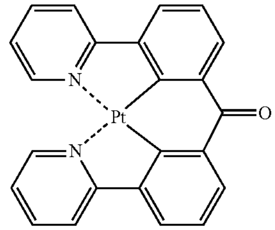
PD58
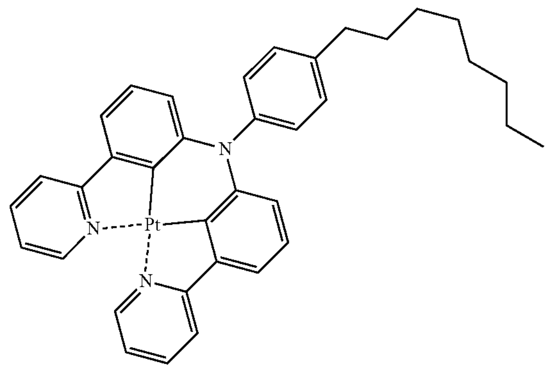
PD59
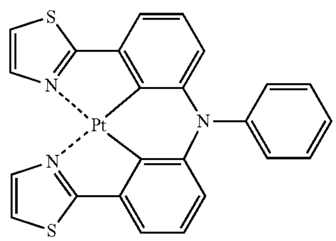
PD60
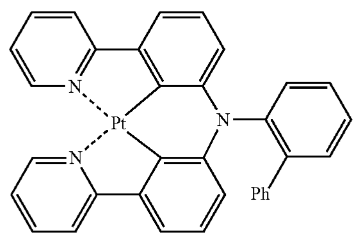
PD61
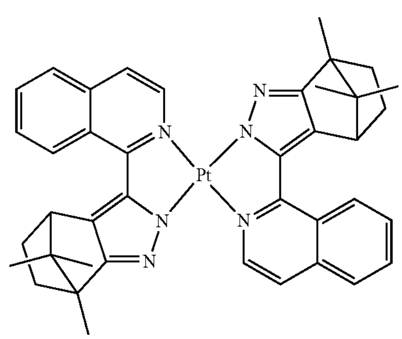

PD62
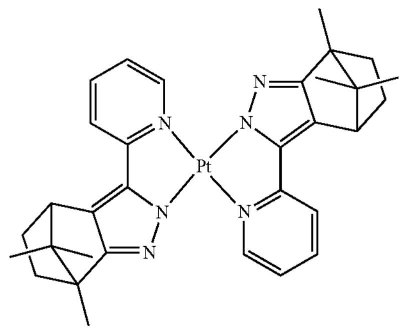
PD63
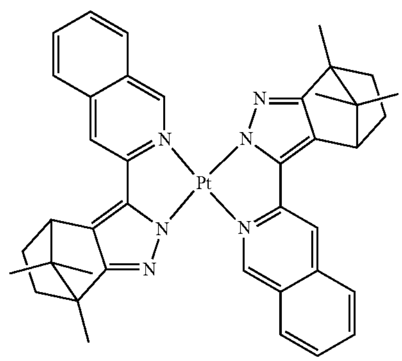
PD64
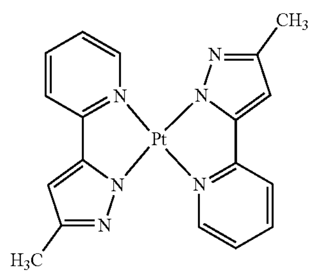
PD65
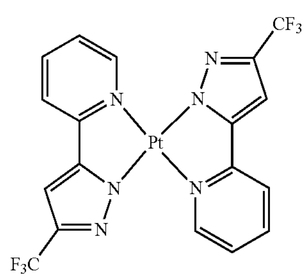
PD66
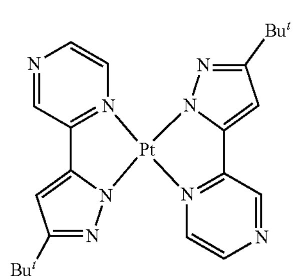
PD67
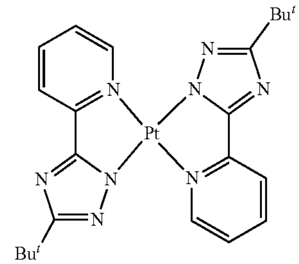
PD68
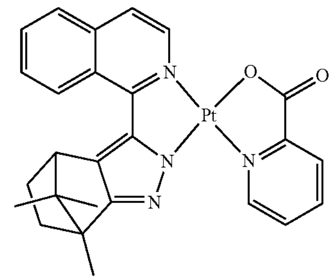
PD69
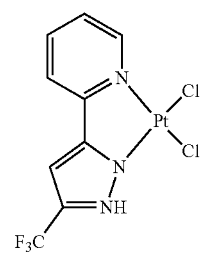
PD70
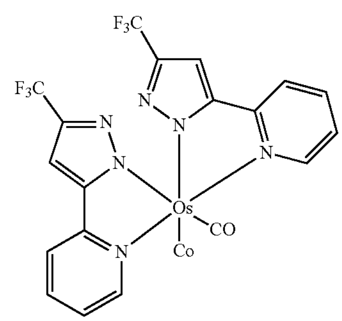
PD71
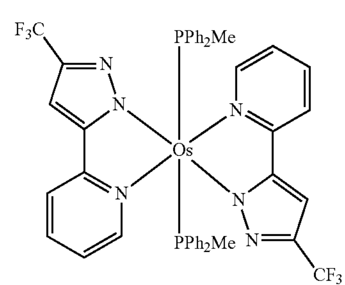

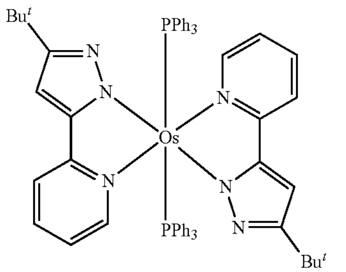
PD72
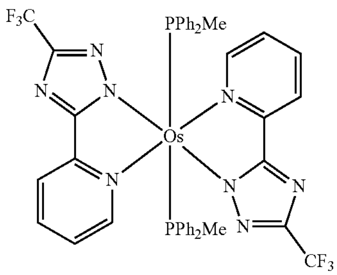
PD73
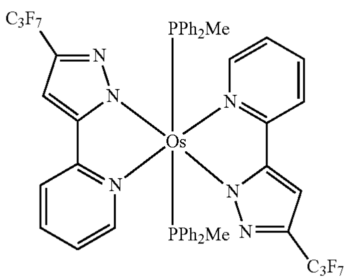
PD74
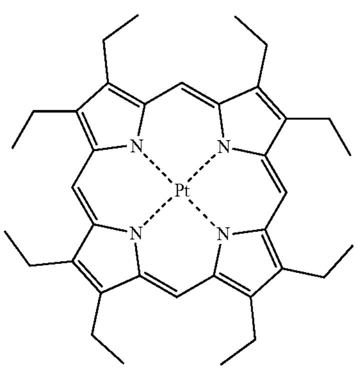
PD75
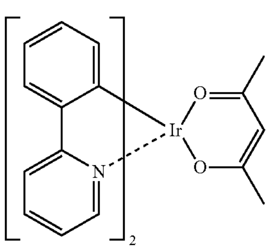
PD76
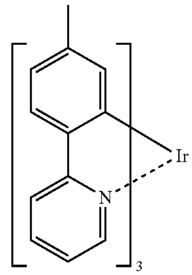
PD77
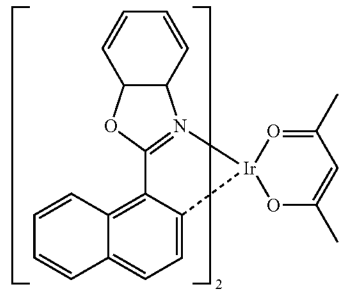
PD78
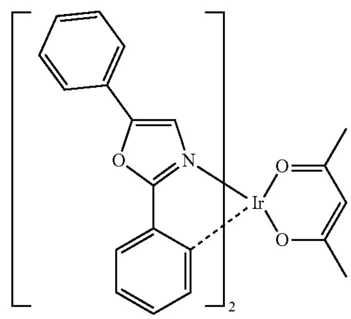
PD79
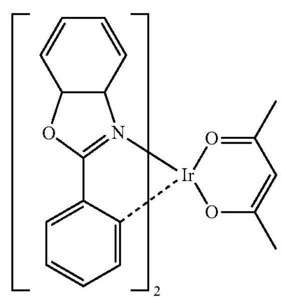
PD80
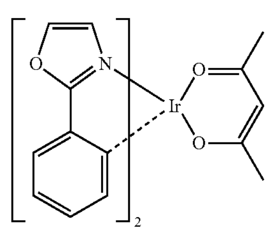
PD81

-continued

PD82

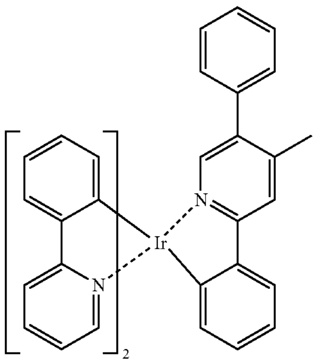

In some other embodiments, the phosphorescent dopant may be selected from Compound PD1 and Compounds PD76 to PD82, but is not limited thereto:

PD1

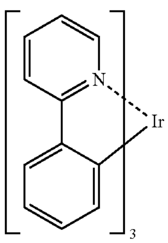

PD76

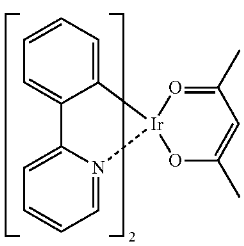

PD77

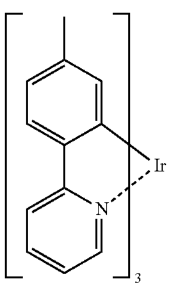

PD78

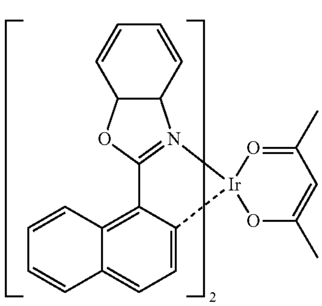

-continued

PD79

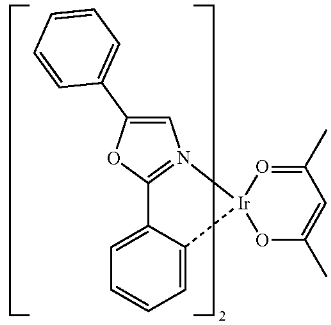

PD80

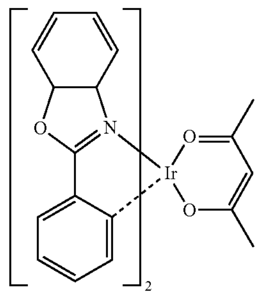

PD81

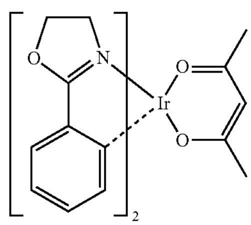

PD82

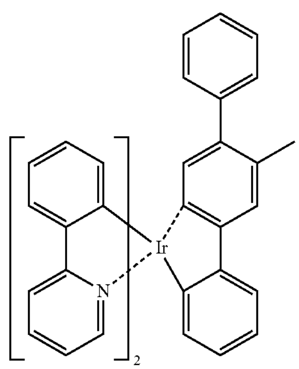

An amount of the dopant in the EML may be from about 0.01 parts to about 15 parts by weight based on 100 parts by weight of the host, but is not limited to this range.

A thickness of the EML may be about 100 Å to about 1000 Å, and in some embodiments, may be from about 200 Å to about 600 Å. In one embodiment, when the thickness of the EML is within these ranges, the EML has good light emitting ability without a substantial increase in driving voltage.

Next, the electron transport region may be formed on the EML.

The electron transport region may include at least one of an HBL, an ETL, and an EIL. However, embodiments of the present disclosure are not limited thereto.

In some embodiments, the electron transport region may have a structure including an ETL/EIL or an HBL/ETL/EIL, wherein the layers forming a structure of the electron transport region may be sequentially stacked on the EML in the order stated above. However, embodiments of the present disclosure are not limited thereto.

The electron transport region may include an HBL. When the EML includes a phosphorescent dopant, the HBL may reduce or prevent the diffusion of triplet exitons or holes into the ETL from the EML.

When the electron transport region includes an HBL, the HBL may be formed on the EML by using (utilizing) any of a variety of suitable methods, for example, by using (utilizing) vacuum deposition, spin coating, casting, Langmuir-Blodgett (LB) deposition, inkjet printing, laser printing, laser induced thermal imaging (LITI), or the like. When the HBL is formed using (utilizing) vacuum deposition or spin coating, the deposition and coating conditions for forming the HBL may be similar to the above-described deposition and coating conditions for forming the HIL, and accordingly will not be described in more detail.

For example, the HBL may include at least one of BCP below and Bphen below. However, embodiments of the present disclosure are not limited thereto.

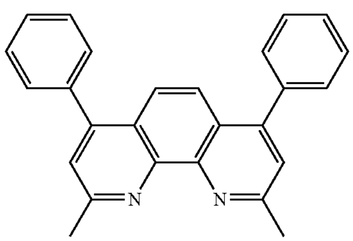

BCP

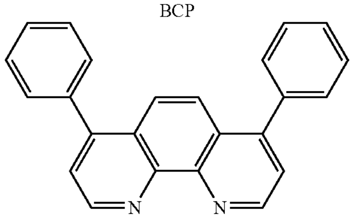

Bphen

A thickness of the HBL may be from about 20 Å to about 1,000 Å, and in some embodiments, from about 30 Å to about 300 Å. In one embodiment, when the thickness of the HBL is within these ranges, the HBL has improved hole blocking ability without a substantial increase in driving voltage.

The electron transport region may include an ETL. The ETL may be formed on the EML or the HBL by using (utilizing) any of a variety of suitable methods, for example, by using (utilizing) vacuum deposition, spin coating, casting, Langmuir-Blodgett (LB) deposition, inkjet printing, laser printing, laser induced thermal imaging (LITI), or the like. When the ETL is formed using (utilizing) vacuum deposition or spin coating, the deposition and coating conditions for forming the ETL may be similar to the above-described deposition and coating conditions for forming the HIL, and accordingly will not be described in more detail.

The ETL may further include at least one of BCP, Bphen, $Alq_3$, Balq, TAZ, and NTAZ below.

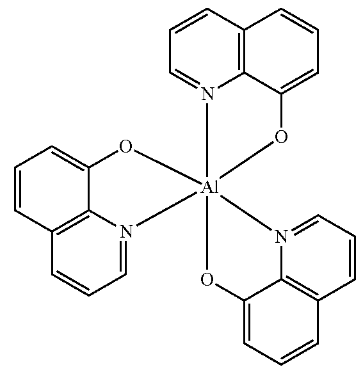

$Alq_3$

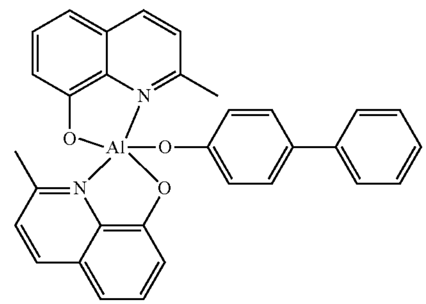

BAlq

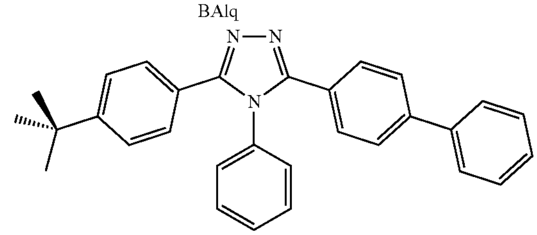

TAZ

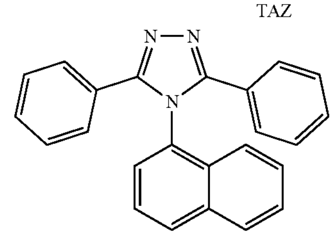

NTAZ

In some embodiments, the ETL may include at least one of the compounds represented by Formula 601 below:

$$Ar_{601}\text{-}[(L_{601})_{xe1}\text{-}E_{601}]_{xe2} \qquad \text{Formula 601}$$

In Formula 601, $Ar_{601}$ may be selected from:

a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group; and a naphthalene group, a heptalene group, a fluorene group, a spiro-fluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, and an indenoanthracene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ hetero aryl group, a divalent non-aromatic condensed polycyclic group, and —Si($Q_{301}$)($Q_{302}$)($Q_{303}$) (where $Q_{301}$ to $Q_{303}$ are each independently selected from a hydrogen, a $C_1$-$C_{60}$ alkyl group, a $C_2$-$C_{60}$ alkenyl group, a $C_6$-$C_{60}$ aryl group, and a $C_2$-$C_{60}$ heteroaryl group);

$L_{601}$ may be defined as described above herein in conjunction with $L_{201}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coroneryl group, an obarenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

In some other embodiments, the ETL may include at least one of the Compounds represented by Formula 602 below:

Formula 602

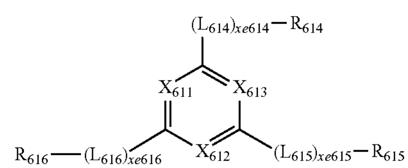

In Formula 602, $X_{611}$ may be N or C-$(L_{611})_{xe611}$-$R_{611}$; $X_{612}$ may be N or C-$(L_{612})_{xe612}$-$R_{612}$; $X_{613}$ may be N or C-$(L_{613})_{xe613}$-$R_{613}$; at least one of $X_{611}$ to $X_{613}$ may be N;

$L_{611}$ to $L_{616}$ may be defined as described above in conjunction $L_{201}$;

$R_{611}$ to $R_{616}$ may be each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one of a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from, 0, 1, 2, and 3.

The compound of Formula 601 and the compound of Formula 602 may each independently include at least one of Compounds ET1 to ET15 illustrated below.

ET1

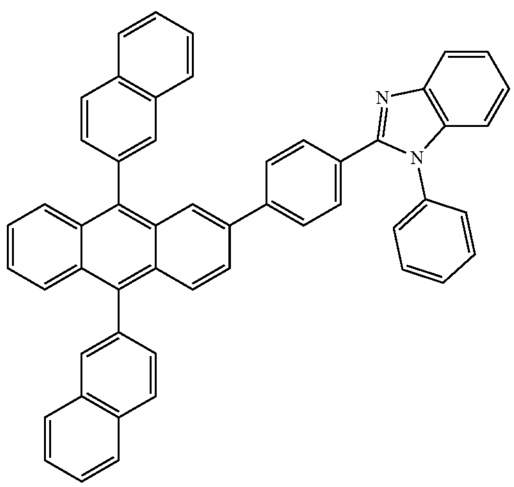

ET2

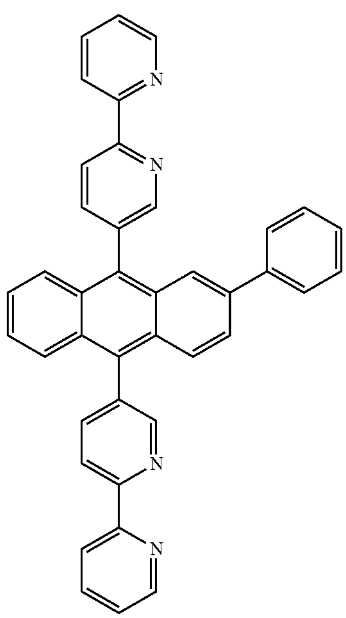

-continued

ET3

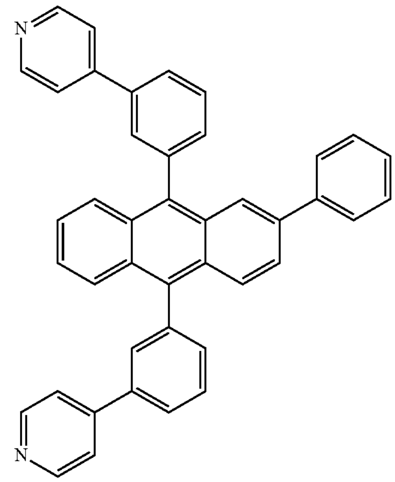

ET4

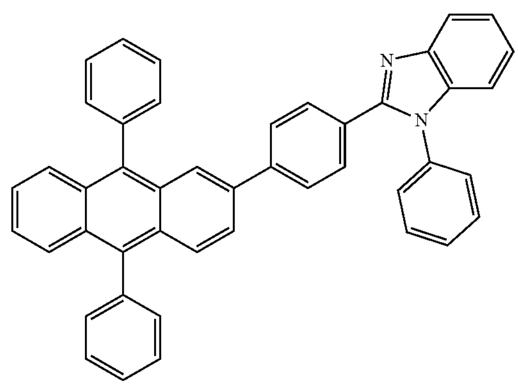

ET5

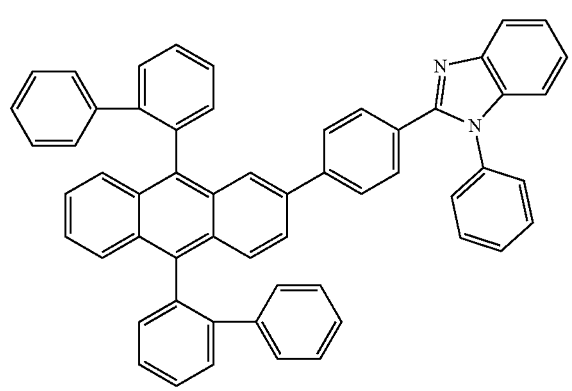

-continued
ET6
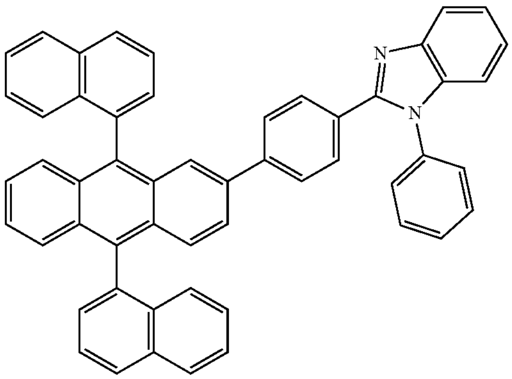
ET7
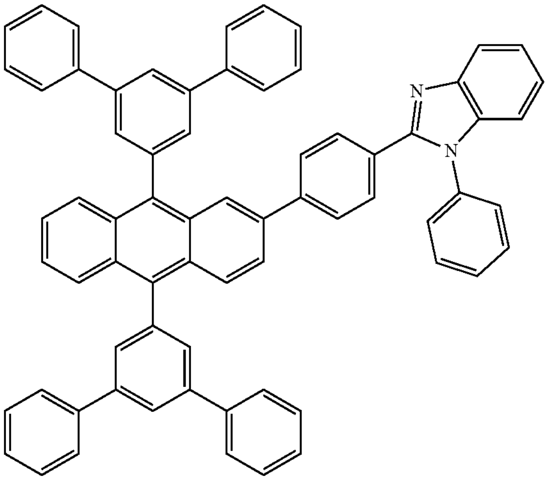
ET8
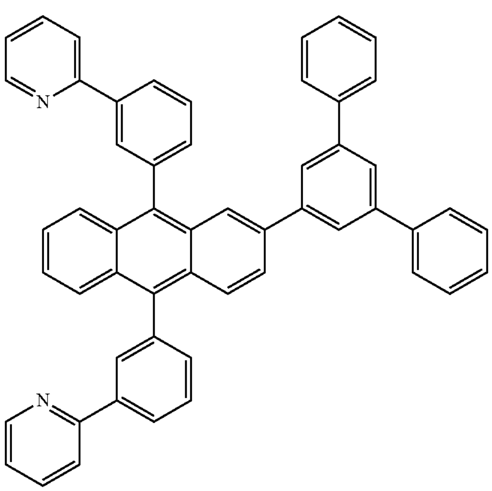
-continued
ET9
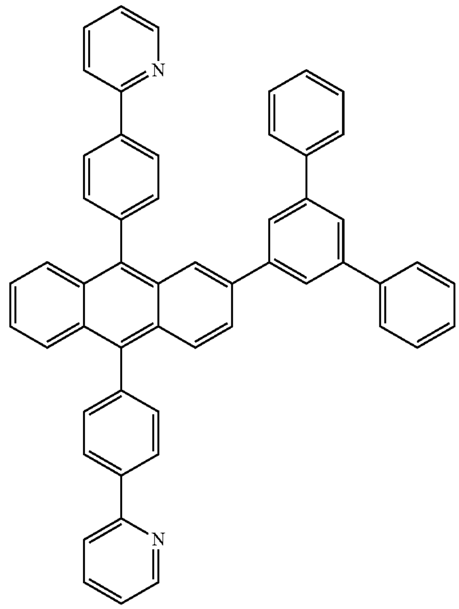
ET10
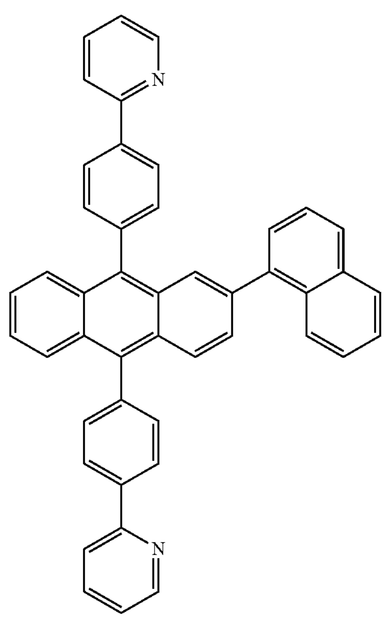

ET11

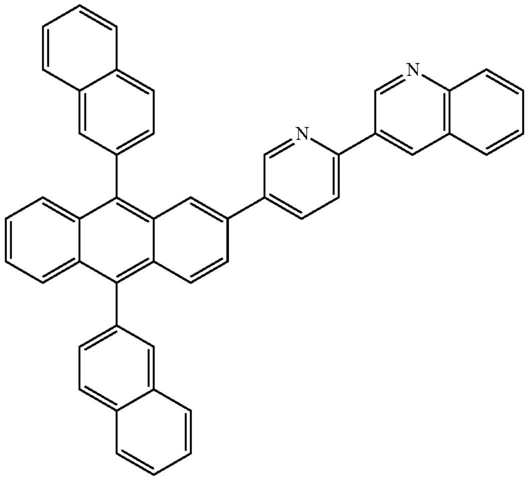

ET12

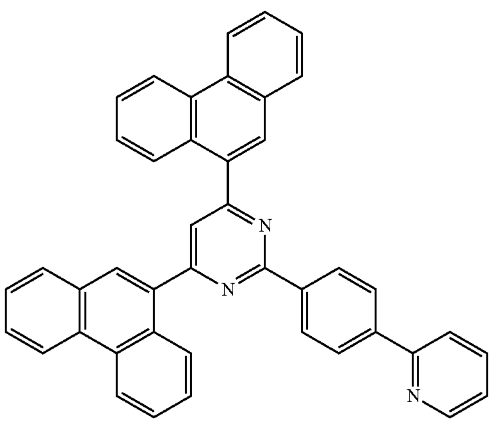

ET13

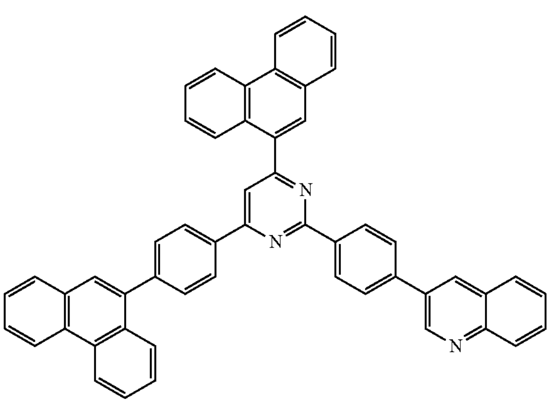

ET14

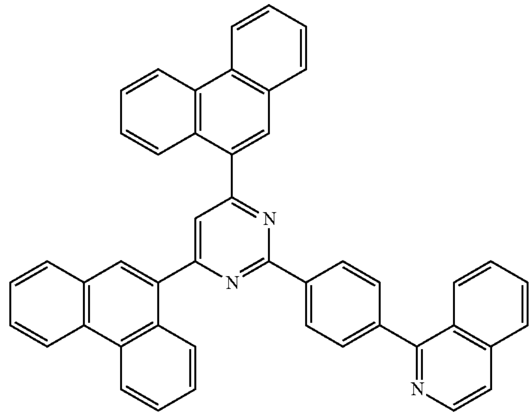

ET15

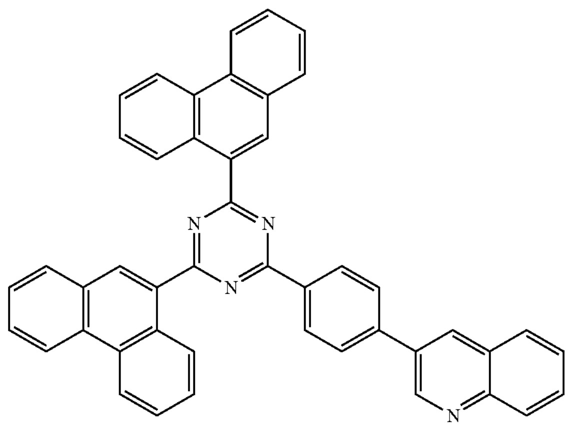

A thickness of the ETL may be from about 100 Å to about 1,000 Å, and in some embodiments, from about 150 Å to about 500 Å. In one embodiment, when the thickness of the ETL is within these ranges, the ETL has satisfactory electron transporting ability without a substantial increase in driving voltage.

In some embodiments the ETL may further include a metal-containing material, in addition to the above-described materials.

The metal-containing material may include a lithium (Li) complex. Non-limiting examples of the Li complex are compound ET-D1 below (lithium quinolate (LiQ)), and compound ET-D2 below.

ET-D1

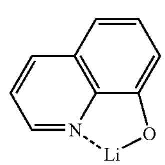

-continued

ET-D2

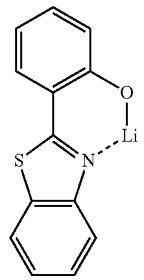

The electron transport region may include an EIL that may facilitate injection of electrons from the second electrode 190.

The EIL may be formed on the ETL by using (utilizing) any of a variety of suitable methods, for example, by using (utilizing) vacuum deposition, spin coating, casting, Langmuir-Blodgett (LB) deposition, inkjet printing, laser printing, laser induced thermal imaging (LITI), or the like. When the EIL is formed using (utilizing) vacuum deposition or spin coating, the deposition and coating conditions for forming the EIL may be similar to the above-described deposition and coating conditions for forming the HIL, and accordingly will not be described in more detail.

The EIL may include at least one selected from LiF, NaCl, a CsF, $Li_2O$, BaO, and LiQ.

A thickness of the EIL may be from about 1 Å to about 100 Å, and in some embodiments, from about 3 Å to about 90 Å. In one embodiment, when the thickness of the EIL is within these ranges, the EIL has satisfactory electron injection ability without a substantial increase in driving voltage.

The second electrode 190 may be disposed on the organic layer 150, as described above. The second electrode 190 may be a cathode as an electron injecting electrode. A material for forming the second electrode 190 may be a metal, an alloy, an electrically conductive compound, which have a low-work function, or a mixture thereof. Non-limiting examples of suitable materials for forming the second electrode 190 are lithium (Li), magnesium (Mg), aluminum (Al), aluminum-lithium (Al—Li), calcium (Ca), magnesium-indium (Mg—In), and magnesium-silver (Mg—Ag). In some embodiments, a material for forming the second electrode 190 may be ITO or IZO. The second electrode 190 may be a reflective electrode, a semi-transmissive electrode, or a transmissive electrode.

Although the organic light-emitting device of the drawing is described above, embodiments of the present disclosure are not limited thereto.

As used herein, a $C_1$-$C_{60}$ alkyl group refers to a linear or branched aliphatic hydrocarbon monovalent group having 1 to 60 carbon atoms. Non-limiting examples of the $C_1$-$C_{60}$ alkyl group include a methyl group, an ethyl group, a propyl group, an isobutyl group, a sec-butyl group, a tert-butyl group, a pentyl group, an iso-amyl group, and a hexyl group. A $C_1$-$C_{60}$ alkylene group refers to a divalent group having the same structure as the $C_1$-$C_{60}$ alkyl group.

As used herein, a $C_1$-$C_{60}$ alkoxy group refers to a monovalent group represented by —$OA_{101}$ (where $A_{101}$ is a $C_1$-$C_{60}$ alkyl group, as described above). Non-limiting examples of the $C_1$-$C_{60}$ alkoxy group are a methoxy group, an ethoxy group, and an isopropyloxy group.

As used herein, a $C_2$-$C_{60}$ alkenyl group refers to a hydrocarbon group including at least one carbon double bond in the middle or terminal position of the $C_2$-$C_{60}$ alkyl group.

Non-limiting examples of the $C_2$-$C_{60}$ alkenyl group are an ethenyl group, a prophenyl group, and a butenyl group. A $C_2$-$C_{60}$ alkylene group refers to a divalent group having the same structure as the $C_2$-$C_{60}$ alkenyl group.

As used herein, a $C_2$-$C_{60}$ alkynyl group refers to a hydrocarbon group including at least one carbon triple bond in the middle or terminal position of the $C_2$-$C_{60}$ alkyl group. Non-limiting examples of the $C_2$-$C_{60}$ alkynyl group are an ethynyl group and a propynyl group. A $C_2$-$C_{60}$ alkynylene group used herein refers to a divalent group having the same structure as the $C_2$-$C_{60}$ alkynyl group.

As used herein, a $C_3$-$C_{10}$ cycloalkyl group refers to a monovalent, monocyclic hydrocarbon group having 3 to 10 carbon atoms. Non-limiting examples of the $C_3$-$C_{10}$ cycloalkyl group are a cyclopropyl group, a cyclobutyl group, a cyclopentyl group, a cyclohexyl group, and a cycloheptyl group. A $C_3$-$C_{10}$ cycloalkylene group refers to a divalent group having the same structure as the $C_3$-$C_{10}$ cycloalkyl group.

As used herein, a $C_3$-$C_{10}$ heterocycloalkyl group refers to a monovalent monocyclic group having 3 to 10 carbon atoms in which at least one hetero atom selected from N, O, P, and S is included as a ring-forming atom. Non-limiting examples of the $C_2$-$C_{10}$ heterocycloalkyl group are a tetrahydrofuranyl group, and a tetrahydrothiophenyl group. A $C_3$-$C_{10}$ heterocycloalkylene group refers to a divalent group having the same structure as the $C_3$-$C_{10}$ heterocycloalkyl group.

As used herein, a $C_3$-$C_{10}$ cycloalkenyl group refers to a monovalent monocyclic group having 3 to 10 carbon atoms that includes at least one double bond in the ring but does not have aromaticity. Non-limiting examples of the $C_3$-$C_{10}$ cycloalkenyl group are a cyclopentenyl group, a cyclohexenyl group, and a cycloheptenyl group. A $C_3$-$C_{10}$ cycloalkenylene group refers to a divalent group having the same structure as the $C_3$-$C_{10}$ cycloalkenyl group.

As used herein, a $C_3$-$C_{10}$ heterocycloalkenyl group used herein refers to a monovalent monocyclic group having 3 to 10 carbon atoms that includes at least one double bond in the ring and in which at least one hetero atom selected from N, O, P, and S is included as a ring-forming atom. Non-limiting examples of the $C_3$-$C_{10}$ heterocycloalkenyl group are a 2,3-hydrofuranyl group and a 2,3-hydrothiophenyl group. A $C_3$-$C_{10}$ heterocycloalkenylene group used herein refers to a divalent group having the same structure as the $C_3$-$C_{10}$ heterocycloalkenyl group.

As used herein, a $C_6$-$C_{60}$ aryl group refers to a monovalent, aromatic carbocyclic aromatic group having 6 to 60 carbon atoms, and a $C_6$-$C_{60}$ arylene group refers to a divalent, aromatic carbocyclic group having 6 to 60 carbon atoms. Non-limiting examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include at least two rings, the rings may be fused to each other.

As used herein, a $C_2$-$C_{60}$ heteroaryl group refers to a monovalent, aromatic carbocyclic aromatic group having 2 to 60 carbon atoms in which at least one hetero atom selected from N, O, P, and S is included as a ring-forming atom. A $C_2$-$C_{60}$ heteroarylene group refers to a divalent, aromatic carbocyclic group having 2 to 60 carbon atoms in which at least one hetero atom selected from N, O, P, and S is included as a ring-forming atom. Non-limiting examples of the $C_2$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_2$-$C_{60}$ heteroaryl group and the $C_2$-$C_{60}$ heteroarylene group include at least two rings, the rings may be fused to each other.

As used herein, a $C_6$-$C_{60}$ aryloxy group refers to a group represented by —$OA_{102}$ (where $A_{102}$ is a $C_6$-$C_{60}$ aryl group as described above), and a $C_6$-$C_{60}$ arylthio group refers to a group represented by —$SA_{103}$ (where $A_{103}$ is a $C_6$-$C_{60}$ aryl group as described above).

As used herein, the monovalent non-aromatic condensed polycyclic group refers to a monovalent group that includes at least two rings condensed to each other, includes only carbon atoms as ring-forming atoms, and has non-aromaticity as a whole. An example of the monovalent non-aromatic condensed polycyclic group is a fluorenyl group. As used herein, a divalent non-aromatic condensed polycyclic group refers to a divalent group with the same structure as the monovalent non-aromatic condensed polycyclic group.

As used herein, the monovalent non-aromatic condensed heteropolycyclic group refers to a monovalent group that includes at least two rings condensed to each other, includes carbon and hetero atoms selected from N, O, P and S as ring-forming atoms, and has non-aromaticity as a whole. An example of the monovalent non-aromatic condensed heteropolycyclic group is a carbazolyl group. As used herein, a divalent non-aromatic condensed heteropolycyclic group refers to a divalent group with the same structure as the monovalent non-aromatic condensed polycyclic group.

The acronym "Ph" used herein refers to a phenyl group, the acronym "Me" used herein refers to a methyl group, the acronym "Et" used herein refers to an ethyl group, and the acronym "ter-Bu" or "But" used herein refers to a tert-butyl group.

One or more embodiments of the present disclosure will now be described in more detail with reference to the following examples. However, these examples are only for illustrative purposes and are not intended to limit the scope of the one or more embodiments of the present disclosure. In the following synthesis example, the expression that "'B' instead of 'A' was used" refers to that the amounts of 'B' and 'A' were the same in equivalent amounts.

EXAMPLES

Example 1

To manufacture an anode, a glass substrate (with ITO, Ag, and ITO layers having a thickness of about 70 Å, about 1000 Å, and about 70 Å, respectively) was cut to a size of 50 mm×50 mm×0.4 mm and then sonicated in isopropyl alcohol for 10 minutes and pure water for 10 minutes, and then cleaned by irradiation of ultraviolet rays for 10 minutes and exposure to ozone. The resulting ITO/Ag/ITO substrate was mounted into a vacuum deposition device.

After HT13 was deposited on the anode to form an HIL having a thickness of 700 Å, HT3 was deposited on the HIL to form an HTL having a thickness of about 800 Å. Compound 112A (host), Compound 226 (host), and Compound PD82 were co-deposited in a weight ratio of 100:100:15 on the HTL to form an EML having a thickness of about 400 Å. Next, ET1 and LiQ were vacuum-deposited on the EML in a weight ratio of 100:100 to form an ETL having a thickness of about 360 Å. LiQ was deposited on the ETL to form an EIL having a thickness of about 10 Å. Subsequently, Mg and Ag were co-deposited on the EIL in a weight ratio of 90:10 to form a cathode having a thickness of about 120 Å, thereby manufacturing an organic light-emitting device.

Example 2

An organic light-emitting device was manufactured in the same manner as in Example 1, except that Compound 108A and Compound 119, instead of Compound 112A and Compound 226, respectively, were used (utilized) to form the EML.

Example 3

An organic light-emitting device was manufactured in the same manner as in Example 1, except that Compound 127A and Compound 104, instead of Compound 112A and Compound 226, respectively, were used (utilized) to form the EML.

Example 4

An organic light-emitting device was manufactured in the same manner as in Example 1, except that Compound 112A and Compound 226 were co-deposited in a weight ratio of about 70:30 to form the EML.

Example 5

An organic light-emitting device was manufactured in the same manner as in Example 1, except that Compound 108A and Compound 119, instead of Compound 112A and Compound 226, respectively, were used (utilized), and Compound 108A and Compound 119 were co-deposited in a weight ratio of about 70:30 to form the EML.

Example 6

An organic light-emitting device was manufactured in the same manner as in Example 1, except that Compound 127A and Compound 104, instead of Compound 112A and Compound 226, respectively, were used (utilized); and Compound 127A and Compound 104 were co-deposited in a weight ratio of about 70:30 to form the EML.

Example 7

An organic light-emitting device was manufactured in the same manner as in Example 1, except that Compound 161B and Compound 306, instead of Compound 112A and Compound 226, respectively, were used (utilized) to form the EML.

Example 8

An organic light-emitting device was manufactured in the same manner as in Example 1, except that Compound 149B and Compound 312, instead of Compound 112A and Compound 226, respectively, were used (utilized) to form the EML.

Example 9

An organic light-emitting device was manufactured in the same manner as in Example 1, except that Compound 161B and Compound 306, instead of Compound 112A and Compound 226, respectively, were used (utilized); and Compound 161B and Compound 306 were co-deposited in a weight ratio of about 70:30 to form the EML.

Example 10

An organic light-emitting device was manufactured in the same manner as in Example 1, except that Compound 149B and Compound 312, instead of Compound 112A and Compound 226, respectively, were used (utilized); and Compound 149B and Compound 312 were co-deposited in a weight ratio of about 70:30 to form the EML.

Comparative Example 1

An organic light-emitting device was manufactured in the same manner as in Example 1, except that only Compounds 112A and PD82 (not using (utilizing) Compound 226) were co-deposited in a weight ratio of about 100:15 to form the EML.

Comparative Example 2

An organic light-emitting device was manufactured in the same manner as in Example 1, except that only Compounds 226 and PD82 (not using (utilizing) Compound 112A) were co-deposited in a weight ratio of about 100:15 to form the EML.

Comparative Example 3

An organic light-emitting device was manufactured in the same manner as in Example 1, except that only Compounds 306 and PD82 were co-deposited in a weight ratio of about 100:15 to form the EML.

Comparative Example 4

An organic light-emitting device was manufactured in the same manner as in Example 1, except that only Compounds 161B and PD82 were co-deposited in a weight ratio of about 100:15 to form the EML.

Comparative Example 5

An organic light-emitting device was manufactured in the same manner as in Example 1, except that host A and host B, instead of Compounds 112A and 226, respectively, were used (utilized) to form the EML.

Host A

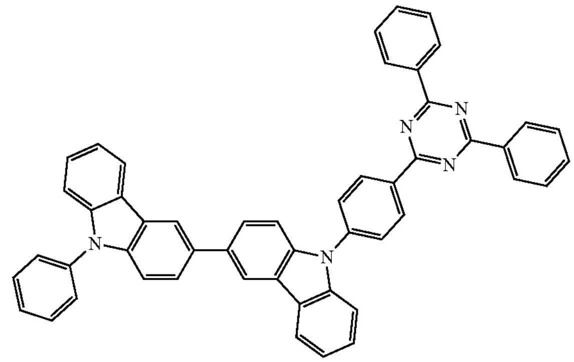

Host B

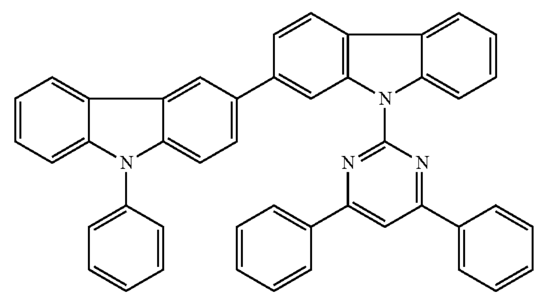

Evaluation Example 1

Driving voltages, current densities, luminances, efficiencies and emission colors of the organic light-emitting devices of Examples 1 to 10 and Comparative Examples 1 to 5 were evaluated using (utilizing) a PR650 (Spectroscan) Source Measurement Unit (available from Photo Research, Inc). The results are shown in Table 1. In Table 1, lifetime 97% refers to the time taken to reach 97% of an initial luminance.

TABLE 1

| Example | Host | Driving voltage (V) | Current density (mA/cm$^2$) | Luminance (cd/A) | Power (lm/W) | CIE_x | CIE_y | Lifetime 97% (hr) |
|---|---|---|---|---|---|---|---|---|
| Example 1 | Compound 112A<br>Compound 226 | 4.0 | 10.7 | 84.5 | 65.8 | 0.207 | 0.740 | 132 |
| Example 2 | Compound 108A<br>Compound 119 | 4.1 | 10.4 | 86.4 | 66.1 | 0.268 | 0.695 | 158 |
| Example 3 | Compound 127A<br>Compound 104 | 4.1 | 10.0 | 90.5 | 69.0 | 0.305 | 0.671 | 143 |
| Example 4 | Compound 112A<br>Compound 226 | 4.5 | 9.7 | 92.9 | 65.6 | 0.213 | 0.737 | 148 |
| Example 5 | Compound 108A<br>Compound 119 | 4.5 | 10.1 | 89.0 | 61.5 | 0.280 | 0.686 | 175 |
| Example 6 | Compound 127A<br>Compound 104 | 4.6 | 9.8 | 92.3 | 62.8 | 0.305 | 0.671 | 186 |
| Example 7 | Compound 161B<br>Compound 306 | 4.0 | 10.3 | 87.4 | 69.1 | 0.240 | 0.715 | 130 |
| Example 8 | Compound 149B<br>Compound 312 | 4.2 | 10.5 | 85.7 | 64.8 | 0.234 | 0.719 | 136 |
| Example 9 | Compound 161B<br>Compound 306 | 4.6 | 10.8 | 83.4 | 57.0 | 0.248 | 0.711 | 151 |

TABLE 1-continued

| Example | Host | Driving voltage (V) | Current density (mA/cm²) | Luminance (cd/A) | Power (lm/W) | CIE_x | CIE_y | Lifetime 97% (hr) |
|---|---|---|---|---|---|---|---|---|
| Example 10 | Compound 149B Compound 312 | 4.8 | 10.5 | 85.6 | 55.6 | 0.237 | 0.717 | 128 |
| Comparative Example 1 | Compound 112A | 9.6 | 131.7 | 6.8 | 2.2 | 0.332 | 0.648 | 1 |
| Comparative Example 2 | Compound 226 | 3.7 | 17.0 | 52.9 | 44.8 | 0.226 | 0.724 | 42 |
| Comparative Example3 | Compound 306 | 9.0 | 166.3 | 5.4 | 1.9 | 0.216 | 0.724 | 1 |
| Comparative Example4 | Compound 161B | 4.0 | 12.8 | 70.4 | 54.8 | 0.242 | 0.720 | 52 |
| Comparative Example 5 | Host A Host B | 4.1 | 12.8 | 70.3 | 53.4 | 0.277 | 0.697 | 64 |

Referring to Table 1, the organic light-emitting devices of Examples 1 to 10 were found to have improved characteristics in terms of driving voltage, luminance, efficiency and color purity, compared to the organic light-emitting devices of Comparative Examples 1 to 5.

As described above, according to the one or more of the above embodiments of the present invention, an organic light-emitting device may have a low driving voltage, a high luminance, a high efficiency, and long lifetime.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and equivalent thereof.

What is claimed is:

1. An organic light-emitting device comprising:

a first electrode;

a second electrode facing the first electrode; and an organic layer comprising an emission layer between the first electrode and the second electrode, wherein the emission layer comprises at least one compound selected from carbazole-based compounds represented by Formula 1, and at least one compound selected from heterocyclic compounds represented by Formulae 10A, 10B 10C, 10D, and 10E:

Formula 1

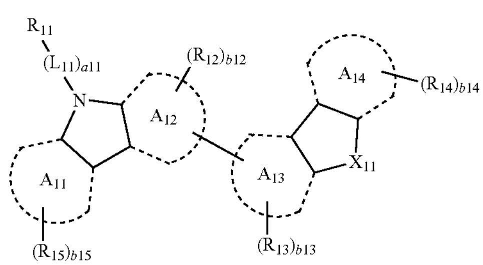

-continued

Formula 10A

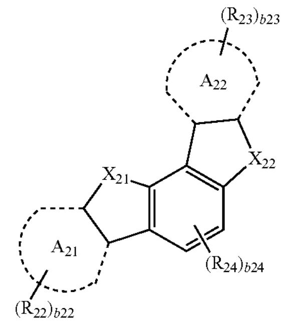

Formula 10B

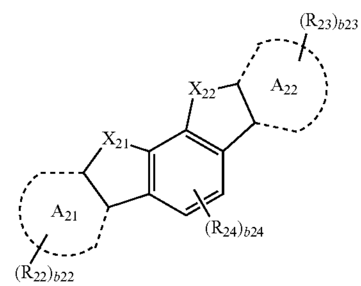

Formula 10C

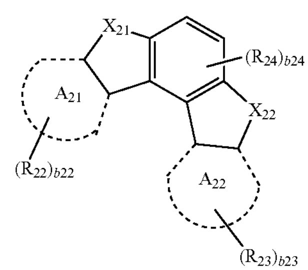

Formula 10D

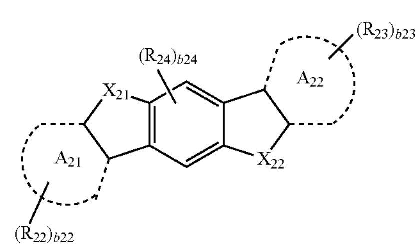

-continued

Formula 10E

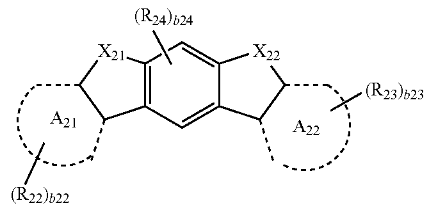

wherein, in Formulae 1, 10A, 10B, 10C, 10D, and 10E, $A_{11}$ to $A_{14}$, $A_{21}$, and $A_{22}$ are each independently selected from benzene, naphthalene, pyridine, pyrimidine, pyrazine, quinoline, isoquinoline, 2,6-naphthyridine, 1,8-naphthyridine, 1,5-naphthyridine, 1,6-naphthyridine, 1,7- naphthyridine, 2,7-naphthyridine, quinoxaline, phthalazine, and quinazoline;

$X_{11}$ is O, S, $C(R_{16})(R_{17})$, $Si(R_{16})(R_{17})$, $P(R_{16})$, $B(R_{16})$, $P(=O)(R_{16})$, or $N(R_{16})$;

$X_{21}$ is $N-(L_{21})_{a21}-R_{21}$, and $X_{22}$ is O or S; or $X_{21}$ is O or S, and $X_{22}$ is $N-(L_{21})_{a21}-R_{21}$;

$L_{11}$ is selected from:

a $C_3-C_{10}$ cycloalkylene group, a $C_3-C_{10}$ heterocycloalkylene group, a $C_3-C_{10}$ cycloalkenylene group, a $C_3-C_{10}$ heterocycloalkenylene group, a $C_6-C_{60}$ arylene group, a $C_1-C_{60}$ heteroarylene group, a divalent nonaromatic condensed polycyclic group, and a divalent nonaromatic condensed heteropolycyclic group; and a $C_3-C_{10}$ cycloalkylene group, a $C_3-C_{10}$ heterocycloalkylene group, a $C_3-C_{10}$ cycloalkenylene group, a $C_3-C_{10}$ heterocycloalkenylene group, a $C_6-C_{60}$ arylene group, a $C_2-C_{60}$ heteroarylene group, a divalent nonaromatic condensed polycyclic group, and a divalent nonaromatic condensed heteropolycyclic group, each substituted with at least one selected from a deuterium; —F; —Cl; —Br; —I; a $C_1-C_{60}$ alkyl group; a $C_6-C_{60}$ aryl group; a monovalent nonaromatic condensed polycyclic group; and a monovalent nonaromatic condensed heteropolycyclic group; except for a nitrogen (N)-containing $C_1-C_{60}$ heteroarylene group, and a nitrogen (N)-containing $C_1-C_{60}$ heteroarylene group substituted with at least one selected from a deuterium, —F, —Cl, —Br, —I, a $C_1-C_{60}$ alkyl group, a $C_6-C_{60}$ aryl group, a monovalent nonaromatic condensed polycyclic group, and a monovalent nonaromatic condensed heteropolycyclic group;

a11 is an integer selected from 0 to 5;

$R_{11}$, $R_{16}$, and $R_{17}$ are each independently selected from:

a hydrogen, a $C_1-C_{60}$ alkyl group, a $C_3-C_{10}$ cycloalkyl group, a $C_3-C_{10}$ heterocycloalkyl group, a $C_3-C_{10}$ cycloalkenyl group, a $C_3-C_{10}$ heterocycloalkenyl group, a $C_6-C_{60}$ aryl group, a $C_1-C_{60}$ heteroaryl group, a monovalent nonaromatic condensed polycyclic group, a monovalent nonaromatic condensed heteropolycyclic group, and $—N(Q_{11})(Q_{12})$; and a $C_1-C_{60}$ alkyl group, a $C_3-C_{10}$ cycloalkyl group, a $C_3-C_{10}$ heterocycloalkyl group, a $C_3-C_{10}$ cycloalkenyl group, a $C_3-C_{10}$ heterocycloalkenyl group, a $C_6-C_{60}$ aryl group, a $C_1-C_{60}$ heteroaryl group, a monovalent nonaromatic condensed polycyclic group, and a monovalent nonaromatic condensed heteropolycyclic group, each substituted with at least one selected from a deuterium; —F; —Cl; —Br; —I; a $C_1-C_{60}$ alkyl group; a $C_6-C_{60}$ aryl group; a monovalent nonaromatic condensed polycyclic group; and a monovalent nonaromatic condensed heteropolycyclic group; except for a nitrogen (N)-containing $C_1-C_{60}$ heteroaryl group, and a nitrogen (N)-containing $C_1-C_{60}$ heteroaryl group substituted with at least one selected from a deuterium, —F, —Cl, —Br, —I, a $C_1-C_{60}$ alkyl group, a $C_6-C_{60}$ aryl group, a monovalent nonaromatic condensed polycyclic group, and a monovalent nonaromatic condensed heteropolycyclic group;

$L_{21}$ is selected from a nitrogen (N)-containing $C_1-C_{60}$ heteroarylene group, and a $C_1-C_{60}$ heteroarylene group substituted with at least one selected from a deuterium, —F, —Cl, —Br, —I, a $C_1-C_{60}$ alkyl group, a $C_6-C_{60}$ aryl group, a monovalent nonaromatic condensed polycyclic group, and a monovalent nonaromatic condensed heteropolycyclic group;

a21 is an integer selected from 0 to 5;

$R_{21}$ is selected from:

a hydrogen, a $C_1-C_{60}$ alkyl group, a $C_3-C_{10}$ cycloalkyl group, a $C_3-C_{10}$ heterocycloalkyl group, a $C_3-C_{10}$ cycloalkenyl group, a $C_3-C_{10}$ heterocycloalkenyl group, a $C_6-C_{60}$ aryl group, a $C_1-C_{60}$ heteroaryl group, a monovalent nonaromatic condensed polycyclic group, a monovalent nonaromatic condensed heteropolycyclic group, and $—N(Q_{11})(Q_{12})$; and a $C_1-C_{60}$ alkyl group, a $C_3-C_{10}$ cycloalkyl group, a $C_3-C_{10}$ heterocycloalkyl group, a $C_3-C_{10}$ cycloalkenyl group, a $C_3-C_{10}$ heterocycloalkenyl group, a $C_6-C_{60}$ aryl group, a $C_1-C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1-C_{60}$ alkyl group, a $C_6-C_{60}$ aryl group, a monovalent nonaromatic condensed polycyclic group, and a monovalent nonaromatic condensed heteropolycyclic group;

$R_{12}$ to $R_{15}$, and $R_{22}$ to $R_{24}$ are each independently selected from:

a hydrogen, a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1-C_{60}$ alkyl group a $C_2-C_{60}$ alkenyl group, a $C_2-C_{60}$ alkynyl group, and a $C_1-C_{60}$ alkoxy group;

a $C_1-C_{60}$ alkyl group, a $C_2-C_{60}$ alkenyl group, a $C_2-C_{60}$ alkynyl group, and a $C_1-C_{60}$ alkoxy group, each substituted with at least one of a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3-C_{10}$ cycloalkyl group, a $C_3-C_{10}$ heterocycloalkyl group, a $C_3-C_{10}$ cycloalkenyl group, a $C_3-C_{10}$ heterocycloalkenyl group, a $C_6-C_{60}$ aryl group, a $C_6-C_{60}$ aryloxy group, a $C_6-C_{60}$ arylthio group, a $C_2-C_{60}$ heteroaryl group, a monovalent nonaromatic condensed polycyclic group, and a monovalent nonaromatic condensed heteropolycyclic group;

a $C_3-C_{10}$ cycloalkyl group, a $C_3-C_{10}$ heterocycloalkyl group, a $C_3-C_{10}$ cycloalkenyl group, a $C_3-C_{10}$ heterocycloalkenyl group, a $C_6-C_{60}$ aryl group, a $C_2-C_{60}$ heteroaryl group, a monovalent nonaromatic condensed polycyclic group, and a monovalent nonaromatic condensed heteropolycyclic group;

a $C_3-C_{10}$ cycloalkyl group, a $C_3-C_{10}$ heterocycloalkyl group, a $C_3-C_{10}$ cycloalkenyl group, a $C_3-C_{10}$ heterocycloalkenyl group, a $C_6-C_{60}$ aryl group, a $C_2-C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group; and

—$N(Q_{21})(Q_{22})$;

b12 to b15, and b22 to b24 are each independently an integer selected from 1 to 5; and $Q_{11}$, $Q_{12}$, $Q_{21}$, and $Q_{22}$ are each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group, wherein -$(L_{11})_{a11}$-$R_{11}$ is free of a nitrogen (N)-containing $C_1$-$C_{60}$ heteroarylene group, and a nitrogen (N)-containing $C_1$-$C_{60}$ heteroarylene group substituted with at least one selected from a deuterium, —F, —Cl,—Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group; and when a21 is 0, $R_{21}$ is selected from a nitrogen (N)-containing $C_1$-$C_{60}$ heteroarylene group, and a $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

2. The organic light-emitting device of claim 1, wherein $X_{11}$ is O, S, $C(R_{16})(R_{17})$, or $N(R_{16})$;

$R_{16}$, and $R_{17}$ are each independently selected from:

a hydrogen, a $C_1$-$C_{60}$ alkyl group, a $C_6$-$C_{60}$ aryl group, and —$N(Q_{11})(Q_{12})$; and a $C_1$-$C_{60}$ alkyl group and a $C_6$-$C_{60}$ aryl group, each substituted with at least one selected from a deuterium, —F, —Cl, —Br, —I, a $C_1$-$C_{60}$ alkyl group, a $C_6$-$C_{60}$ aryl group, and monovalent nonaromatic condensed polycyclic group; and $Q_{11}$ and $Q_{12}$ are each independently selected from a hydrogen, a $C_1$-$C_{60}$ alkyl group, and a $C_6$-$C_{60}$ aryl group.

3. The organic light-emitting device of claim 1, wherein $L_{11}$ is selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, and an ovalenylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, and an ovalenylene group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

4. The organic light-emitting device of claim 1, wherein $R_{11}$ is selected from:

a $C_6$-$C_{60}$ aryl group, a monovalent nonaromatic condensed polycyclic group, a monovalent nonaromatic condensed heteropolycyclic group, and —$N(Q_{11})(Q_{12})$; and a $C_6$-$C_{60}$ aryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, and a $C_6$-$C_{60}$ aryl group; and $Q_{11}$ and $Q_{12}$ are each independently selected from a $C_6$-$C_{60}$ aryl group, and a $C_6$-$C_{60}$ aryl group substituted with a $C_6$-$C_{60}$ aryl group.

5. The organic light-emitting device of claim 1, wherein $L_{21}$ is selected from:

a pyrrolylene group, an imidazolylene group, a pyrazolylene group, a pyridinylene group, a pyrazinylene group, a pyrimidinylene group, an indolylene group, a quinolinylene group, an isoquinolinylene group, a benzoquinolinylene group, a phenanthridinylene group, an acridinylene group, a phenanthrolinylene group, a triazolylene group, and a tetrazolylene group; and a pyrrolylene group, an imidazolylene group, a pyrazolylene group, a pyridinylene group, a pyrazinylene group, a pyrimidinylene group, an indolylene group, a quinolinylene group, an isoquinolinylene group, a benzoquinolinylene group, a phenanthridinylene group, an acridinylene group, a phenanthrolinylene group, a triazolylene group, and a tetrazolylene group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

6. The organic light-emitting device of claim 1, wherein $R_{21}$ is selected from: a hydrogen, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —$N(Q_{11})(Q_{12})$; and a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent non-aromatic condensed heteropolycyclic group; and $Q_{11}$ and $Q_{12}$ are each independently selected from a $C_6$-$C_{60}$ aryl group, and a $C_6$-$C_{60}$ aryl group substituted with a $C_6$-$C_{60}$ aryl group.

7. The organic light-emitting device of claim 1, wherein $R_{12}$ to $R_{15}$, and $R_{22}$ to $R_{24}$ are each independently selected from a hydrogen, a deuterium, —F, —Cl, —Br, —I, a $C_1$-$C_{60}$ alkyl group, a $C_6$-$C_{60}$ aryl group, a $C_2$-$C_{60}$ heteroaryl group, and —N($Q_{21}$)($Q_{22}$); and $Q_{21}$ and $Q_{22}$ are each independently selected from a $C_6$-$C_{60}$ aryl group, and a $C_6$-$C_{60}$ aryl group substituted with a $C_6$-$C_{60}$ aryl group.

8. The organic light-emitting device of claim 1, wherein the carbazole-based compound represented by Formula 1 is selected from Compounds 101A to 163A, and the heterocyclic compound represented by Formulae 10A, 10B, 10C, 10D, and 10E is selected from Compounds 109, 112, 113, 119, 122, 125, 126, 128, 131, 132, 219, 220, and 234:

101A

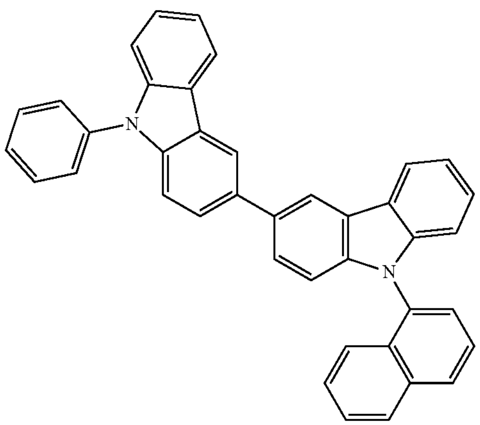

102A

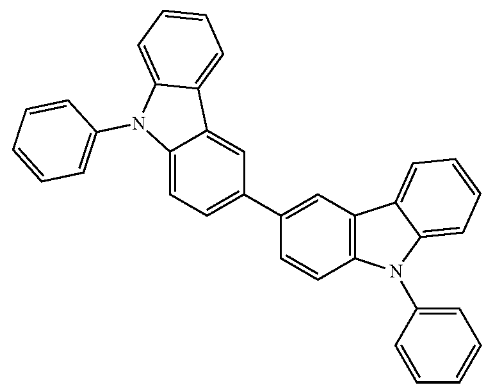

103A

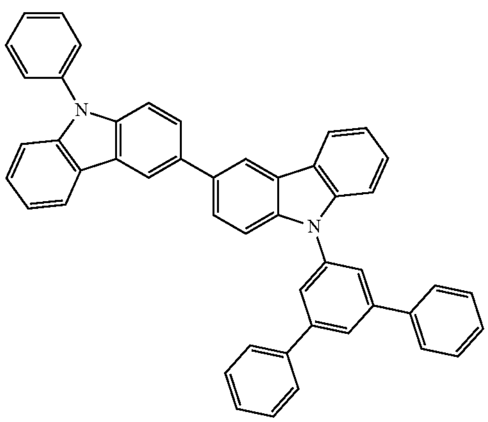

104A

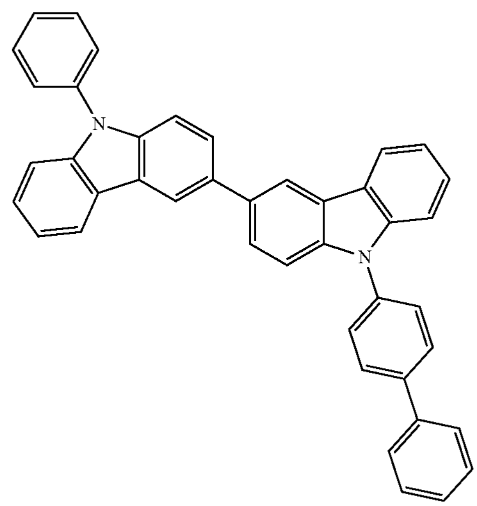

105A

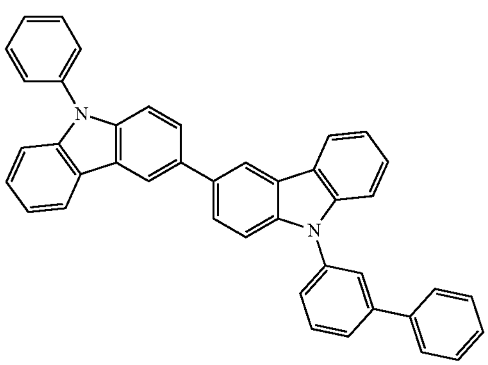

106A

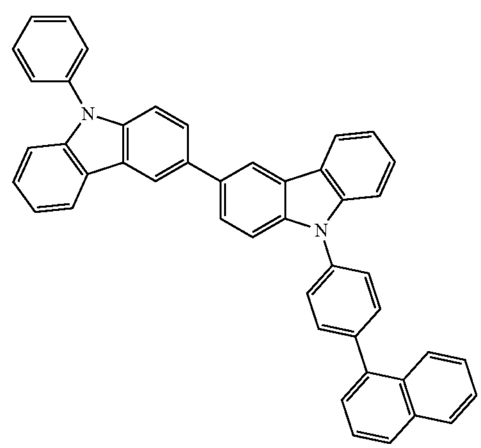

-continued
107A
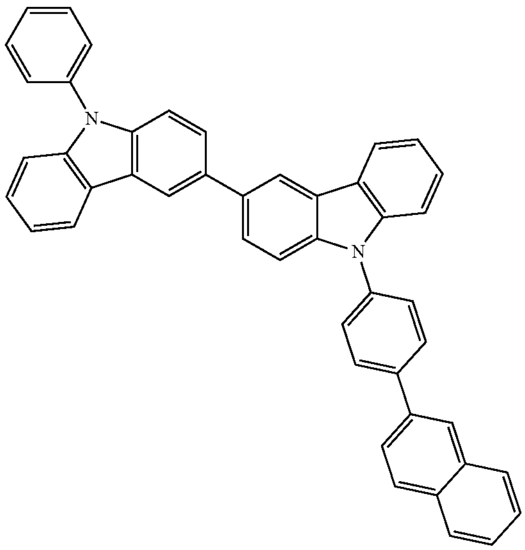
108A
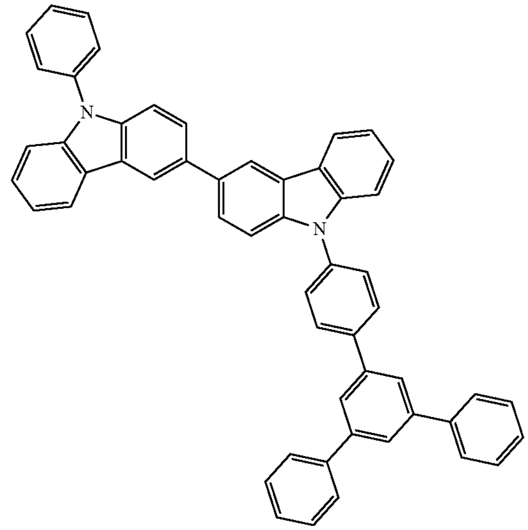
109A
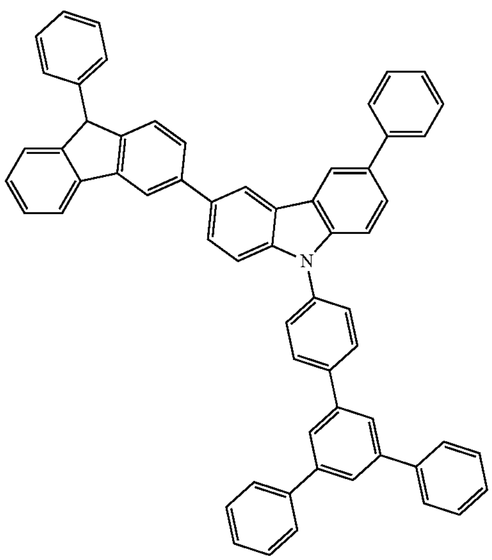
110A
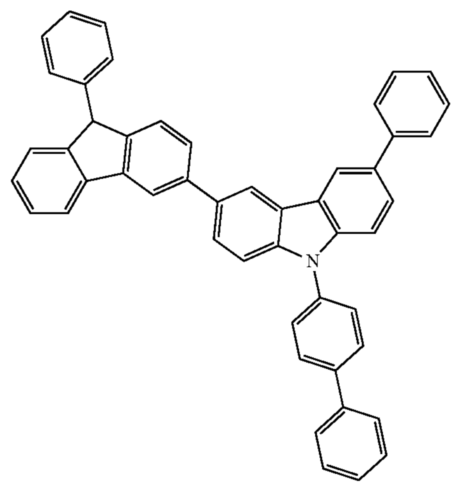
111A
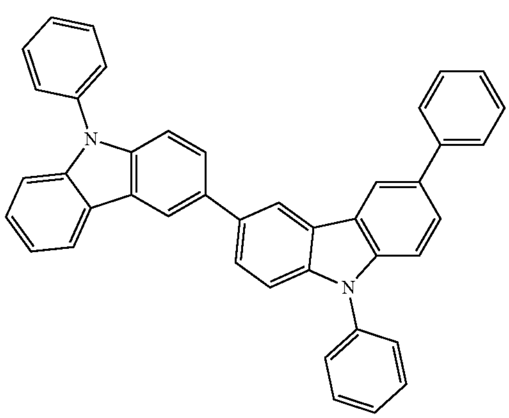
112A
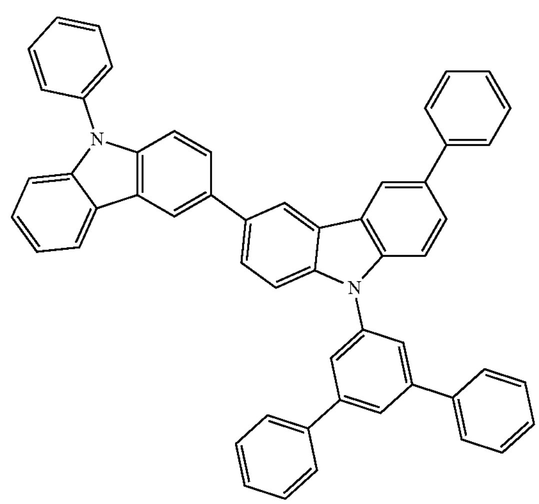

-continued
113A
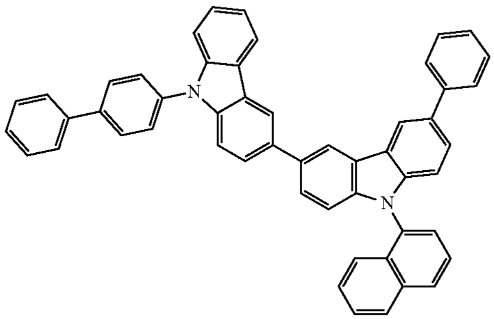
114A
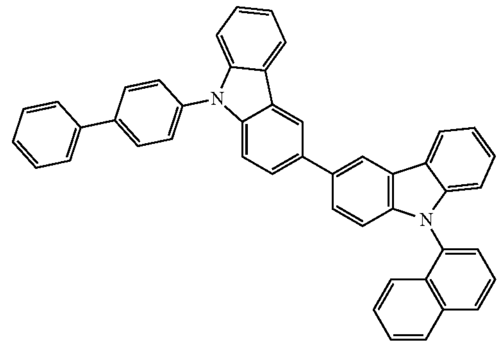
115A
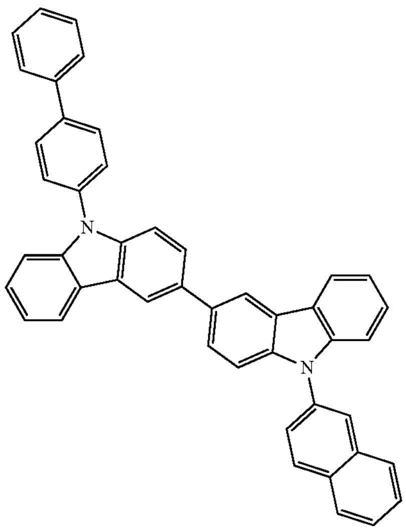
116A
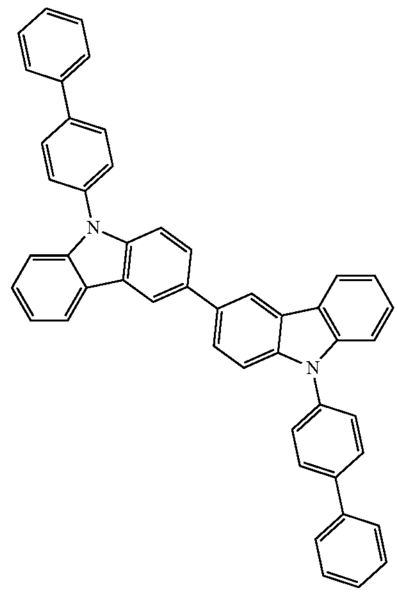
117A
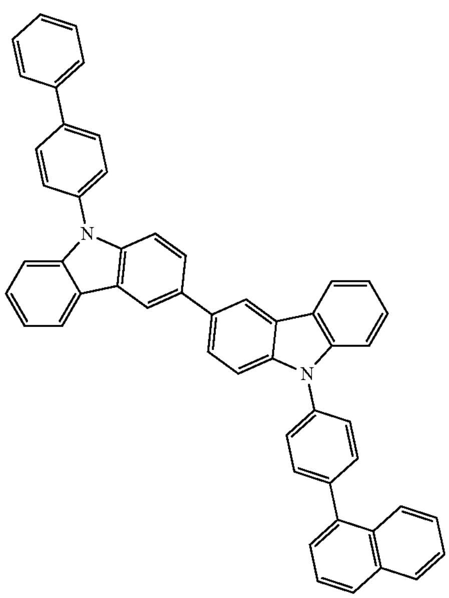
118A
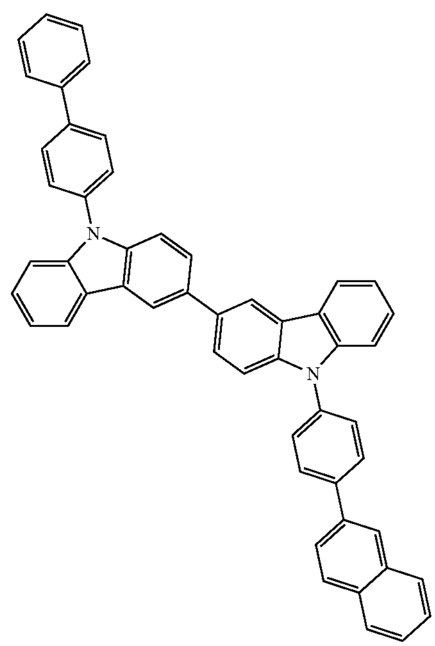

-continued
119A
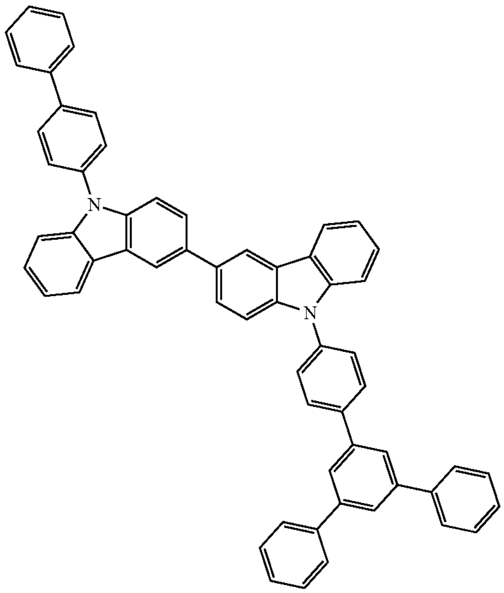
120A
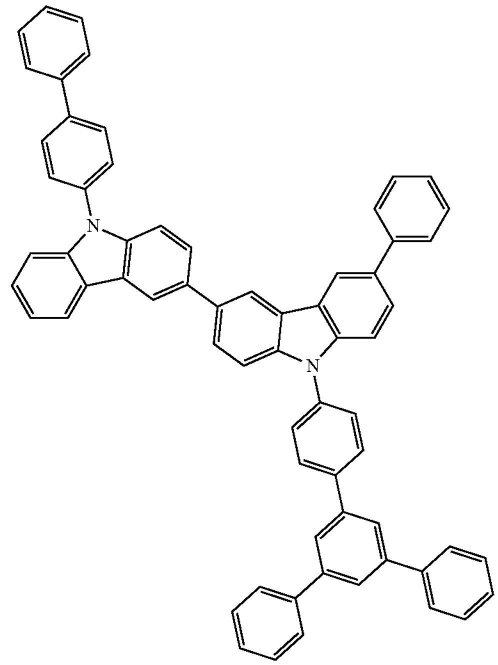
121A
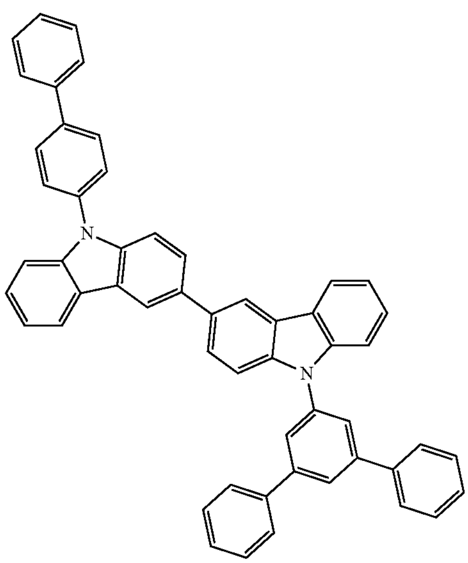
122A
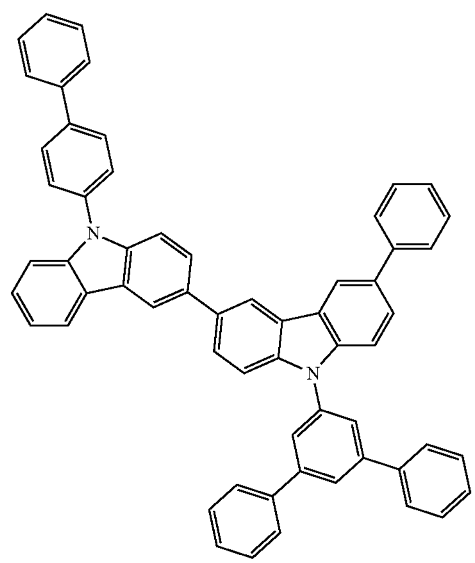

-continued
123A
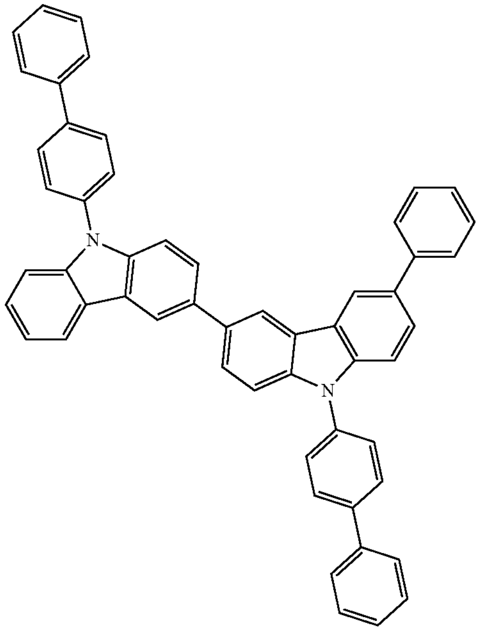
124A
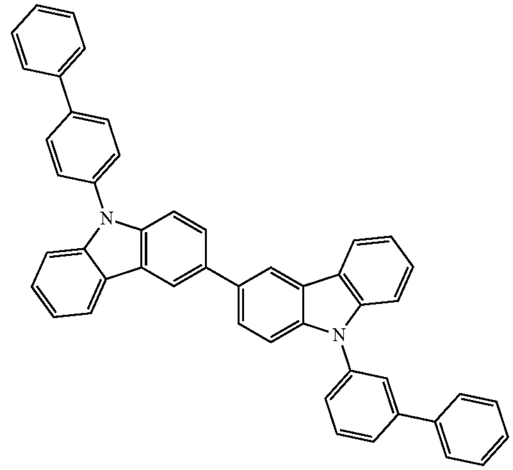
125A
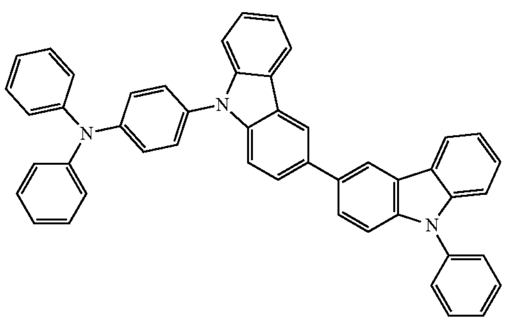
126A
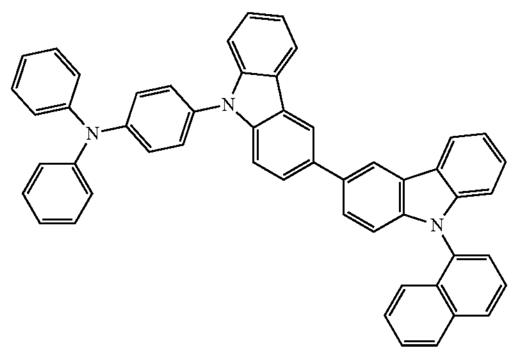
127A
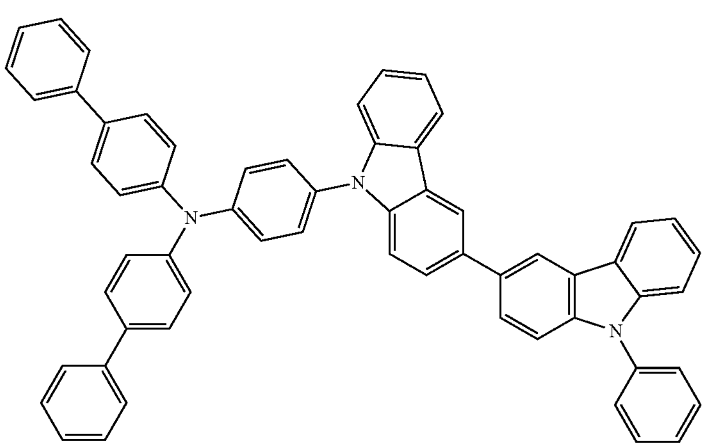

-continued
128A
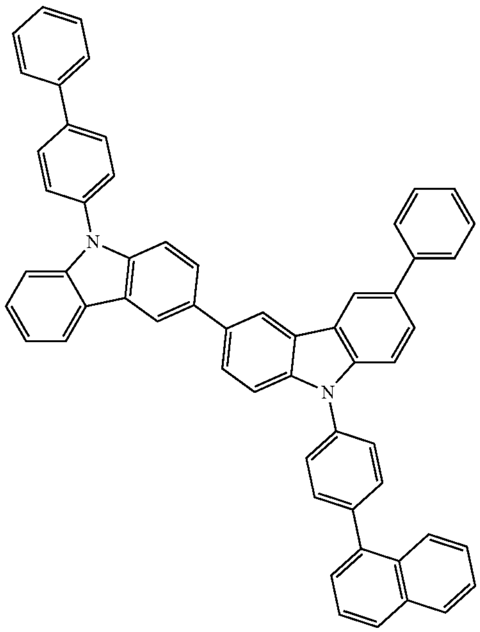
129A
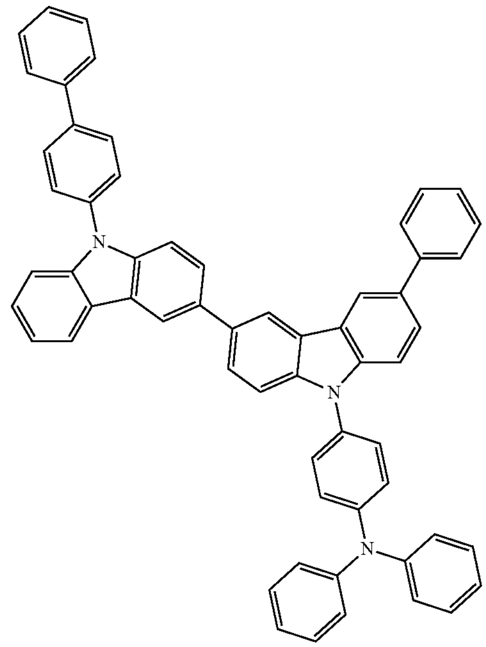
130A
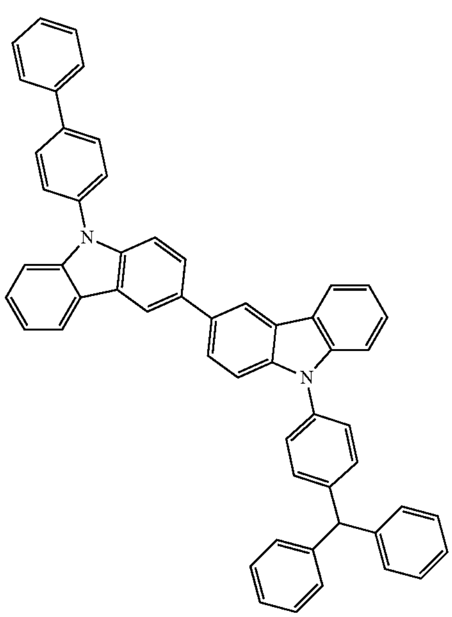
131A
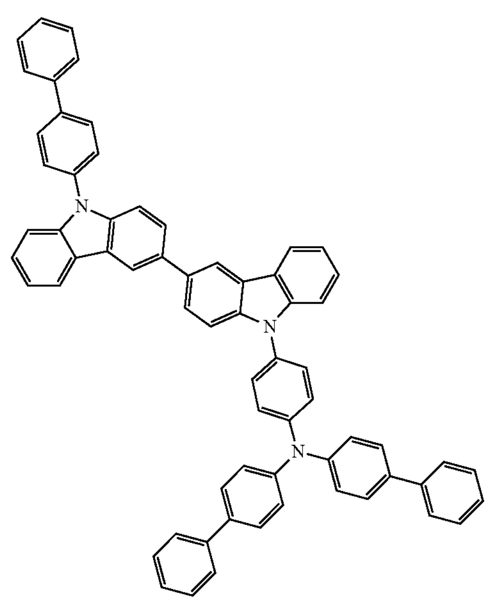

-continued
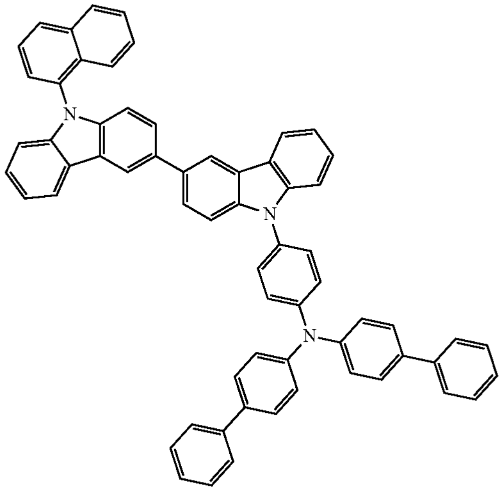
132A
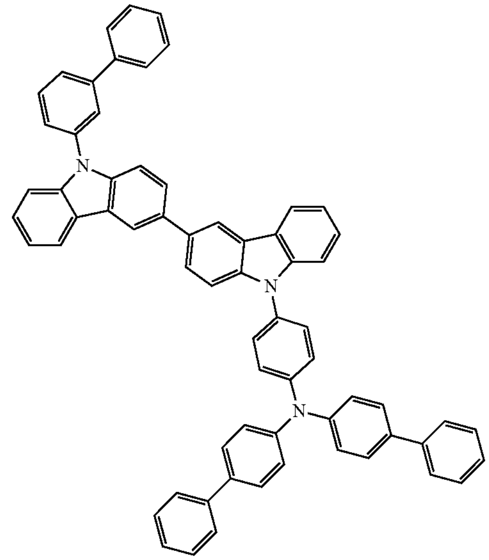
133A
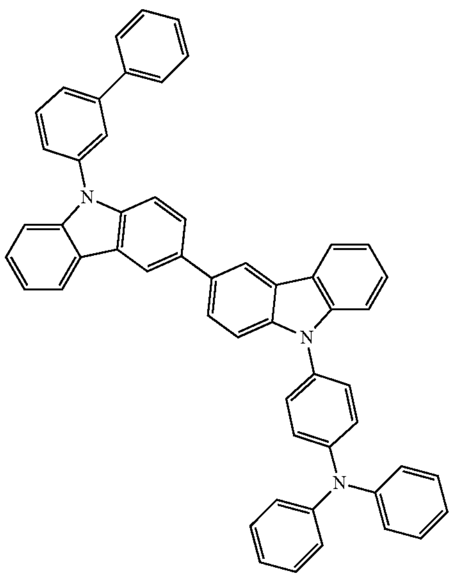
134A
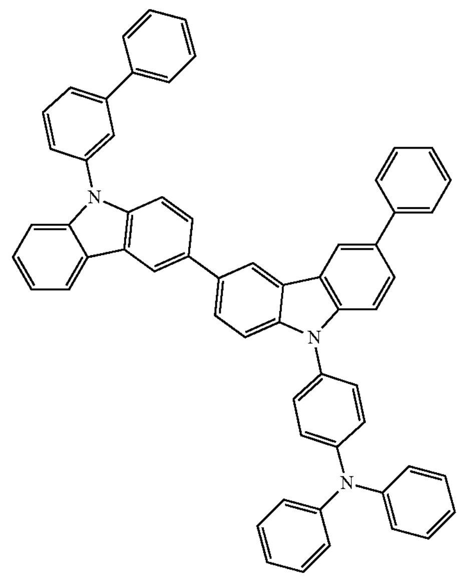
135A
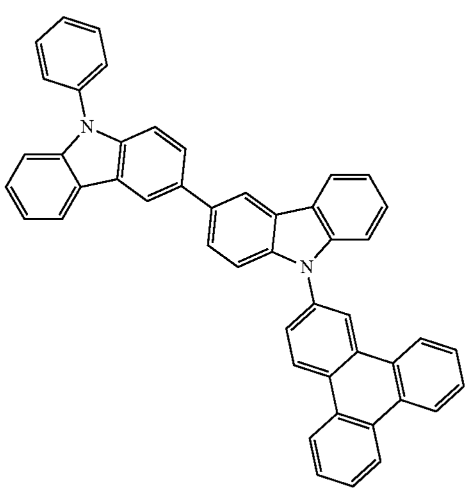
136A
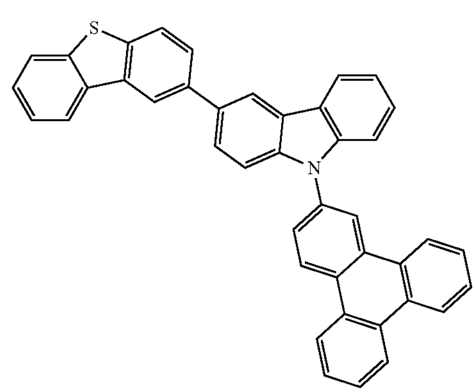
137A -continued
138A
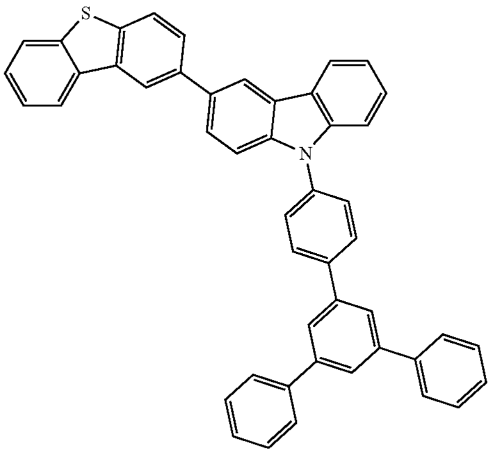
139A
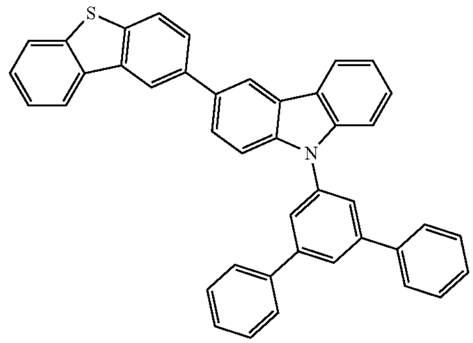
140A
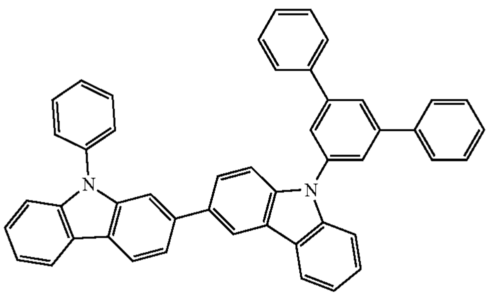
141A
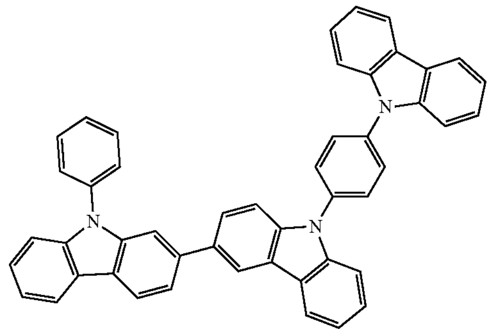
142A
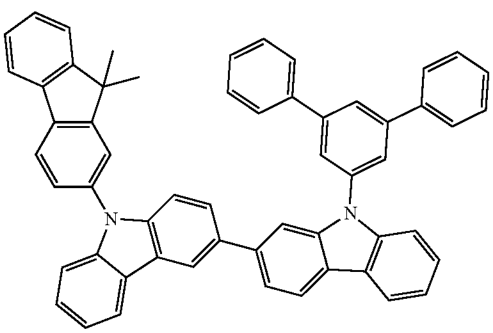
143A
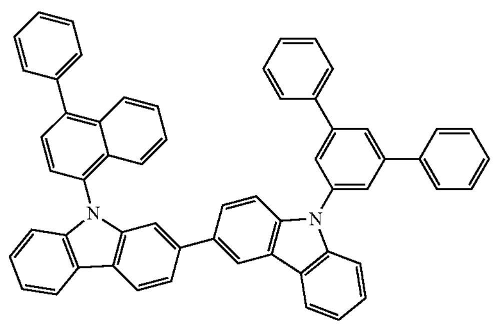
144A
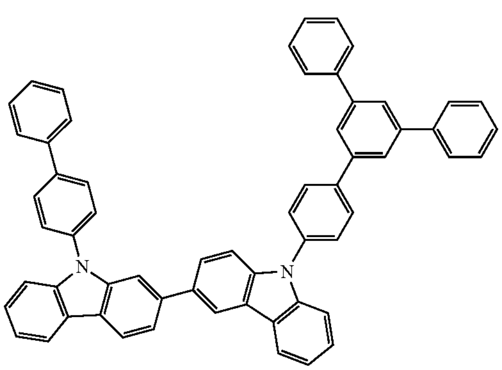
145A
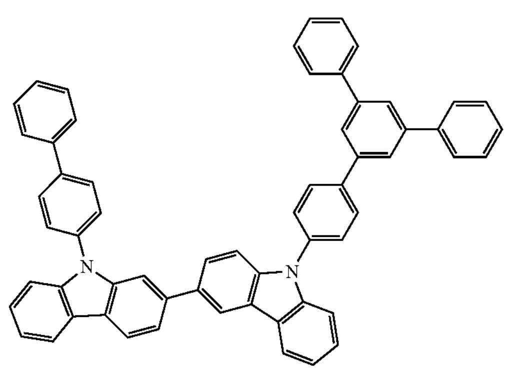

-continued
146A
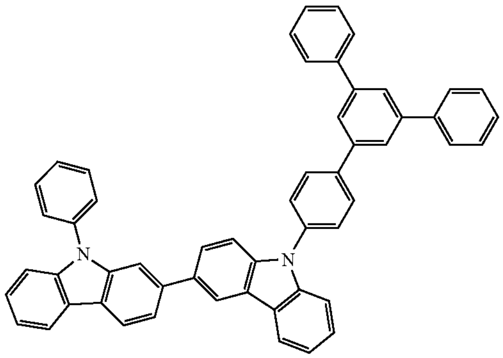
147A
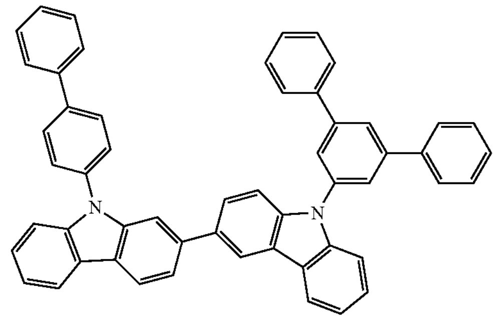
148A
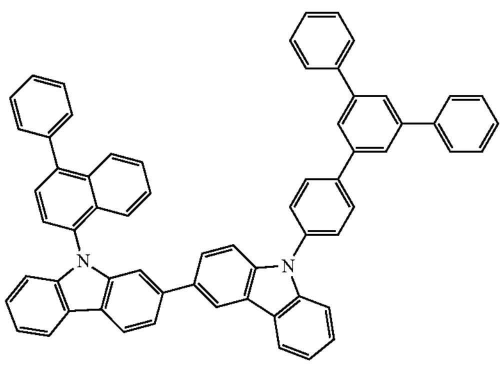
149A
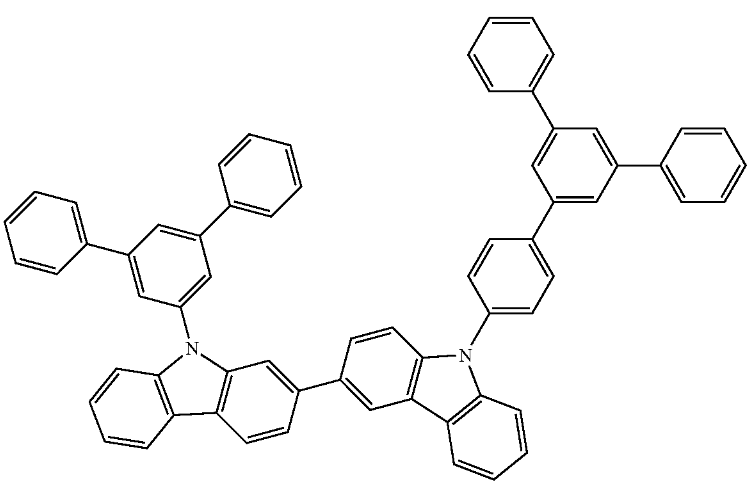

-continued
150A
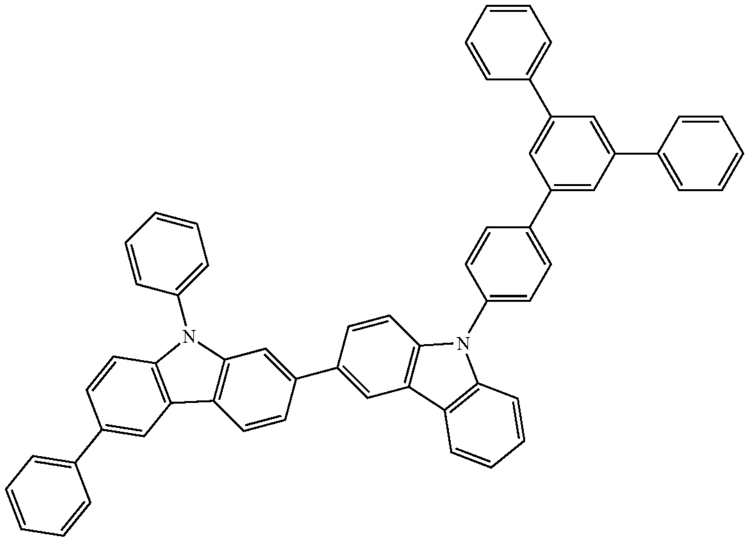
151A
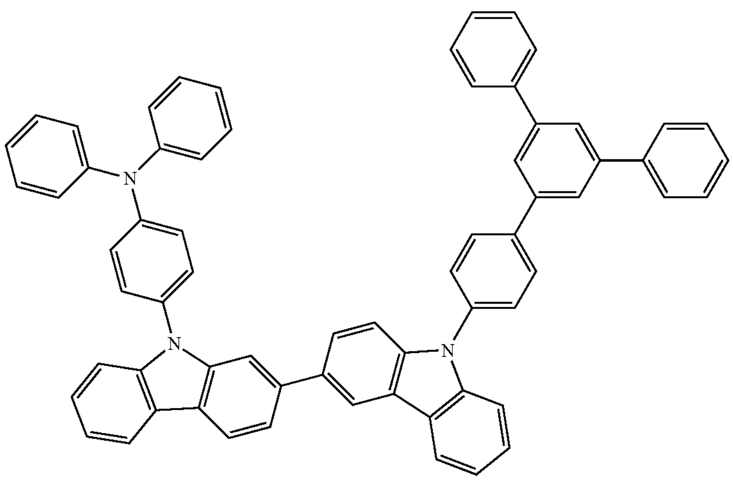
152A
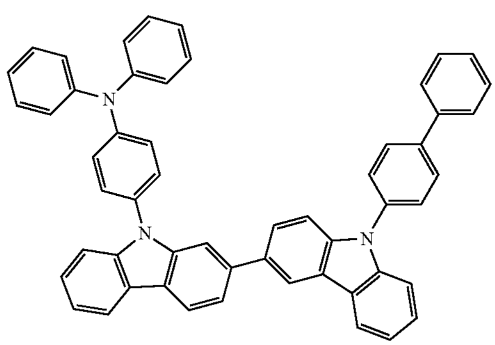
153A
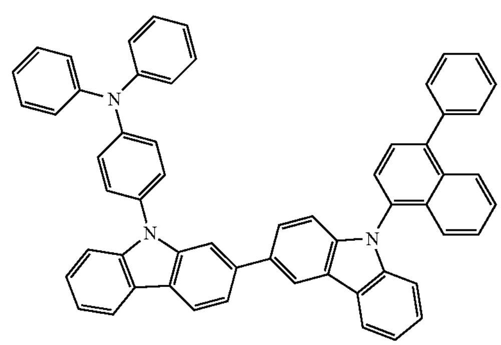

-continued
154A
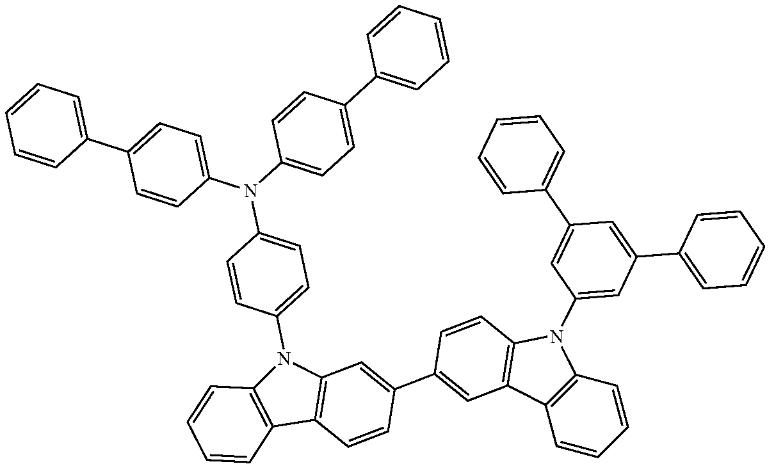
155A
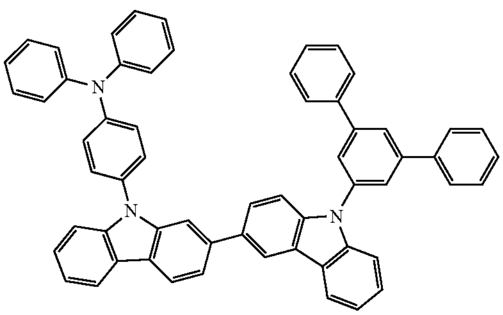
156A
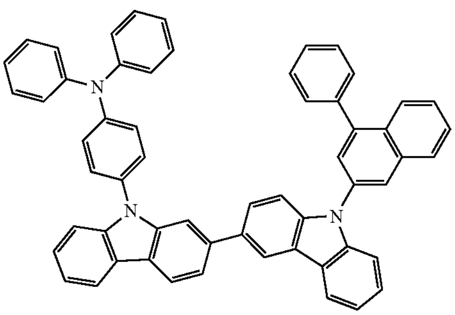
157A
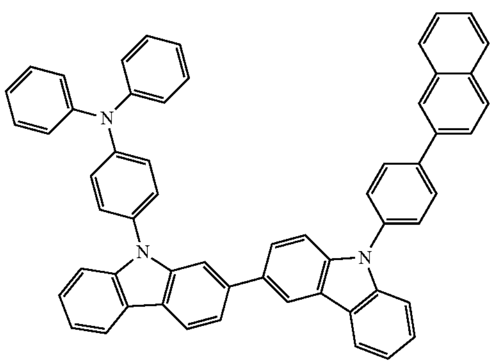
158A
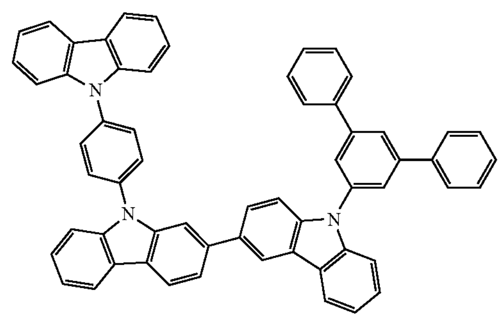
159A
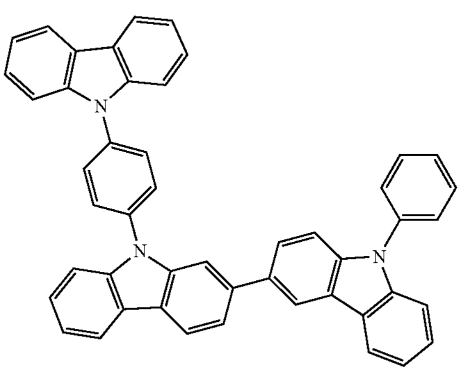
160A
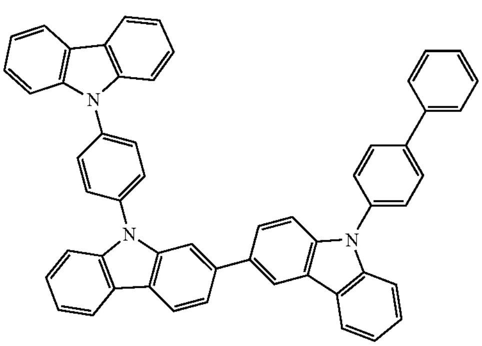

-continued
161A
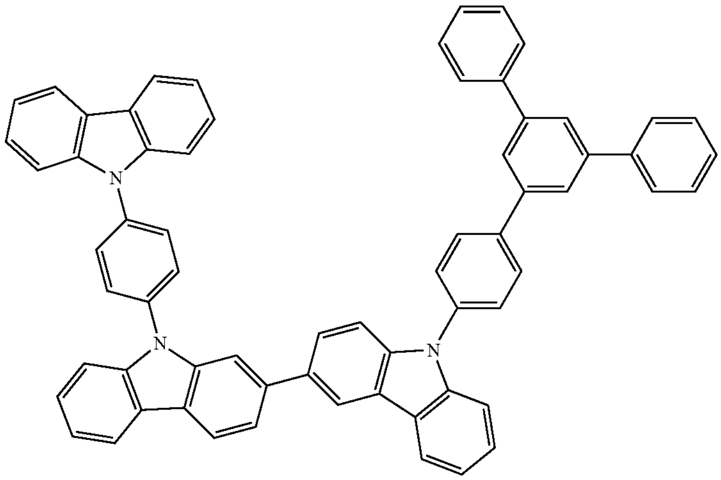
162A
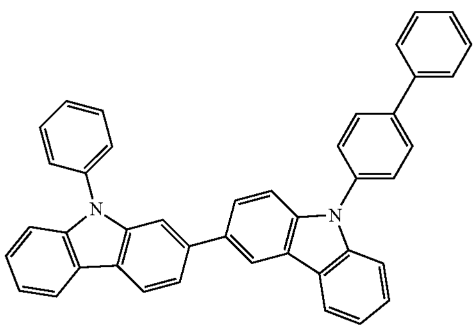
163A
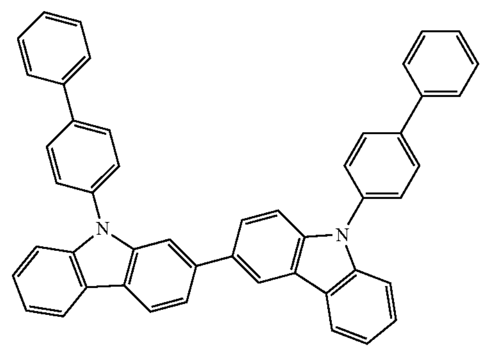
109
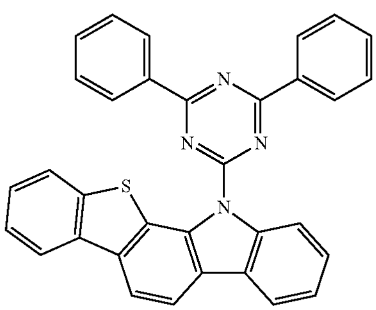
112
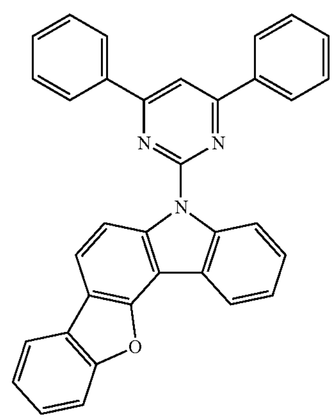

-continued
113
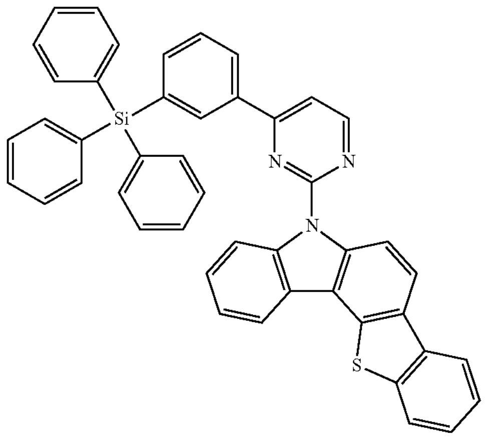
119
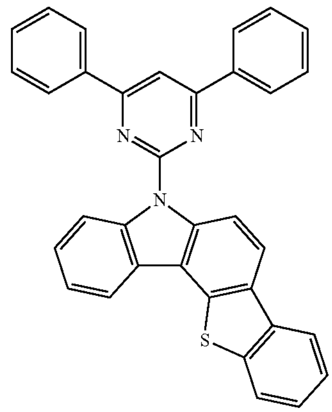
122
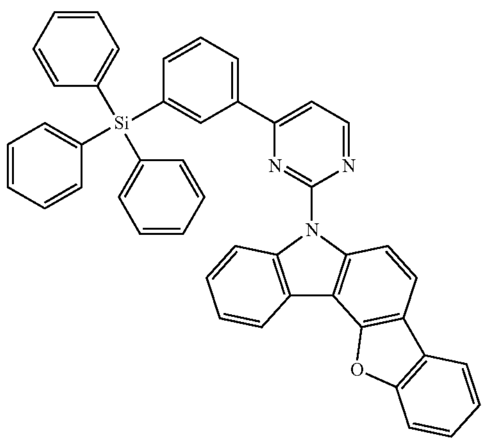
125
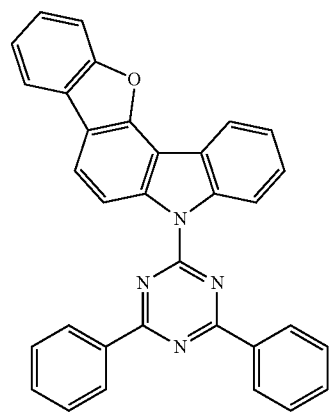
126
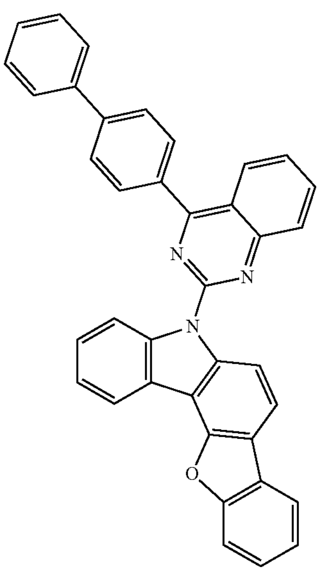
128
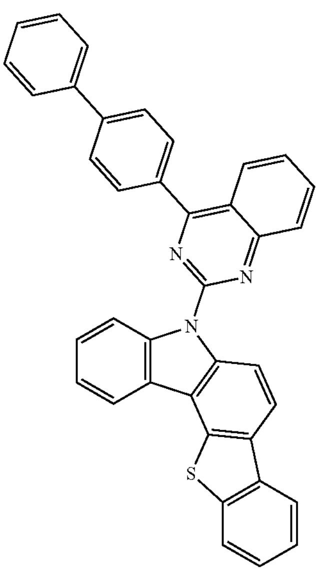

-continued

131

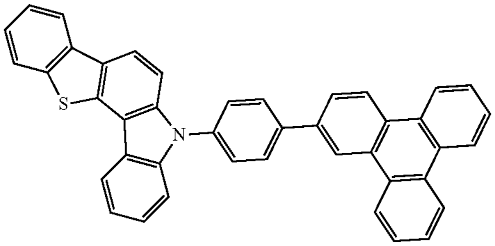

132

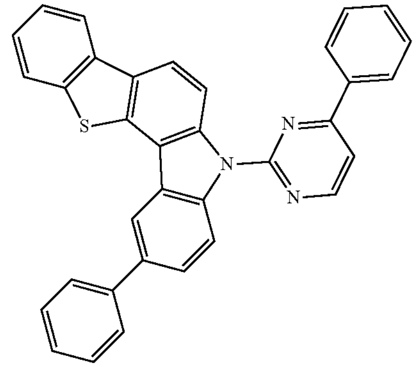

220

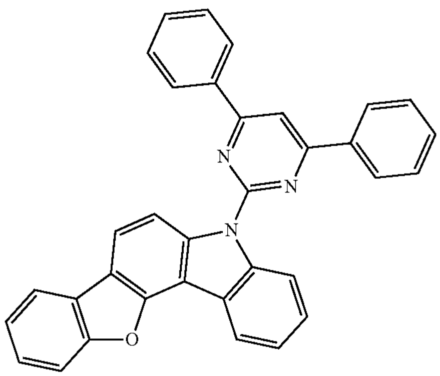

219

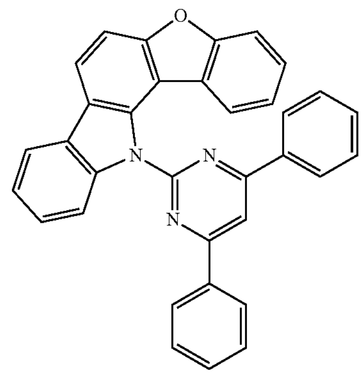

234

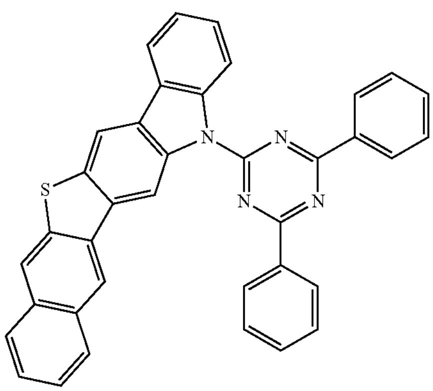

.

9. The organic light-emitting device of claim 1, wherein the emission layer further comprises a phosphorescent dopant.

10. An organic light-emitting device comprising:

a first electrode;

a second electrode facing the first electrode; and an organic layer comprising an emission layer between the first electrode and the second electrode, wherein the emission layer comprises at least one compound selected from carbazole-based compounds represented by Formula 1, and at least one compound selected from heterocyclic compounds represented by Formulae 10A, 10B 10C, 10D, and 10E:

Formula 1

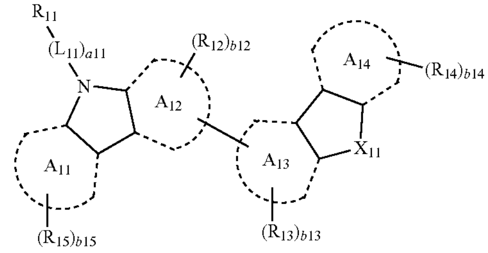

-continued

Formula 10A

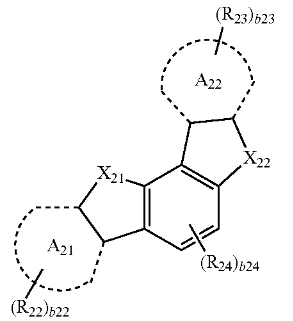

Formula 10B

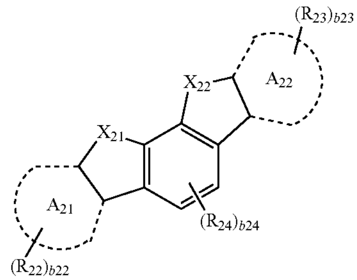

Formula 10C

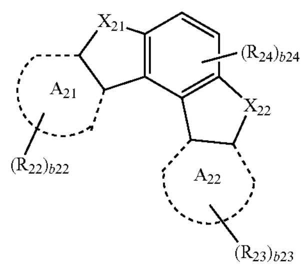

Formula 10D

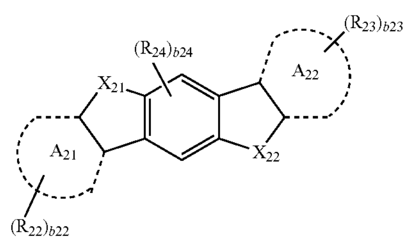

Formula 10E

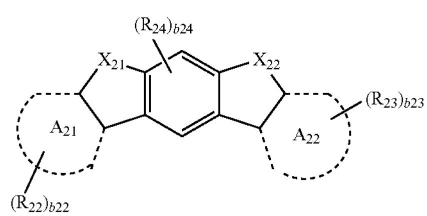

wherein, in Formulae 1, and 10A, 10B, 10C, 10D, and 10E, $A_{11}$ to $A_{14}$, $A_{21}$, and $A_{22}$ are each independently selected from benzene, naphthalene, pyridine, pyrimidine, pyrazine, quinoline, isoquinoline, 2,6-naphthyridine, 1,8-naphthyridine, 1,5-naphthyridine, 1,6-naphthyridine, 1,7-naphthyridine, 2,7-naphthyridine, quinoxaline, phthalazine, and quinazoline;

$X_{11}$ is O, S, $C(R_{16})(R_{17})$, $Si(R_{16})(R_{17})$, $P(R_{16})$, $B(R_{16})$, $P({=}O)(R_{16})$, or $N(R_{16})$;

$X_{21}$ is $N\text{-}(L_{21})_{a21}\text{-}R_{21}$, and $X_{22}$ is O or S; or $X_{21}$ is O or S, and $X_{22}$ is $N\text{-}(L_{21})_{a21}\text{-}R_{21}$;

$L_{11}$ is selected from:

a nitrogen (N)-containing $C_1$-$C_{60}$ heteroarylene group; and a $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

a11 is an integer selected from 0 to 5;

$R_{11}$, $R_{16}$, and $R_{17}$ are each independently selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —$N(Q_{11})(Q_{12})$; and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

$L_{21}$ is selected from:

a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_1$-$C_{60}$ heteroarylene group, a divalent nonaromatic condensed polycyclic group, and a divalent nonaromatic condensed heteropolycyclic group; and a $C_3$-$C_{10}$ cycloalkylene group, a $C_3$-$C_{10}$ heterocycloalkylene group, a $C_3$-$C_{10}$ cycloalkenylene group, a $C_3$-$C_{10}$ heterocycloalkenylene group, a $C_6$-$C_{60}$ arylene group, a $C_2$-$C_{60}$ heteroarylene group, a divalent nonaromatic condensed polycyclic group, and a divalent nonaromatic condensed heteropolycyclic group, each substituted with at least one selected from a deuterium; —F; —Cl; —Br; —I; a $C_1$-$C_{60}$ alkyl group; a $C_6$-$C_{60}$ aryl group; a monovalent nonaromatic condensed polycyclic group; and a monovalent nonaromatic condensed heteropolycyclic group; except for a nitrogen (N)-containing $C_1$-$C_{60}$ heteroarylene group, and a nitrogen (N)-containing $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

a21 is an integer selected from 0 to 5;

$R_{21}$ is selected from:

a hydrogen, a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —$N(Q_{11})(Q_{12})$; and a $C_1$-$C_{60}$ alkyl group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium; —F; —Cl; —Br; —I; a $C_1$-$C_{60}$ alkyl group; a $C_6$-$C_{60}$ aryl group; a monovalent nonaromatic condensed polycyclic group; and a monovalent nonaromatic condensed heteropolycyclic group; except for a nitrogen (N)-containing $C_1$-$C_{60}$ heteroaryl group, and a nitrogen (N)-containing $C_1$-$C_{60}$ heteroaryl group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group;

$R_{12}$ to $R_{15}$, and $R_{22}$ to $R_{24}$ are each independently selected from:

a hydrogen, a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_2$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a hydroxyl group, a cyano group, a nitro group, an amino group, an amidino group, a hydrazine, a hydrazone, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent nonaromatic condensed polycyclic group, and a monovalent nonaromatic condensed heteropolycyclic group; and

—$N(Q_{21})(Q_{22})$;

b12 to b15, and b22 to b24 are each independently an integer selected from 1 to 5; and $Q_{11}$, $Q_{12}$, $Q_{21}$, and $Q_{22}$ are each independently selected from a hydrogen, a $C_1$-$C_{60}$ alkyl group, a $C_6$-$C_{60}$ aryl group, and a $C_6$-$C_{60}$ aryl group substituted with a $C_6$-$C_{60}$ aryl group, wherein:

when a11 is 0, $R_{11}$ is selected from a nitrogen (N)-containing $C_1$-$C_{60}$ heteroarylene group, and a $C_1$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group; and -$(L_{21})_{a21}$-$R_{21}$ is free of a nitrogen (N)-containing $C_1$-$C_{60}$ heteroarylene group, and a nitrogen (N)-containing $C_l$-$C_{60}$ heteroarylene group substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

11. The organic light-emitting device of claim 10, wherein $X_{11}$ is O, S, $C(R_{16})(R_{17})$, or $N(R_{16})$;

$R_{16}$ and $R_{17}$ are each independently selected from:

a hydrogen, a $C_1$-$C_{60}$ alkyl group, a $C_6$-$C_{60}$ aryl group, and —$N(Q_{11})(Q_{12})$; and a $C_1$-$C_{60}$ alkyl group and a $C_6$-$C_{60}$ aryl group, each substituted with at least one selected from a deuterium, —F, —Cl, —Br, —I, a $C_1$-$C_{60}$ alkyl group, a $C_6$-$C_{60}$ aryl group, and monovalent nonaromatic condensed polycyclic group; and $Q_{11}$ and $Q_{12}$ are each independently selected from a hydrogen, a $C_1$-$C_{60}$ alkyl group, and a $C_6$-$C_{60}$ aryl group.

12. The organic light-emitting device of claim 10, wherein $L_{11}$ is selected from:

a pyrrolylene group, an imidazolylene group, a pyrazolylene group, a pyridinylene group, a pyrazinylene group, a pyrimidinylene group, an indolylene group, a quinolinylene group, an isoquinolinylene group, a benzoquinolinylene group, a phenanthridinylene group, an acridinylene group, a phenanthrolinylene group, a triazolylene group, and a tetrazolylene group; and a pyrrolylene group, an imidazolylene group, a pyrazolylene group, a pyridinylene group, a pyrazinylene group, a pyrimidinylene group, an indolylene group, a quinolinylene group, an isoquinolinylene group, a benzoquinolinylene group, a phenanthridinylene group, an acridinylene group, a phenanthrolinylene group, a triazolylene group, and a tetrazolylene group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

13. The organic light-emitting device of claim 10, wherein $R_{11}$ is selected from:

a hydrogen, a $C_6$-$C_{60}$ aryl group, a $C_1$-$C_{60}$ heteroaryl group, a monovalent nonaromatic condensed polycyclic group, a monovalent nonaromatic condensed heteropolycyclic group, and —$N(Q_{11})(Q_{12})$; and a $C_6$-$C_{60}$ aryl group, a $C_1$-$C_{60}$ heteroaryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent non-aromatic condensed heteropolycyclic group; and $Q_{11}$ and $Q_{12}$ are each independently selected from a $C_6$-$C_{60}$ aryl group, and a $C_6$-$C_{60}$ aryl group substituted with a $C_6$-$C_{60}$ aryl group.

14. The organic light-emitting device of claim 10, wherein $L_{21}$ is selected from:

a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, and an ovalenylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, and an ovalenylene group, each substituted with at least one selected from a deuterium, —F, —Cl, —Br, —I, a $C_1$-$C_{60}$ alkyl group, a $C_6$-$C_{60}$ aryl group, a monovalent nonaromatic condensed polycyclic group, and a monovalent nonaromatic condensed heteropolycyclic group.

15. The organic light-emitting device of claim 10, wherein $R_{21}$ is selected from:

a $C_6$-$C_{60}$ aryl group, a monovalent nonaromatic condensed polycyclic group, a monovalent nonaromatic condensed heteropolycyclic group, and —N($Q_{11}$)($Q_{12}$); and a $C_6$-$C_{60}$ aryl group, a monovalent nonaromatic condensed polycyclic group, and a monovalent nonaromatic condensed heteropolycyclic group, each substituted with at least one selected from a deuterium, —F, —Cl, —Br, —I, a $C_1$-$C_{60}$ alkyl group, and a $C_6$-$C_{60}$ aryl group; and $Q_{11}$ and $Q_{12}$ are each independently selected from a $C_6$-$C_{60}$ aryl group, and a $C_6$-$C_{60}$ aryl group substituted with a $C_6$-$C_{60}$ aryl group.

16. The organic light-emitting device of claim 10, wherein $R_{12}$ to $R_{15}$, and $R_{22}$ to $R_{24}$ are each independently selected from a hydrogen, a deuterium, —F, —Cl, —Br, —I, a $C_1$-$C_{60}$ alkyl group, a $C_6$-$C_{60}$ aryl group, a $C_2$-$C_{60}$ heteroaryl group, and —N($Q_{21}$)($Q_{22}$); and $Q_{21}$ and $Q_{22}$ are each independently selected from a $C_6$-$C_{60}$ aryl group, and a $C_6$-$C_{60}$ aryl group substituted with a $C_6$-$C_{60}$ aryl group.

17. The organic light-emitting device of claim 10, wherein the carbazole-based compound represented by Formula 1 is selected from Compounds 101B to 196B:

101B

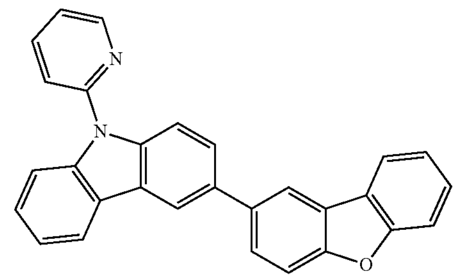

102B

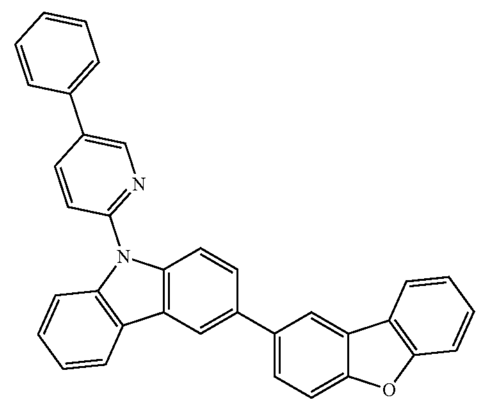

103B

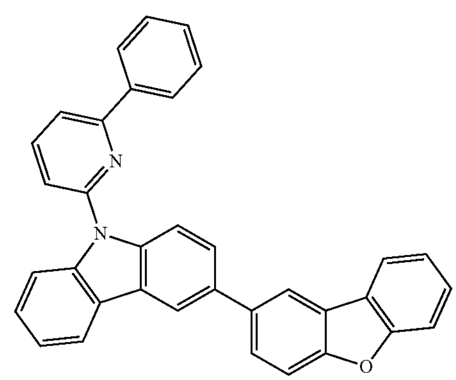

104B

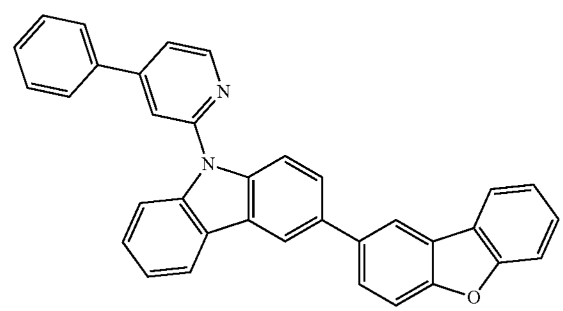

-continued
105B
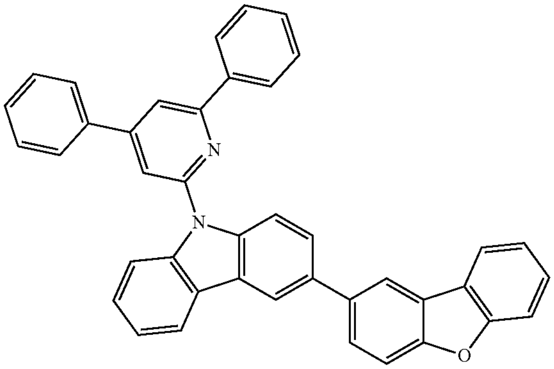
106B
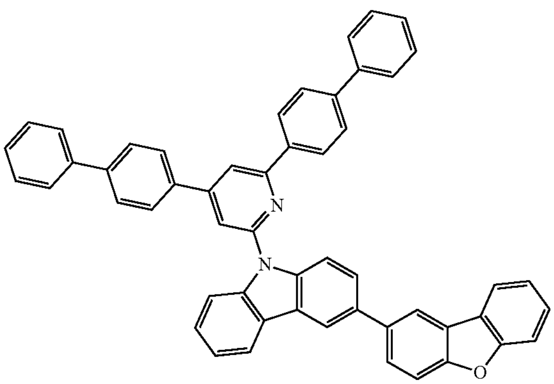
107B
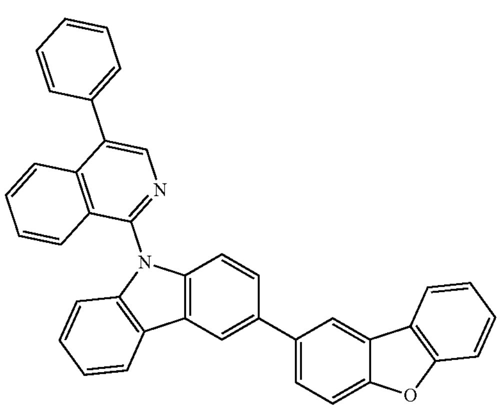
-continued
108B
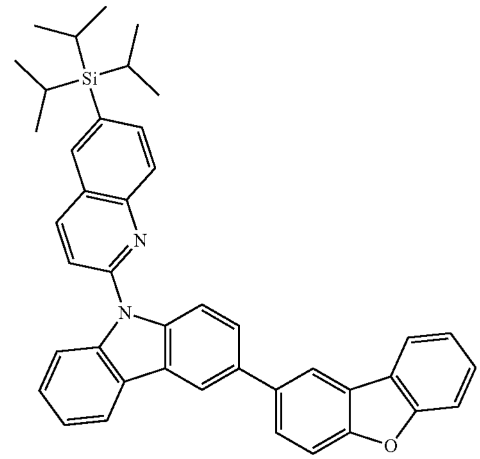
109B
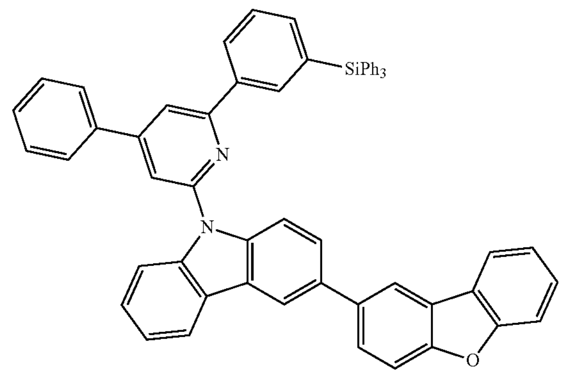
110B
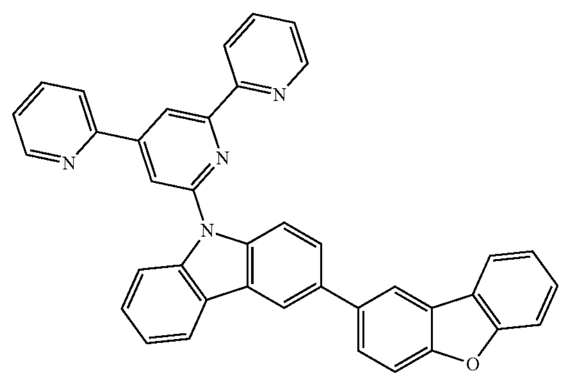
111B
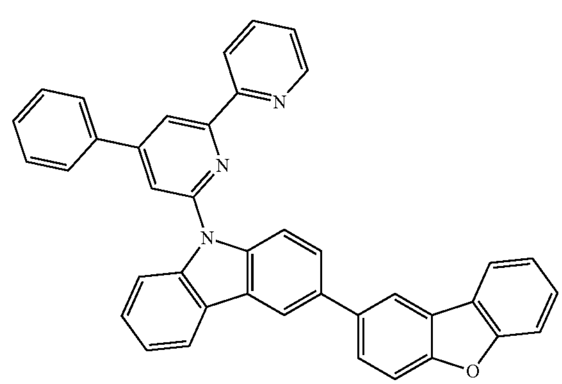

-continued
112B
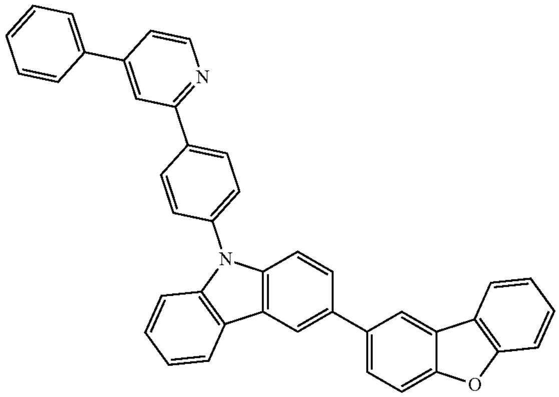
113B
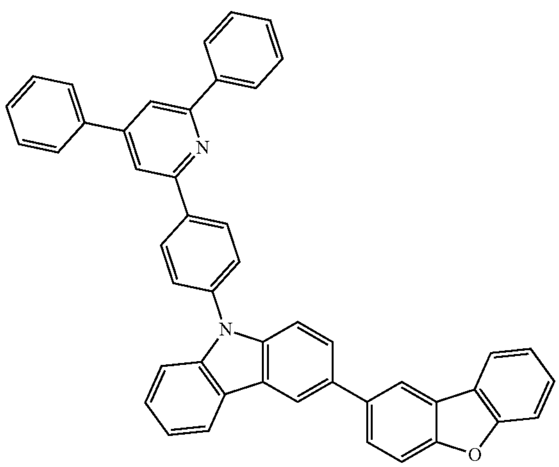
114B
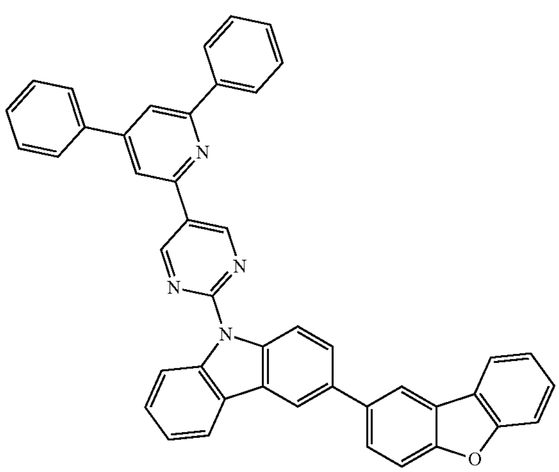
-continued
115B
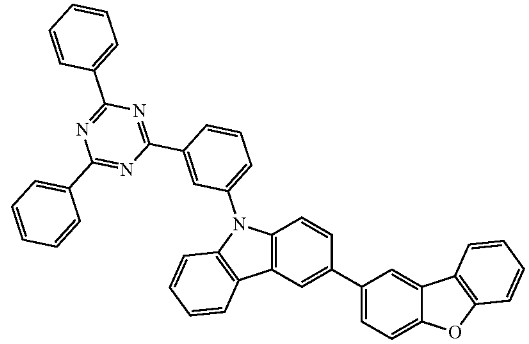
116B
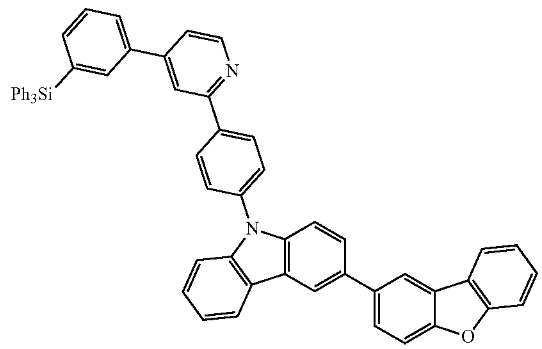
117B
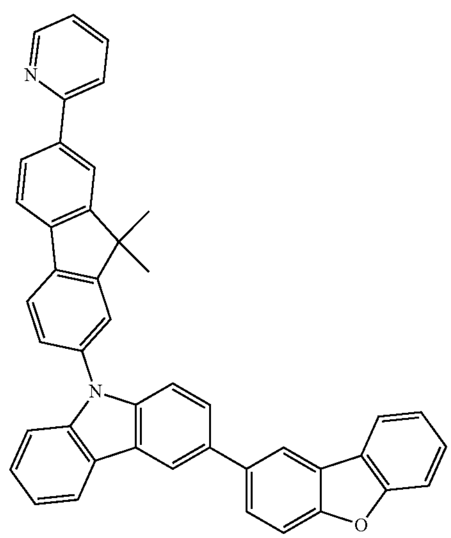
118B
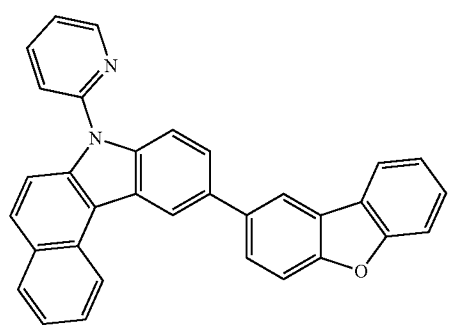

-continued
119B
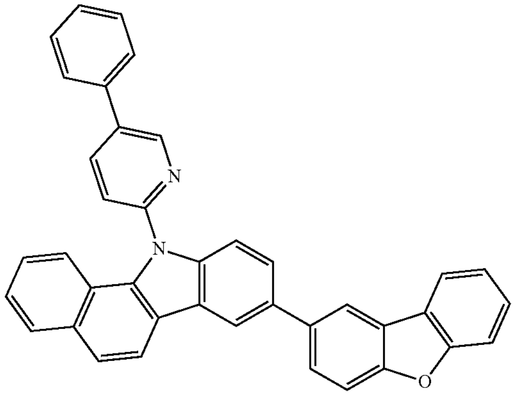
120B
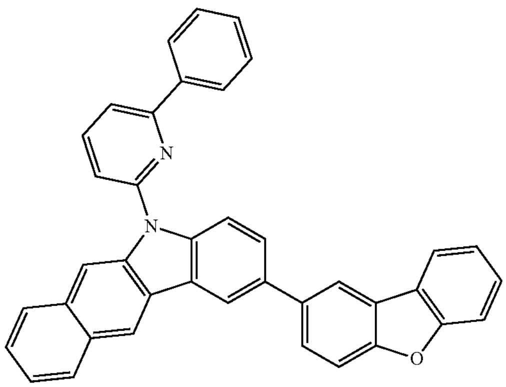
121B
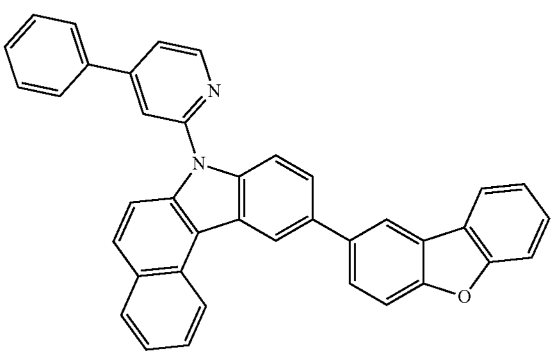
122B
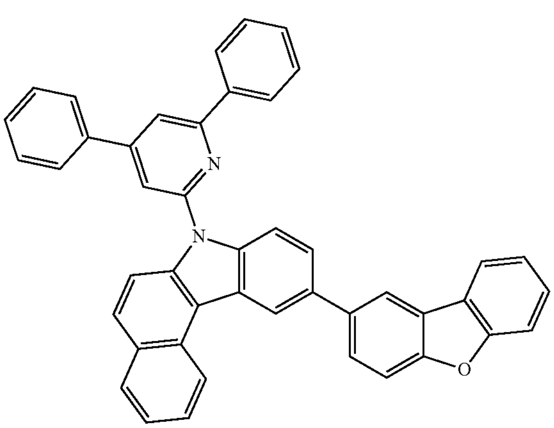
-continued
123B
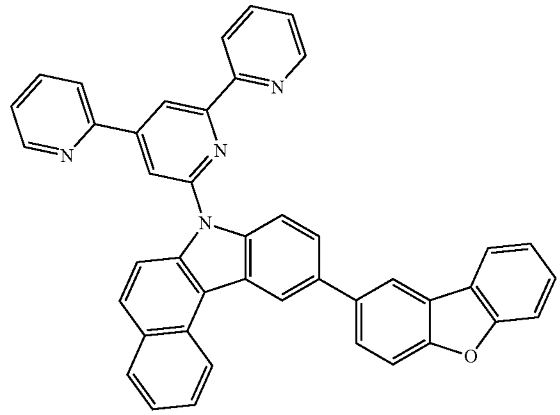
124B
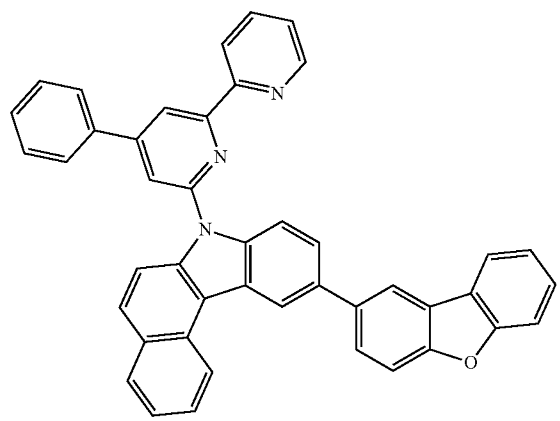
125B
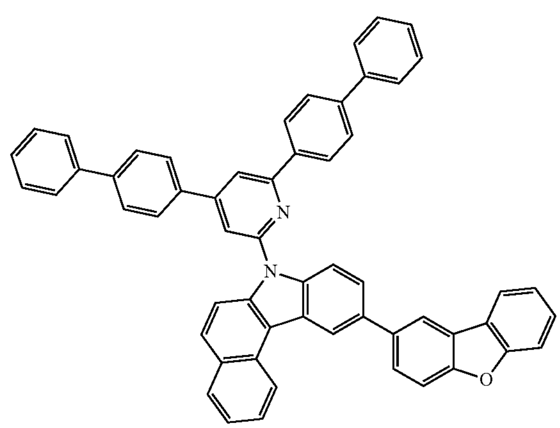

-continued
126B
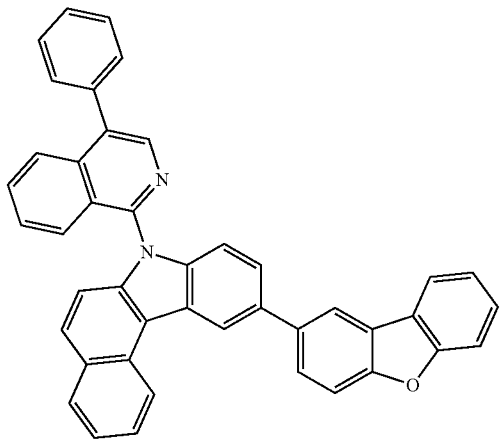
127B
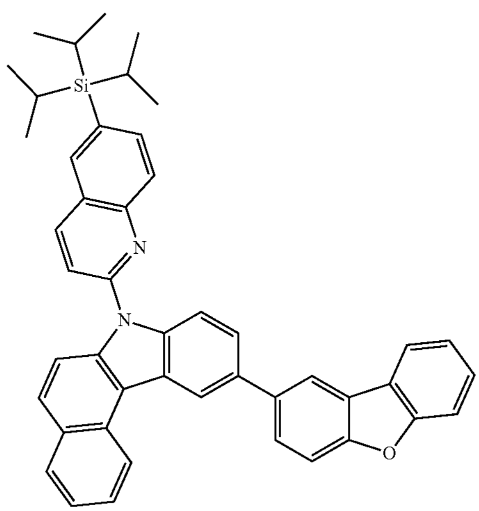
128B
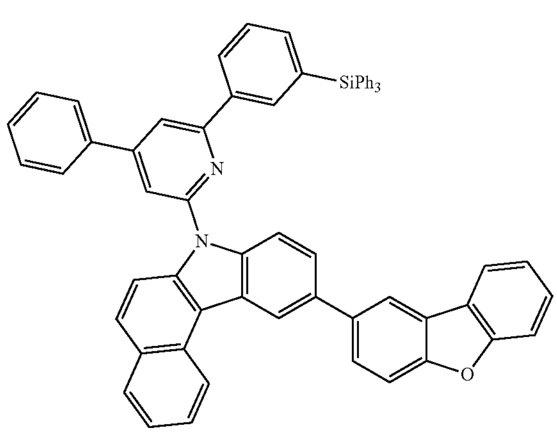
-continued
129B
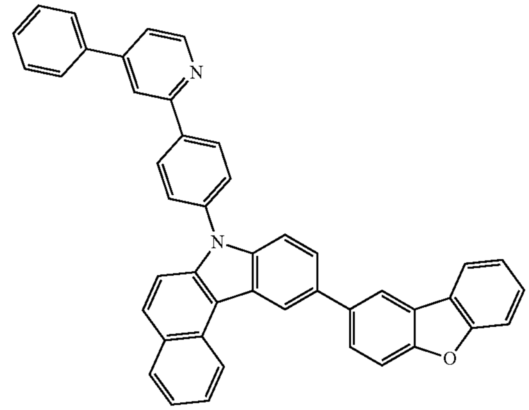
130B
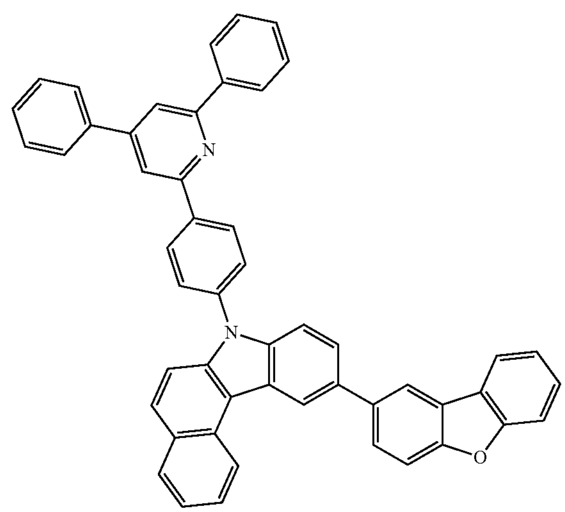
131B
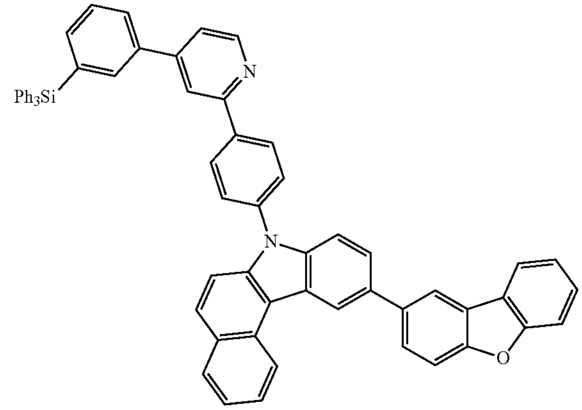

-continued
132B
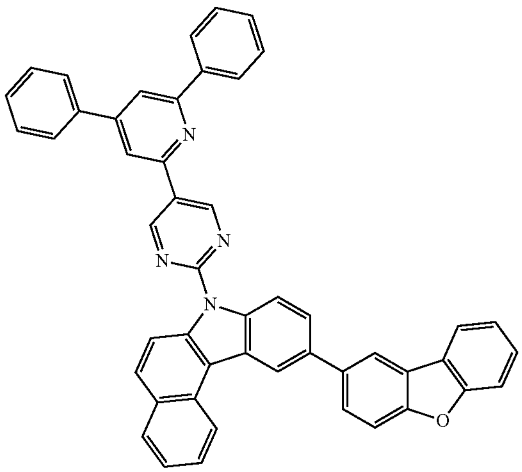
133B
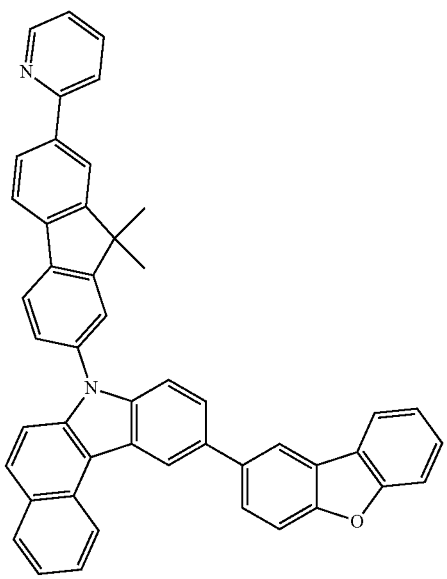
134B
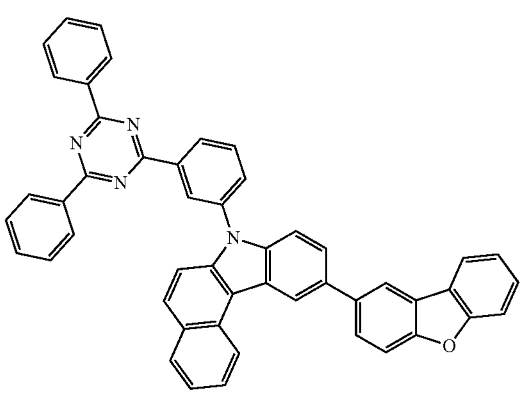
-continued
135B
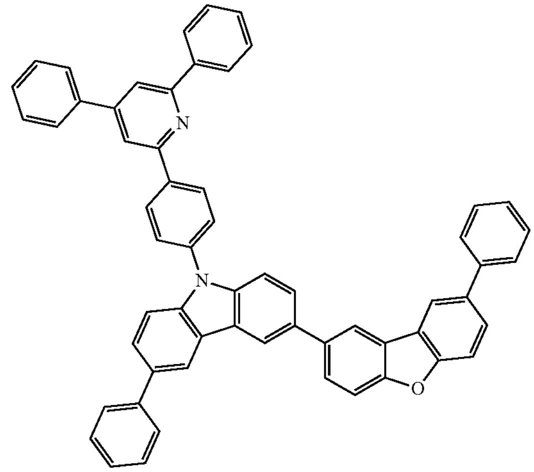
136B
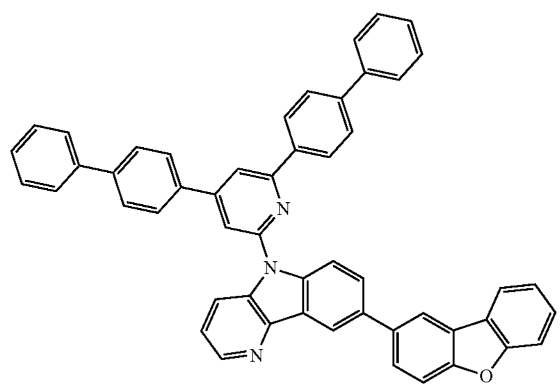
137B
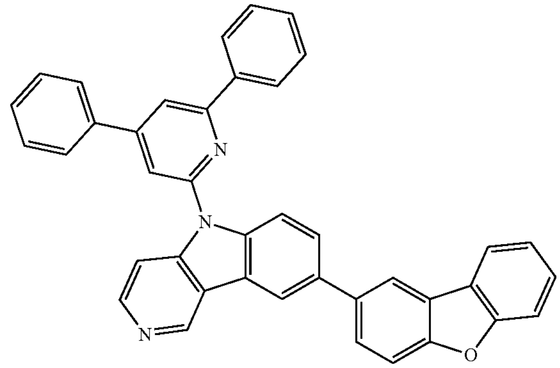

-continued
138B
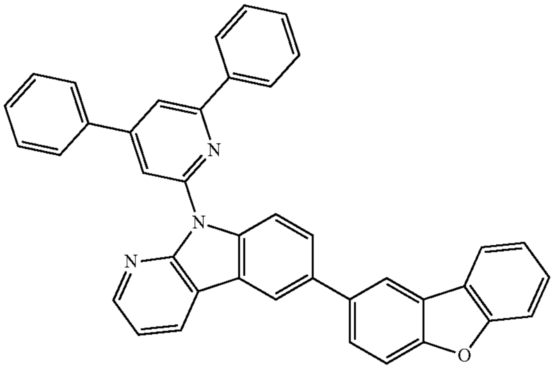
139B
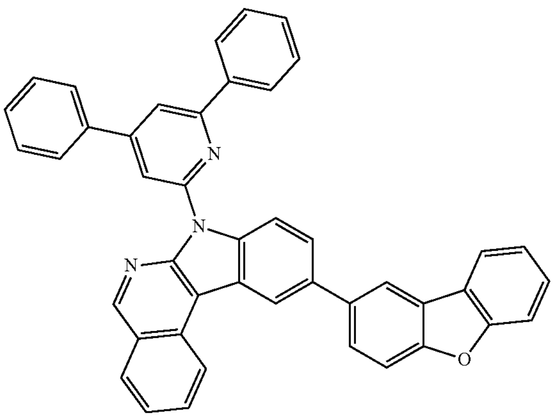
140B
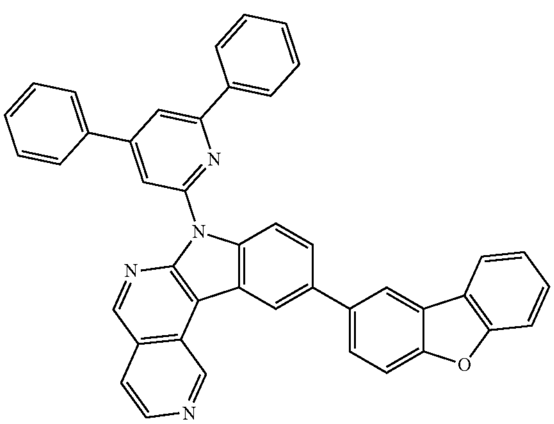
141B
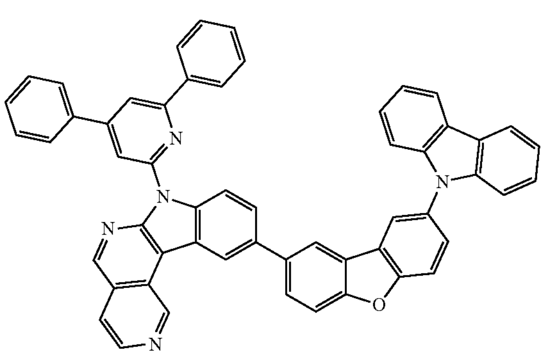
-continued
142B
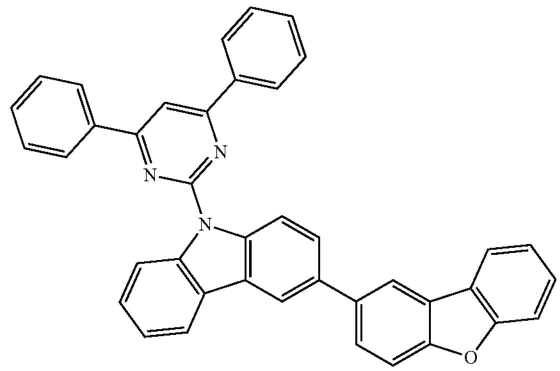
143B
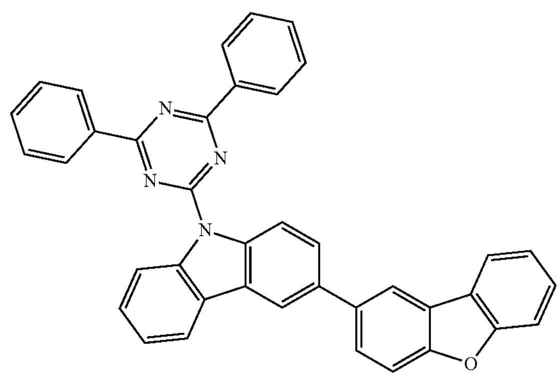
144B
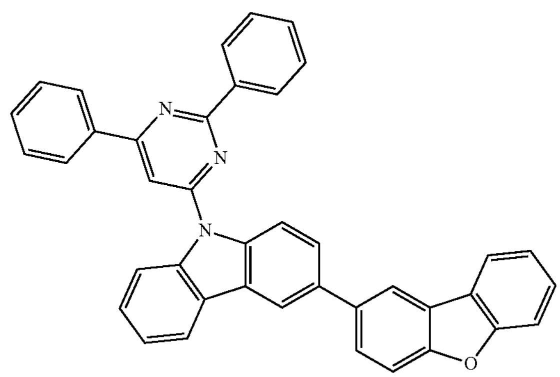
145B
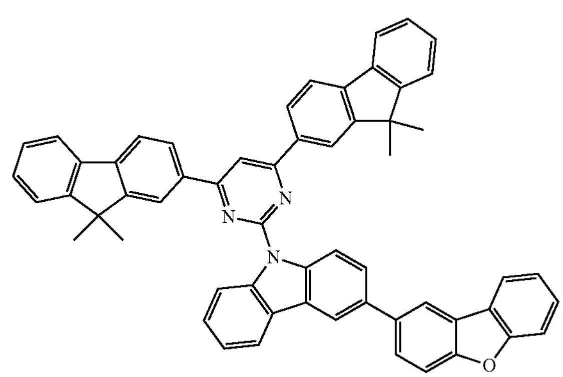

-continued
146B
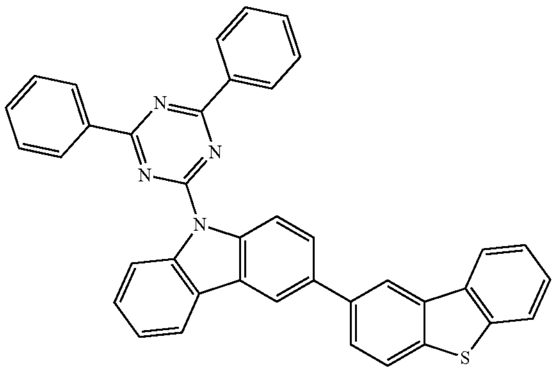
147B
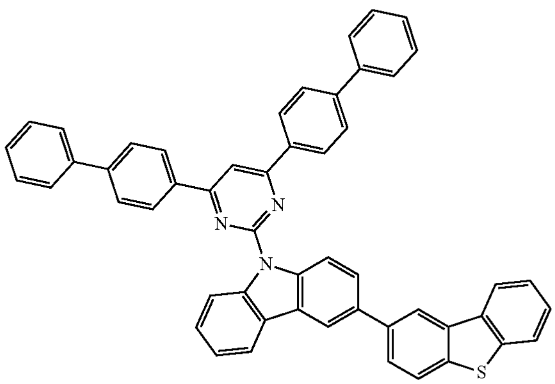
148B
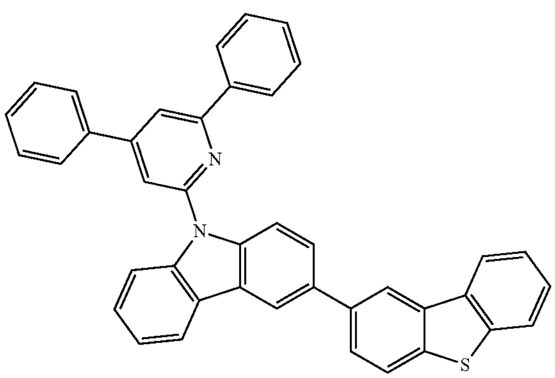
149B
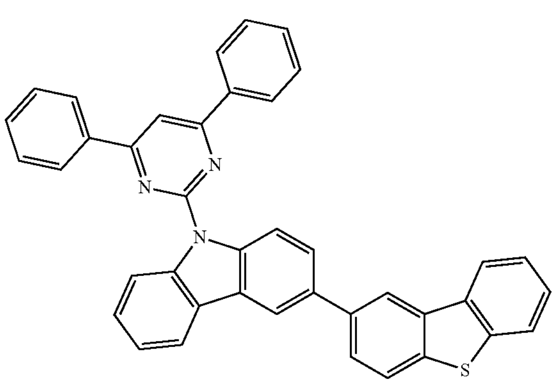
-continued
150B
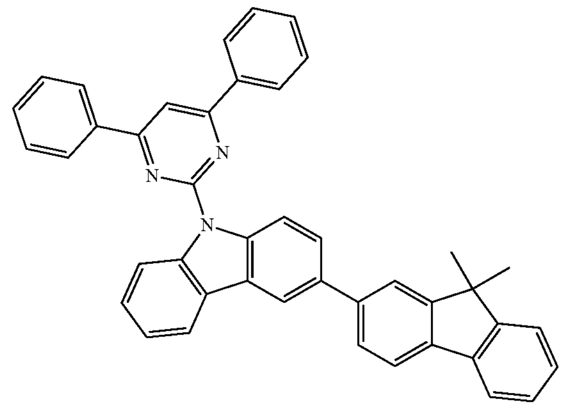
151B
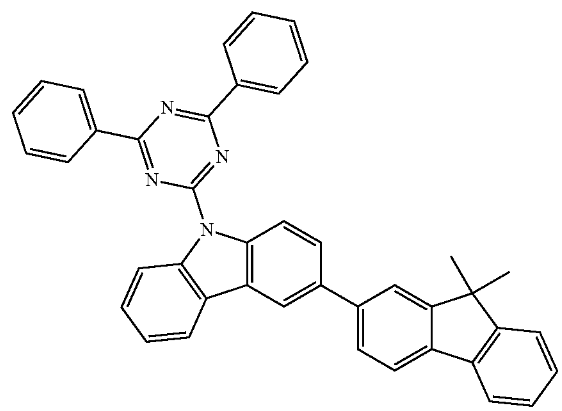
152B
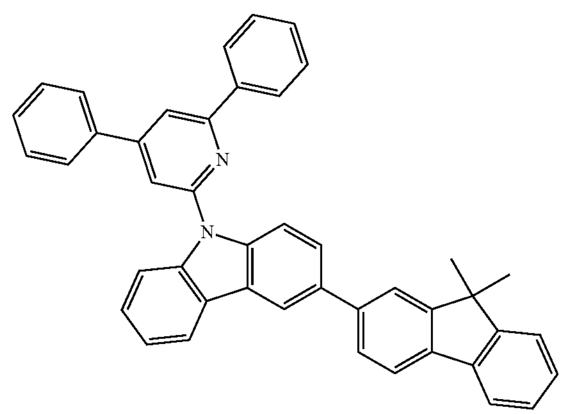
153B
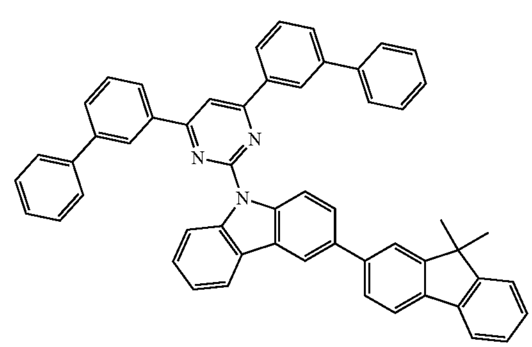

-continued
154B
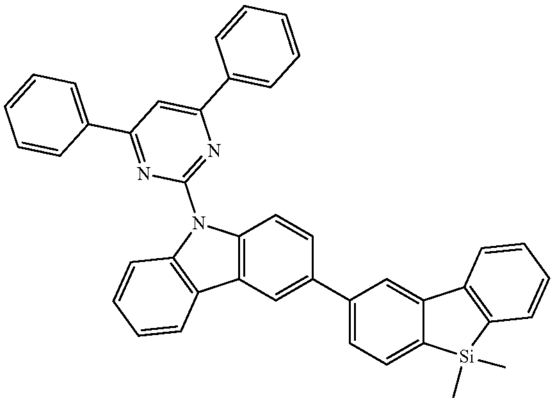
155B
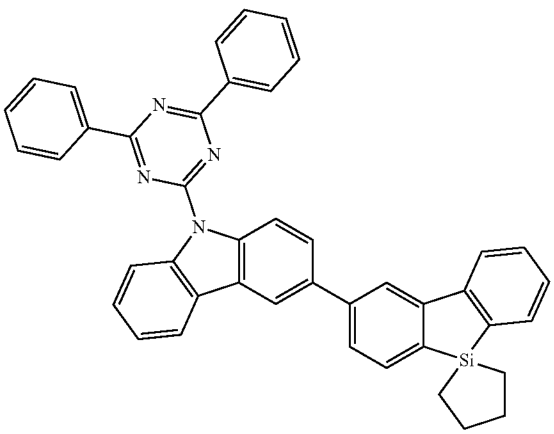
156B
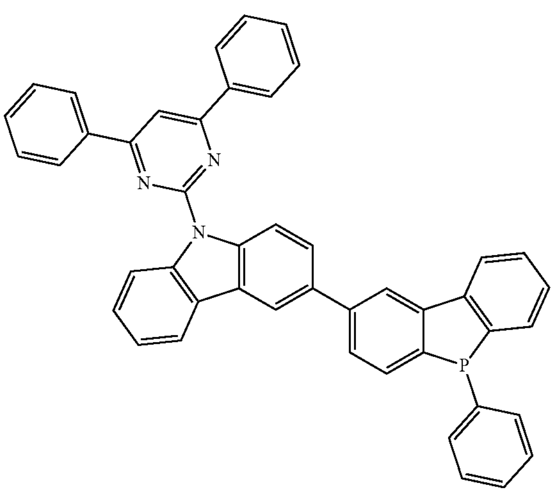
-continued
157B
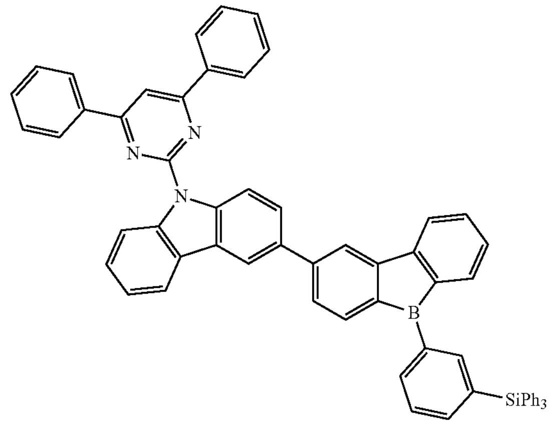
158B
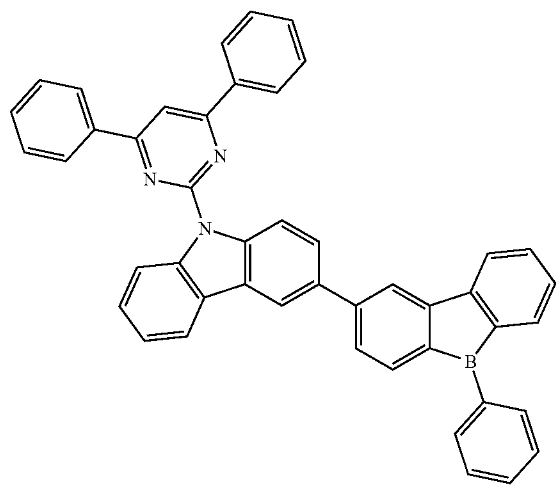
159B
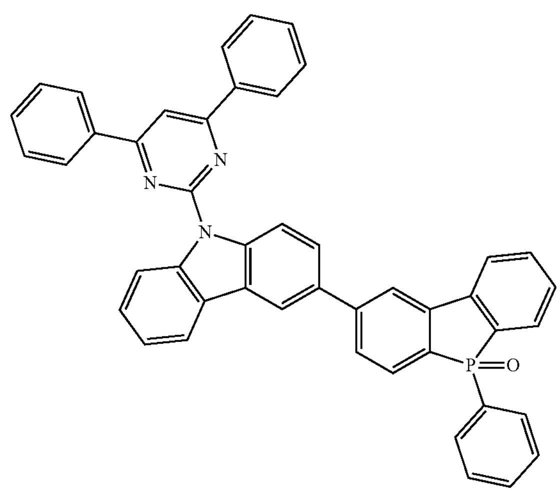

-continued
160B
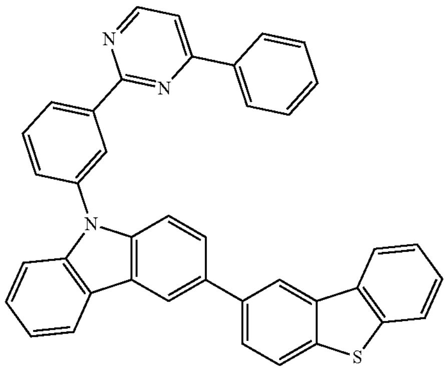
161B
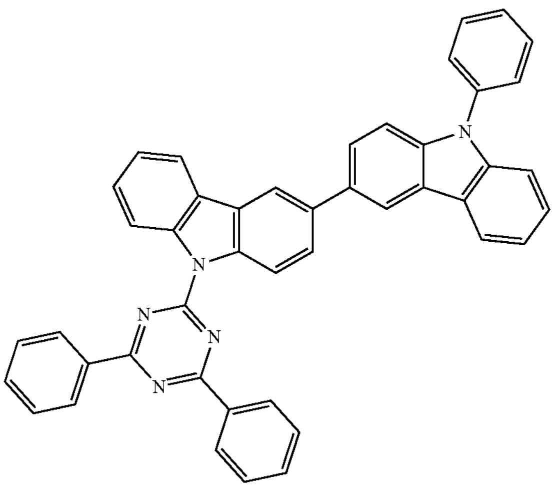
162B
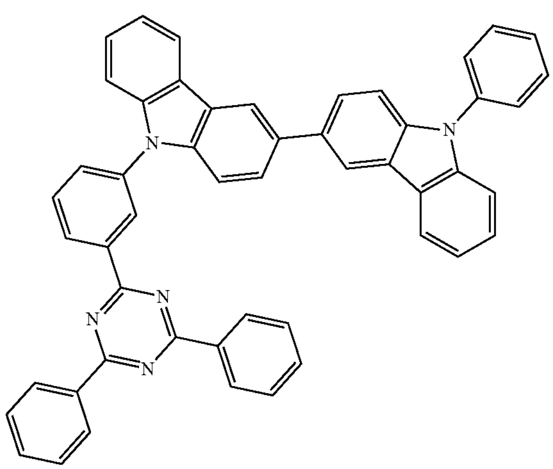
-continued
163B
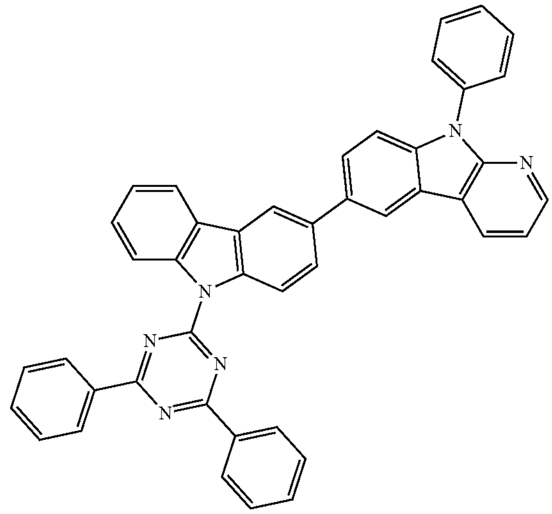
164B
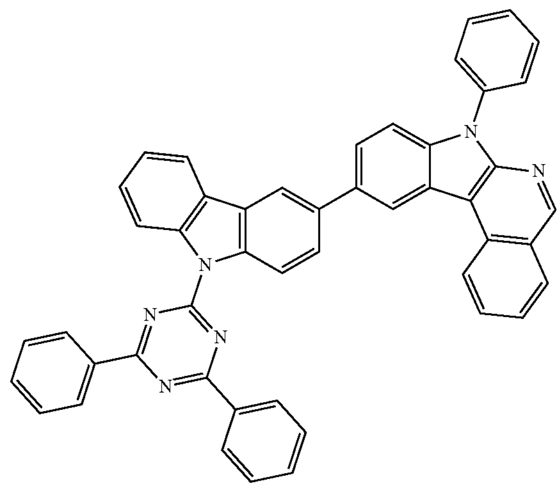
165B
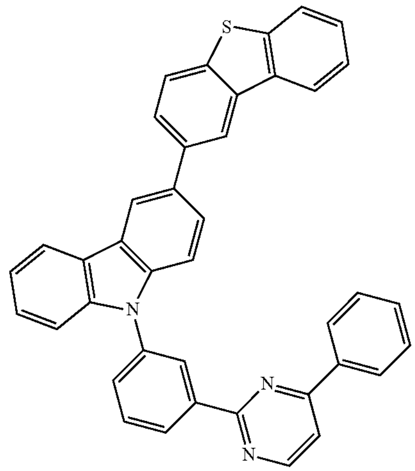

-continued
166B
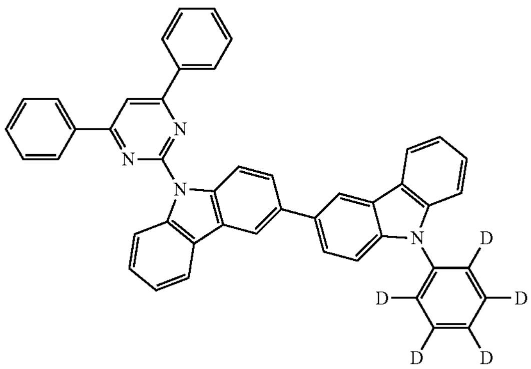
167B
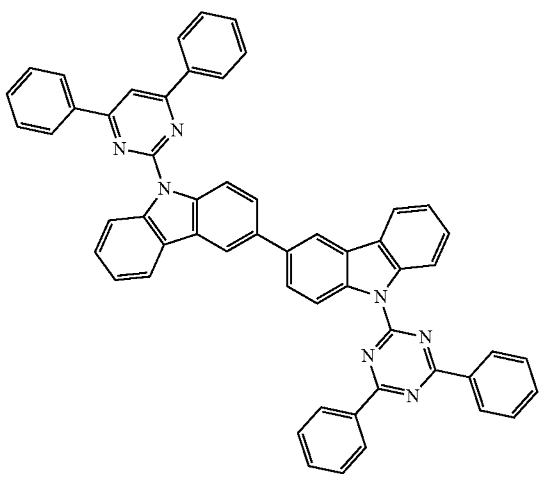
168B
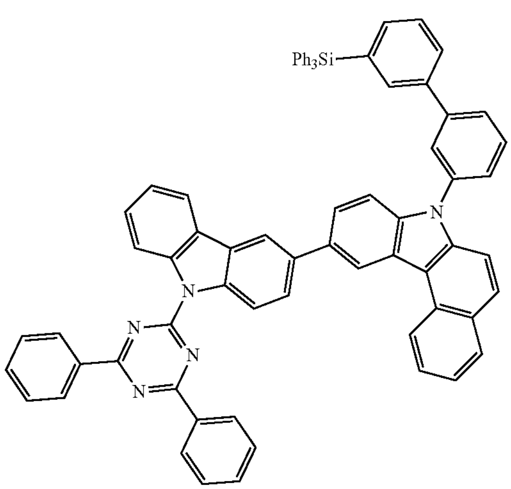
-continued
169B
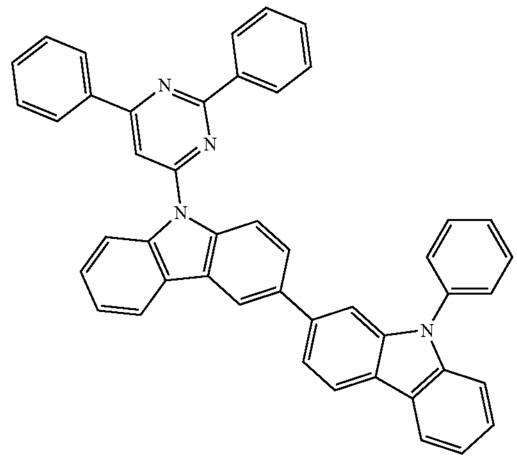
170B
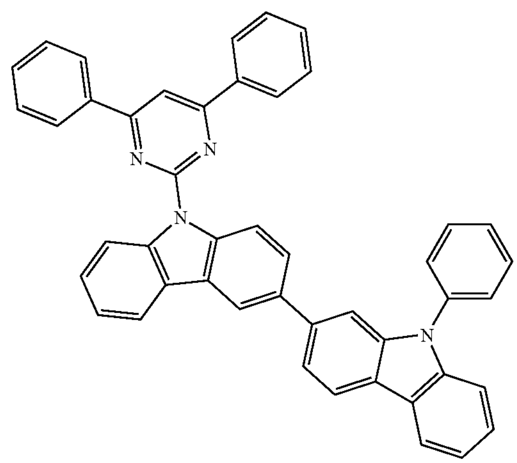
171B
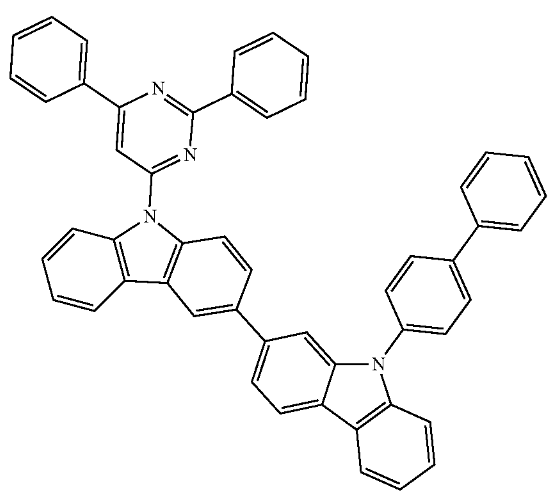

-continued
172B
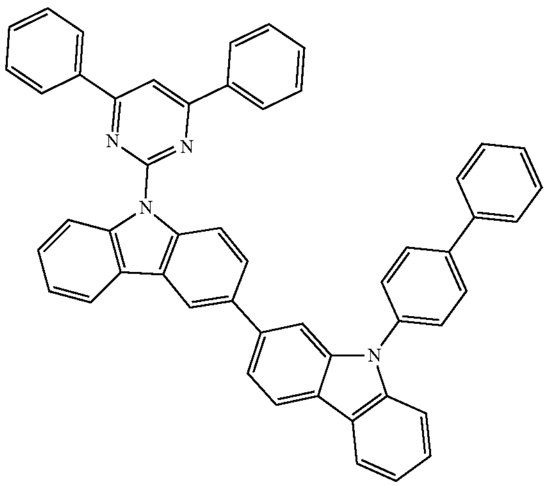
173B
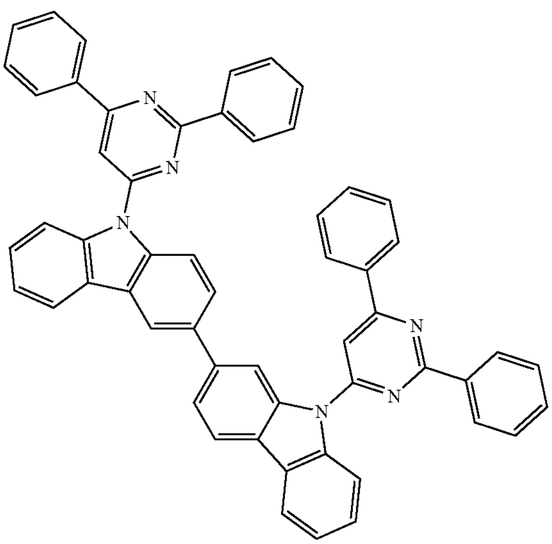
174B
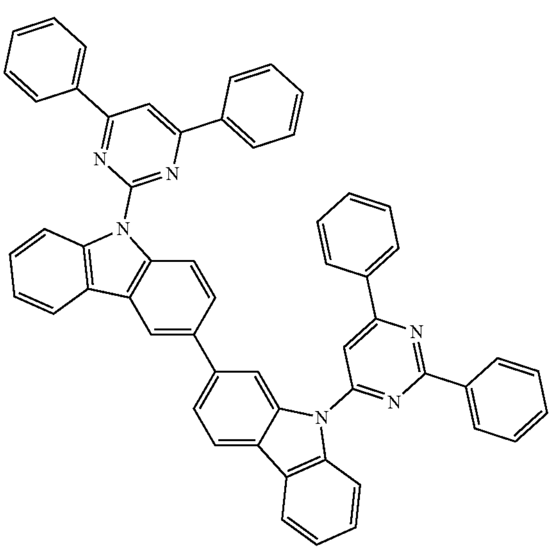
-continued
175B
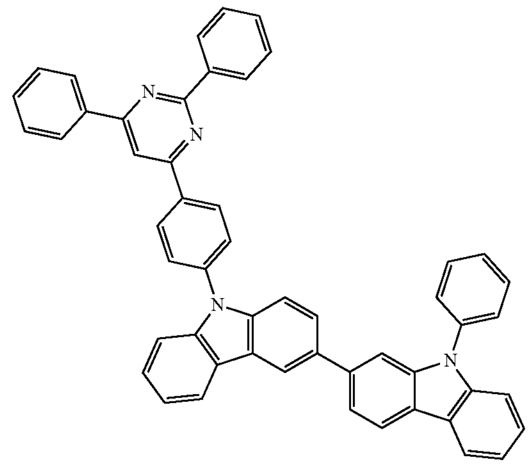
176B
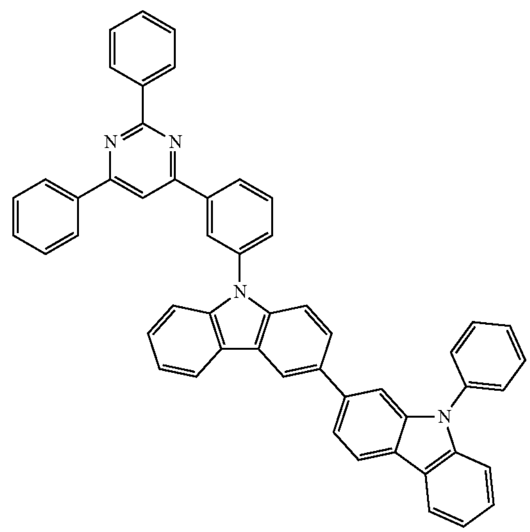
177B
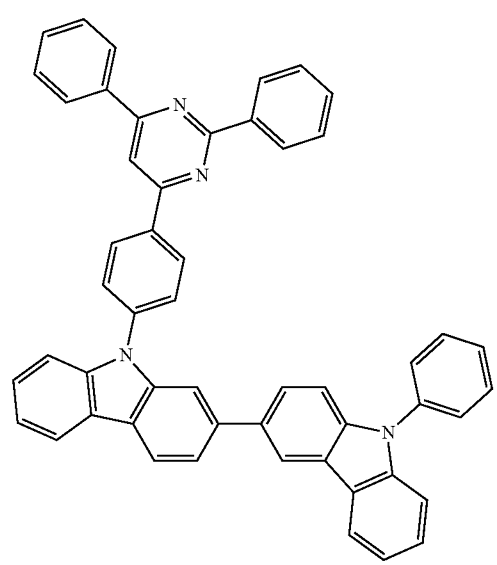

178B
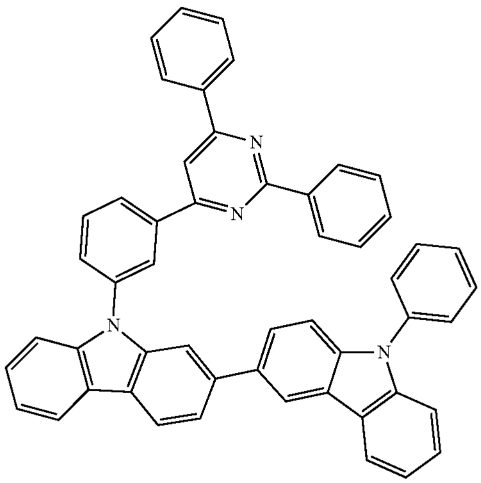
179B
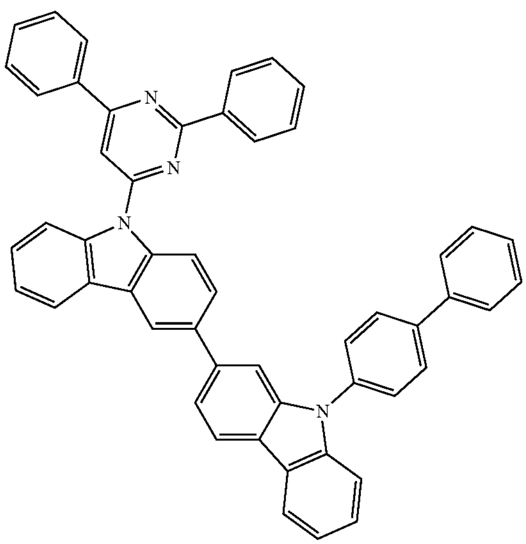
180B
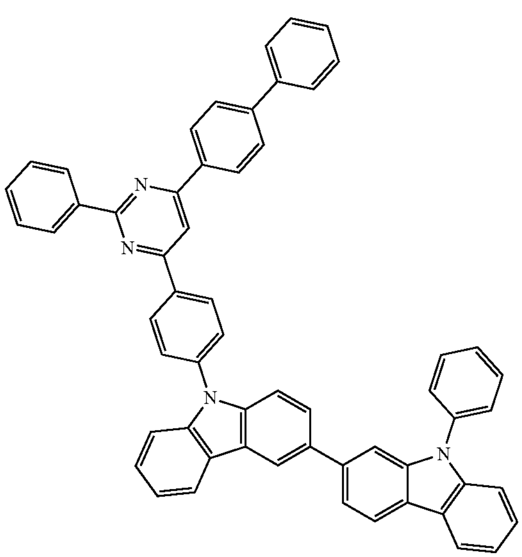
181B
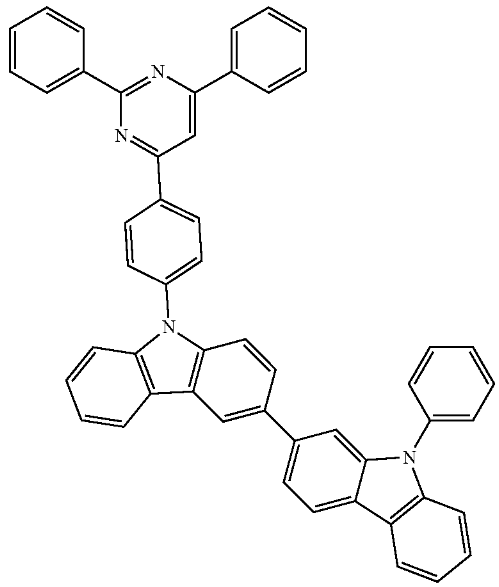
182B
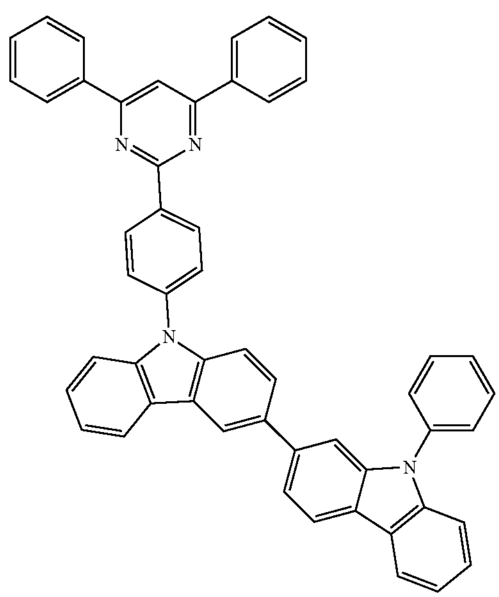

-continued
183B
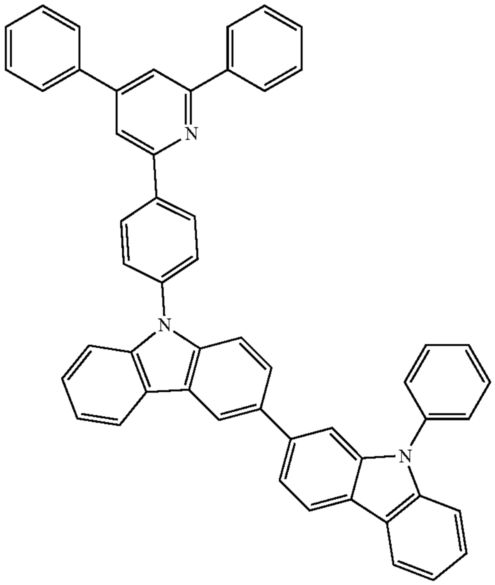
184B
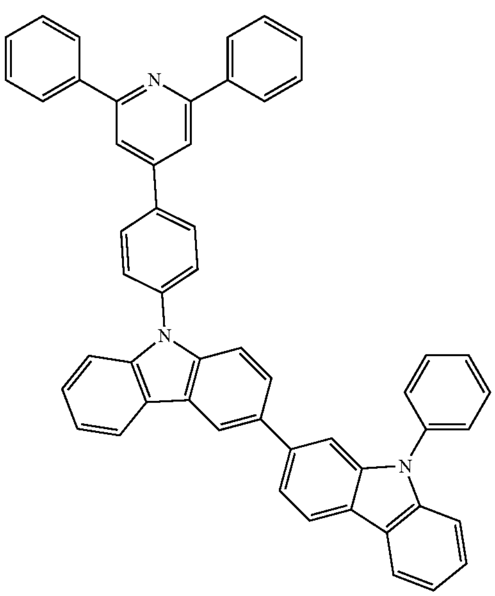
-continued
191B
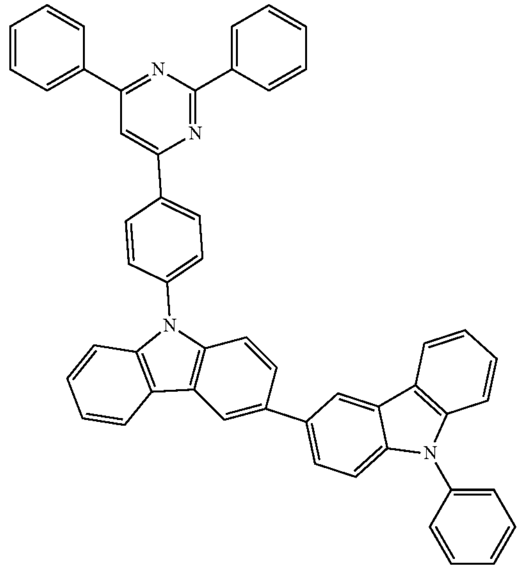
192B
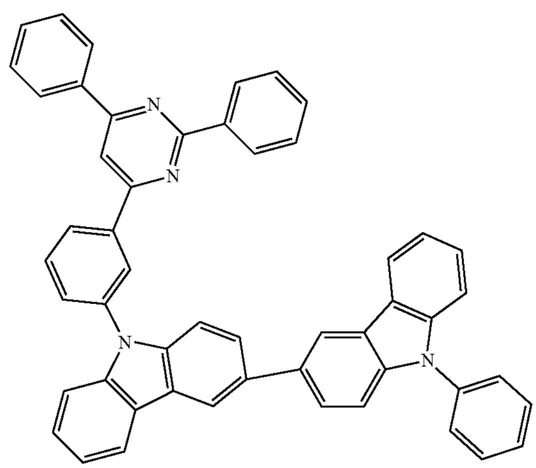

-continued
193B
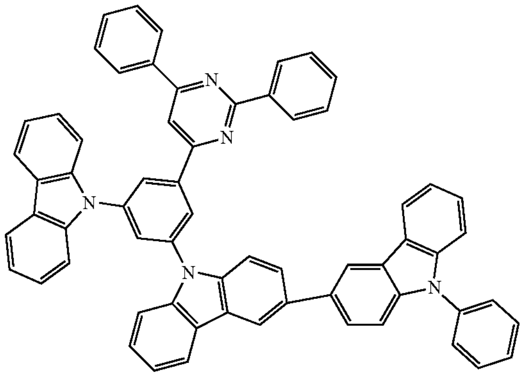
194B
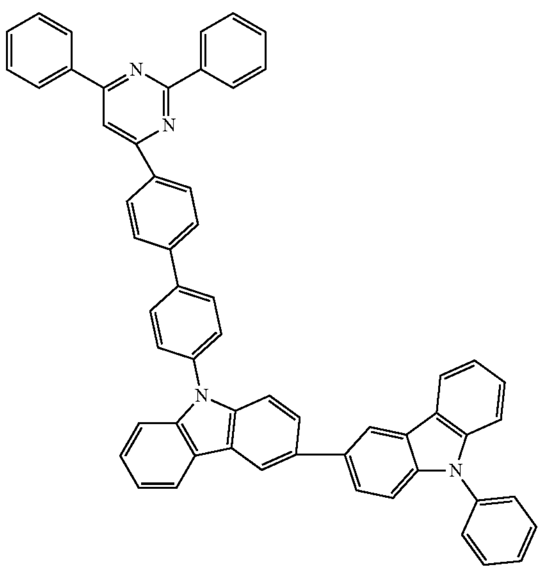
-continued
195B
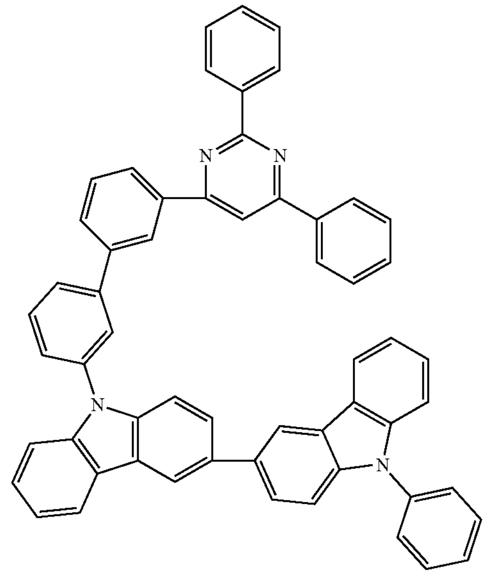
196B
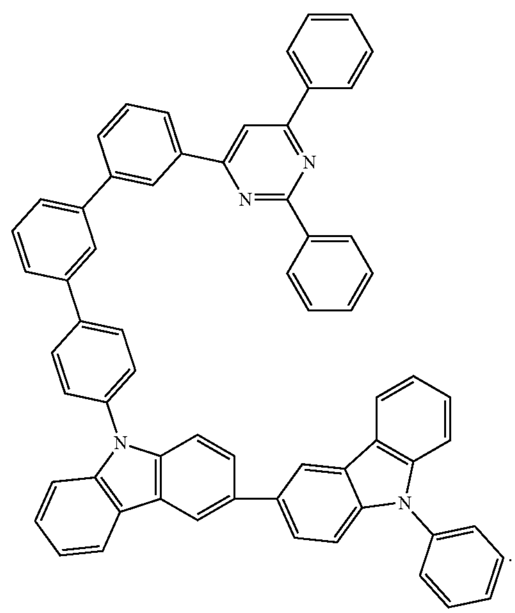
18. The organic light-emitting device of claim 10, wherein the emission layer further comprises a phosphorescent dopant.
* * * * *